(12) United States Patent
Lin et al.

(10) Patent No.: US 6,740,576 B1
(45) Date of Patent: *May 25, 2004

(54) METHOD OF MAKING A CONTACT TERMINAL WITH A PLATED METAL PERIPHERAL SIDEWALL PORTION FOR A SEMICONDUCTOR CHIP ASSEMBLY

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/165,483

(22) Filed: Jun. 6, 2002

Related U.S. Application Data

(63) Continuation-in-part of application No. 09/972,796, filed on Oct. 6, 2001, now Pat. No. 6,667,229, which is a continuation-in-part of application No. 09/962,754, filed on Sep. 24, 2001, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835, said application No. 09/975,796, is a continuation-in-part of application No. 09/917,339, filed on Jul. 27, 2001, now Pat. No. 6,537,851, which is a continuation-in-part of application No. 09/878,626, filed on Jun. 11, 2001, now Pat. No. 6,653,217, which is a continuation-in-part of application No. 09/687,619, filed on Oct. 13, 2000, now Pat. No. 6,440,835.

(51) Int. Cl.$^7$ .............................................. H01L 21/44
(52) U.S. Cl. ................ 438/611; 438/597; 438/599; 438/612; 438/613; 438/614
(58) Field of Search ................ 438/597, 599, 438/612, 613, 614

(56) References Cited

U.S. PATENT DOCUMENTS

| 4,442,967 A | 4/1984 | van de Pas et al. ........ 228/159 |
| 4,661,192 A | 4/1987 | McShane .................... 156/292 |
| 4,717,066 A | 1/1988 | Goldenberg et al. ........ 228/179 |
| 4,750,666 A | 6/1988 | Neugebauer et al. ....... 228/160 |
| 4,807,021 A | 2/1989 | Okumura ..................... 357/75 |
| 4,925,083 A | 5/1990 | Farassat et al. ............. 228/102 |

(List continued on next page.)

FOREIGN PATENT DOCUMENTS

| EP | 0 718 882 A1 | 6/1996 | ......... H01L/23/057 |
| WO | WO 97/38563 | 10/1997 | ............ H05K/1/03 |
| WO | WO 99/57762 | 11/1999 | ........... H01L/23/48 |

OTHER PUBLICATIONS

Markstein et al., "Controlling the Variables in Stencil Printing," Electronic Packaging & Production, Feb. 1997, pp. 48–56.
Elenius, "Choosing a Flip Chip Bumping Supplier—Technology an IC Package contractor should look for," Advanced Packaging, Mar./Apr. 1998, pp. 70–73.
Erickson, "Wafer Bumping: The Missing Link for DCA," Electronic Packaging & Production, Jul. 1998, pp. 43–46.

(List continued on next page.)

*Primary Examiner*—David Nelms
*Assistant Examiner*—Renee R. Berry
(74) *Attorney, Agent, or Firm*—David M. Sigmond

(57) ABSTRACT

A method of making a semiconductor chip assembly includes providing a semiconductor chip that includes a conductive pad, providing a conductive trace and a metal base, wherein the conductive trace includes a routing line and a contact terminal, the routing line is disposed outside the metal base, the contact terminal extends from the routing line through the metal base, the contact terminal includes a plated metal that contacts and extends through the metal base, the plated metal forms a peripheral sidewall portion of the contact terminal, and the plated metal surrounds a central surface area without extending into the central surface area, then mechanically attaching the chip to the conductive trace, removing a portion of the metal base that contacts the plated metal, and forming a connection joint that contacts and electrically connects the conductive trace and the pad.

280 Claims, 97 Drawing Sheets

U.S. PATENT DOCUMENTS

| | | | |
|---|---|---|---|
| 4,937,653 A | 6/1990 | Blonder et al. | 357/68 |
| 4,955,523 A | 9/1990 | Calomagno et al. | 228/179 |
| 4,970,571 A | 11/1990 | Yamakawa et al. | 357/71 |
| 4,984,358 A | 1/1991 | Nelson | 29/830 |
| 5,014,111 A | 5/1991 | Tsuda et al. | 357/68 |
| 5,060,843 A | 10/1991 | Yasuzato et al. | 228/179 |
| 5,074,947 A | 12/1991 | Estes et al. | 156/307.3 |
| 5,090,119 A | 2/1992 | Tsuda et al. | 29/843 |
| 5,106,461 A | 4/1992 | Volfson et al. | 205/125 |
| 5,116,463 A | 5/1992 | Lin et al. | 156/653 |
| 5,137,845 A | 8/1992 | Lochon et al. | 437/183 |
| 5,167,992 A | 12/1992 | Lin et al. | 427/437 |
| 5,172,851 A | 12/1992 | Matsushita et al. | 228/179 |
| 5,196,371 A | 3/1993 | Kulesza et al. | 437/183 |
| 5,209,817 A | 5/1993 | Ahmad et al. | 156/643 |
| 5,237,130 A | 8/1993 | Kulesza et al. | 174/260 |
| 5,260,234 A | 11/1993 | Long | 437/203 |
| 5,261,593 A | 11/1993 | Casson et al. | 228/180.22 |
| 5,275,330 A | 1/1994 | Isaacs et al. | 228/180.2 |
| 5,284,796 A | 2/1994 | Nakanishi et al. | 437/183 |
| 5,293,067 A | 3/1994 | Thompson et al. | 257/668 |
| 5,294,038 A | 3/1994 | Nakano et al. | 228/179.1 |
| 5,327,010 A | 7/1994 | Uenaka et al. | 257/679 |
| 5,334,804 A | 8/1994 | Love et al. | 174/267 |
| 5,346,750 A | 9/1994 | Hatakeyama et al. | 428/209 |
| 5,355,283 A | 10/1994 | Marrs et al. | 361/760 |
| 5,358,621 A | 10/1994 | Oyama | 205/123 |
| 5,364,004 A | 11/1994 | Davidson | 228/1.1 |
| 5,397,921 A | 3/1995 | Karnezos | 257/779 |
| 5,407,864 A | 4/1995 | Kim | 437/203 |
| 5,424,245 A | 6/1995 | Gurtler et al. | 437/183 |
| 5,438,477 A | 8/1995 | Pasch | 361/689 |
| 5,439,162 A | 8/1995 | George et al. | 228/180.22 |
| 5,447,886 A | 9/1995 | Rai | 437/183 |
| 5,454,161 A | 10/1995 | Beilin et al. | 29/852 |
| 5,454,928 A | 10/1995 | Rogers et al. | 205/125 |
| 5,475,236 A | 12/1995 | Yoshizaki | 257/48 |
| 5,477,933 A | 12/1995 | Nguyen | 174/262 |
| 5,478,007 A | 12/1995 | Marrs | 228/180.22 |
| 5,483,421 A | 1/1996 | Gedney et al. | 361/771 |
| 5,484,647 A | 1/1996 | Nakatani et al. | 428/209 |
| 5,485,949 A | 1/1996 | Tomura et al. | 228/180.5 |
| 5,487,218 A | 1/1996 | Bhatt et al. | 29/852 |
| 5,489,804 A | 2/1996 | Pasch | 257/778 |
| 5,493,096 A | 2/1996 | Koh | 219/121.71 |
| 5,508,229 A | 4/1996 | Baker | 437/183 |
| 5,525,065 A | 6/1996 | Sobhani | 439/67 |
| 5,536,973 A | 7/1996 | Yamaji | 257/737 |
| 5,542,601 A | 8/1996 | Fallon et al. | 228/119 |
| 5,547,740 A | 8/1996 | Higdon et al. | 428/209 |
| 5,556,810 A | 9/1996 | Fujitsu | 437/209 |
| 5,556,814 A | 9/1996 | Inoue et al. | 437/230 |
| 5,564,181 A | 10/1996 | Dineen et al. | 29/841 |
| 5,572,069 A | 11/1996 | Schneider | 257/690 |
| 5,576,052 A | 11/1996 | Arledge et al. | 427/98 |
| 5,583,073 A | 12/1996 | Lin et al. | 439/183 |
| 5,595,943 A | 1/1997 | Itabashi et al. | 437/230 |
| 5,599,744 A | 2/1997 | Koh et al. | 437/195 |
| 5,611,140 A | 3/1997 | Kulesza et al. | 29/832 |
| 5,611,884 A | 3/1997 | Bearinger et al. | 156/325 |
| 5,613,296 A | 3/1997 | Kurino et al. | 29/852 |
| 5,614,114 A | 3/1997 | Owen | 219/121.66 |
| 5,615,477 A | 4/1997 | Sweitzer | 29/840 |
| 5,619,791 A | 4/1997 | Lambrecht, Jr. et al. | 29/852 |
| 5,627,405 A | 5/1997 | Chillara | 257/668 |
| 5,627,406 A | 5/1997 | Pace | 257/700 |
| 5,633,204 A | 5/1997 | Tago et al. | 438/614 |
| 5,637,920 A | 6/1997 | Loo | 257/700 |
| 5,641,113 A | 6/1997 | Somaki et al. | 228/180.22 |
| 5,645,628 A | 7/1997 | Endo et al. | 106/1.23 |
| 5,646,067 A | 7/1997 | Gaul | 437/180 |
| 5,648,686 A | 7/1997 | Hirano et al. | 257/778 |
| 5,654,584 A | 8/1997 | Fujitsu | 257/666 |
| 5,656,858 A | 8/1997 | Kondo et al. | 257/737 |
| 5,663,598 A | 9/1997 | Lake et al. | 257/737 |
| 5,665,652 A | 9/1997 | Shimizu | 438/127 |
| 5,666,008 A | 9/1997 | Tomita et al. | 257/778 |
| 5,669,545 A | 9/1997 | Pham et al. | 228/1.1 |
| 5,674,785 A | 10/1997 | Akram et al. | 437/217 |
| 5,674,787 A | 10/1997 | Zhao et al. | 437/230 |
| 5,682,061 A | 10/1997 | Khandros et al. | 257/666 |
| 5,686,353 A | 11/1997 | Yagi et al. | 437/183 |
| 5,691,041 A | 11/1997 | Frankeny et al. | 4287/209 |
| 5,722,162 A | 3/1998 | Chou et al. | 29/852 |
| 5,723,369 A | 3/1998 | Barber | 438/106 |
| 5,731,223 A | 3/1998 | Padmanabhan | 437/183 |
| 5,736,456 A | 4/1998 | Akram | 438/614 |
| 5,739,585 A | 4/1998 | Akram et al. | 257/698 |
| 5,744,859 A | 4/1998 | Ouchida | 257/668 |
| 5,757,071 A | 5/1998 | Bhansali | 257/697 |
| 5,757,081 A | 5/1998 | Chang et al. | 257/778 |
| 5,764,486 A | 6/1998 | Pendse | 361/774 |
| 5,774,340 A | 6/1998 | Chang et al. | 361/771 |
| 5,789,271 A | 8/1998 | Akram | 438/18 |
| 5,798,285 A | 8/1998 | Bentlage et al. | 438/108 |
| 5,801,072 A | 9/1998 | Barber | 438/107 |
| 5,801,447 A | 9/1998 | Hirano et al. | 257/778 |
| 5,803,340 A | 9/1998 | Yeh et al. | 228/56.3 |
| 5,804,771 A | 9/1998 | McMahon et al. | 174/255 |
| 5,808,360 A | 9/1998 | Akram | 257/738 |
| 5,811,879 A | 9/1998 | Akram | 257/723 |
| 5,813,115 A | 9/1998 | Misawa et al. | 29/832 |
| 5,817,541 A | 10/1998 | Averkiou et al. | 438/107 |
| 5,822,856 A | 10/1998 | Bhatt et al. | 29/832 |
| 5,834,844 A | 11/1998 | Akagawa et al. | 257/734 |
| 5,861,666 A | 1/1999 | Bellaar | 257/686 |
| 5,863,816 A | 1/1999 | Cho | 438/123 |
| 5,870,289 A | 2/1999 | Tokuda et al. | 361/779 |
| 5,883,435 A | 3/1999 | Geffken et al. | 257/758 |
| 5,925,931 A | 7/1999 | Yamamoto | 257/737 |
| 5,994,222 A | 11/1999 | Smith et al. | 438/689 |
| 6,012,224 A | 1/2000 | DiStefano et al. | 29/840 |
| 6,013,877 A | 1/2000 | Degani et al. | 174/264 |
| 6,017,812 A | 1/2000 | Yonezawa et al. | 438/613 |
| 6,018,196 A | 1/2000 | Noddin | 257/777 |
| 6,020,561 A | 2/2000 | Ishida et al. | 174/261 |
| 6,037,665 A | 3/2000 | Miyazaki | 257/773 |
| 6,046,909 A | 4/2000 | Joy | 361/748 |
| 6,084,297 A | 7/2000 | Brooks et al. | 257/698 |
| 6,084,781 A | 7/2000 | Klein | 361/771 |
| 6,088,236 A | 7/2000 | Tomura et al. | 361/783 |
| 6,103,552 A | 8/2000 | Lin | 438/113 |
| 6,103,992 A | 8/2000 | Noddin | 219/121.71 |
| 6,127,204 A | 10/2000 | Isaacs et al. | 438/106 |
| 6,159,770 A | 12/2000 | Tetaka et al. | 438/112 |

OTHER PUBLICATIONS

Kuchenmeister et al., "Film Chip Interconnection Systems Prepared By Wet Chemical Metallization," IEEE publication 0–7803–4526–6/98, Jun. 1998, 5 pages.

Ghaffarian, "Long Time BGA Assembly Reliability," Advancing Microelectronics, vol. 25, No. 6, Sep./Oct. 1998, pp. 20–23.

U.S. application Ser. No. 09/465,024, filed Dec. 16, 1999, entitled "Bumpless Flip Chip Assembly With Soldier Via".

U.S. application Ser. No. 09/464,562, filed Dec. 16, 1999, entitled "Bumpless Flip Chip Assembly With Strips And Via–Fill".

U.S. application Ser. No. 09/464,561, filed Dec. 16, 1999, entitled "Bumpless Flip Chip Assembly With Strips–In–Via And Plating".

U.S. application Ser. No. 09/120,408, filed Jul. 22, 1998, entitled "Flip Chip Assembly With Via Interconnection".

U.S. application Ser. No. 09/643,212, filed Aug. 22, 2000, entitled "Semiconductor Chip Assembly With Simultaneously Electroplated Contact Terminal and Connection Joint".

U.S. application Ser. No. 09/643,214, filed Aug. 22, 2000, entitled "Semiconductor Chip Assembly with Simultaneously Electrolessly Plated Contact Terminal and Connection Joint".

U.S. application Ser. No. 09/643,213, filed Aug. 22, 2000, entitled "Method Of Making A Support Circuit For A Semiconductor Chip Assembly".

U.S. application Ser. No. 09/643,445, filed Aug. 22, 2000, entitled "Method Of Making A Semiconductor Chip Assembly".

U.S. application Ser. No. 09/65,928, filed Sep. 20, 2000, entitled "Semiconductor Chip Assembly With Ball Bond Connection Joint".

U.S. application Ser. No. 09/665,931, filed Sep. 20, 2000, entitled "Method Of Making A Support Circuit With A Tapered Through–Hole For A Semiconductor Chip Assembly".

U.S. application Ser. No. 09/677,207, filed Oct. 2, 2000, entitled "Method of Making A Semiconductor Chip Assembly With A Conductive Trace Subtractively Formed Before And After Chip Attachment".

U.S. application Ser. No. 09/865,367, filed May 24, 2001, entitled "Semiconductor Chip Assembly With Simultaneously Electroplated Contact Terminal and Connection Joint".

U.S. application Ser. No. 09/864,555, filed May 24, 2001, entitled "Semiconductor Chip Assembly With Ball Bond Connection Joint".

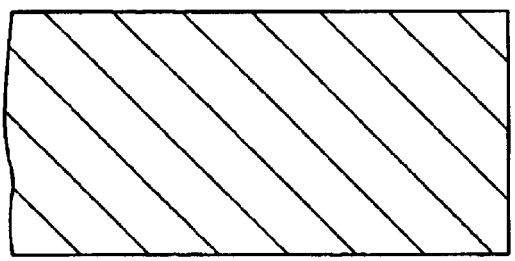
FIG. 19E
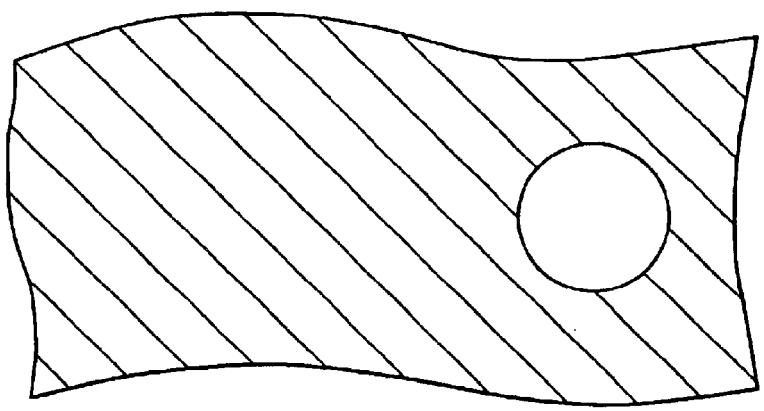
FIG. 20E
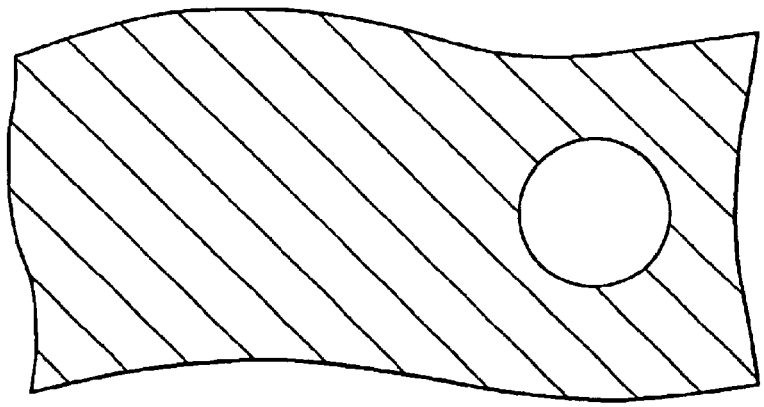
FIG. 21E

METHOD OF MAKING A CONTACT TERMINAL WITH A PLATED METAL PERIPHERAL SIDEWALL PORTION FOR A SEMICONDUCTOR CHIP ASSEMBLY

CROSS-REFERENCE TO RELATED APPLICATIONS

This application is a continuation-in-part of U.S. application Ser. No. 09/972,796 filed Oct. 6, 2001, now U.S. Pat. No. 6,667,229 which is incorporated by reference.

The '796 application is a continuation-in-part of U.S. application Ser. No. 09/962,754 filed Sep. 24, 2001, which is a continuation-in-part of U.S. application Ser. No. 09/878, 626 filed Jun. 11, 2001 now U.S. Pat. No. 6,653,217, which is a continuation-in-part of U.S. application Ser. No. 09/687, 619 filed Oct. 13, 2000 now U.S. Pat. No. 6,440, 835, each of which is incorporated by reference.

The '796 application is also a continuation-in-part of U.S. application Ser. No. 09/917,339 filed Jul. 27, 2001 now U.S. Pat. No. 6,537,851, which is a continuation-in-part of U.S. application Ser. No. 09/878,626 filed Jun. 11, 2001 now U.S. Pat. No. 6,653,217, which is a continuation-in-part of U.S. application Ser. No. 09/687,619 filed Oct. 13, 2000 now U.S. Pat. No. 6,440,835, each of which is incorporated by reference.

BACKGROUND OF THE ON INVENTION

1. Field of the Invention

The present invention relates to a semiconductor chip assembly, and more particularly to a semiconductor chip assembly with a contact terminal having a plated metal peripheral sidewall portion and methods of making such an assembly.

2. Description of the Related Art

Semiconductor chips have input/output pads that must be connected to external circuitry in order to function as part of an electronic system. The connection media is typically an array of metallic leads (e.g., a lead fame) or a support circuit (e.g., a substrate), although the connection can be made directly to a circuit panel (e.g., a mother board). Several connection techniques are widely used. These include wire bonding, tape automated bonding (TAB) and flip-chip bonding.

A semiconductor chip assembly is subsequently connected to another circuit such as a printed circuit board (PCB) or mother board during the next level assembly. Different semiconductor assemblies are connected to the next level assembly in different ways. For instance, ball grid array (BGA) packages contain an array of solder balls, and land grid array (LGA) packages contain an array of metal pads that receive corresponding solder traces on the PCB.

Semiconductor chip assemblies such as BOA packages that include solder-containing contact terminals normally require a solder reflow operation at an elevated temperature, for instance to harden previously deposited solder paste portions. Low temperature solder with a melting point below 200° C. is typically a tin-lead alloy and lead-based materials are becoming far less popular due to environmental concerns over disposing of toxic materials and leaching of toxic materials into ground water supplies. High temperature solder with a melting point between 200–300° C. can result in damage to the semiconductor chip assembly during the reflow operation. The damage includes die attach delamination, encapsulant delamination and epoxy substrate warping, and these problems are compounded when the solder is subsequently reflowed during the next level assembly.

Thermo-mechanical wear or creep of the solder joints that connect the semiconductor chip assembly to the next level assembly is a major cause of failure in most board assemblies. This is because non-uniform thermal expansion and/or contraction of different materials causes mechanical stress on the solder joints.

Thermal mismatch induced solder joint stress can be reduced by using materials having a similar coefficient of thermal expansion (CTE). However, due to large transient temperature differences between the chip and other materials during power-up of the system, the induced solder joint stress makes the assembly unreliable even when the chip and the other materials have closely matched thermal expansion coefficients.

Thermal mismatch induced solder joint stress can also be reduced by proper design of the support circuit For instance, BGA and LGA packages have been designed with pillar post type contact terminals that extend above the package and act as a stand-off or spacer between the package and the PCB in order to absorb thermal stress and reduce solder joint fatigue. The higher the aspect ratio of the pillar, the more easily the pillar can flex to follow expansion of the two ends and reduce shear stress.

Conventional approaches to forming the pillar either on a wafer or a separate support circuit include a bonded interconnect process (BIP) and plating using photoresist.

BIP forms a gold ball on a pad of the chip and a gold pin extending upwardly from the gold ball using a thermocompression wire bonder. Thereafter, the gold pin is brought in contact with a molten solder bump on a support circuit, and the solder is reflowed and cooled to form a solder joint around the gold pin. A drawback to this approach is that when the wire bonder forms the gold ball on the pad it applies substantial pressure to the pad which might destroy active circuitry beneath the pad. In addition, gold from the pin can dissolve into the solder to form a gold-tin intermetallic compound which mechanically weakens the pin and therefore reduces reliability.

U.S. Pat. No. 5,722,162 discloses fabricating a pillar by electroplating the pillar on a selected portion of an underlying metal exposed by an opening in photoresist and then stripping the photoresist. Although it is convenient to use photoresist to define the location of the pillar, electroplating the pillar in an opening in the photoresist has certain drawbacks. First, the photoresist is selectively exposed to light that initiates a reaction in regions of the photoresist that correspond to the desired pattern. Since photoresist is not fully transparent and tends to absorb the light, the thicker the photoresist, the poorer the penetration efficiency of the light. As a result, the lower portion of the photoresist might not receive adequate light to initiate or complete the intended photo-reaction. Consequently, the bottom portion of the opening in the photoresist might be too narrow, causing a pillar formed in the narrowed opening to have a diameter that decreases with decreasing height. Such a pillar has a high risk of fracturing at its lower portion in response to thermally induced stress. Furthermore, photoresist residue on the underlying metal might cause the pillar to have poor quality or even prevent the pillar from being formed. Second, if the photoresist is relatively thick (such as 100 microns or more), the photoresist may need to be applied with multiple coatings and receive multiple light exposures and bakes, which increases cost and reduces yield. Third, if the photoresist is relatively thick, the electroplated pillar may be non-uniform due to poor current density distribution in the relatively deep opening. As a result, the pillar may have a jagged or pointed top surface instead of a flat top surface that is better suited for providing a contact terminal for the next level assembly.

In view of the various development stages and limitations in currently available semiconductor chip assemblies, there is a need for a semiconductor chip assembly that is cost-effective, reliable, manufacturable, and provides excellent mechanical and electrical performance.

SUMMARY OF THE INVENTION

An object of the present invention is to provide a semiconductor chip assembly that provides a low cost, high performance, high reliability package.

Another object of the present invention is to provide a convenient, cost-effective method for manufacturing semiconductor chip assemblies as grid arrays or other structures.

In accordance with an aspect of the invention, a method of making a semiconductor chip assembly includes providing a semiconductor chip that includes a conductive pad, providing a conductive trace and a metal base, wherein the conductive trace includes a routing line and a contact terminal, the routing line is disposed outside the metal base, the contact terminal extends from the routing line through the metal base, the contact terminal includes a plated metal that contacts and extends through the metal base, the plated metal forms a peripheral sidewall portion of the contact terminal, and the plated metal surrounds a central surface area without extending into the central surface area, then mechanically attaching the chip to the conductive trace, removing a portion of the metal base that contacts the plated metal, and forming a connection joint that contacts and electrically connects the conductive trace and the pad.

The method may include mechanically attaching the chip to the conductive trace using an insulative adhesive, and then forming a through-hole through the adhesive that exposes the routing line and the pad after removing the portion of the metal base and before forming the connection joint.

The method may also include providing the conductive trace, an insulative base and the metal base, and then mechanically attaching the chip to the insulative base using the adhesive such that the metal base is disposed on a side of the insulative base that faces away from the chip and the routing line is disposed on a side of the insulative base that faces towards the chip.

The method may also include forming a via that extends through the metal base, the insulative base and the metal layer and has opposing open ends, and then depositing the contact terminal into the via.

The method may also include forming a first plating mask on the metal base and a second plating mask on the metal layer, and then forming the via through the metal base, the insulative base, the metal layer and the plating masks.

The method may also include depositing the contact terminal into the via by plating the plated metal into the via and on the metal base without plating the plated metal on the metal layer and then plating the plated metal into the via and on the metal layer.

The method may also include depositing the contact terminal into the via by plating the plated metal as a first plated metal portion on the metal base and a second plated metal portion on the metal layer without the first and second plated metal portions contacting one another, and then plating the plated metal into the via such that the first and second plated metal portions contact one another.

The method may also include depositing the contact terminal into the via by electroplating the plated metal as a firs plated metal portion on the metal base and a second plated metal portion on the metal layer without the first and second plated metal portions contacting one another, rendering the insulative base in the via catalytic to electroless plating, and then electrolessly plating the plated metal into the via as a third plated metal portion that contacts the first and second plated metal portions and the insulative base.

The method may also include depositing the contact terminal into the via by plating the plated metal into the via and on the metal base without plating the plated metal on the metal layer, and then depositing a conductive adhesive into the via and on the plated metal and the metal layer.

The method may also include depositing the contact terminal into the via by plating the plated metal as a first plated metal portion on the metal base and a second plated metal portion on the metal layer without the first and second plated metal portions contacting one another, and then depositing a conductive adhesive into the via and on the first and second plated metal portions.

The method may also include forming a photoresist layer over the metal layer, etching the metal layer using the photoresist layer as an etch mask such that an unetched portion of the metal layer forms at least a portion of the routing line, and then removing the photoresist layer.

The method may also include filling an insulator into the contact terminal that extends from the routing line through the insulative base and the metal base and contacts the plated metal after mechanically attaching the chip and before removing the portion of the metal base. Preferably, the insulator is a transfer molded encapsulant that contacts and covers a distal end of the contact terminal that faces away from the chip, and contacts the peripheral sidewall portion of the contact terminal. It is also preferred that the encapsulant contacts the chip, the insulative base and the routing line outside the via. It is also preferred that the encapsulant is compressible and permits the contact terminal to exhibit elastic deformation in response to externally applied pressure.

In accordance with another aspect of the invention, a semiconductor chip assembly includes a semiconductor chip, an insulative base, a conductive trace and a connection joint. The chip includes a conductive pad. The conductive trace that includes a routing line and a contact terminal. The routing line is disposed on a side of the insulative base that faces towards the chip, and the contact terminal extends from the routing line through the insulative base and protrudes from a side of the insulative base that faces away from the chip. The contact terminal includes a plated metal that forms a peripheral sidewall portion, and the plated metal surrounds a central surface area without extending into the central surface area. The connection joint contacts and electrically connects the routing line and the pad.

The assembly may include a conductive adhesive that extends from the routing line through the insulative base and contacts and electrically connects the plated metal and the routing line.

The assembly may also include an encapsulant that extends through the routing line, the insulative base and the contact terminal and contacts the distal end and peripheral sidewall portion of the contact terminal.

An advantage of the present invention is that the semiconductor chip assembly includes a conductive trace with an additively formed contact terminal that includes a plated metal that provides a peripheral sidewall portion of the contact terminal. The plated metal can surround a central surface area without extending into the central surface area. A compressible material such as a transfer molded encapsulant can be filled into the central surface area and extend from the routing line across the insulative base to the distal end of the contact terminal, thereby permitting the contact terminal to exhibit compliance for the next level assembly. Alternatively, a conductive adhesive can be filled into the central surface area and extend from the routing line across the insulative base to the plated metal, thereby permitting more rapid manufacture of the contact terminal since the plated metal need not extend through the insulative base. Another advantage is that the contact terminal can be solder-free. Another advantage is that the assembly can be manufactured using low temperature processes which reduces stress and improves reliability. A further advantage is that the assembly can be manufactured using well-controlled wet chemical processes which can be easily implemented by circuit board, lead frame and tape manufacturers. Still another advantage is that the assembly can be manufactured using materials that are compatible with copper chip and lead-free environmental requirements.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which:

FIGS. 25N–25Q are cross-sectional views showing a method of making a semiconductor chip assembly in accordance with a ninth embodiment of the present invention;

FIGS. 26N–26Q are top plan views corresponding to FIGS. 25N–25Q, respectively;

FIGS. 27N–27Q are bottom plan views corresponding to FIGS. 25N–25Q, respectively;

DETAILED DESCRIPTION OF THE PREFERRED EMBODIMENTS

FIGS. 1A–1P, 2A–2P and 3A–3P are cross-sectional, top and bottom views, respectively, of a method of making a semiconductor chip assembly in accordance with a first embodiment of the present invention.

Figure 1A:
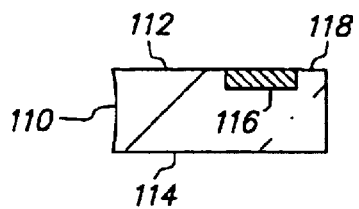
FIGS. 1A–1P are cross-sectional views showing a method of making a semiconductor chip assembly in accordance with a first embodiment of the present invention.
Figure 2A:
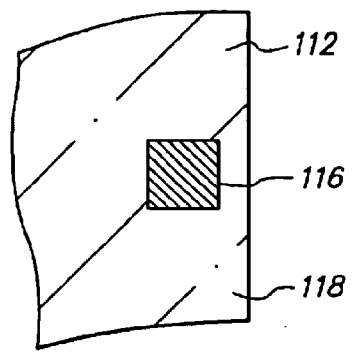
FIGS. 2A–2P are top plan views corresponding to FIGS. 1A–1P, respectively.
Figure 3A:
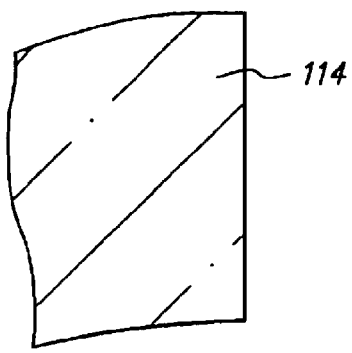
FIGS. 3A–3P are bottom plan views corresponding to FIGS. 1A–1P, respectively.

FIGS. 1A, 2A and 3A are cross-sectional, top and bottom views, respectively, of semiconductor chip 110 which is an integrated circuit in which various transistors, circuits, interconnect lines and the like are formed (not shown). Chip 110 includes opposing major surfaces 112 and 114 and has a thickness of 200 microns between these surfaces. Surface 112 includes conductive pad 116 and passivation layer 118. Pad 116 is substantially aligned with passivation layer 118 so that surface 112 is essentially flat. Alternatively, if desired, pad 116 can extend above or be recessed below passivation layer 118. Pad 116 provides a bonding site to electrically couple chip 110 with external circuitry. Thus, pad 116 can be an input/output pad or a power/ground pad. Pad 116 has a length and width of 70 microns.

Pad 116 has an aluminum base that is cleaned by dipping chip 110 in a solution containing 0.05 M phosphoric acid at room temperature for 1 minute and then rinsed in distilled water.

Chip 110 includes many other pads on sure 112, and only pad 116 is shown for convenience of illustration. In addition, chip 110 has already been singulated from other chips that it was previously attached to on a wafer.

Figure 1B:
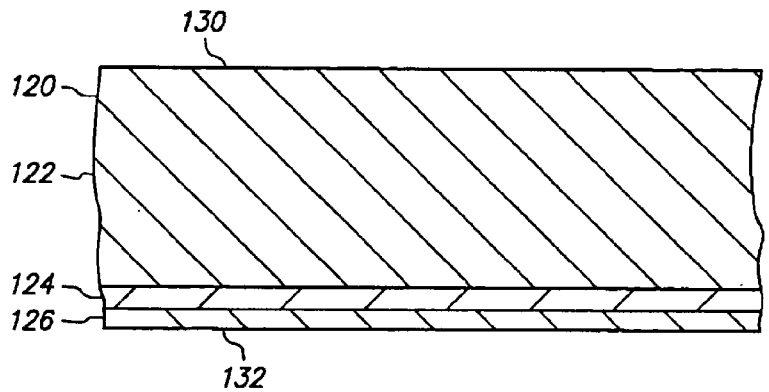
Figure 2B:
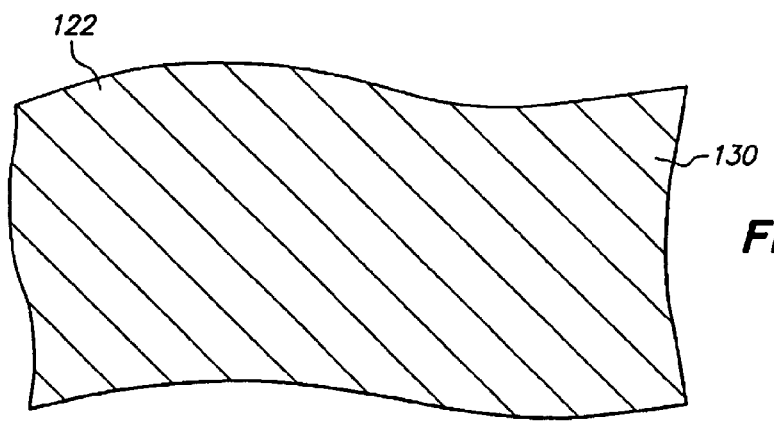
Figure 3B:
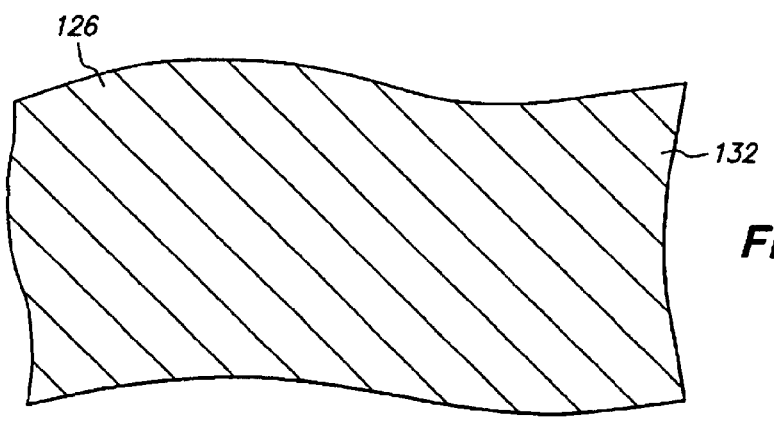

FIGS. 1B, 2B and 3B are cross-sectional, top and bottom views, respectively, of laminated structure 120 which includes metal base 122, insulative base 124 and metal layer 126. Laminated structure 120 also includes opposing major surfaces 130 and 132 at metal base 122 and metal layer 126, respectively. Thus, laminated structure 120 is a diclad laminate in which insulative base 124 adhesively attaches metal base 122 and metal layer 126, and metal base 122 and metal layer 126 are separated from one another. Metal base 122 is a copper foil with a thickness of 200 microns, insulative base 124 is a thermoplastic polyimide layer with a thickness of 15 microns, and metal layer 126 is a copper foil with a thickness of 12 microns.

Figure 1C:
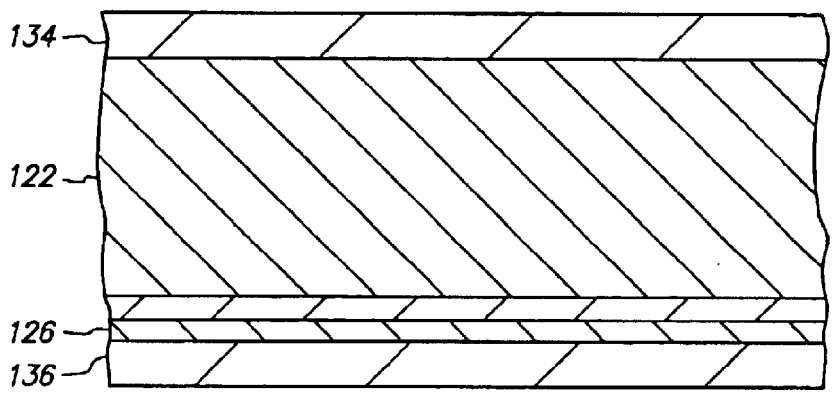
Figure 2C:
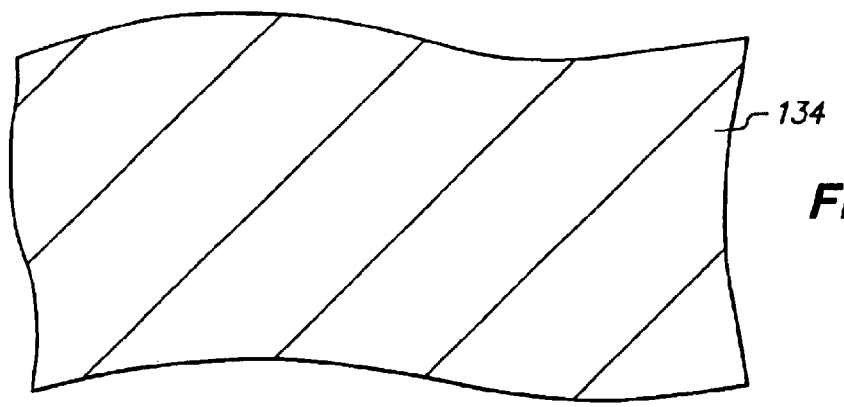
Figure 3C:
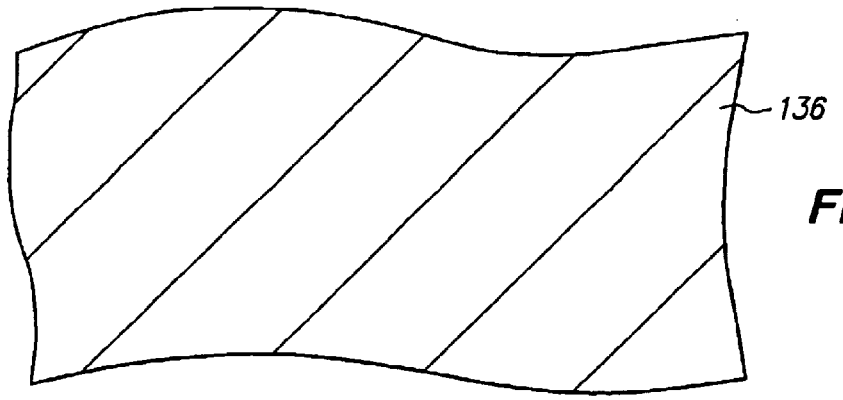

FIGS. 1C, 2C and 3C are cross-sectional, top and bottom views, respectively, of plating masks 134 and 136 formed on metal base 122 and metal layer 126, respectively. Plating masks 134 and 136 are deposited on metal base 122 and metal layer 126, respectively, as dry films of epoxy (B stage) using a dry film lamination process in which hot rolls simultaneously press the dry films onto surfaces 130 and 132, respectively. Thereafter, the dry films are cured or hardened at a relatively low temperature in the range of 100–250° C. to form plating mask 134 and 136 as solid adherent epoxy layers (C stage) with a thickness of 50 microns.

Figure 1D:
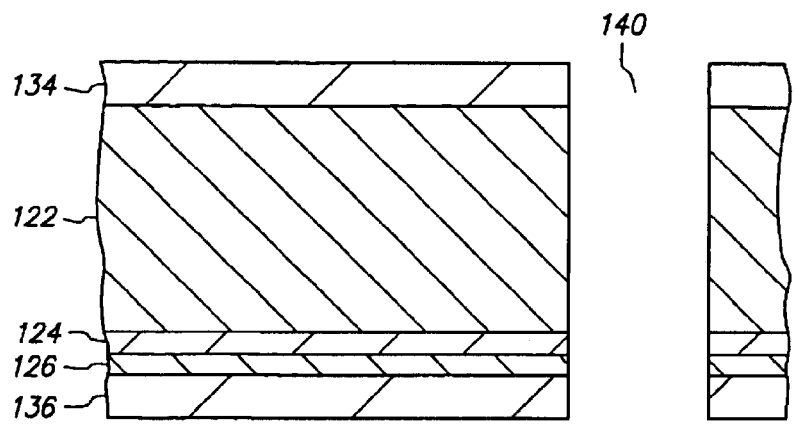
Figure 2D:
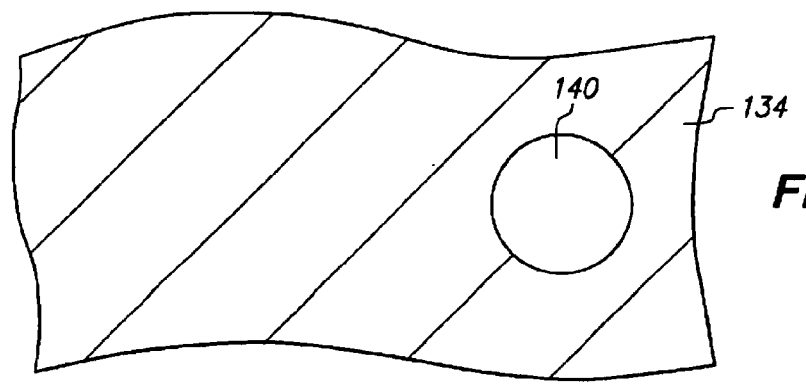
Figure 3D:
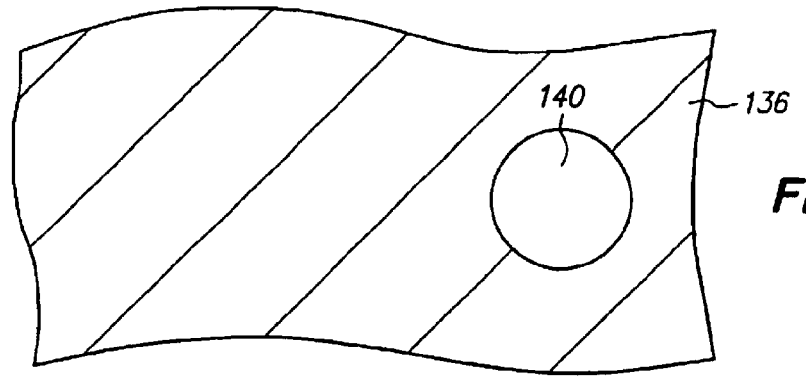

FIGS. 1D, 2D and 3D are cross-sectional, top and bottom views, respectively, of via 140 formed in laminated structure 120 and plating masks 134 and 136. Via 140 is an opening or through-via formed by mechanical drilling that extends through metal base 122, insulative base 124, metal layer 126 and plating masks 134 and 136. Thus, via 140 has opposing open ends at plating masks 134 and 136. Via 140 has a diameter of 300 microns.

Figure 1E:
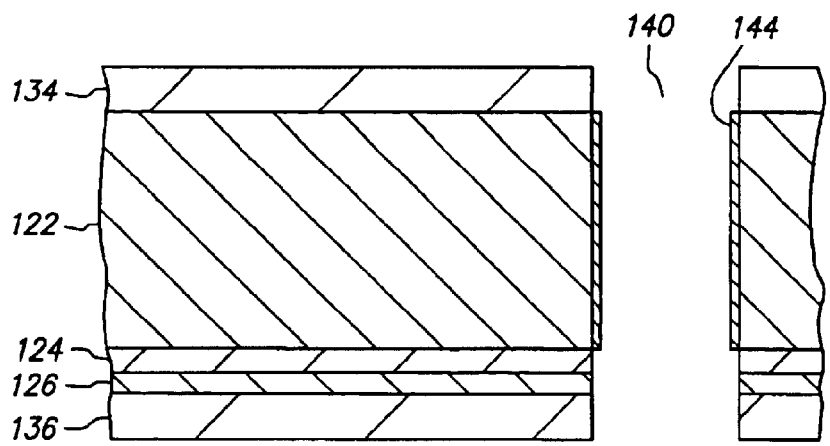
Figure 2E:
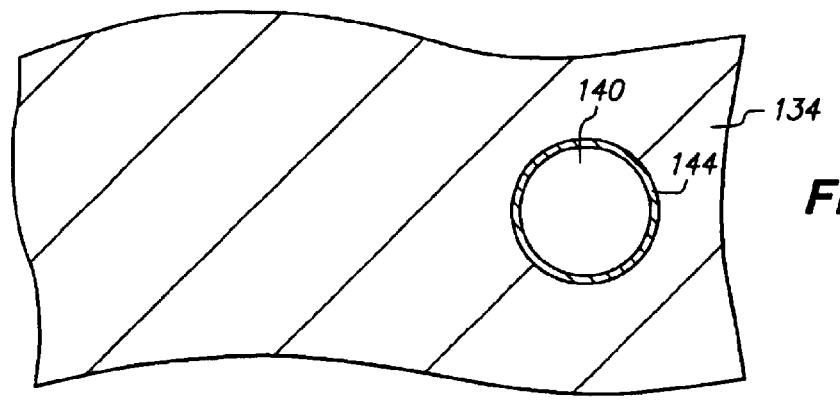
Figure 3E:
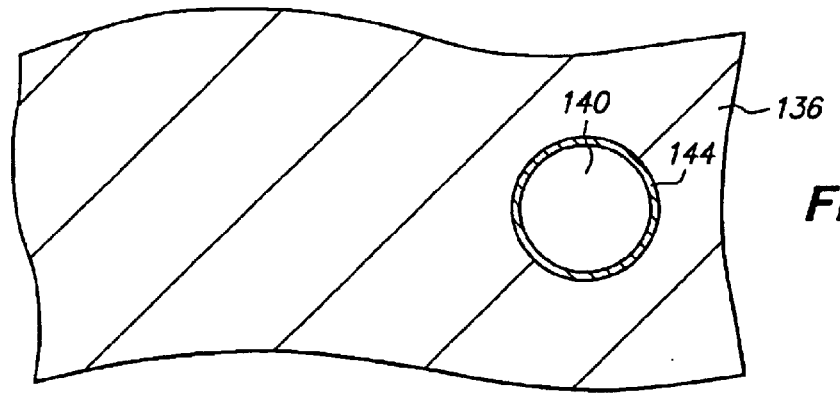

FIGS. 1E, 2E and 3E are cross-sectional, top and bottom views, respectively, of plated metal 144 formed on metal base 122 in via 140. Plated metal 144 includes a gold layer deposited on metal base 122, and a nickel layer deposited on the gold layer. The gold layer is 0.2 microns thick and the nickel layer is 1 micron thick. For convenience of illustration, the gold and nickel layers are shown as a single layer.

Plated metal 144 is formed by an electroplating operation. Thus, plated metal 144 is formed additively. Initially, metal base 122 is connected to a plating bus (not shown), current is applied to the plating bus from an external power source, and the structure is submerged in an electrolytic gold plating solution such as Technic Orotemp at room temperature to electroplate the gold layer on metal base 122. Thereafter, the structure is removed from the electrolytic gold plating solution and submerged in an electrolytic nickel plating solution such as Technic Techni Nickel "S" at room temperature while current is applied to the plating bus to electroplate the nickel layer on the gold layer.

At this initial stage, plated metal 144 is deposited on metal base 122 in via 140. However, plated metal 144 does not deposit on insulative base 124 or metal layer 126. To elaborate, insulative base 124 is an electrical insulator and therefore cannot supply current from the plating bus to generate electroplating. Metal layer 126 is not connected to the plating bus, and plated metal 144 does not extend across insulative base 124 or contact metal layer 126. Furthermore, plating mask 134 prevents metal from electroplating on surface 130 of metal base 122. However, the nickel electroplating operation is not finished.

Figure 1F:
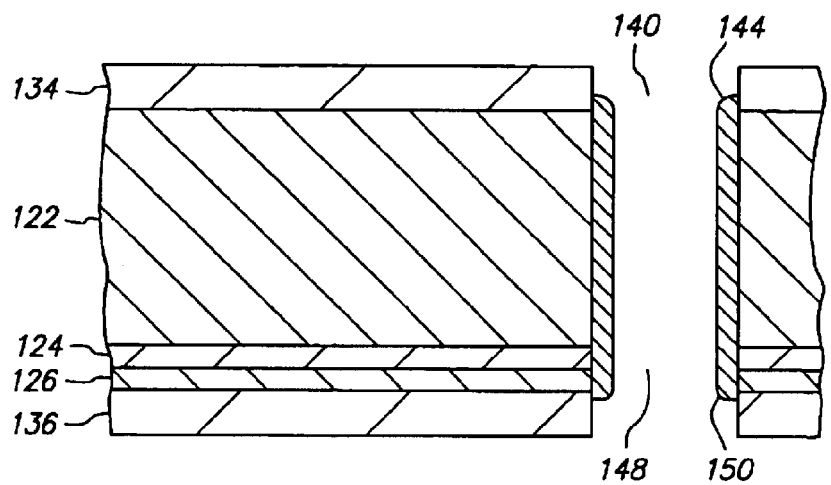
Figure 2F:
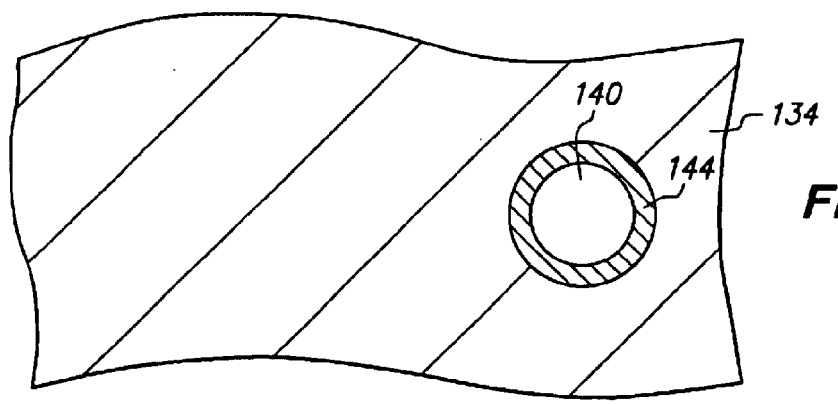
Figure 3F:
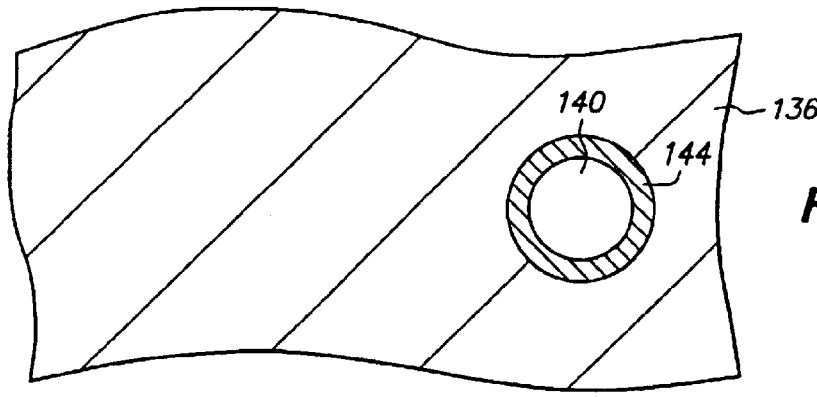

FIGS. 1F, 2F and 3F are cross-sectional, top and bottom views, respectively, of plated metal 144 formed on metal base 122 and metal layer 126 in via 140. The nickel electroplating operation continues, and as during the initial stage, metal base 122 receives current from the plating bus and the structure is submerged in the electrolytic nickel plating solution. Plated metal 144 continues to plate on metal base 122 and expand both radially and axially in via 140. At this stage, unlike the initial stage, plated metal 144 extends through insulative base 124 and contacts metal layer 126. As a result, metal layer 126 is connected to the plating bus via metal base 122 and plated metal 144, and therefore plated metal 144 begins to plate on metal layer 126 in via 140. Furthermore, plating mask 136 prevents metal from electroplating on surface 132 of metal layer 126. The nickel electroplating operation continues until plated metal 144 has a thickness of about 20 microns. Thereafter, the structure is removed from the electrolytic nickel plating solution and rinsed in distilled water to remove contaminants.

Plated metal 144 has a hollow, tube-like shape that contacts and completely covers the previously exposed sidewalls of metal base 122, insulative base 124 and metal layer 126 in via 140. Plated metal 144 extends through metal base 122, insulative base 124 and metal layer 126 in via 140 and extends into but not through plating masks 134 and 136 in via 140. Plated metal 144 includes or defines central bore 148 that includes the remaining space in via 140 between the distal ends of plated metal 144. Thus, plated metal 144 surrounds a central surface area without extending into the central surface area. That is, plated metal 144 surrounds a central surface area within central bore 148 and does not intersect any imaginary line that extends axially through the central surface area.

Plated metal 144 provides contact terminal 150. Advantageously, the nickel layer provides the primary electrical conductor and a wettable surface so that solder (not shown) can be subsequently reflowed on contact terminal 150 during the next level assembly, and the gold layer prevents the nickel layer from oxidizing and dissolves into the solder during the reflow operation.

Figure 1G:
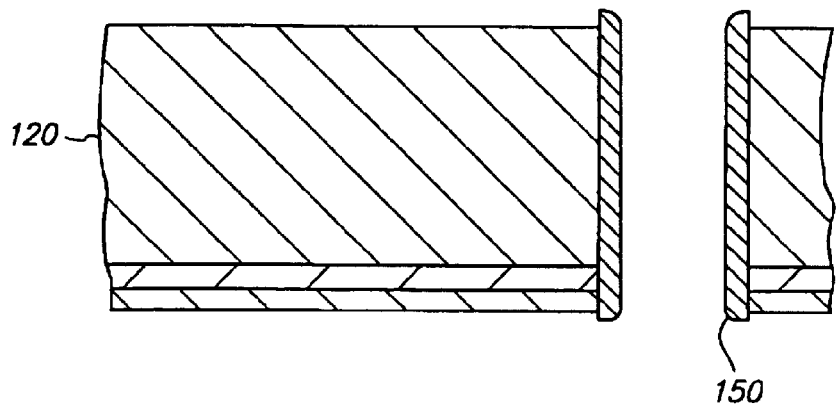
Figure 2G:
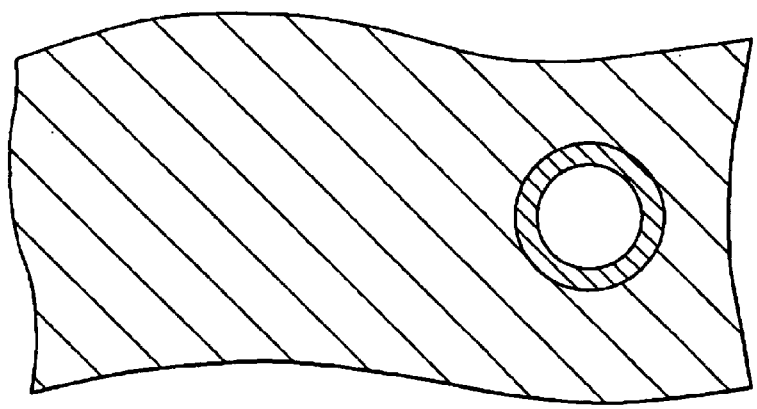
Figure 3G:
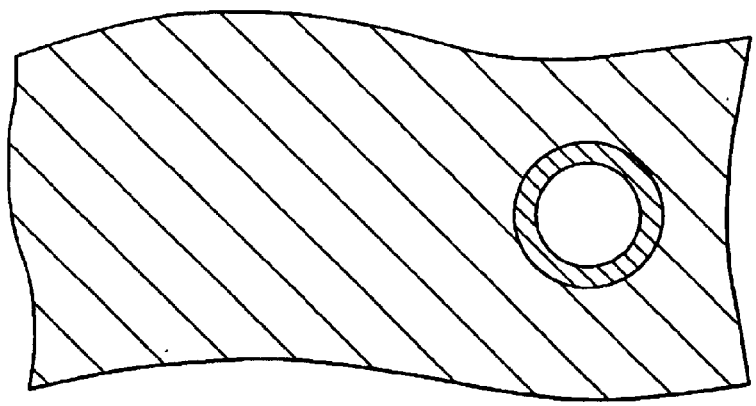

FIGS. 1G, 2G and 3G are cross-sectional, top and bottom views, respectively, of laminated structure 120 and contact terminal 150 after plating masks 134 and 136 are stripped. Plating masks 134 and 136 are removed by being peeled off since they adhere relatively weakly to the structure and do not contain isolated segments, and the peeling off process is more economical and convenient than applying a solvent Therefore, no appreciable amount of metal base 122, insulative base 124, metal layer 126 or contact terminal 150 is removed.

Figure 1H:
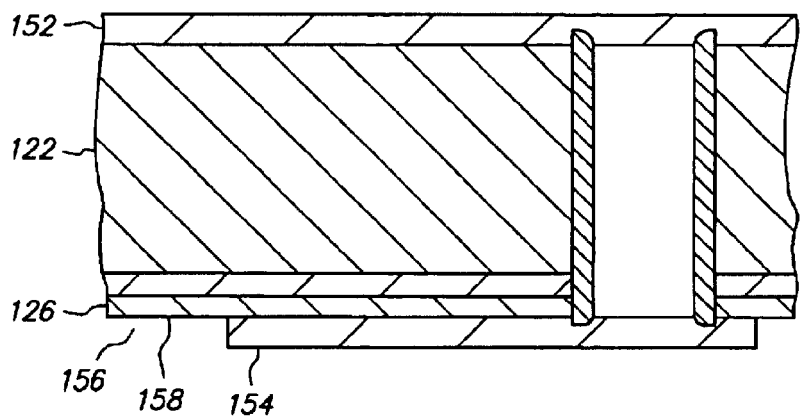
Figure 2H:
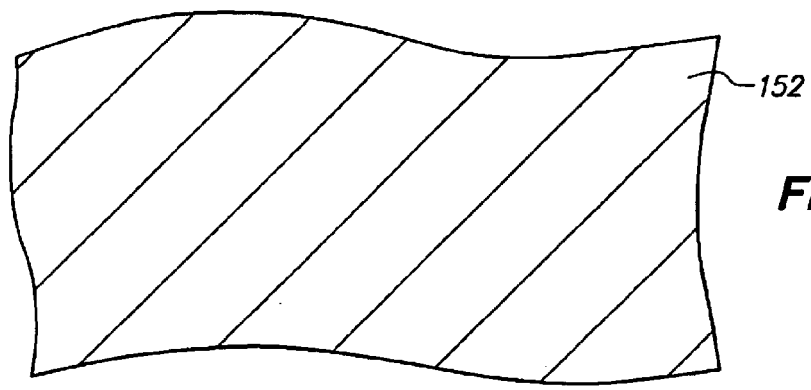
Figure 3H:
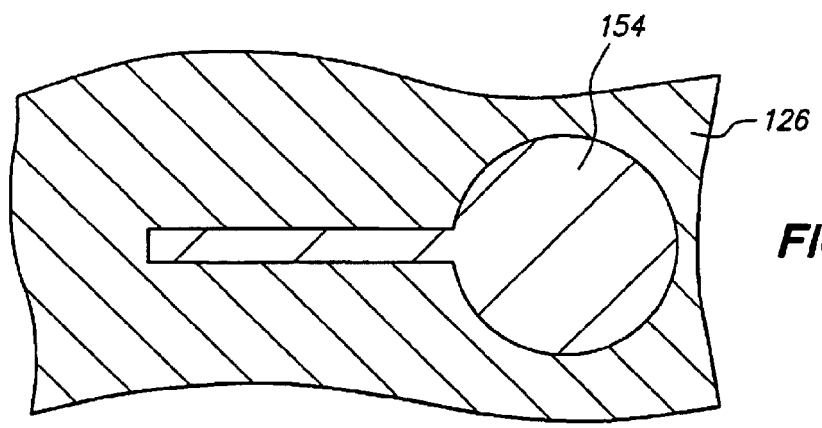

FIGS. 1H, 2H and 3H are cross-sectional, top and bottom views, respectively, of photoresist layers 152 and 154 formed on metal base 122 and metal layer 126, respectively. Photoresist layers 152 and 154 are deposited using a dry film lamination process in which hot rolls simultaneously press photoresist layers 152 and 154 onto the respective surfaces. A reticle (not shown) is positioned proximate to photoresist layer 154 using via 140 as a registration point so that the reticle is precisely located relative to via 140. Thereafter, photoresist layer 154 is patterned by selectively applying light through the reticle, applying a developer solution to remove the photoresist portions rendered soluble by the light, and then hard baking, as is conventional. As a result, photoresist layer 154 contains opening 156 that selectively exposes portion 158 of metal layer 126, and photoresist layer 152 remains unpatterned. Photoresist layers 152 and 154 each have a thickness of 25 microns.

Figure 1I:
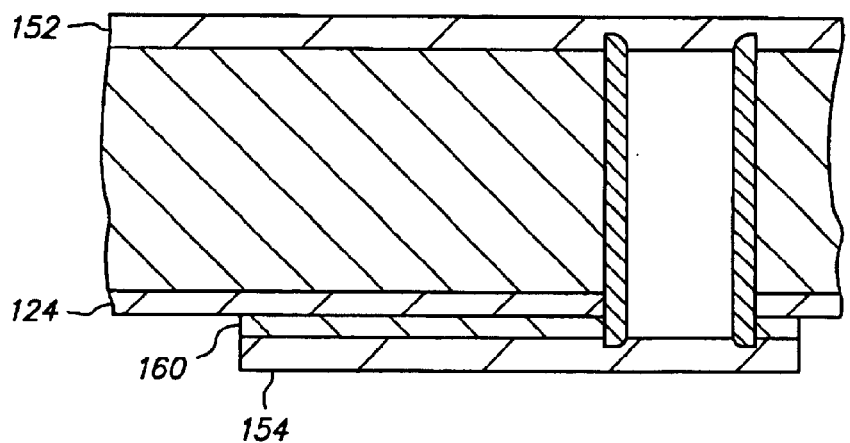
Figure 2I:
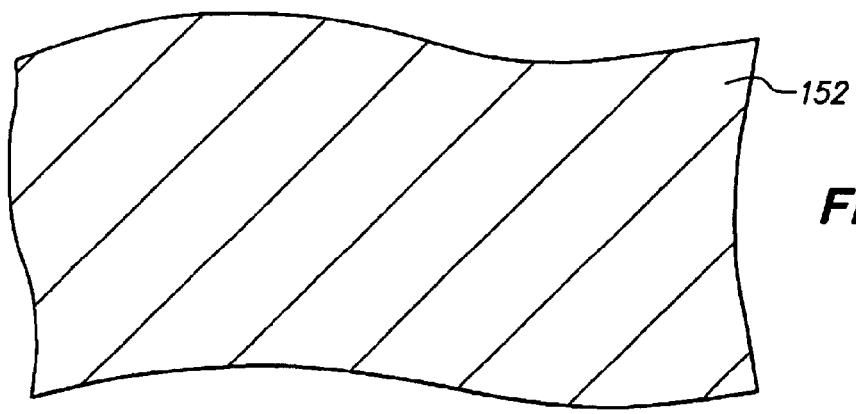
Figure 3I:
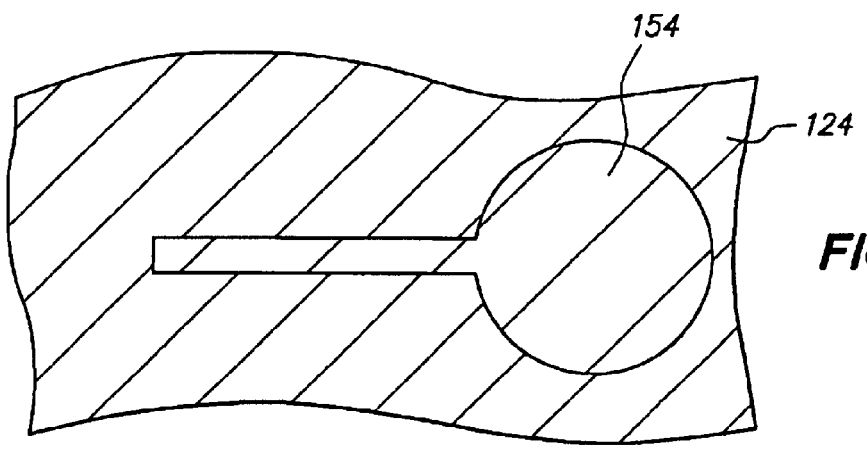

FIGS. 1I, 2I and 3I are cross-sectional, top and bottom views, respectively, of routing line 160 formed in metal layer 126. Routing line 160 is formed by applying a wet chemical etch to metal layer 126 using photoresist layer 154 as an etch mask. The wet chemical etch etches completely through metal layer 126, thereby effecting a pattern transfer of photoresist layer 154 onto metal layer 126. The wet chemical etch is highly selective of copper with respect to polyimide, and therefore, after the wet chemical etch etches through portion 158 of metal layer 126 and contacts insulative base 124, no appreciable amount of insulative base 124 is removed. Thus, routing line 160 is formed subtractively and constitutes a remaining or unetched portion of metal layer 126 after the wet chemical etch is applied. Furthermore, photoresist layers 152 and 154 prevent the wet chemical etch from entering via 140.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing the structure to the wet chemical etch in order to form routing line 160 with a negligible undercut can be established through trial and error.

Figure 1J:
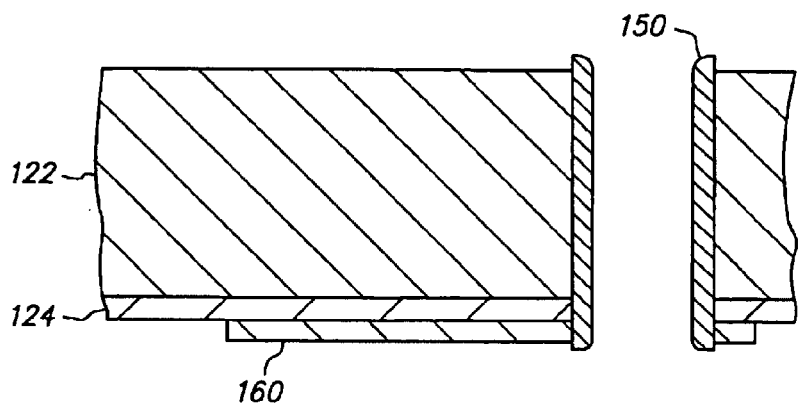
Figure 2J:
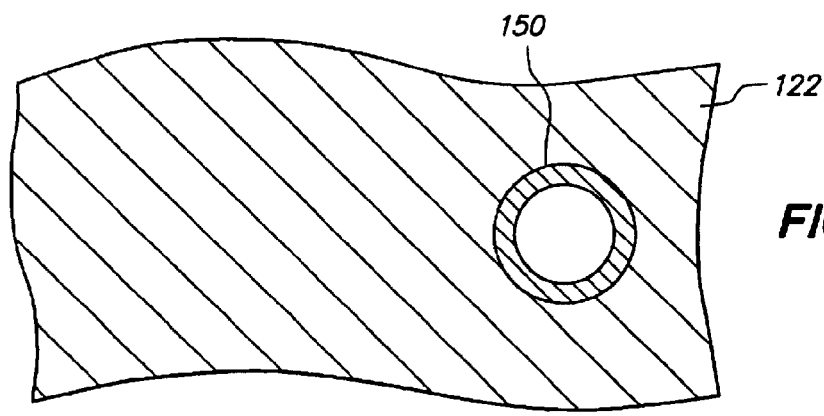
Figure 3J:
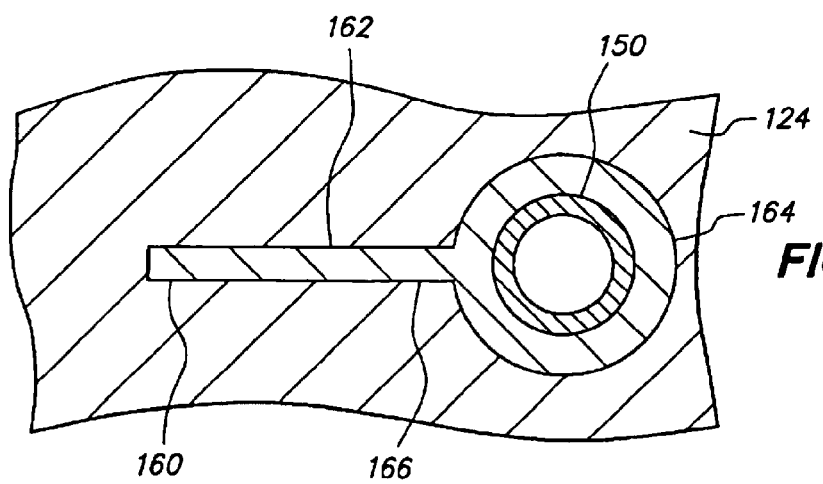

FIGS. 1J, 2J and 3J are cross-sectional, top and bottom views, respectively, of the structure after photoresist layers 152 and 154 are stripped. Photoresist layers 152 and 154 are removed using a solvent, such as a mild alkaline solution with a pH of 9, that is highly selective of photoresist with respect to copper, nickel, gold and polyimide. Therefore, no appreciable amount of metal base 122, insulative base 124, contact terminal 150 or routing line 160 is removed. Furthermore, central bore 148 becomes exposed.

Routing line 160 includes an elongated routing region 162 with a width (orthogonal to its elongated length) of 30 microns, and an enlarged circular region 164 with a diameter of 500 microns. Contact terminal 150 is axially centered within enlarged circular region 164. Thus, contact terminal 150 has peripheral sidewalls that are laterally spaced from the outer edges of enlarged circular region 164 by 100 microns ((500–300)/2).

The combination of contact terminal 150 and routing line 160 provides conductive trace 166 that is adapted for providing horizontal and vertical routing between pad 116 and a terminal on a printed circuit board (not shown) in a next level assembly.

Figure 1K:
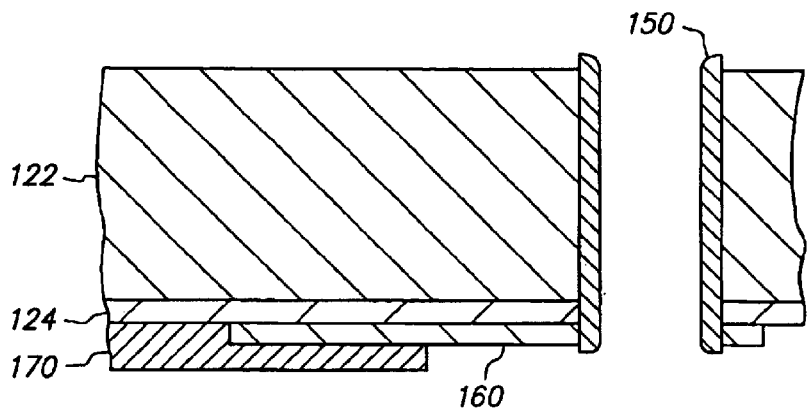
Figure 2K:
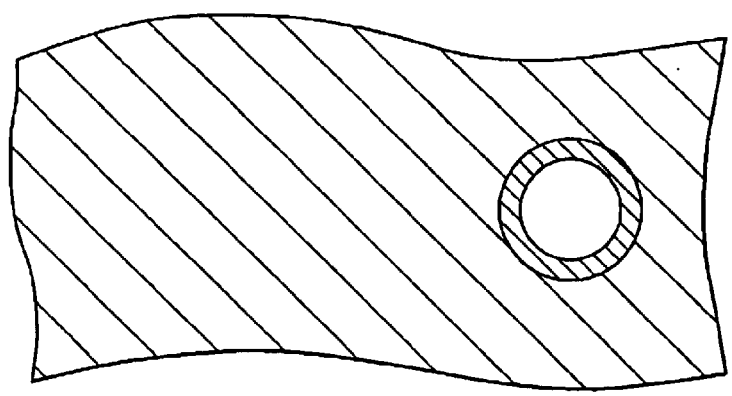
Figure 3K:
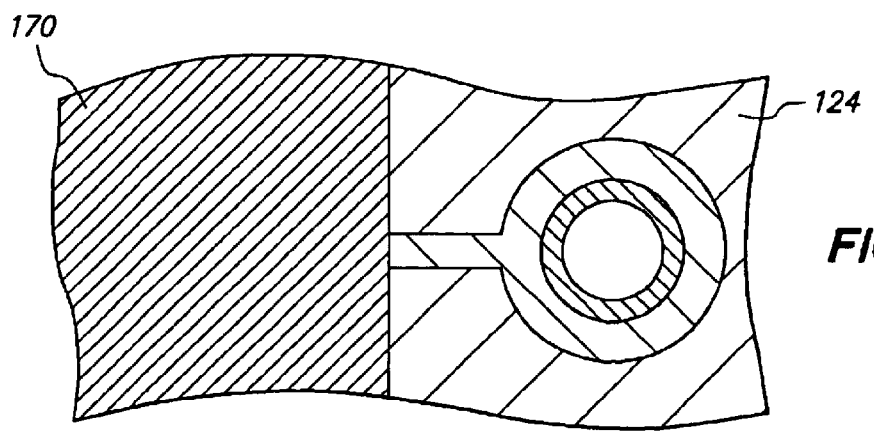

FIGS. 1K, 2K and 3K are cross-sectional, top and bottom views, respectively, of adhesive 170 formed on insulative base 124 and routing line 160. Adhesive 170 may include an organic surface protectant such as HK 2000 which is promptly applied to the structure after the photoresist layers are stripped to reduce native oxide formation on the exposed copper surfaces. The use of organic surface protectant layers in insulative adhesives for semiconductor chip assemblies is well-known in the art. Thereafter, a liquid resin (A stage) such as polyarnic acid is applied over a predetermined portion of the structure using stencil printing. The liquid resin flows over insulative base 124 and routing line 160. Adhesive 170 has a thickness of 30 microns as measured from insulative base 124 outside routing line 160. However, adhesive 170 does not contact metal base 122 or contact terminal 150.

For convenience of illustration, adhesive 170 is shown below insulative base 124 to retain a single orientation throughout the figures for ease of comparison between the figures, although in this step the structure would be inverted so that gravitational force would assist the liquid resin flow.

Figure 1L:
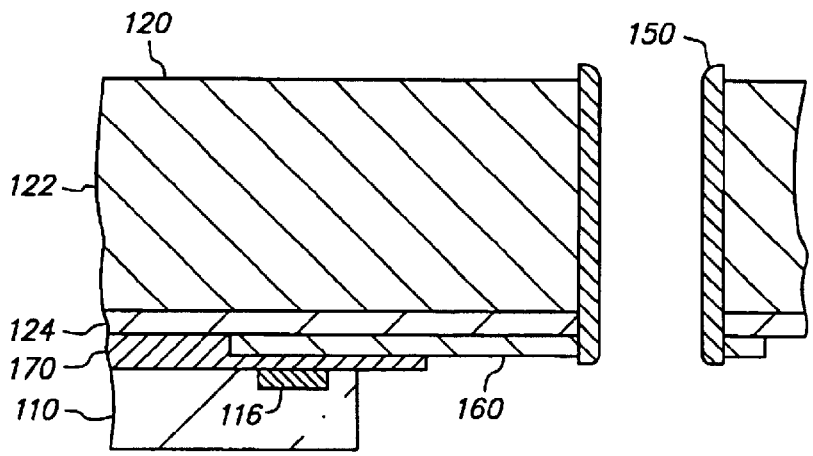
Figure 2L:
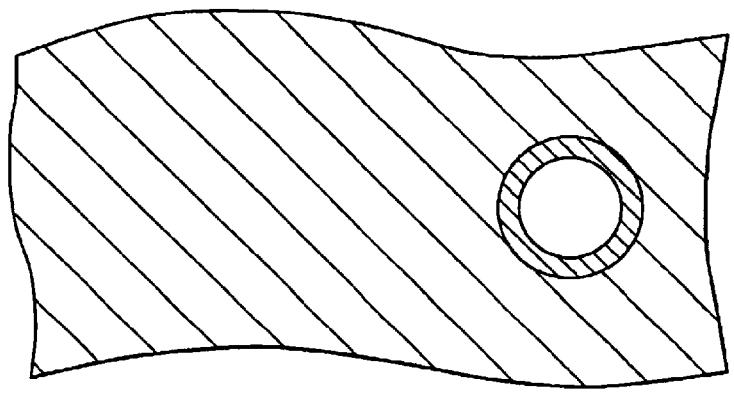
Figure 3L:
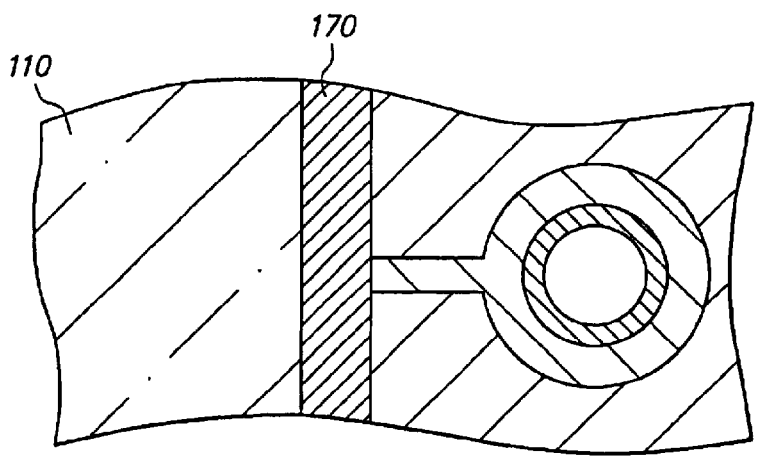

FIGS. 1L, 2L and 3L are cross-sectional top and bottom views, respectively, of chip 110 mechanically attached to laminated structure 120 by adhesive 170. Adhesive 170 is disposed between and contacts chip 110 and insulative base 124, and likewise, adhesive 170 is disposed between and contacts chip 110 and routing line 160. Thus, chip 110 and insulative base 124 do not contact one another, and chip 110 and routing line 160 do not contact one another. Surface 112 of chip 110 faces towards insulative base 124 and is embedded in adhesive 170, and surface 114 of chip 10 faces away from insulative base 124 and is exposed.

Chip 110 and laminated structure 120 are positioned relative to one another so that chip 110 is disposed within the surface area of adhesive 170, routing line 160 is disposed above and overlaps and is electrically isolated from pad 116, routing line 160 extends within and outside the periphery of chip 110, and contact terminal 150 is disposed outside the periphery of chip 110. Chip 110 and laminated structure 120 can be aligned using an automated pattern recognition system. Adhesive 170 is sandwiched between chip 110 and laminated structure 120 using relatively low pressure. Thereafter, adhesive 170 is heated and fully cured (C stage) at relatively low temperature in the range of 200 to 250° C. to form a solid adhesive electrically insulative thermosetting polyimide layer that mechanically fastens chip 110 to laminated structure 120. Adhesive 170 is 3 microns thick between pad 116 and routing line 160.

At this stage, insulative base 124 is covered from above by metal base 122, routing line 160 is covered from above by insulative base 124, the portion of routing line 160 within and slightly outside the periphery of chip 110 is covered from below by adhesive 170, the portion of conductive trace 166 more than slightly outside the periphery of chip 110 is not covered from below, contact terminal 150 is not covered from above or below, pad 116 is covered from above by adhesive 176, and pad 116 is separated from routing line 160 by the thickness of adhesive 170.

Figure 1M:
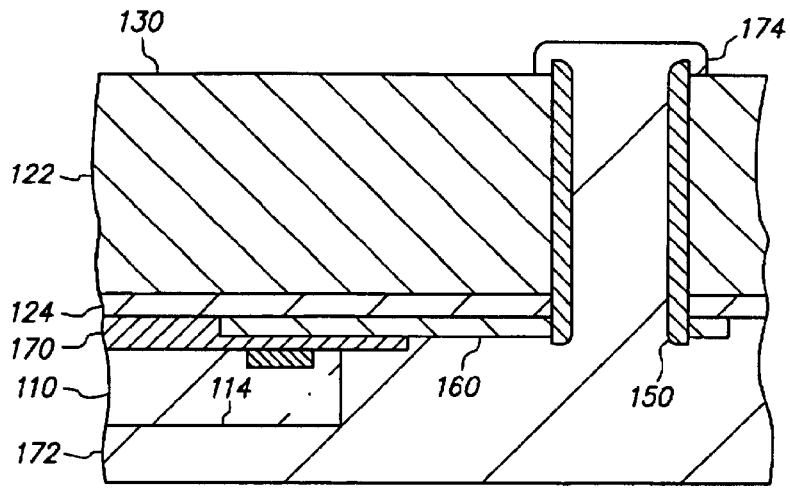
Figure 2M:
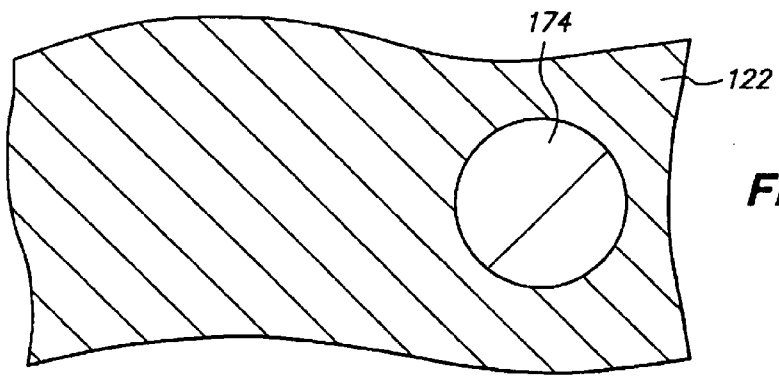
Figure 3M:
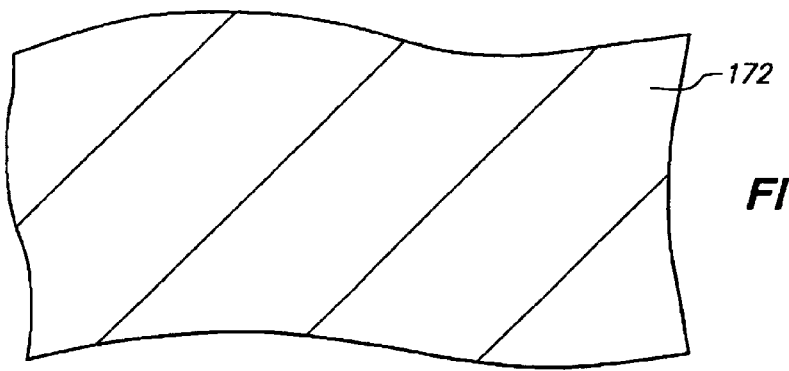

FIGS. 1M, 2M and 3M are cross-sectional, top and bottom views, respectively, of encapsulant 172 formed on chip 110, metal base 122, insulative base 124, contact terminal 150, routing line 160 and adhesive 170 by transfer molding.

Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

The preferred transfer molding system includes a preheater, a mold, a press and a cure oven. The mold includes an upper mold section and a lower mold section, also called "platens" or "halves" which define the mold cavities. The mold also includes the transfer pot, runners, gates and vents. The transfer pot holds the molding compound. The runners and gates provide channels from the transfer pot to the cavities. The gates are placed near the entrances of the cavities and are constricted to control the flow and injection velocity of the molding compound into the cavities and to facilitate removal of the solidified molding compound after molding occurs. The vents allow tapped air to escape but are small enough to permit only a negligible amount of the molding compound to pass through them.

The molding compound is initially in tablet form. The preheater applies high-frequency energy to preheat the molding compound to a temperature in the range of 50 to 100° C. The preheated temperature is below the transfer temperature and therefore the preheated molding compound is not in a fluid state. In addition, chip 110 is placed in one of the mold cavities, and the press operates hydraulically to close the mold and seal the mold cavities by clamping together the upper and lower mold sections. Guide pins ensure proper mating of the upper and lower mold sections at the parting line. In addition, the mold is heated to a transfer temperature in the range of 150 to 250° C. by inserting electric heating cartridges in the upper and lower mold sections.

After closing the mold, the preheated molding compound in tablet form is placed in the transfer pot. Thereafter, a transfer plunger applies pressure to the molding compound in the transfer pot. The pressure is in the range of 10 to 100 kgf/cm² and preferably is set as high as possible without introducing reliability problems. The combination of heat from the mold and pressure from the transfer plunger converts the molding compound in the transfer pot into a fluid state. Furthermore, the pressure from the transfer plunger forces the fluid molding compound through the runners and the gates into the mold cavities. The pressure is maintained for a certain optimum time to ensure that the molding compound fills the cavities.

The upper mold section contacts and makes sealing engagement with and is generally flush with surface 130 of metal base 122. However, the upper mold section contains a recess that is aligned with via 140, and contact terminal 150 protrudes from metal base 122 into the recess without contacting the upper mold section. The recess is large enough to prevent the upper mold section from striking contact terminal 150 despite minor registration and alignment inaccuracies. Thus, the upper mold section remains spaced from contact terminal 150 to assure that it does not dislodge or damage contact terminal 150, and the upper mold section and metal base 122 form a sealed chamber at the recess. The lower mold section contacts and makes sealing engagement with insulative base 124 outside the peripheries of chip 110 and conductive trace 166. Thus, the lower mold section is shaped to allow the molding compound to cover the entire lower surface of the chip 110 and flow through central bore 148 into the recess. As a result, the molding compound contacts the exposed portions of the chip 110, insulative base 124, contact terminal 150, routing line 160 and adhesive 170 in the cavity. In addition, the molding compound fills central bore 148 and the recess in the upper mold section. After 1 to 3 minutes at the transfer temperature, the molding compound polymerizes and is partially cured in the mold.

Once the partially cured molding compound is resilient and hard enough to withstand ejection forces without significant permanent deformation, the press opens the mold, ejector pins remove the molded structures from the mold, and excess molding compound attached to the molded structures that solidified in the runners and the gates is trimmed and removed The molded structures are then loaded into magazines and postcured in the curing oven for 4 to 16 hours at a temperature somewhat lower than the transfer temperature but well above room temperature to completely cure the molding compound.

The molding compound is a multi-component mixture of an encapsulating resin with various additives. The principal additives include curing agents (or hardeners), accelerators, inert fillers, coupling agents, flame retardants, stress-relief agents, coloring agents and mold-release agents. The encapsulating resin provides a binder, the curing agent provides linear/cross-polymerization, the accelerator enhances the polymerization rate, the inert filler increases thermal conductivity and thermal shock resistance and reduces the thermal coefficient of expansion, resin bleed, shrinkage and residual stress, the coupling agent enhances adhesion to the wafer, the flame retardant reduces flammability, the stress-relief agent reduces crack propagation, the coloring agent reduces photonic activity and device visibility, and the mold-release agent facilitates removal from the mold.

Encapsulant 172 contacts surface 114 of chip 110, the outer edges of chip 110, and surfaces of insulative base 124, routing line 160 and adhesive 170 that face towards and are outside the periphery of chip 110. Encapsulant 172 fills central bore 148. Encapsulant 172 also includes tip 174 that contacts and covers the distal end portion of contact terminal 150 that protrudes from surface 130 of metal base 122, and contacts and covers a circular portion of surface 130 of metal base 122 that surrounds and is adjacent to contact terminal 150.

Encapsulant 172 is a solid adherent compressible protective single-piece layer that provides back-side environmental protection such as moisture resistance and particle protection for chip 110 as well as mechanical support for insulative base 124, contact terminal 150 and routing line 160 outside the periphery of chip 110. Encapsulant 172 is 100 microns thick beyond surface 114. Tip 174 has a diameter of 400 microns and a height (beyond metal base 122) of 50 microns, and contact terminal 150 (with a diameter of 300 microns) is centered within and axially aligned with tip 174. Thus, tip 174 has peripheral sidewalls that are laterally spaced from the peripheral sidewalls of contact terminal 150 by 50 microns ((400–300)/2).

Figure 1N:
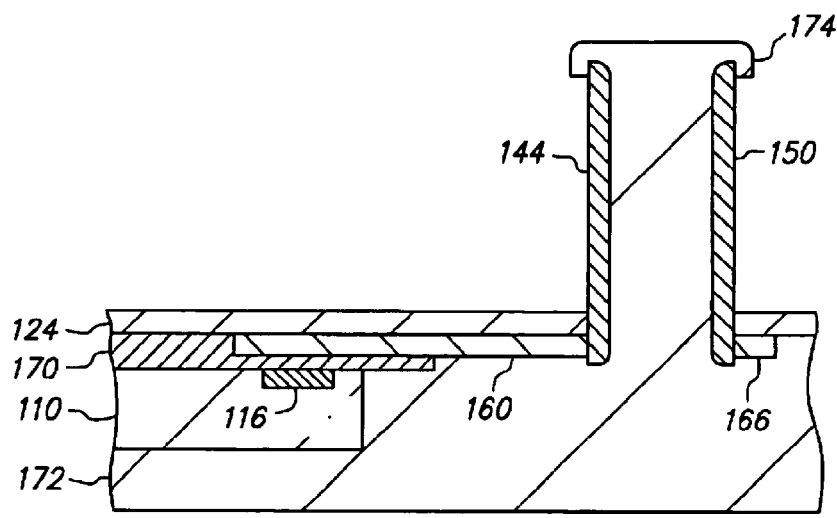
Figure 2N:
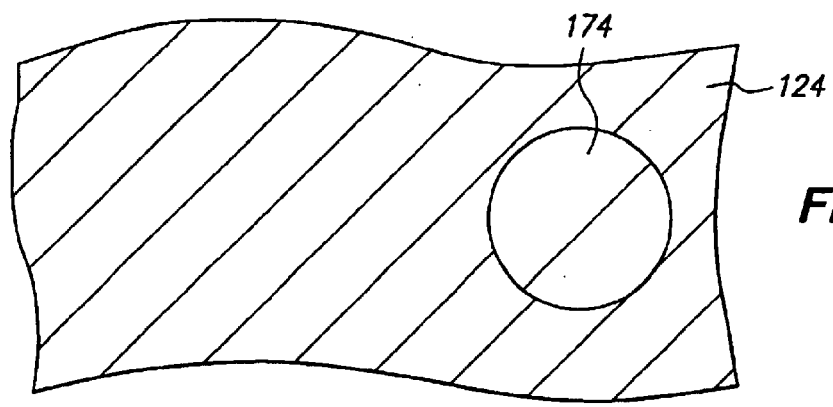
Figure 3N:
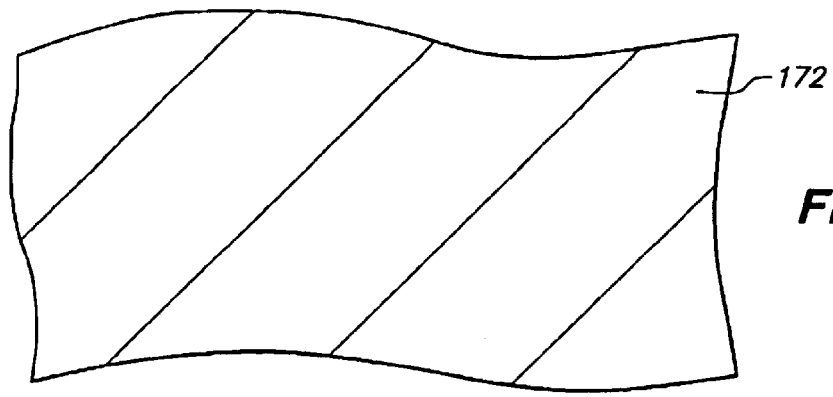

FIGS. 1N, 2N and 3N are cross-sectional, top and bottom views, respectively, of the structure after metal base 122 is removed by wet chemical etching. The wet chemical etch can be sprayed on metal base 122, or the structure can be dipped in the wet chemical etch since chip 110 and routing line 160 are protected by insulative base 124 and encapsulant 172. A suitable wet chemical etch can be provided by the same solution used for etching metal layer 126 to form routing line 160. The wet chemical etch is highly selective of copper with respect to gold, polyimide and the molding compound. Therefore, no appreciable amount of insulative base 124, contact terminal 150 or encapsulant 172 is removed. The optimal etch time for exposing the structure to the wet chemical etch in order to completely remove metal base 122 without excessively exposing the gold surface layer of contact terminal 150 to the wet chemical etch can be established through trial and error.

Advantageously, since the wet chemical etch is not selective of insulative base 124, the gold surface layer of contact terminal 150 or encapsulant 172, there is a wide window of acceptable etch times and little or no endpoint concern Another advantage is that insulative base 124 and encapsulant 172 provide mechanical support for contact terminal 150, and therefore reduce the mechanical strain on adhesive 170. A further advantage is that contact terminal 150 extends from but does not overlap metal base 122, and therefore does not provide an etch mask for metal base 122. Likewise, tip 174 of encapsulant 172 has a smaller lateral extension (50 microns) over metal base 122 than the thickness (200 microns) of metal base 122, and therefore the wet chemical etch which is isotropic in nature laterally undercuts and removes the portion of metal base 122 that underlies tip 174 and contacts contact terminal 150. A still further advantage is that insulative base 124 protects conductive trace 166 from chemical and mechanical damage by the wet chemical etch and subsequent cleaning steps (such as rinsing in distilled water and air blowing). For instance, insulative base 124 protects routing line 160 from chemical attack by the wet chemical etch, protects routing line 160 from the physical force of the wet chemical etch and cleaning steps that might otherwise cause routing line 160 to separate from adhesive 170, and protects the lower portion of contact terminal 150 from the physical force of the wet chemical etch and cleaning steps that might otherwise cause contact terminal 150 to separate from routing line 160. Accordingly, insulative base 124 improves the structural integrity and allows the wet chemical etch and subsequent cleaning steps to be applied more vigorously, thereby improving manufacturing throughput.

At this stage, adhesive 170 continues to cover pad 116, insulative base 124 and encapsulant 172 provide enhanced mechanical support for conductive trace 166, and encapsulant 172 provides protection for chip 110. The enhanced mechanical strength is particularly useful after metal base 122 is removed. Plated metal 144 provides an exposed peripheral sidewall portion of contact terminal 150. Encapsulant 172 wraps around and interlocks the distal end of contact terminal 150. Furthermore, the compressibility of encapsulant 172 permits contact terminal 150 to be compressible and compliant. That is, contact terminal 150 exhibits elastic deformation in response to external pressure. As a result, contact terminal 150 provides excellent compliance for the next level assembly.

Figure 1O:
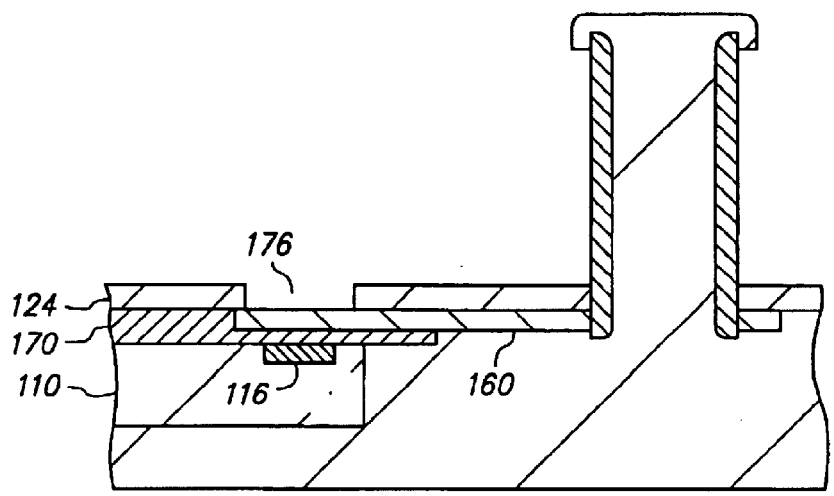
Figure 2O:
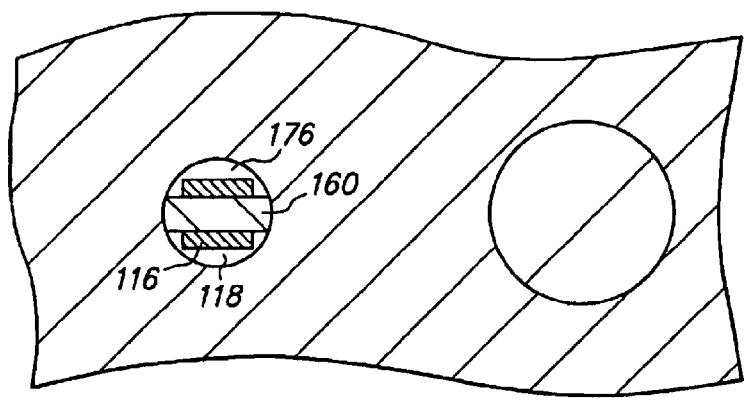
Figure 3O:
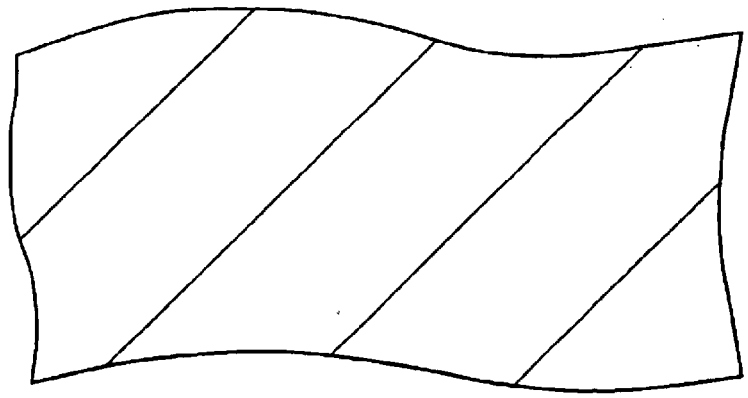

FIGS. 1O, 2O and 3O are cross-sectional, top and bottom views, respectively, of the structure after portions of insulative base 124 and adhesive 170 are selectively removed to form through-hole 176 in insulative base 124 and adhesive 170 that exposes pad 116 and routing line 160. Through-hole 176 is formed by applying a suitable etch that is highly selective of insulative base 124 and adhesive 170 with respect to pad 116 and routing line 160.

In this instance, a plasma etch is applied. A metal mask (not shown) is positioned above insulative base 124 such that an opening in the metal mask is aligned with pad 116, and a plasma (reactive ion etch) is directed to the side of the metal mask opposite the structure. A suitable plasma is a fluorinated plasma such as $CF_4/O_2$ or $SF_6/O_2$. The metal mask targets the plasma at pad 116. The plasma removes portions of insulative base 124 above routing line 160 and removes portions of insulative base 124 and adhesive 170 above pad 116 and outside routing line 160. Through-hole 176 has a diameter of 100 microns, and pad 116 (with a length and width of 70 microns) is centered within and axially aligned with through-hole 176. Routing line 160 shields the underlying adhesive 170 from the plasma so that a portion of adhesive 170 sandwiched between routing line 160 and pad 116 remains intact. Through-hole 176 is formed in insulative base 124 and adhesive 170 without damaging pad 116, passivation layer 118 or routing line 160. Thus, through-hole 176 extends through insulative base 124 and adhesive 170, but does not extend into chip 110.

Figure 1P:
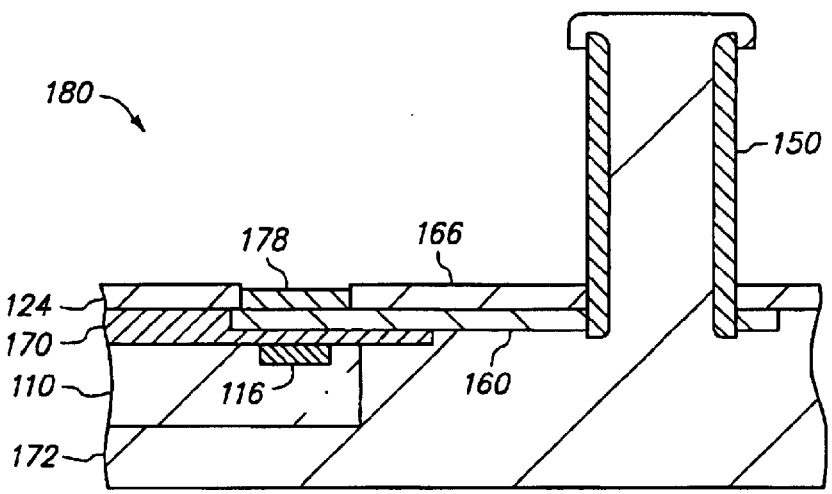
Figure 2P:
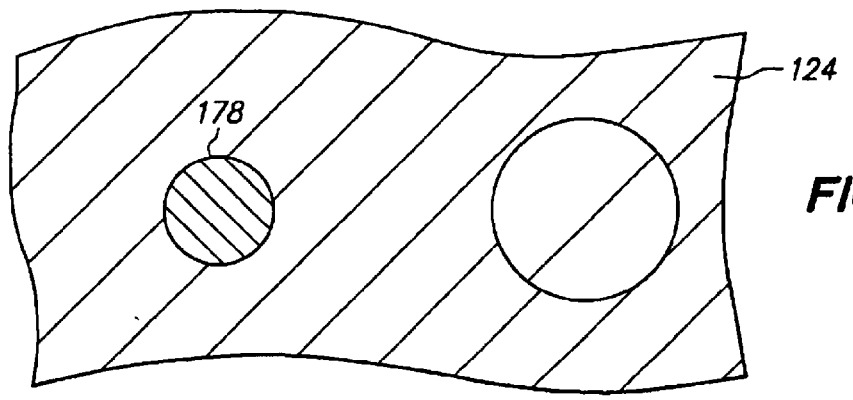
Figure 3P:
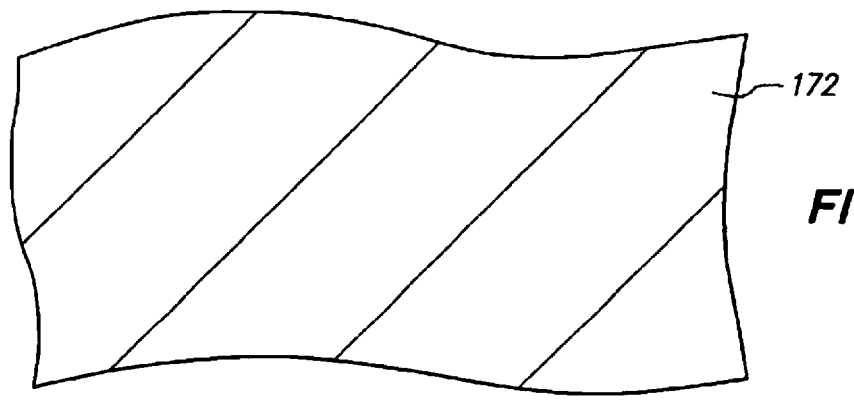

FIGS. 1P, 2P and 3P are cross-sectional top and bottom views, respectively, of connection joint 178 formed on pad 116 and routing line 160. Connection joint 178 is a conductive adhesive. Connection joint 178 is formed by depositing a non-solidified conductive adhesive and then applying energy to cure the conductive adhesive and form a hardened conductive adhesive joint. Suitable conductive adhesives include a polymer binder (or matrix) and a filler metal powder. Isotropic conductive adhesives in which the electrical conductivity is identical along the three coordinate axes are generally preferred. For instance, conductive epoxy paste that includes an epoxy binder and silver flakes is deposited into through-hole 176 and onto pad 116 and routing line 160 by screen printing. The conductive epoxy paste is then cured by applying UV light.

Connection joint 178 is formed in through-hole 176 and contacts and electrically connects pad 116 and routing line 160. Connection joint 178 contacts and covers portions of pad 116 beneath through-hole 176 and outside routing line 160, the surface of routing line 160 that overlaps and faces away from pad 116, and the outer edges (or peripheral sidewalls) of routing line 160 that overlap and are orthogonal to pad 116. Thus, connection joint 178 provides a robust, permanent electrical connection between pad 116 and routing line 160.

Connection joint 178 is the only electrical conductor external to chip 110 that contacts pad 116, adhesive 170 and connection joint 178 are the only materials external to chip 110 that contact pad 116, adhesive 170 and connection joint 178 are the only materials that contact both pad 116 and routing line 160, and contact terminal 150 is the only electrical conductor that is electrically connected to pad 116 and extends to the side of insulative base 124 opposite chip 110.

At this stage, the manufacture of semiconductor chip assembly 180 that includes chip 110, insulative base 124, conductive trace 166, adhesive 170, encapsulant 172 and connection joint 178 can be considered complete. Conductive trace 166 is mechanically coupled to chip 110 by adhesive 170, and is electrically coupled to chip 110 by connection joint 178. Conductive trace 166 extends beyond an outer edge of chip 110 and provides horizontal fan-out routing (via routing line 160) and vertical routing (via contact terminal 150) between pad 116 and external circuitry. Insulative base 124 and encapsulant 172 provide mechanical support and environmental protection for the assembly. Moreover, insulative base 124 protects routing line 160 from unwanted solder reflow during the next level assembly.

Semiconductor chip assembly 180 includes other conductive traces embedded in insulative base 124 and adhesive 170, and only a single conductive trace 166 is shown for convenience of illustration. The conductive traces are each connected to a respective pad on chip 110 by a respective connection joint. Furthermore, the conductive traces each extend horizontally from their respective pads and contain a contact terminal at a distal end outside the periphery of chip 110 to provide horizontal fan-out routing and vertical routing for their respective pads. The contact terminals are the only electrical conductors that extend to the surface of insulative base 124 that faces away from chip 110. Thus, all horizontal routing for the pads that is external to chip 110 occurs at the routing lines between insulative base 124 and chip 110. The conductive traces are electrically isolated from one another by insulative base 124 and adhesive 170 after metal base 122 is removed. Advantageously, there is no plating bus or related circuitry that need be disconnected or severed from chip 110 or the conductive traces after metal base 122 is removed and the connection joints are formed. If desired, solder paste can be screen printed on the tops of the contact terminals to provide connections to the next level assembly.

FIGS. 4E–4F, 5E–5F and 6E–6F are cross-sectional top and bottom views, respectively, of a method of making a semiconductor chip assembly in accordance with a second embodiment of the present invention. In the second embodiment, the plated metal is initially deposited on the metal base and the metal layer. For purposes of brevity, any description in the first embodiment is incorporated herein insofar as the same is applicable, and the same description need not be repeated. Likewise, elements of the second embodiment similar to those in the first embodiment and shown in separate figures from the first embodiment have corresponding reference numerals indexed at two-hundred rather than one-hundred. For instance, metal base 222 corresponds to metal base 122, insulative base 224 corresponds to insulative base 124, etc.

The second embodiment begins with the steps depicted in FIGS. 1A–1D, 2A–2D and 3A–3D, then proceeds to the steps depicted in FIGS. 4E–4F, 5E–5F and 6E–6F, then concludes with the steps depicted in FIGS. 1G–1P, 2G–2P and 3G–3P. Thus, FIGS. 4E–4F, 5E–5F and 6E–6F replace FIGS. 1E–1F, 2E–2F and 3E–3F.

Figure 4E:
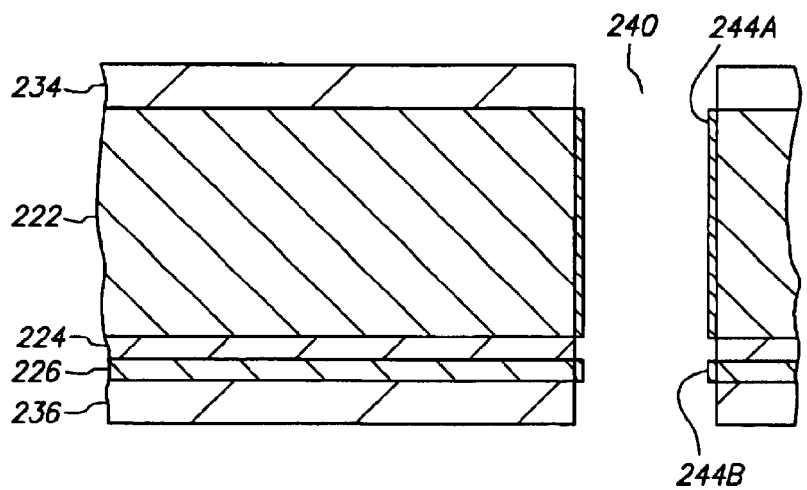
FIGS. 4E–4F are cross-sectional views showing a method of making a semiconductor chip assembly in accordance with a second embodiment of the present invention.
Figure 5E:
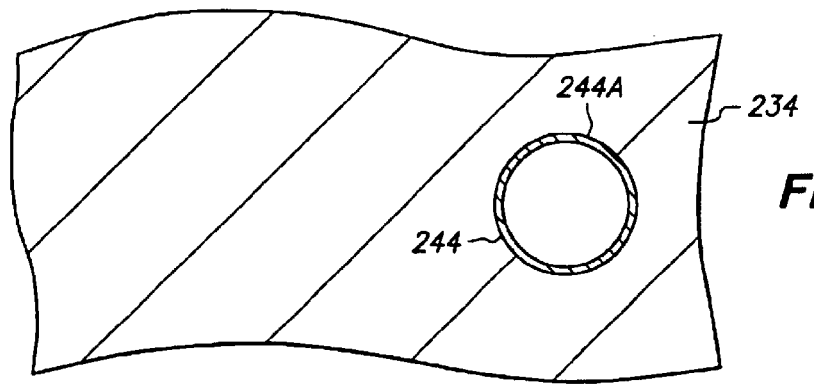
FIGS. 5E–5F are top plan views corresponding to FIGS. 4E–4F, respectively.
Figure 6E:
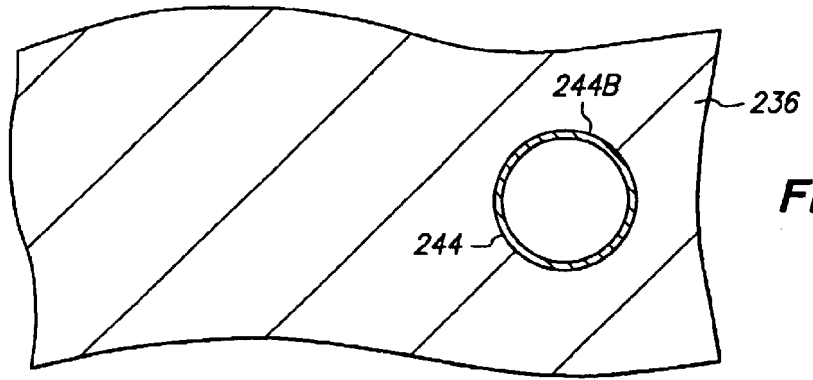
FIGS. 6E–6F are bottom plan views corresponding to FIGS. 4E–4F, respectively.

FIGS. 4E, 5E and 6E are cross-sectional, top and bottom views, respectively, of plated metal 244 formed on metal base 222 and metal layer 226 in via 240. Plated metal 244 includes a gold layer deposited on metal base 222 and metal layer 226, and a nickel layer deposited on the gold layer. The gold layer is 0.2 microns thick and the nickel layer is 1 micron thick. For convenience of illustration, the gold and nickel layers are shown as a single layer.

Plated metal 244 is formed by an electroplating operation. Initially, metal base 222 and metal layer 226 are connected to a plating bus (not shown), current is applied to the plating bus from an external power source, and the structure is submerged in an electrolytic gold plating solution to electroplate the gold layer on metal base 222 and metal layer 226. Thereafter, the structure is removed from the electrolytic gold plating solution and submerged in an electrolytic nickel plating solution while current is applied to the plating bus to electroplate the nickel layer on the gold layer.

At this initial stage, plated metal 244 is deposited as plated metal portion 244A on metal base 222 in via 240 and plated metal portion 244B on metal layer 226 in via 240. However, plated metal 244 does not extend across insulative base 224, and plated metal portions 244A and 244B do not contact one another. Therefore, plated metal 244 deposits on metal base 222 and metal layer 226 as separate spaced segments. Furthermore, plating mask 234 prevents metal from electroplating on surface 230 of metal base 222, and plating mask 236 prevents metal from electroplating on surface 232 of metal layer 226. However, the nickel electroplating operation is not finished.

Figure 4F:
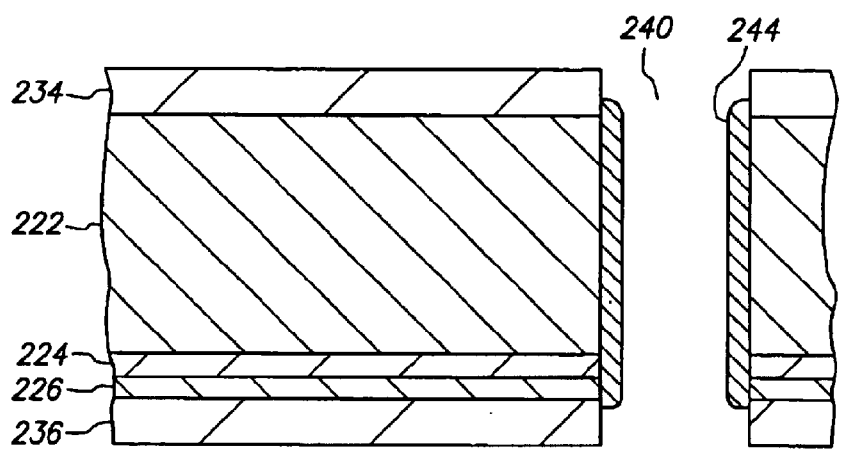
Figure 5F:
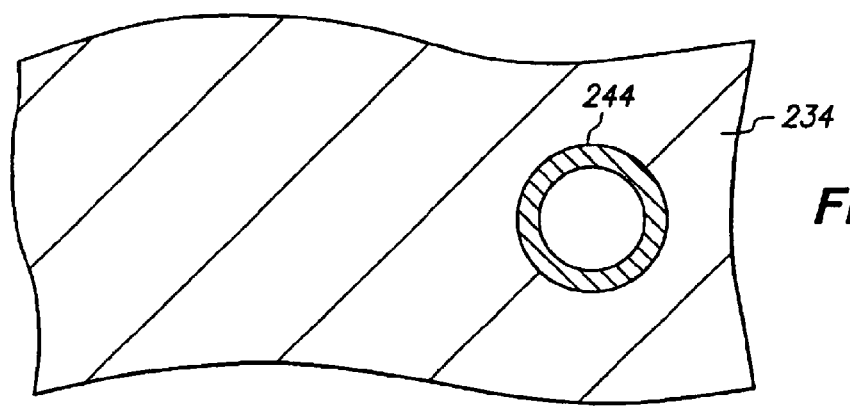
Figure 6F:
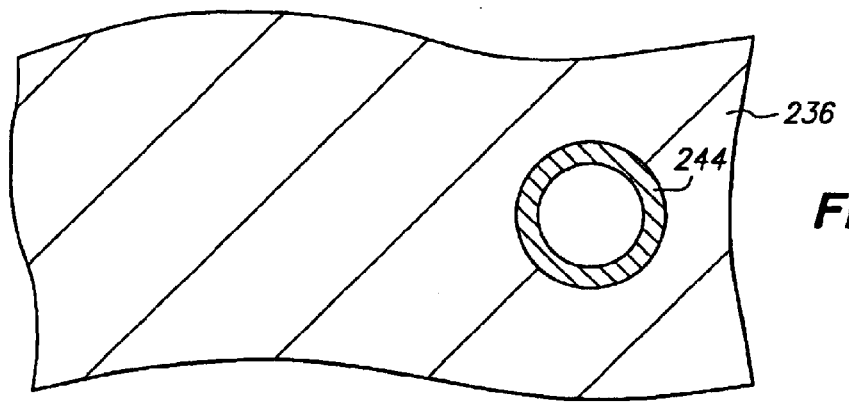

FIGS. 4F, 5F and 6F are cross-sectional, top and bottom views, respectively, of plated metal 244 formed on metal base 222 and metal layer 226 in via 240. The nickel electroplating operation continues, and as during the initial stage, metal base 222 and metal layer 226 receive current from the plating bus and the structure is submerged in the electrolytic nickel plating solution. Plated metal portion 244A continues to plate on metal base 222 and expand both radially and axially in via 240, and plated metal portion 244B continues to plate on metal layer 226 and expand both radially and axially in via 240. At this stage, unlike the initial stage, plated metal portions 244A and 244B contact one another and metallurgically merge into a single plated metal 244 that extends through insulative base 224. Thereafter, the structure is removed from the electrolytic nickel plating solution and rinsed in distilled water to remove contaminants.

Advantageously, plated metal 244 is formed more rapidly than plated metal 144 since plated metal 244 grows from metal base 222 towards metal layer 226 and from metal layer 226 towards metal base 222 as it grows across insulative base 224 whereas plated metal 144 grows from metal base 122 towards metal layer 126 but not vice-versa as it grows across insulative base 124. However, metal layer 226 is initially connected to the plating bus whereas metal layer 126 is not.

FIGS. 7A–7P, 8A–8P and 9A–9P are cross-sectional, top and bottom views, respectively, of a method of making a semiconductor chip assembly in accordance with a third embodiment of the present invention. In the third embodiment, the contact terminal includes the plated metal and a conductive adhesive, and the conductive adhesive rather than the plated metal extends through the insulative base. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, chip 310 corresponds to chip 110, metal base 322 corresponds to metal base 122, etc.

Figure 7A:
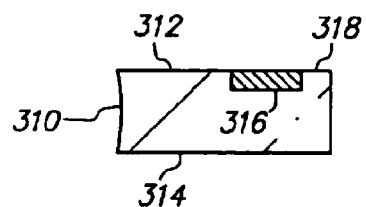
FIGS. 7A–7P are cross-sectional views showing a method of making a semiconductor chip assembly in accordance with a third embodiment of the present invention.
Figure 8A:
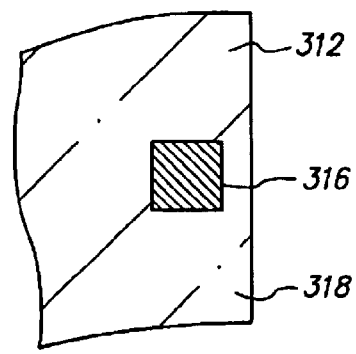
FIGS. 8A–8P are top plan views corresponding to FIGS. 7A–7P, respectively.
Figure 9A:
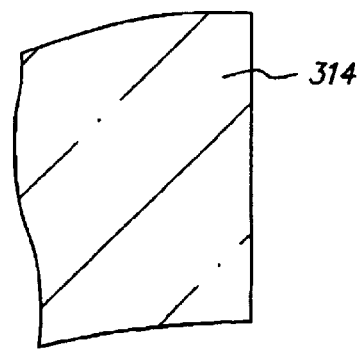
FIGS. 9A–9P are bottom plan views corresponding to FIGS. 7A–7P, respectively.

FIGS. 7A, 8A and 9A are cross-sectional, top and bottom views, respectively, of semiconductor chip 310 which includes surfaces 312 and 314. Surface 312 includes conductive pad 316 and passivation layer 318.

Figure 7B:
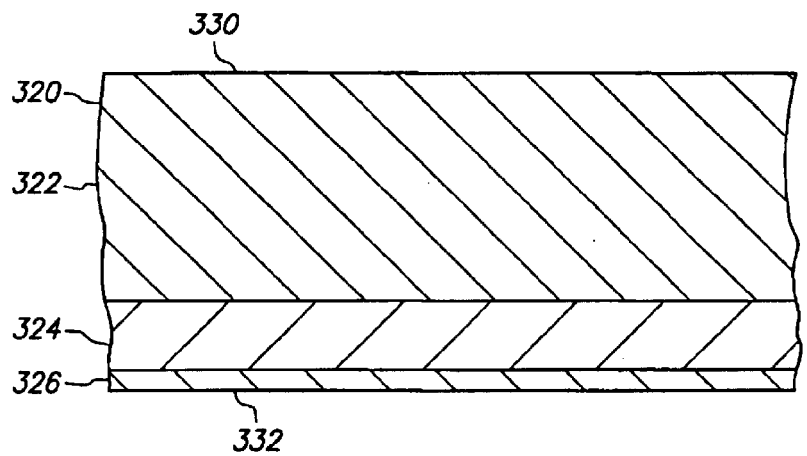
Figure 8B:
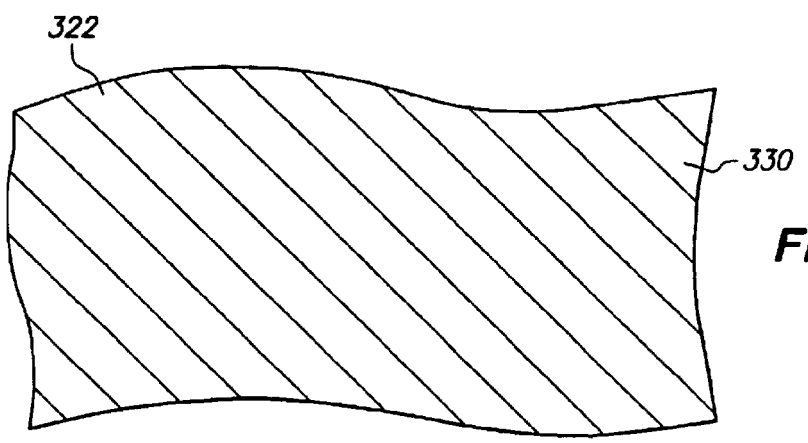
Figure 9B:
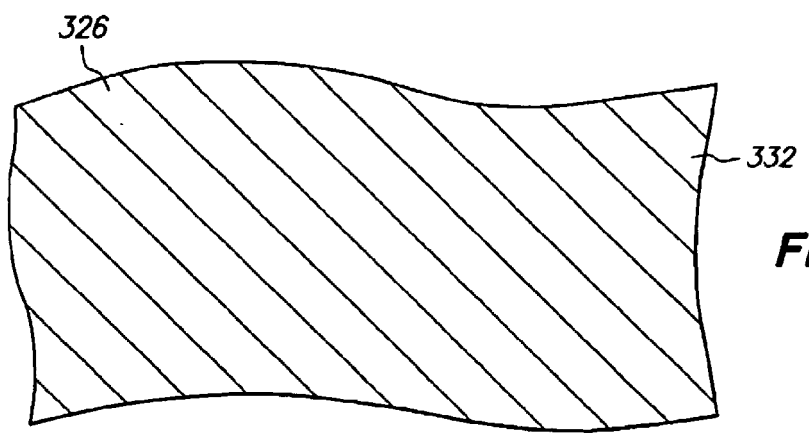

FIGS. 7B, 8B and 9B are cross-sectional, top and bottom views, respectively, of laminated structure 320 which includes metal base 322, insulative base 324 and metal layer 326. Laminated structure 320 also includes surfaces 330 and 332 at metal base 322 and metal layer 326, respectively. Metal base 322 is a copper foil with a thickness of 200 microns, insulative base 324 is a thermoplastic polyimide layer with a thickness of 50 microns, and metal layer 326 is a copper foil with a thickness of 12 microns. Thus, insulative base 324 (with a thickness of 50 microns) is substantially thicker than insulative base 124 (with a thickness of 15 microns).

Figure 7C:
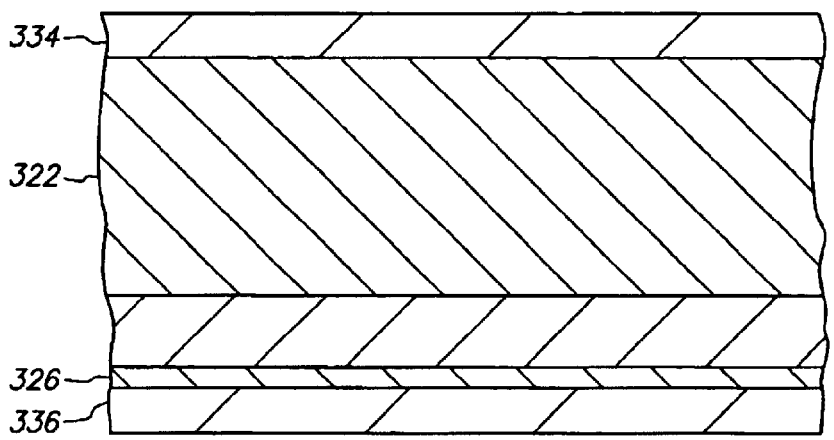
Figure 8C:
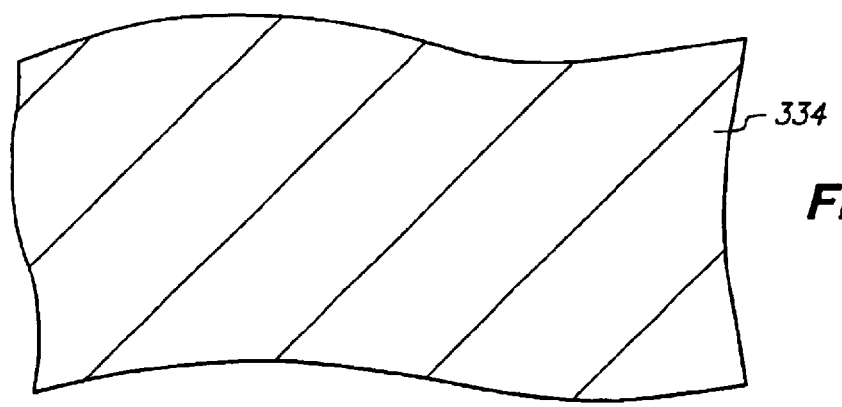
Figure 9C:
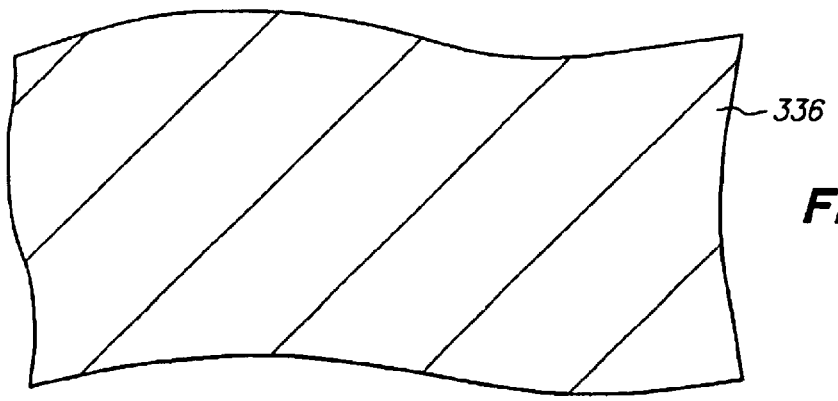

FIGS. 7C, 8C and 9C are cross-sectional, top and bottom views, respectively, of plating masks 334 and 336 formed on metal base 322 and metal layer 326, respectively.

Figure 7D:
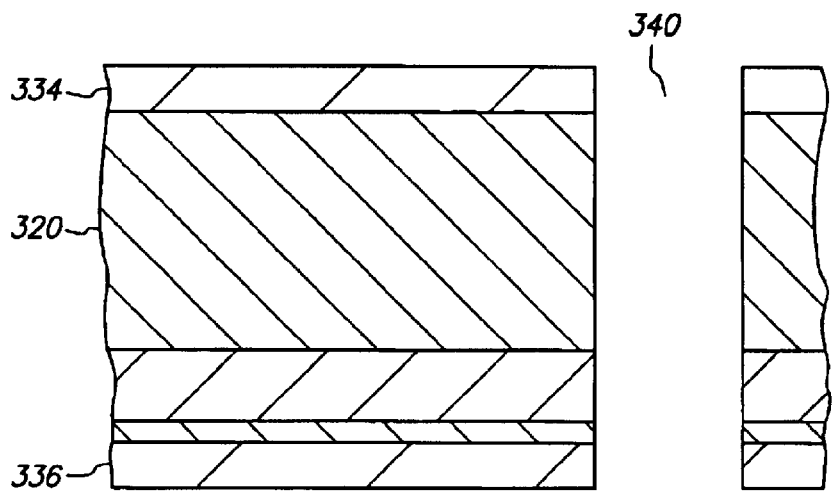
Figure 8D:
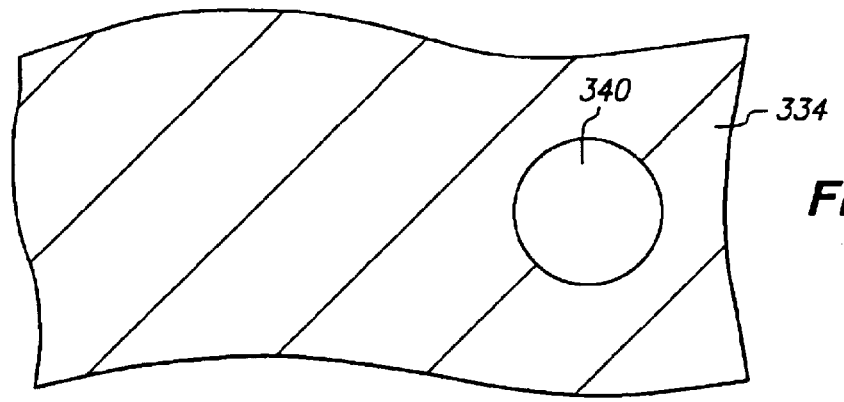
Figure 9D:
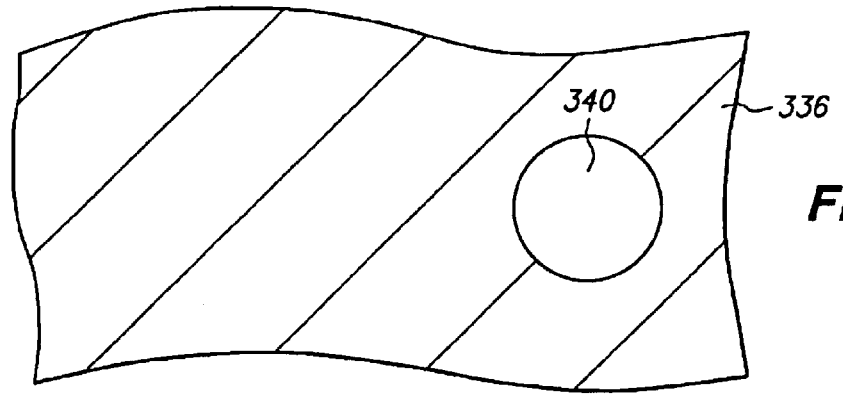

FIGS. 7D, 8D and 9D are cross-sectional, top and bottom views, respectively, of via 340 formed in laminated structure 320 and plating masks 334 and 336 by mechanical drilling.

Figure 7E:
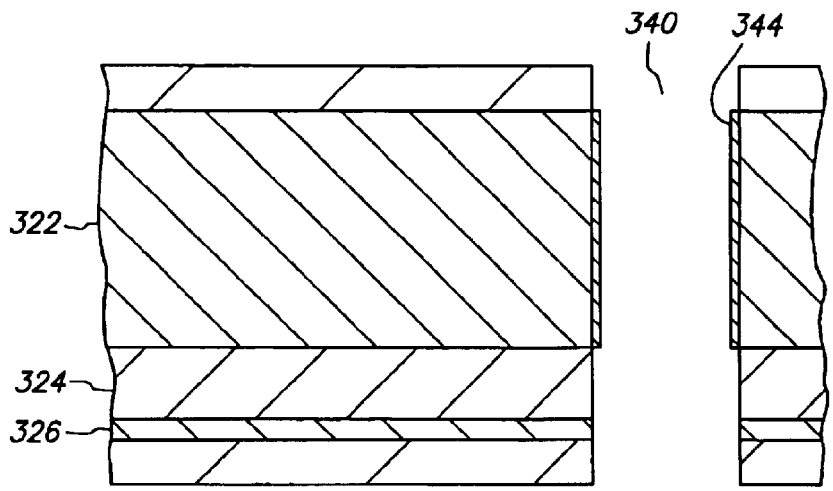
Figure 8E:
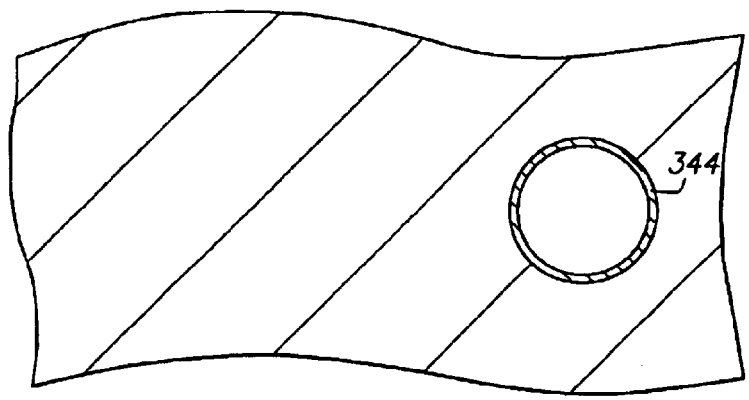
Figure 9E:
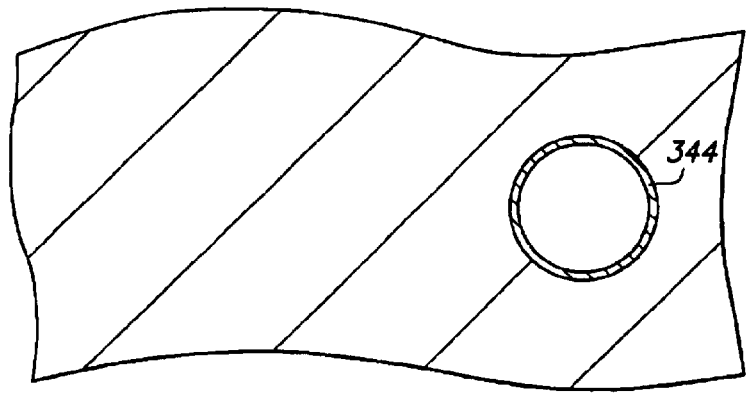

FIGS. 7E, 8E and 9E are cross-sectional, top and bottom views, respectively, of plated metal 344 formed on metal base 322 in via 340. Plated metal 344 includes a first gold layer deposited on metal base 322, a nickel layer deposited on the first gold layer, and a second gold layer deposited on the nickel layer. The first gold layer is 0.2 microns thick, the nickel layer is 2 microns thick and the second gold layer is 0.2 microns thick. For convenience of illustration, the gold and nickel layers are shown as a single layer.

Plated metal 344 is formed by an electroplating operation. Initially, metal base 322 is connected to a plating bus (not shown), current is applied to the plating bus from an external power source, and the structure is submerged in an electrolytic gold plating solution such as Technic Orotemp at room temperature to electroplate the first gold layer on metal base 322. Thereafter, the structure is removed from the electrolytic gold plating solution and submerged in an electrolytic nickel plating solution such as Technic Techni Nickel "S" at room temperature while current is applied to the plating bus to electroplate the nickel layer on the first gold layer. Thereafter, the structure is removed from the electrolytic nickel plating solution and submerged in an electrolytic gold plating solution such as Technic Orotemp at room temperature to electroplate the second gold layer on the nickel layer. Thereafter, the structure is removed from the electrolytic gold plating solution and rinsed in distilled water to remove contaminants.

At this stage, plated metal 344 is deposited on metal base 322 in via 340. However, plated metal 344 does not extend across insulative base 324 or deposit on metal layer 326, and the plating operation is finished.

Figure 7F:
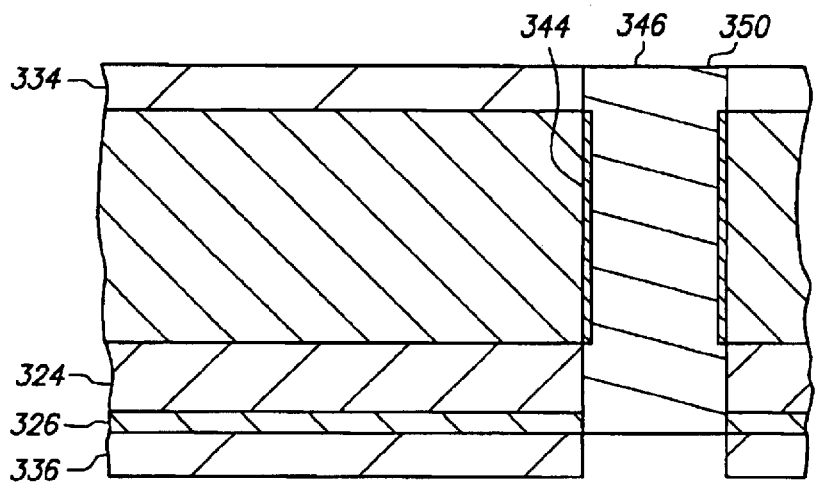
Figure 8F:
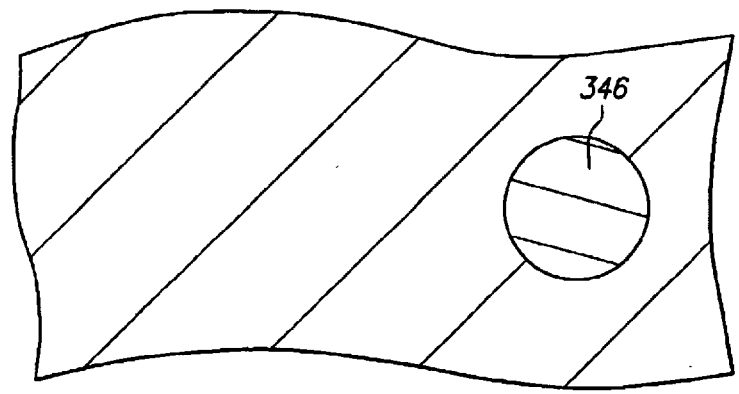
Figure 9F:
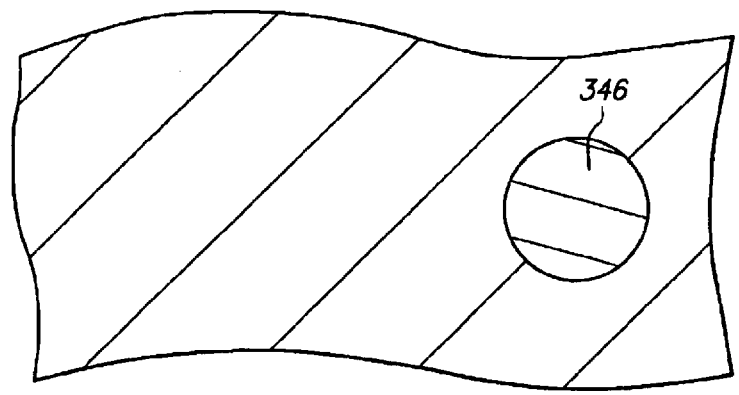

FIGS. 7F, 8F and 9F are cross-sectional, top and bottom views, respectively, of conductive adhesive 346 formed on metal layer 326 and plated metal 344 in via 340. Conductive adhesive 346 contacts and electrically connects metal layer 326 and plated metal 344 in via 340. Conductive adhesive 346 is substantially aligned with surface 332 of metal layer 326 fills the remaining space above surface 332 in via 340.

Conductive adhesive 346 is isotropic and includes a polymer binder (or matrix) and a filler metal powder. Conductive adhesive 346 is formed by depositing a non-solidified conductive adhesive into via 340 and then curing the non-solidified conductive adhesive by applying heat.

Conductive adhesives cured by UV light are preferred when the structure is sensitive to heat and the conductive adhesive is thin. The UV light generates little heat and can adequately penetrate the thin conductive adhesive and complete the intended curing reaction. However, conductive adhesives cured by heat tend to have better physical and chemical properties and lower cost than conductive adhesives cured by UV light. Conductive adhesive 346 is relatively thick and the structure is less sensitive to heat than if chip 310, adhesive 370 and encapsulant 372 were included, whereas connection joint 178 is relatively thin and applied to a structure that includes chip 110, adhesive 170 and encapsulant 172. As a result, conductive adhesive 346 is cured by applying heat where as connection joint 178 is cured by applying UV light.

Conductive adhesive 346 is formed by plugging via 340 at one end with a masking film (not shown) similar to plating mask 334 deposited on plating mask 334, then depositing conductive epoxy paste that includes an epoxy binder and silver flakes into via 340 from the open end at plating mask 336 by stencil printing, and then curing the conductive epoxy paste at a relatively low temperature in the range of 100–210° C. Thereafter, the masking film is stripped when plating masks 334 and 336 are removed.

Conductive adhesive 346 has a solid cylindrical shape that contacts and completely covers the previously exposed portions of insulative base 324, metal layer 326 and plated metal 344 in via 340. Conductive adhesive 346 extends through metal base 322, insulative base 324, and metal layer 326 and extends beyond plated metal 344 into plating mask 334 in via 340. Furthermore, since conductive adhesive 346 fills the remaining space within plated metal 344 in via 340, plated metal 344 no longer defines a central bore with space in via 340. Nonetheless, plated metal 344 surrounds a central surface area without extending into the central surface area.

The combination of plated metal 344 and conductive adhesive 346 provides contact terminal 350. The nickel layer provides an electrical conductor and a wettable surface so that solder (not shown) can be subsequently reflowed on to contact terminal 350 during the next level assembly, the first gold layer prevents the nickel layer from oxidizing and dissolves into the solder during the reflow operation, and the second gold layer prevents the nickel from oxidizing and provides a better interface for conductive adhesive 346 than the nickel layer would. Conductive adhesive 346 provides a robust, permanent electrical connection between metal layer 326 and plated metal 344. Moreover, conductive adhesive 346 (and therefore contact terminal 350) extends into all of the central surface area that plated metal 344 surrounds but does not extend into.

Advantageously, plated metal 344 need not grow across insulative base 324 since conductive adhesive 346 extends across insulative base 324 and electrically connects metal layer 326 and plated metal 344. This becomes increasingly important as the thickness of the insulative base increases due to the relatively slow rate at which the plated metal grows. Insulative base 324 is sufficiently thick that contact terminal 350 can be formed more rapidly with plated metal 344 and conductive adhesive 346 than with plated metal 144 or 244. However, providing plated metal 344 and conductive adhesive 346 requires more process steps than plated metal 144 or 244 alone.

Figure 7G:
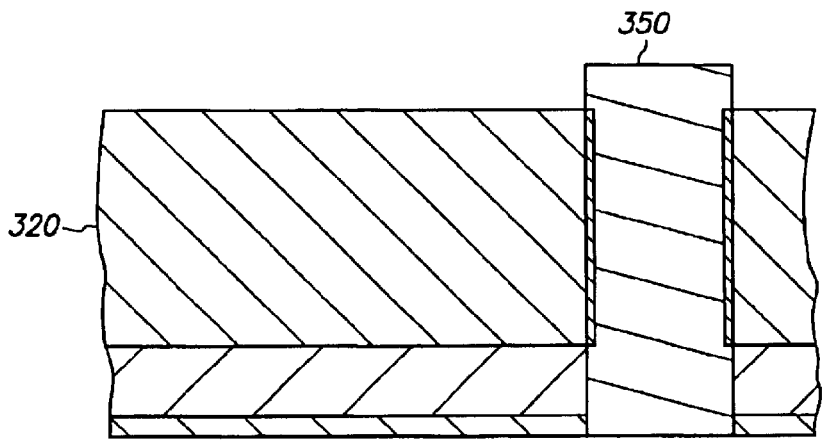
Figure 8G:
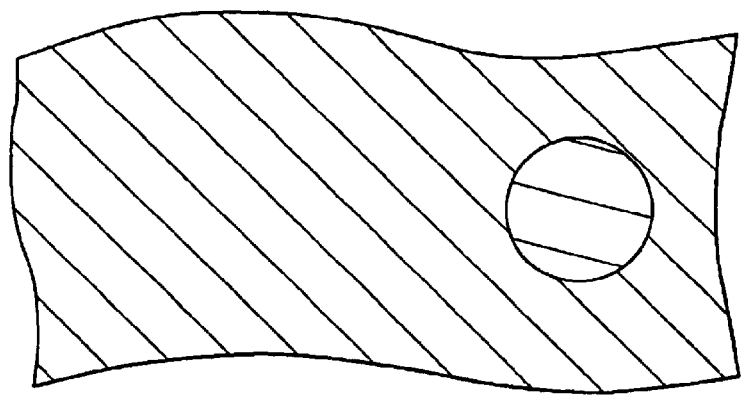
Figure 9G:
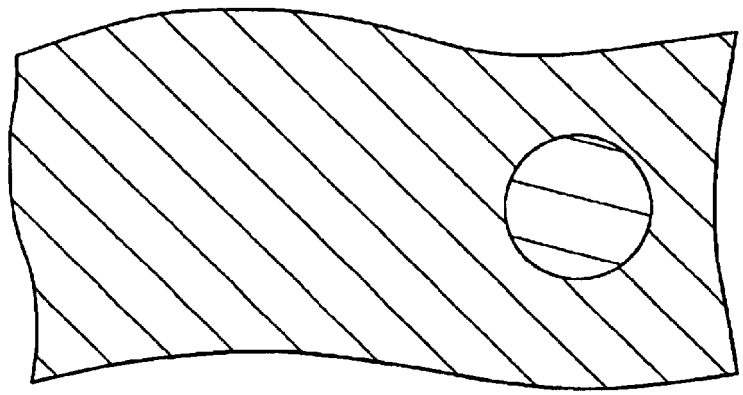

FIGS. 7G, 8G and 9G are cross-sectional, top and bottom views, respectively, of laminated structure 320 and contact terminal 350 after plating masks 334 and 336 are stripped.

Figure 7H:
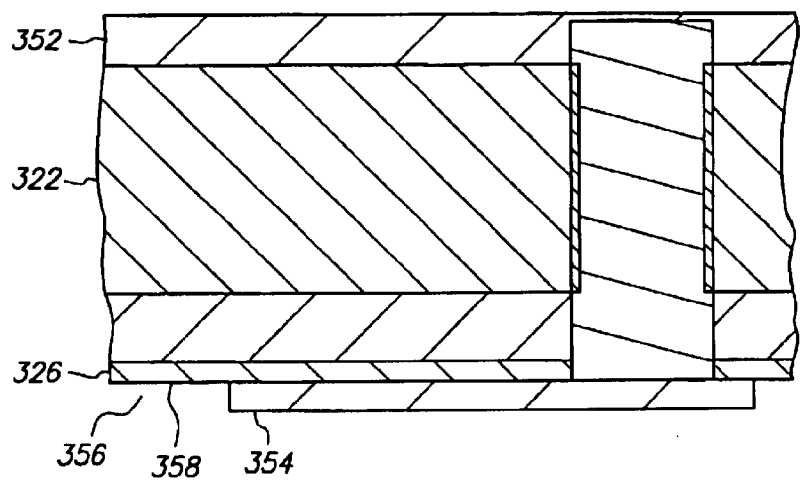
Figure 8H:
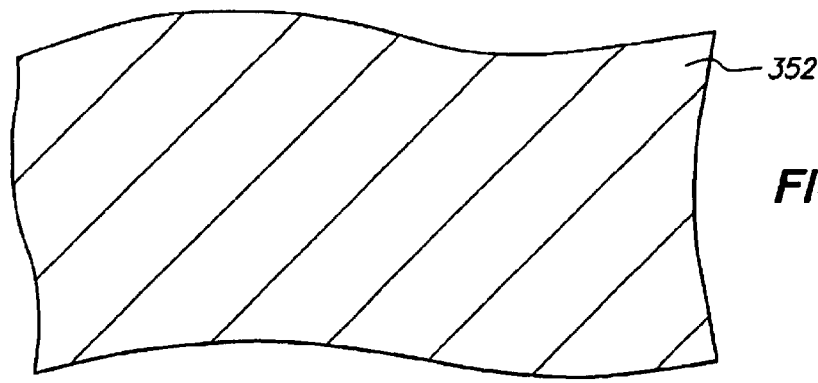
Figure 9H:
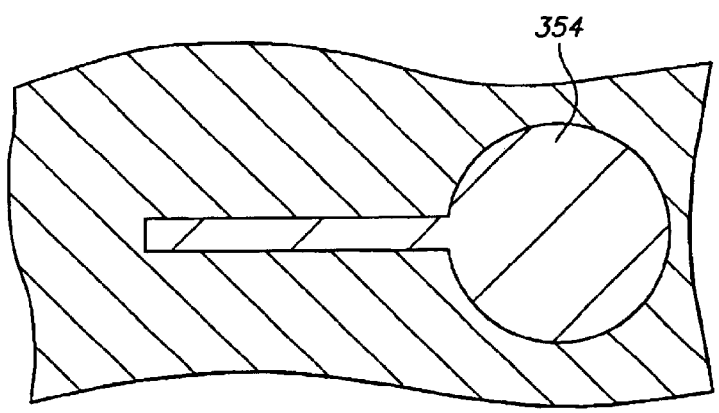

FIGS. 7H, 8H and 9H are cross-sectional, top and bottom views, respectively, of photoresist layers 352 and 354 formed on metal base 322 and metal layer 326, respectively.

Photoresist layer 354 contains opening 356 that selectively exposes portion 358 of metal layer 326, and photoresist layer 352 remains unpatterned.

Figure 7I:
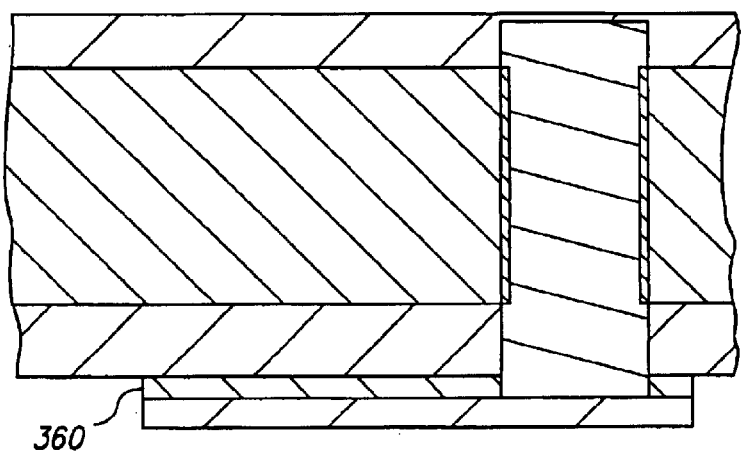
Figure 8I:
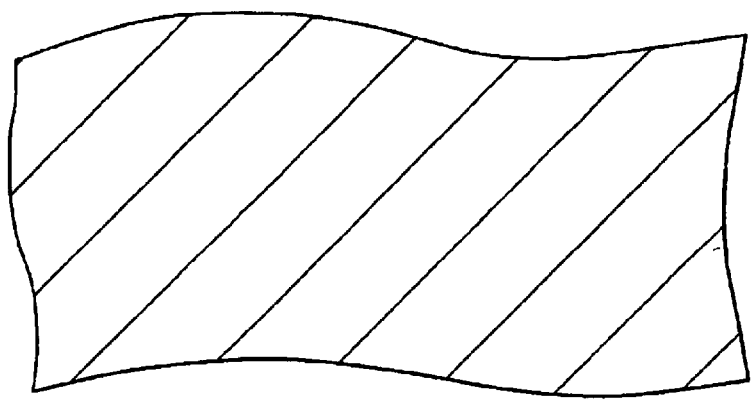
Figure 9I:
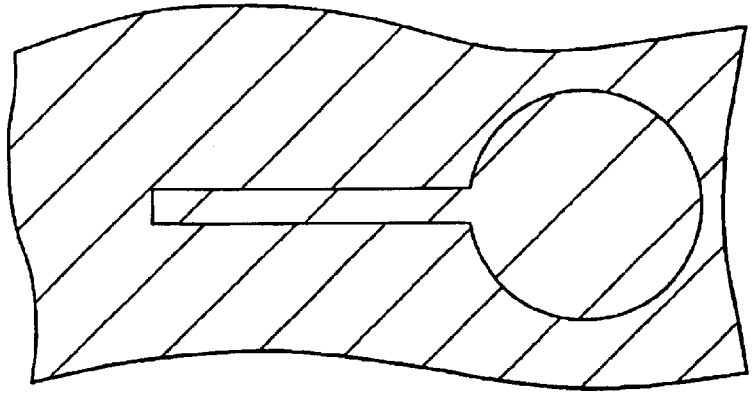

FIGS. 7I, 8I and 9I are cross-sectional, top and bottom views, respectively, of routing line 360 formed in metal layer 326 by wet chemical etching.

Figure 7J:
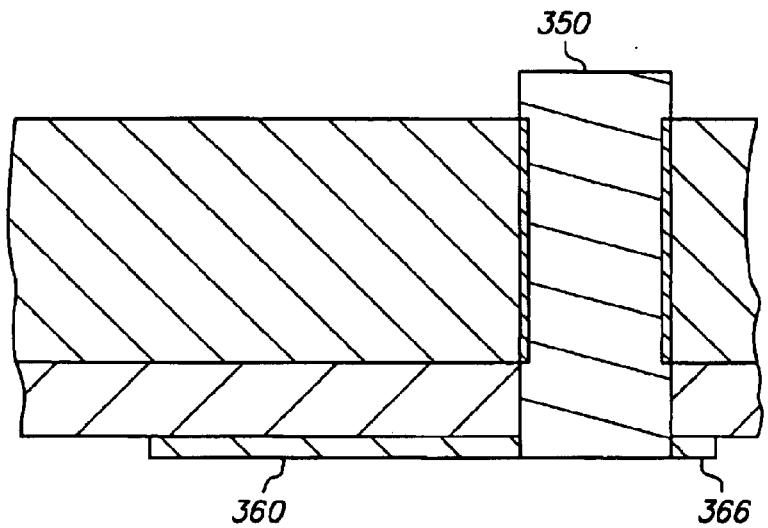
Figure 8J:
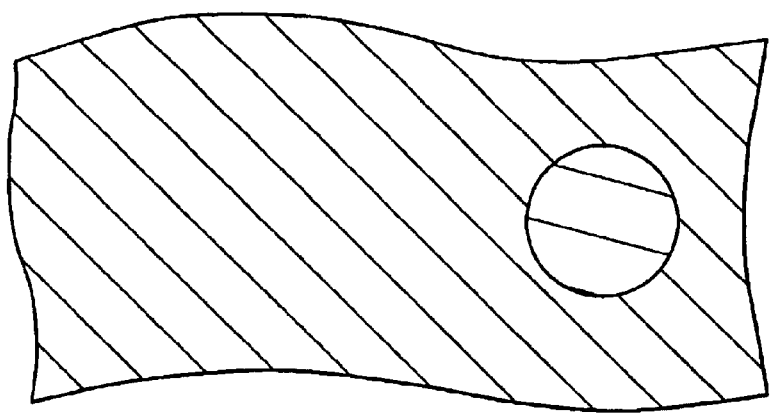
Figure 9J:
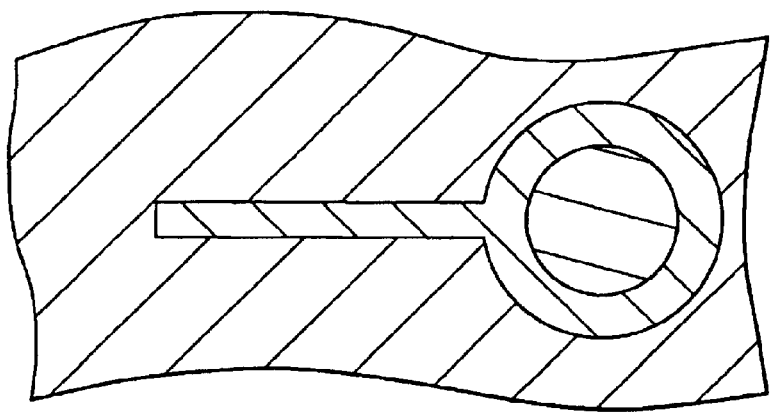

FIGS. 7J, 8J and 9J are cross-sectional, top and bottom views, respectively, of the structure after photoresist layers 352 and 354 are stripped. The combination of contact terminal 350 and routing line 360 provides conductive trace 366.

Figure 7K:
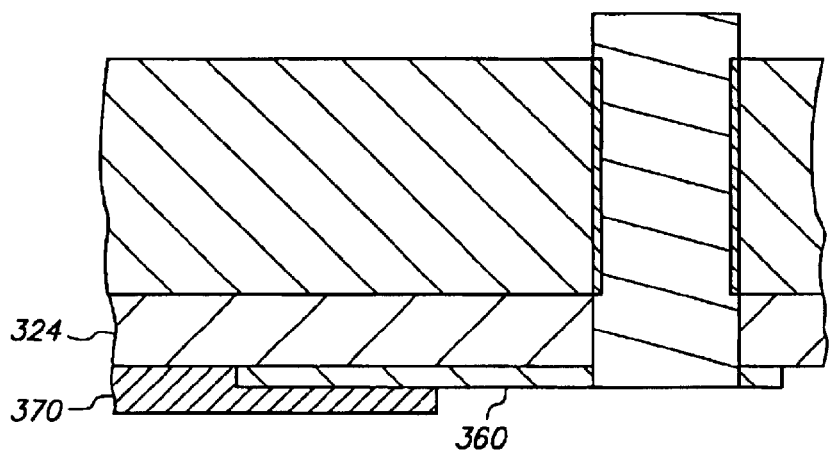
Figure 8K:
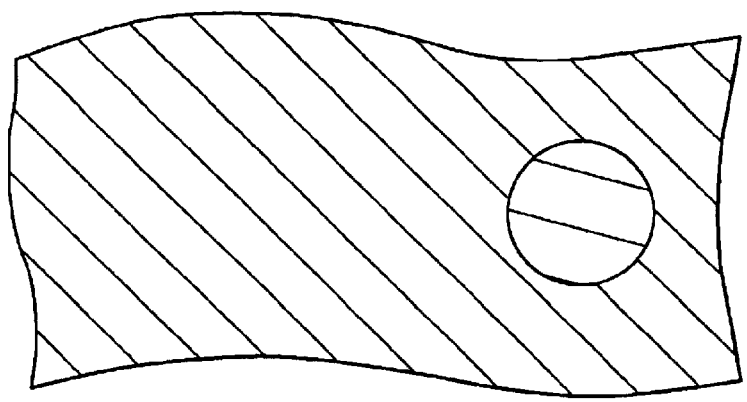
Figure 9K:
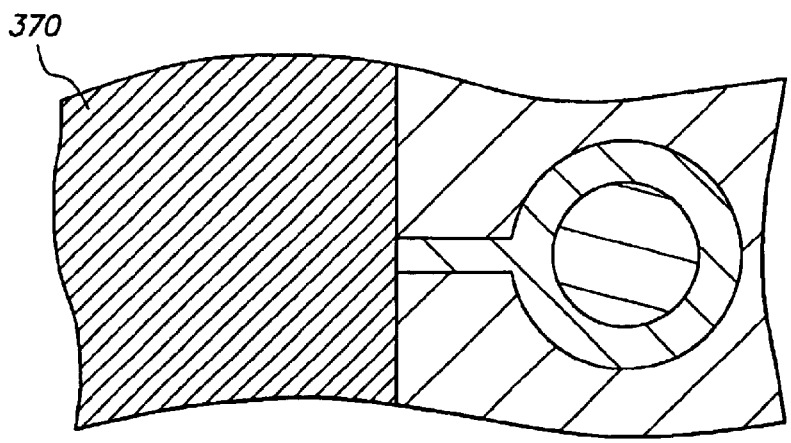

FIGS. 7K, 8K and 9K are cross-sectional, top and bottom views, respectively, of adhesive 370 formed on insulative base 324 and routing line 360.

Figure 7L:
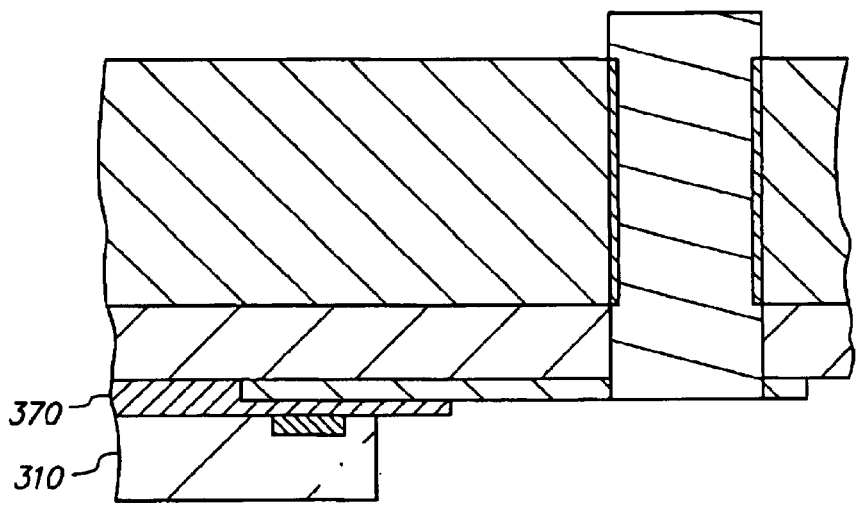
Figure 8L:
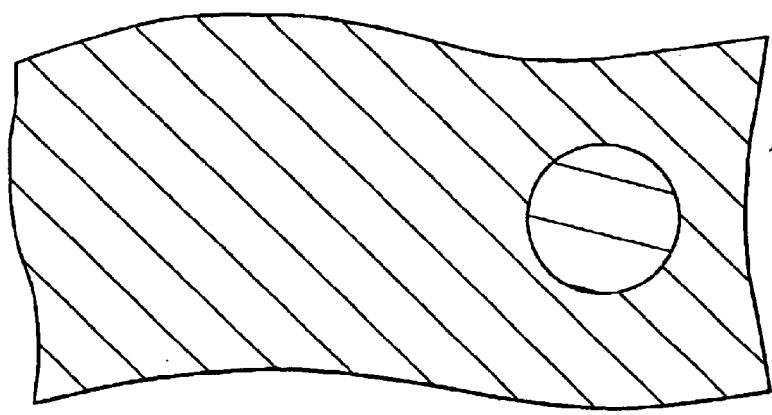
Figure 9L:
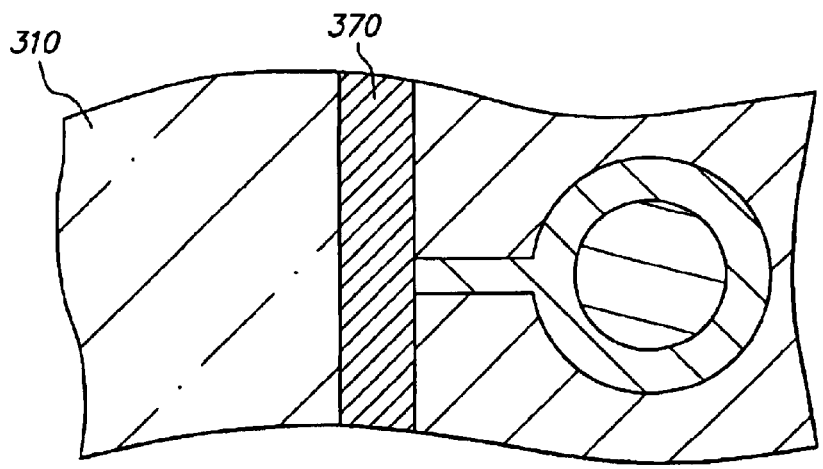

FIGS. 7L, 8L and 9L are cross-sectional, top and bottom views, respectively, of chip 310 mechanically attached to laminated structure 320 by adhesive 370.

Figure 7M:
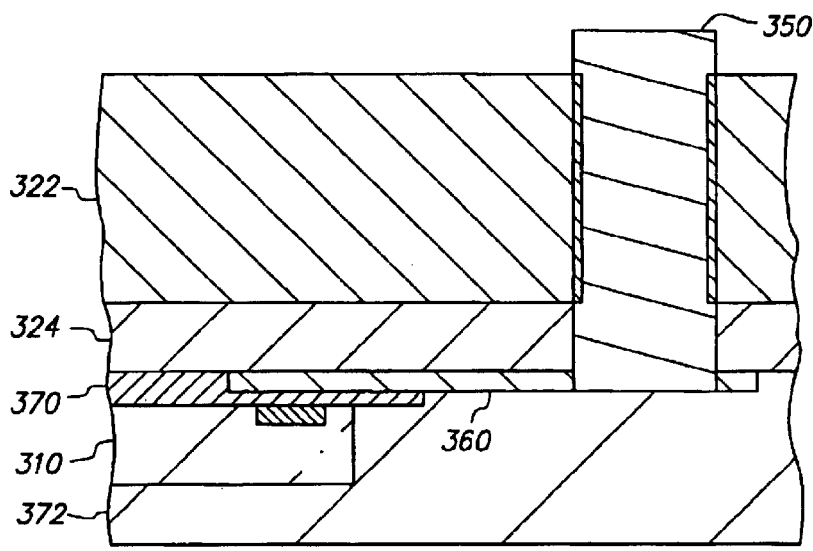
Figure 8M:
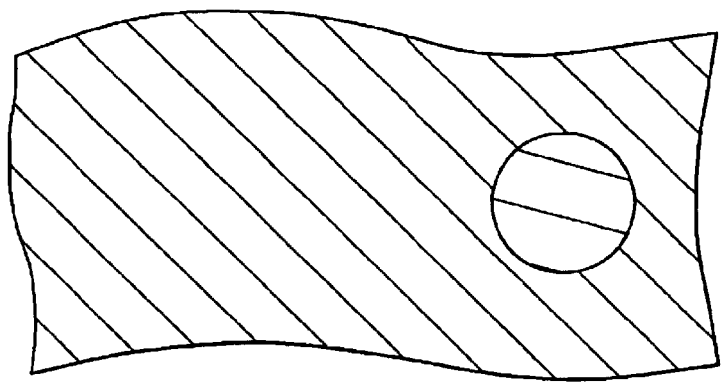
Figure 9M:
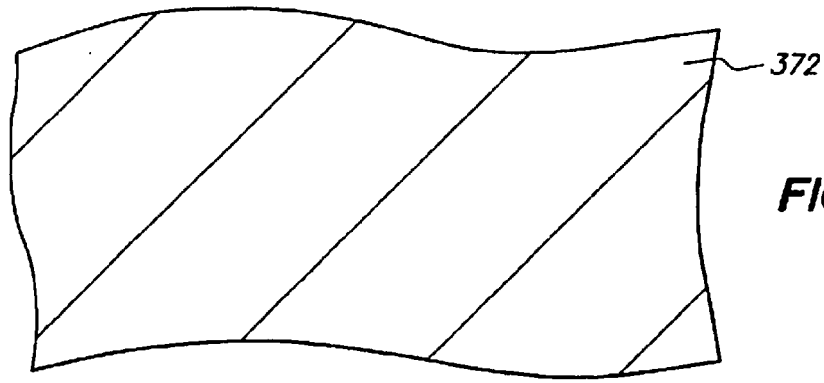

FIGS. 7M, 8M and 9M are cross-sectional, top and bottom views, respectively, of encapsulant 372 formed on chip 310, insulative base 324, contact terminal 350, routing line 360 and adhesive 370 by transfer molding. Since contact terminal 350 does not contain a central bore, encapsulant 372 does not extend through metal base 322, insulative base 324 or routing line 360, nor does encapsulant 372 contact metal base 322 or plated metal 344. However, the upper mold section contains a recess that is aligned with via 340, and contact terminal 350 protrudes from metal base 322 into the recess without contacting the upper mold section to assure that it does not dislodge or damage contact terminal 350.

Figure 7N:
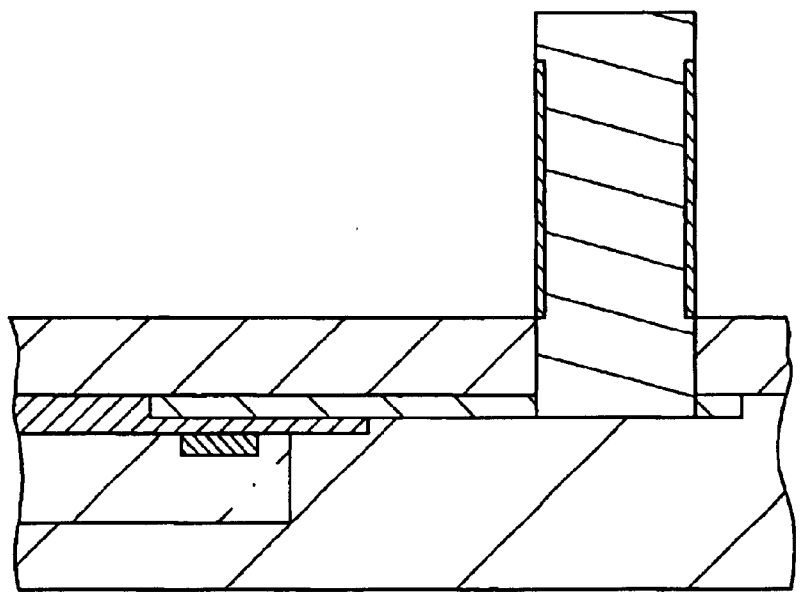
Figure 8N:
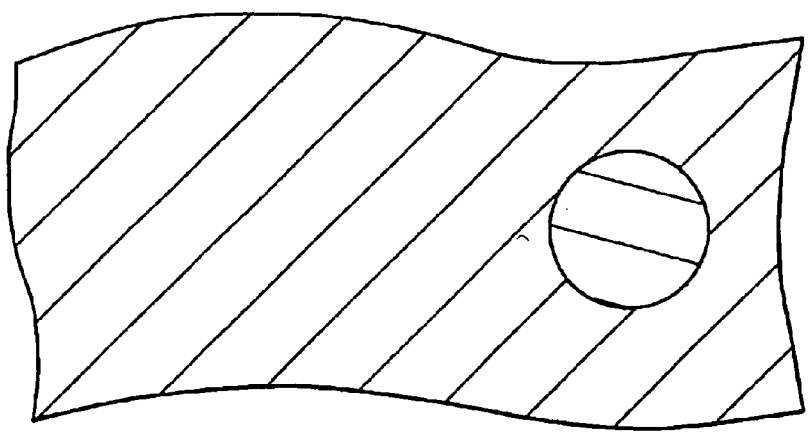
Figure 9N:
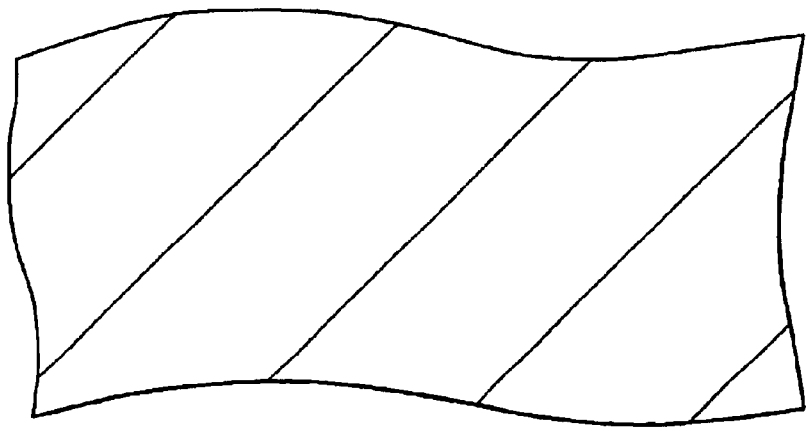

FIGS. 7N, 8N and 9N are cross-sectional, top and bottom views, respectively, of the structure after metal base 322 is removed by wet chemical etching.

Figure 7O:
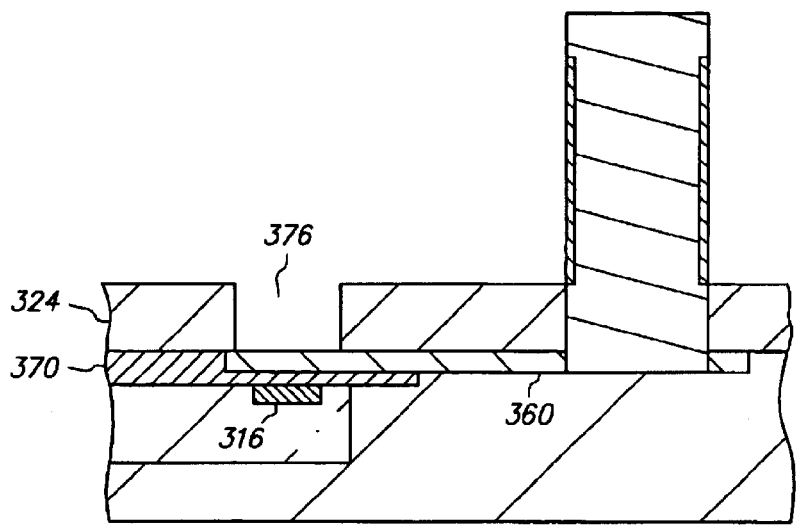
Figure 8O:
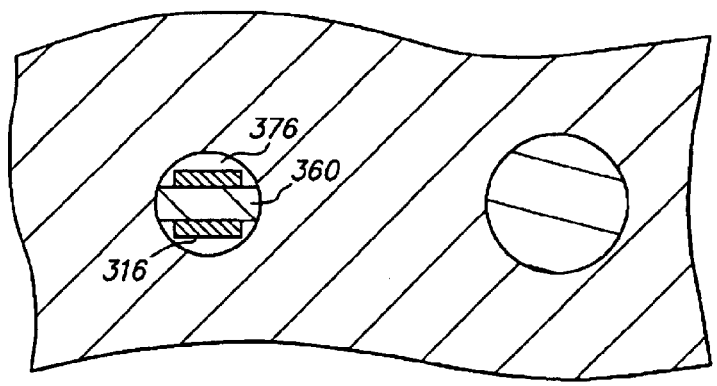
Figure 9O:
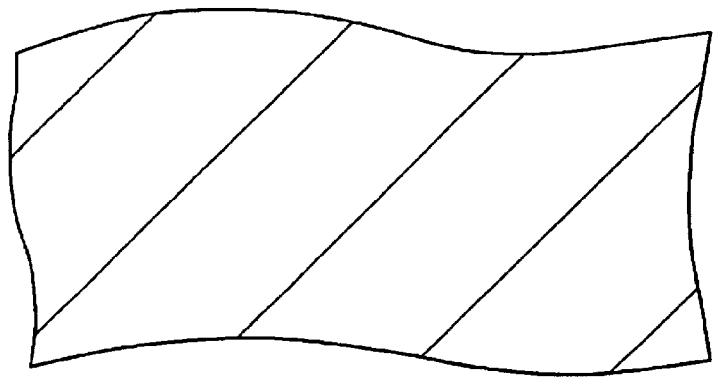

FIGS. 7O, 8O and 9O are cross-sectional, top and bottom views, respectively, of the structure after portions of insulative base 324 and adhesive 370 are selectively removed to form through-hole 376 in insulative base 324 and adhesive 370 that exposes pad 316 and routing line 360.

Figure 7P:
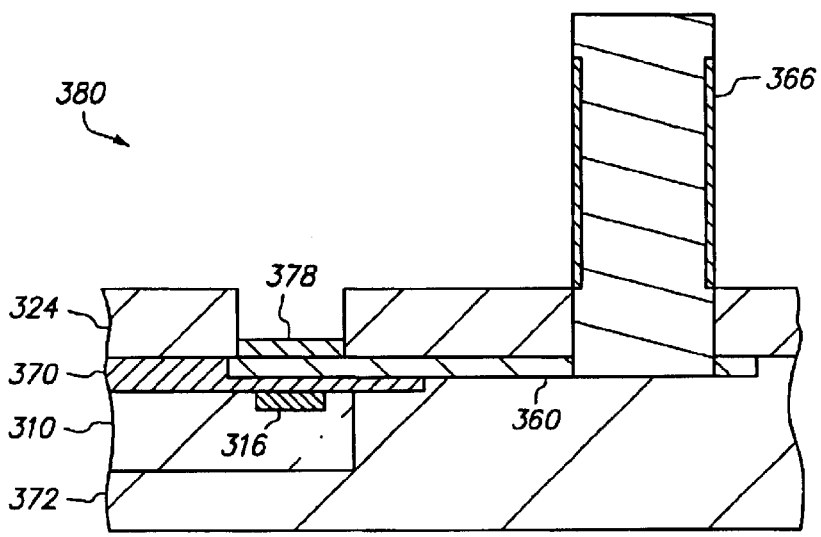
Figure 8P:
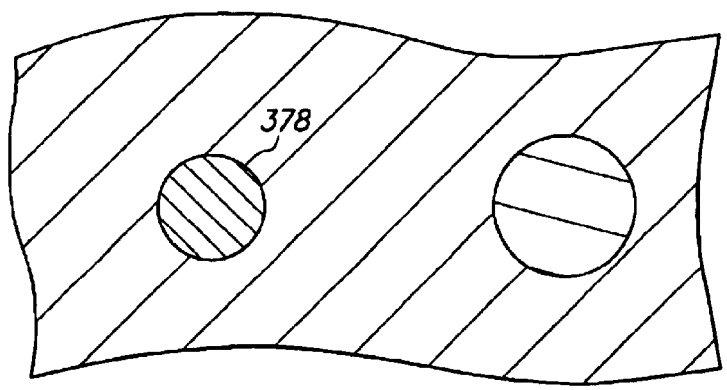
Figure 9P:
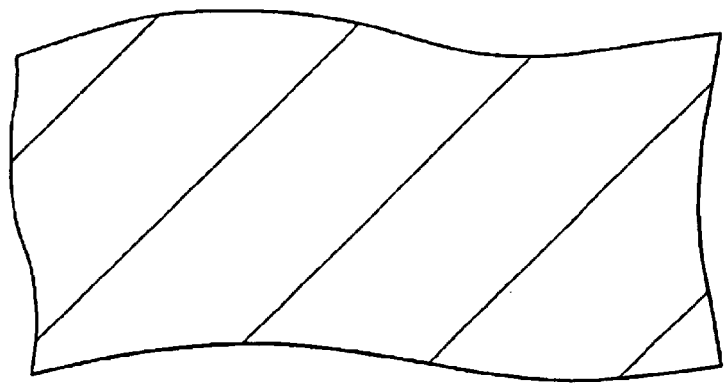

FIGS. 7P, 8P and 9P are cross-sectional, top and bottom views, respectively, of reconnection joint 378 formed on pad 316 and routing line 360.

At this stage, the manufacture of semiconductor chip assembly 380 that includes chip 310, insulative base 324, conductive trace 366, adhesive 370, encapsulant 372 and connection joint 378 can be considered complete.

FIGS. 10E–10F, 11E–11F and 12E–12F are cross-sectional, top and bottom views, respectively, of a method of making a semiconductor chip assembly in accordance with a fourth embodiment of the present invention. In the fourth embodiment, the plated metal is initially deposited on the metal base and the metal layer, and the contact terminal includes the plated metal and the conductive adhesive. For purposes of brevity, any description in the first, second and third embodiments is incorporated herein insofar as the same is applicable, and the same description need not be repeated. Likewise, elements of the fourth embodiment similar to those in the first, second and third embodiments and shown in separate figures from the first, second and third embodiments have corresponding reference numerals indexed at four-hundred rather than one-hundred, two-hundred or three-hundred. For instance, metal base 422 corresponds to metal base 122, plated metal portions 444A and 444B correspond to plated metal portions 244A and 244B, conductive adhesive 446 corresponds to conductive adhesive 346, etc.

The fourth embodiment begins with the steps depicted in FIGS. 7A–7D, 8A–8D and 9A–9D, then proceeds to the steps depicted in FIGS. 10E–10F, 11E–11F and 12E–12F, then concludes with the steps depicted in FIGS. 7G–7P, 8G–8P and 9G–9P. Thus, FIGS. 10E–10F, 11E–11F and 12E–12F replace FIGS. 7E–7F, 8E–8F and 9F–9F.

Figure 10E:
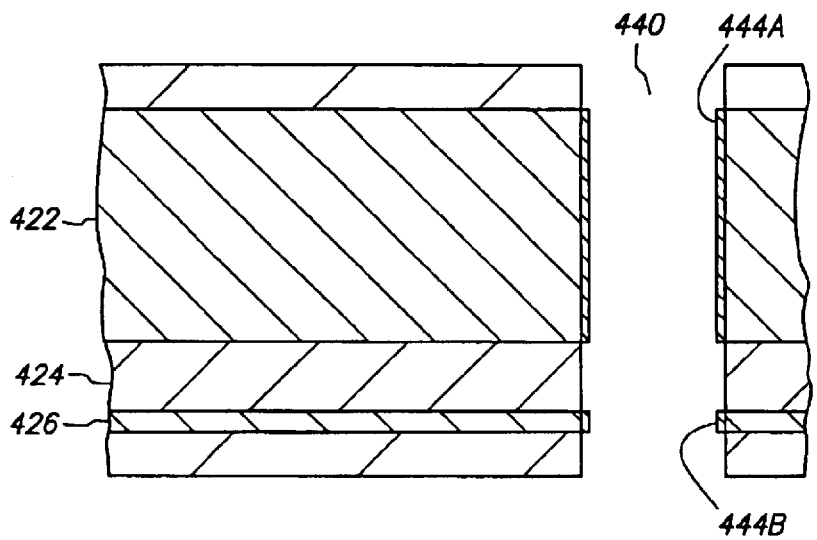
FIGS. 10E–10F are cross-sectional views showing a method of making a semiconductor chip assembly in accordance with a fourth embodiment of the present invention.
Figure 11E:
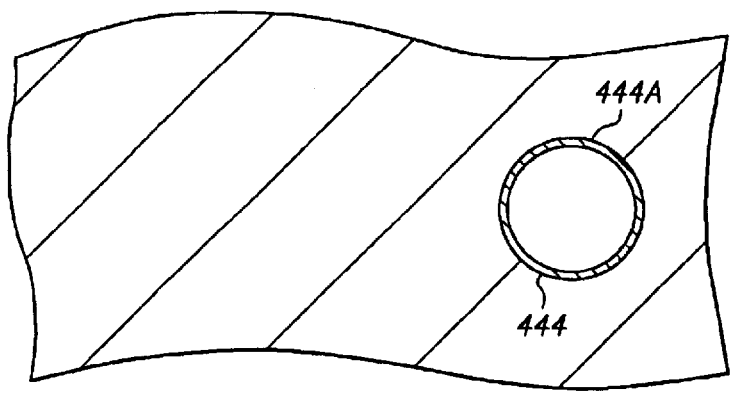
FIGS. 11E–11F are top plan views corresponding to FIGS. 10E–10F, respectively.
Figure 12E:
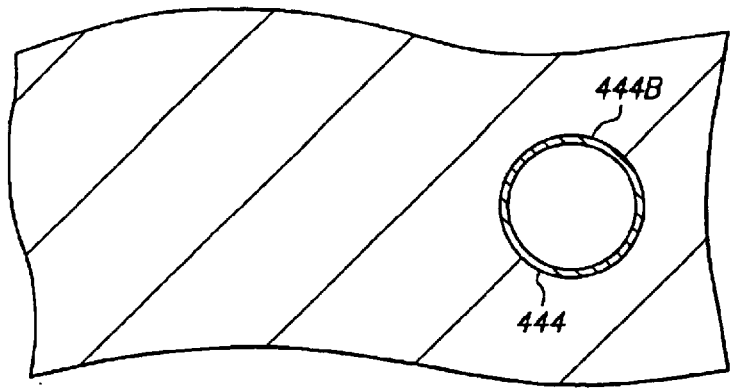
FIGS. 12E–12F are bottom plan views corresponding to FIGS. 10E–10F, respectively.

FIGS. 10E, 11E and 12E are cross-sectional, top and bottom views, respectively, of plated metal 444 formed on metal base 422 and metal layer 426 in via 440. Plated metal 444 includes a first gold layer deposited on metal base 422 and metal layer 426, a nickel layer deposited on the first gold layer, and a second gold layer deposited on the nickel layer. For convenience of illustration, the gold and nickel layers are shown as a single layer.

At this stage, plated metal 444 is deposited as plated metal portion 444A on metal base 422 in via 440 and plated metal portion 444B on metal layer 426 in via 440. However, plated metal 444 does not extend across insulative base 424, plated metal portions 444A and 444B do not contact one another, and the plating operation is finished.

Figure 10F:
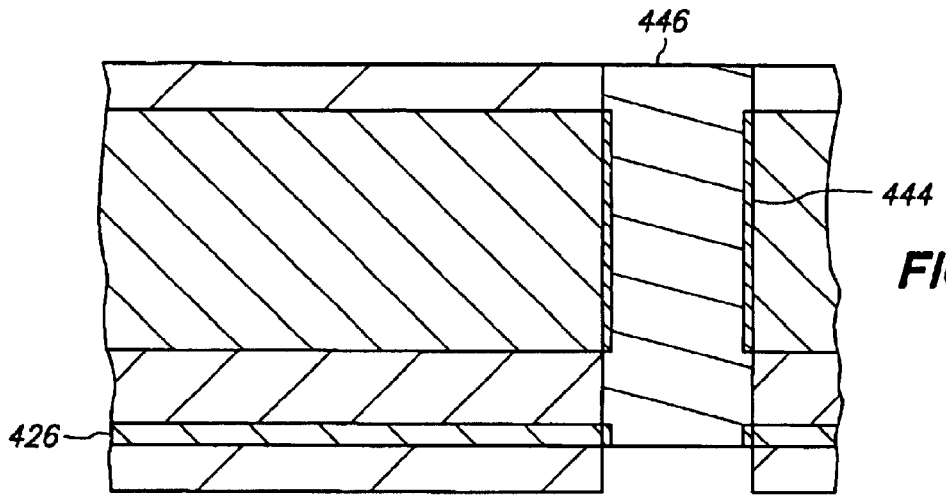
Figure 11F:
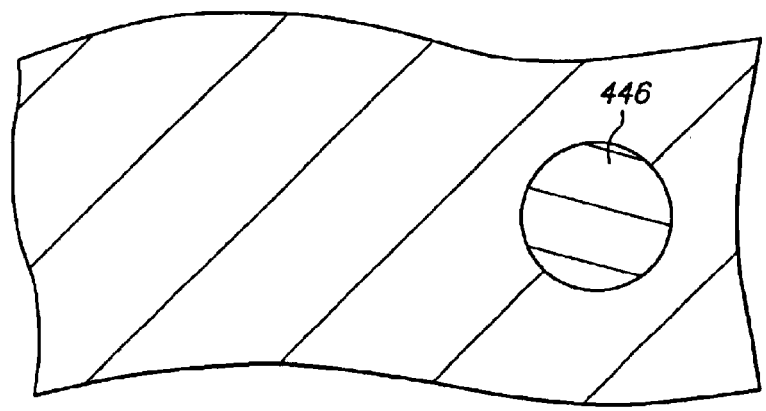
Figure 12F:
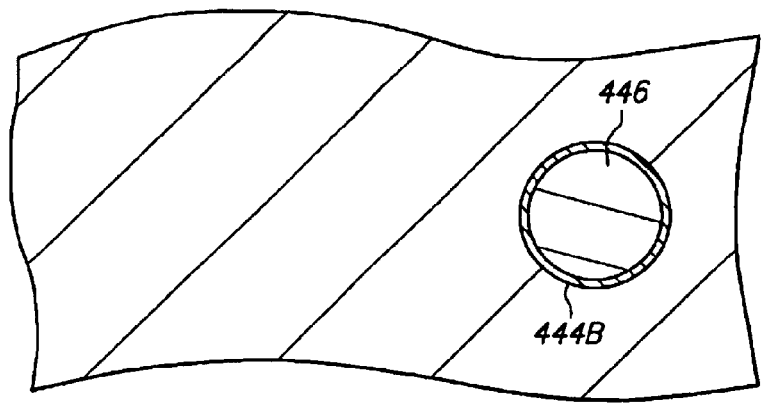

FIGS. 10F, 11F and 12F are cross-sectional top and bottom views, respectively, of conductive adhesive 446 formed on plated metal 444 in via 440. Conductive adhesive 446 does not contact metal layer 426, and plated metal portion 444B is sandwiched between metal layer 426 and conductive adhesive 446.

Advantageously, the second gold layer in plated metal portion 444B provides a better interface for conductive adhesive 446 than the copper in metal layer 426 would. However, metal layer 426 is connected to the plating bus whereas metal layer 326 is not.

FIGS. 13A–13P, 14A–14P and 15A–15P are cross-sectional, top and bottom views, respectively, of a method of making a semiconductor chip assembly in accordance with a fifth embodiment of the present invention. In the fifth embodiment, the via extends into but not through the metal base, and the contact terminal includes the plated metal and the conductive adhesive. For purposes of brevity, any description in the first and third embodiments is incorporated herein insofar as the same is applicable, and the same description need not be repeated. Likewise, elements of the fifth embodiment similar to those in the first and third embodiments have corresponding reference numerals indexed at five-hundred rather than three-hundred or one-hundred. For instance, chip 510 corresponds to chip 110, conductive adhesive 546 corresponds to conductive adhesive 346, etc.

Figure 13A:
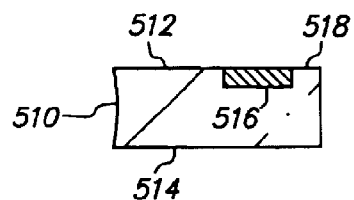
FIGS. 13A–13P are cross-sectional views showing a method of making a semiconductor chip assembly in accordance with a fifth embodiment of the present invention.
Figure 14A:
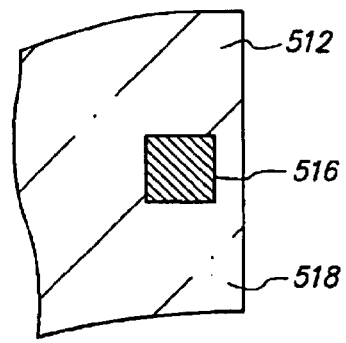
FIGS. 14A–14P are top plan views corresponding to FIGS. 13A–13P, respectively.
Figure 15A:
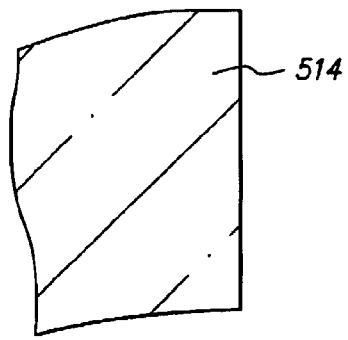
FIGS. 15A–15P are bottom plan views corresponding to FIGS. 13A–13P, respectively.

FIGS. 13A, 14A and 15A are cross-sectional, top and bottom views, respectively, of semiconductor chip 510 which includes surfaces 512 and 514. Surface 512 includes conductive pad 516 and passivation layer 518.

Figure 13B:
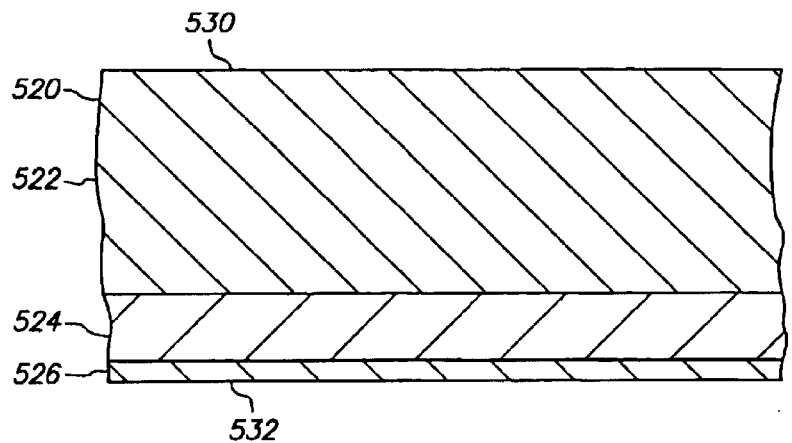
Figure 14B:
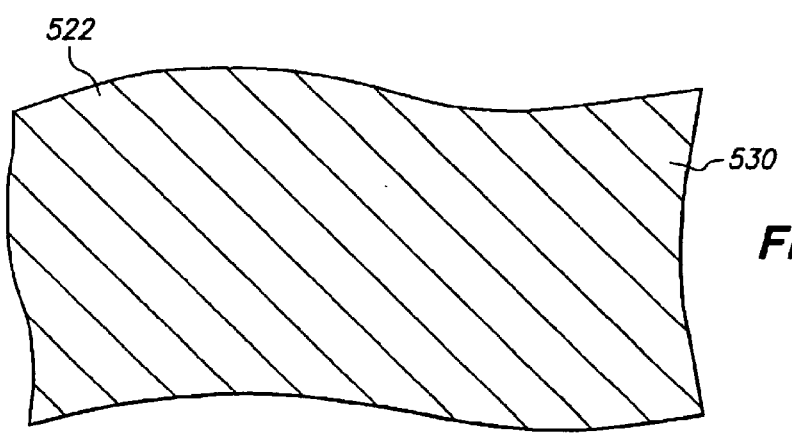
Figure 15B:
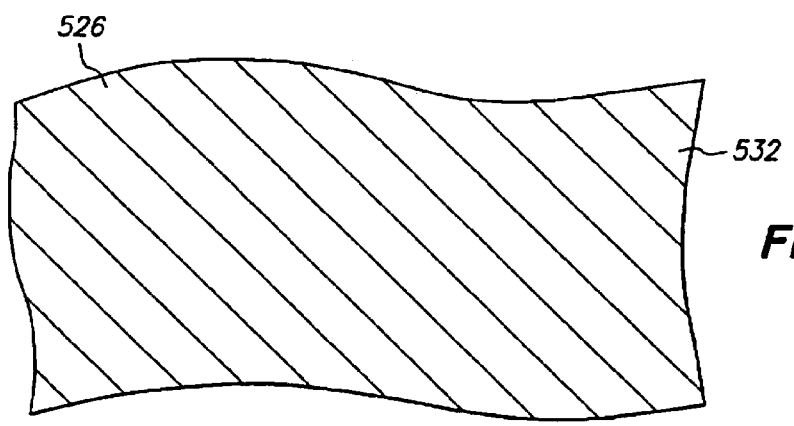

FIGS. 13B, 14B and 15B are cross-sectional, top and bottom views, respectively, of laminated structure 520 which includes metal base 522, insulative base 524 and metal layer 526. Laminated structure 520 also includes surfaces 530 and 532 at metal base 522 and metal layer 526, respectively. Laminated structure 520 is similar to laminated structure 320. Thus, insulative base 524 (with a thickness of 50 microns) is substantially thicker than insulative base 124 (with a thickness of 15 microns).

Figure 13C:
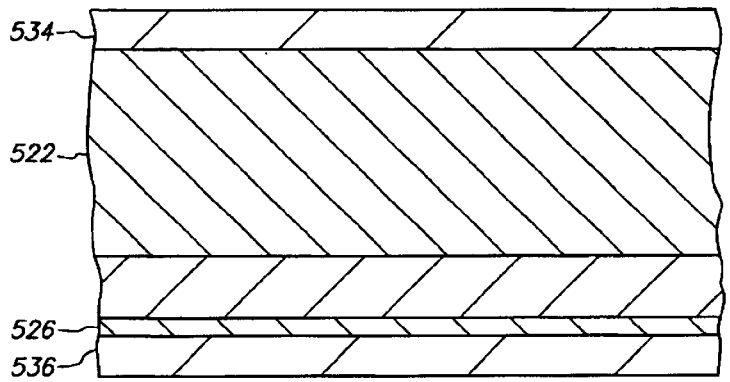
Figure 14C:
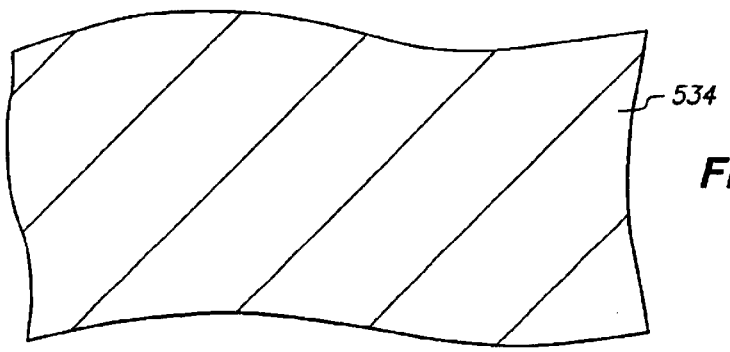
Figure 15C:
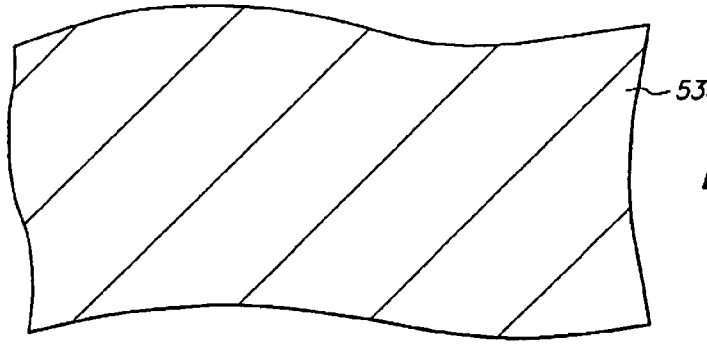

FIGS. 13C, 14C and 15C are cross-sectional, top and bottom views, respectively, of plating masks 534 and 536 formed on metal base 522 and metal layer 526, respectively.

Figure 13D:
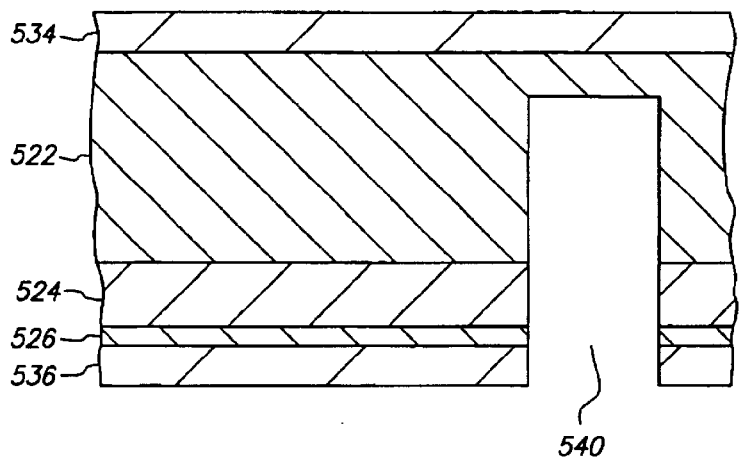
Figure 14D:
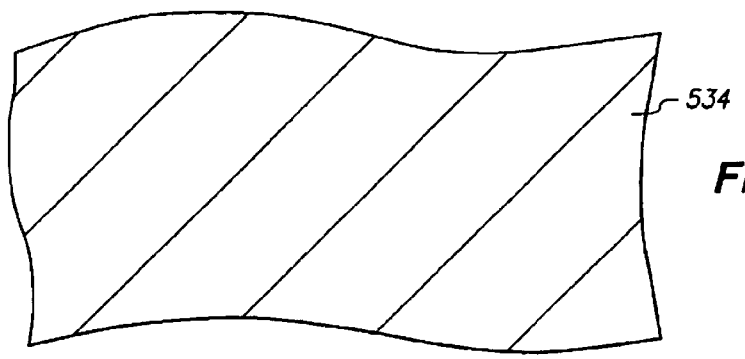
Figure 15D:
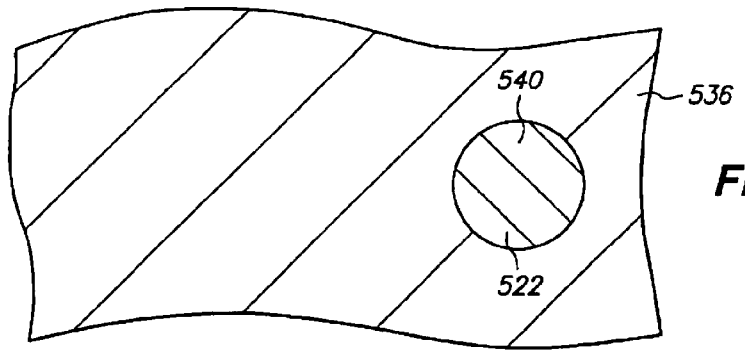

FIGS. 13D, 14D and 15D are cross-sectional, top and bottom views, respectively, of via 540 formed in laminated structure 520 and plating mask 536 by mechanical drilling. Via 540 is a blind via that extends through insulative base 524, metal layer 526 and plating mask 536, extends into but not through metal base 522, and is spaced from plating mask 534. In particular, via 540 extends 150 microns into metal base 522 and is spaced 50 microns from plating mask 534. Therefore, via 540 has a single open end at plating mask 536 and is bounded by the recess in metal base 522. Via 540 has a diameter of 300 microns. Via 540 has a pointed tip due to the shape of the drill bit For convenience of illustration, the tip is not shown.

Figure 13E:
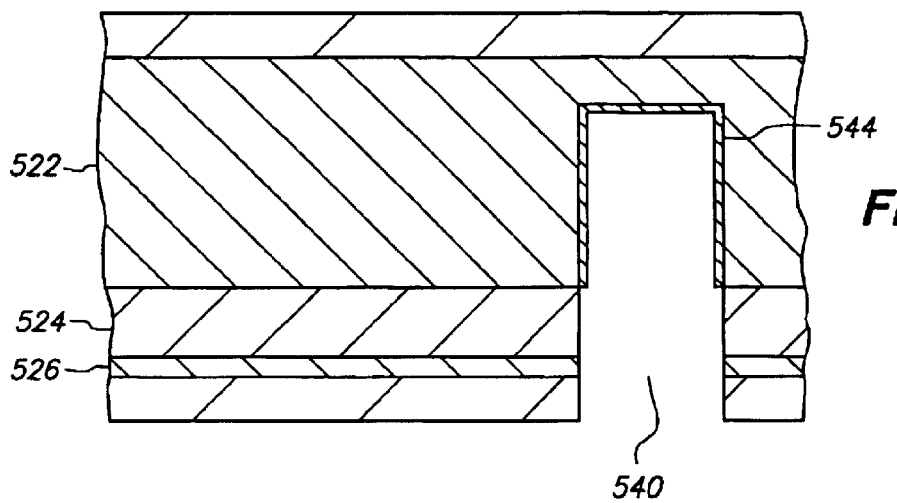
Figure 14E:
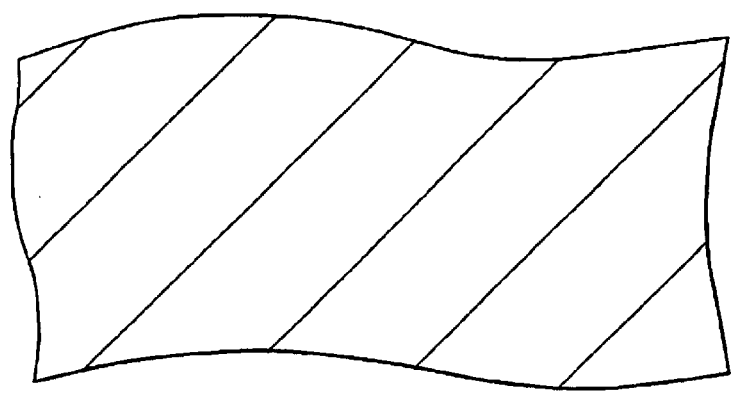
Figure 15E:
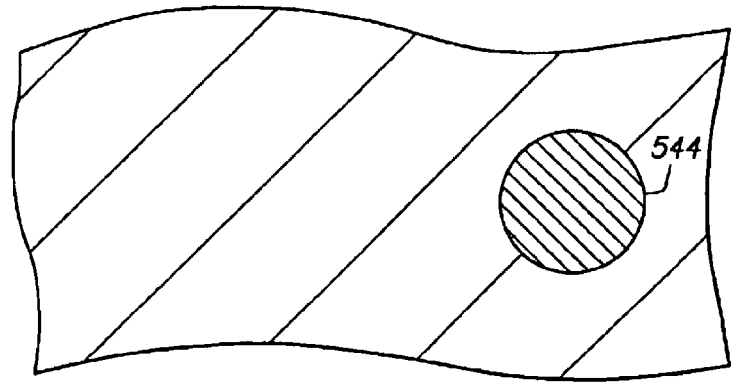

FIGS. 13E, 14E and 15E are cross-sectional, top and bottom views, respectively, of plated metal 544 formed on metal base 522 in via 540. Plated metal 544 includes a first gold layer deposited on metal base 522, a nickel layer deposited on the first gold layer, and a second gold layer deposited on the nickel layer. The first gold layer is 0.2 microns thick, the nickel layer is 5 microns thick and the second gold layer is 0.2 microns thick. For convenience of illustration, the gold and nickel layers are shown as a single layer.

Plated metal 544 is formed by an electroplating operation. Initially, metal base 522 is connected to a plating bus (not shown), current is applied to the plating bus from an external power source, and the structure is submerged in an electrolytic gold plating solution such as Technic Orotemp at room temperature to electroplate the first gold layer on metal base 522. Thereafter, the structure is removed from the electrolytic gold plating solution and submerged in an electrolytic nickel plating solution such as Technic Techni Nickel "S" at room temperature while current is applied to the plating bus to electroplate the nickel layer on the first gold layer. Thereafter, the structure is submerged in an electrolytic gold plating solution such as Technic Orotemp at room temperature to electroplate the second gold layer on the nickel layer. Thereafter, the structure is removed from the electrolytic gold plating solution and rinsed in distilled water to remove contaminants.

Plated metal 544 is similar to plated metal 344, except that since via 540 extends into but not through metal base 522, plated metal 544 has a bowl-like shape (rather than a tube-like shape) and extends into all of the central surface area (rather than none of the central surface area) that it surrounds.

At this stage, plated metal 544 is deposited on metal base 522 in via 540. However, plated metal 544 does not extend across insulative base 524 or deposit on metal layer 526, and the plating operation is finished.

Figure 13F:
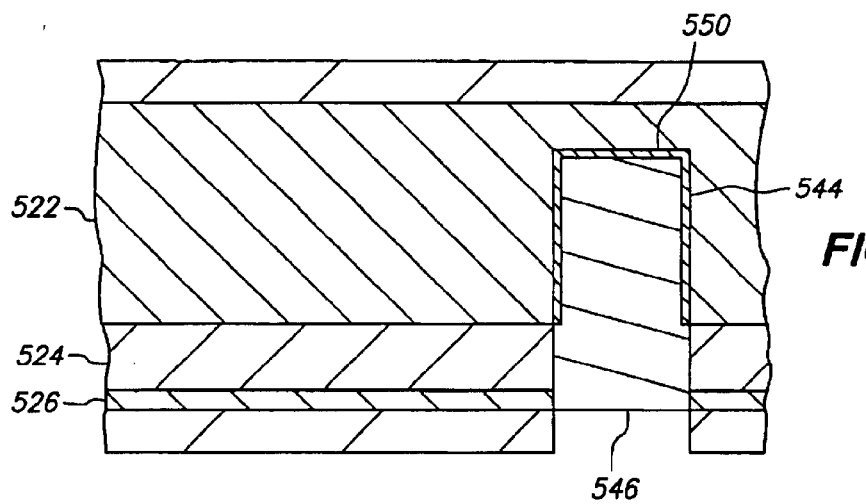
Figure 14F:
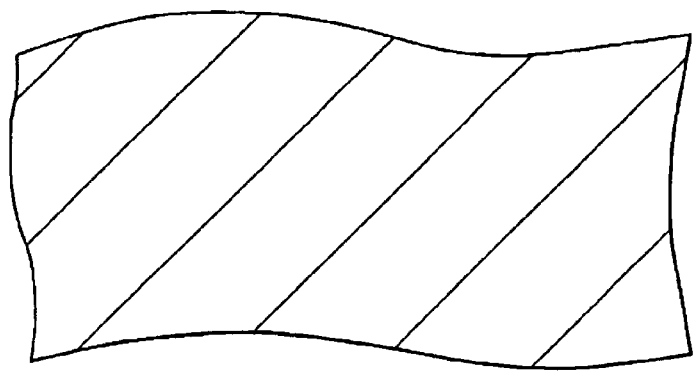
Figure 15F:
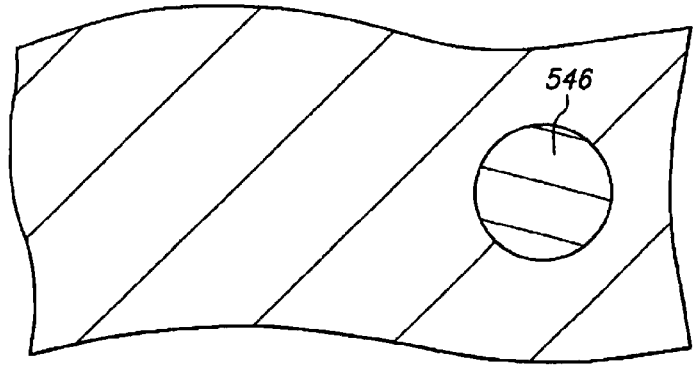

FIGS. 13F, 14F and 15F are cross-sectional, top and bottom views, respectively, of conductive adhesive 546 formed on metal layer 526 and plated metal 544 in via 540. Conductive adhesive 546 has a solid-cylindrical shape that contacts and completely covers the previously exposed portions of insulative base 524, metal layer 526 and plated metal 544 in via 540. Conductive adhesive 546 extends through insulative base 524 and metal layer 526 and into but not through metal base 522 and plated metal 544 in via 540.

The combination of plated metal 544 and conductive adhesive 546 provides contact terminal 550. Conductive adhesive 546 provides a robust, permanent electrical connection between metal layer 526 and plated metal 544. Moreover, plated metal 544 and conductive adhesive 546 (and therefore contact terminal 550) extend into all of the central surface area that plated metal 544 surrounds.

Advantageously, via 540 need not be plugged before depositing conductive adhesive 546 therein since via 540 is a blind via, and plated metal 544 need not grow across insulative base 524 since conductive adhesive 546 extends across insulative base 524 and electrically connects metal layer 526 and plated metal 544. However, contact terminal 550 is shorter than contact terminal 350, and providing plated metal 544 and conductive adhesive 546 requires more process steps than plated metal 144 or 244 alone.

Figure 13G:
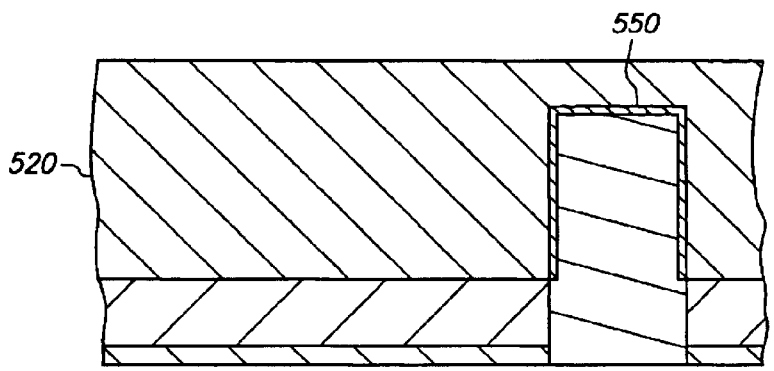
Figure 14G:
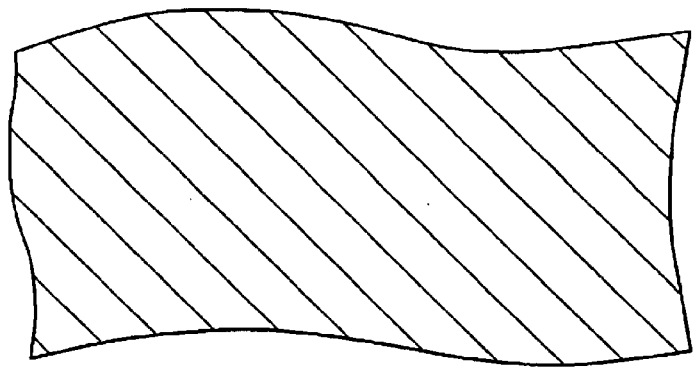
Figure 15G:
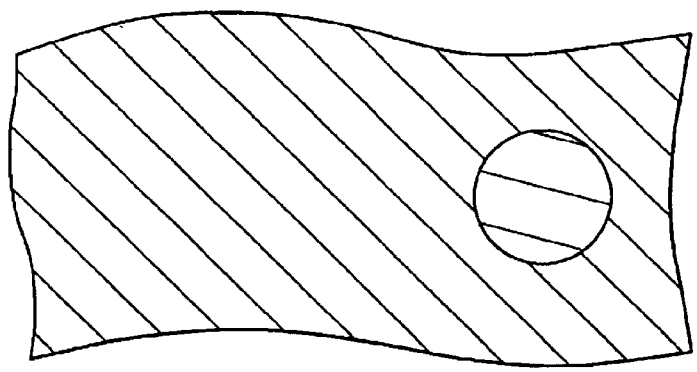

FIGS. 13G, 14G and 15G are cross-section top and bottom views, respectively, of laminated structure 520 and contact terminal 550 after plating masks 534 and 536 are stripped.

Figure 13H:
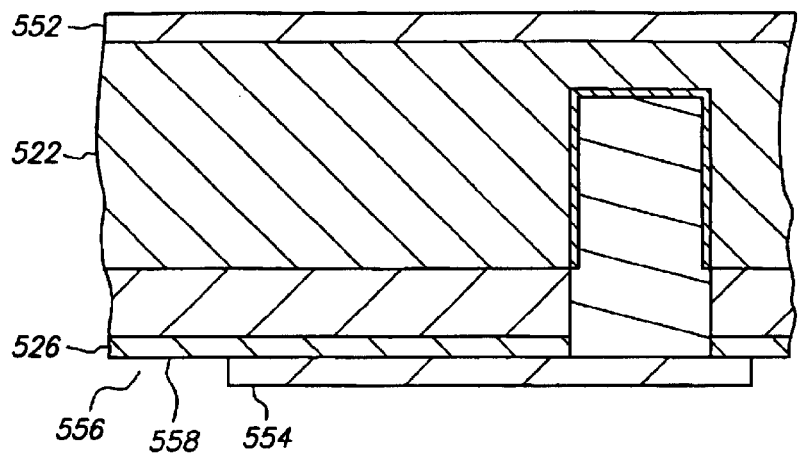
Figure 14H:
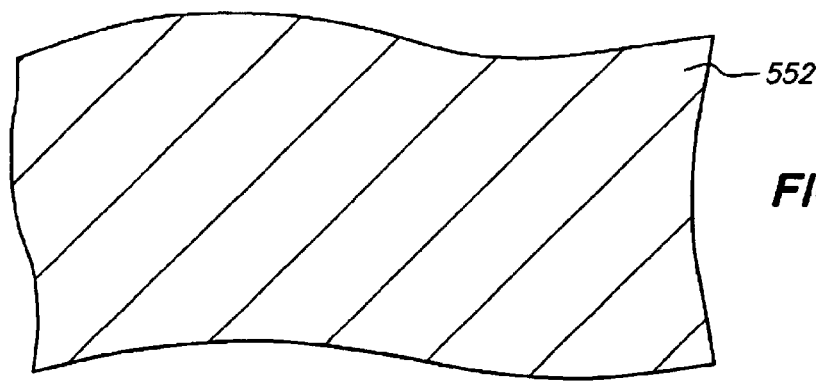
Figure 15H:
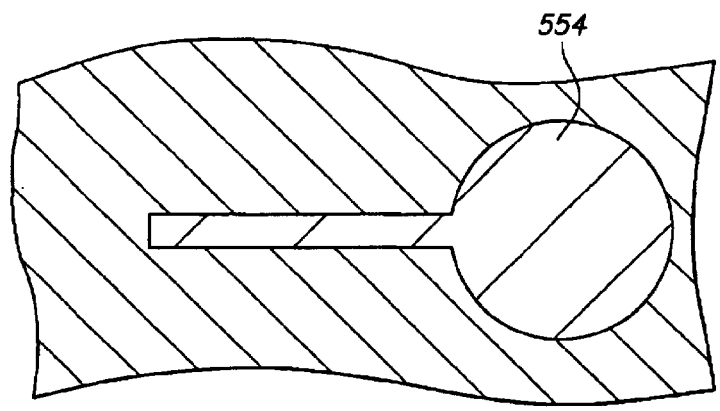

FIGS. 13H, 14H and 15H are cross-sectional, top and bottom views, respectively, of photoresist layers 552 and 554 formed on metal base 522 and metal layer 526, respectively. Photoresist layer 554 contains opening 556 that selectively exposes portion 558 of metal layer 526, and photoresist layer 552 remains unpatterned.

Figure 13I:
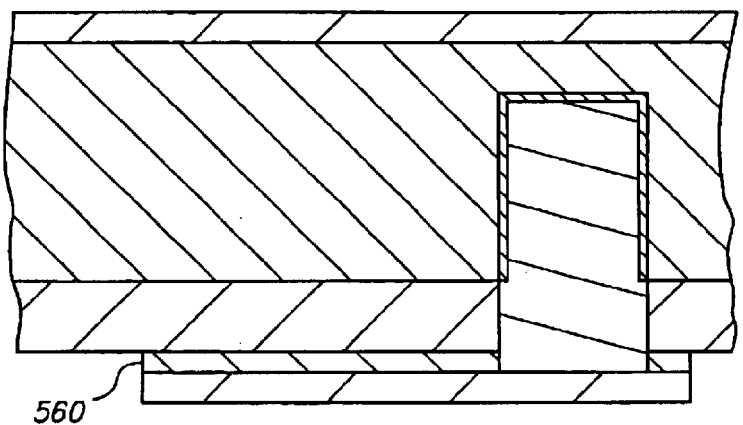
Figure 14I:
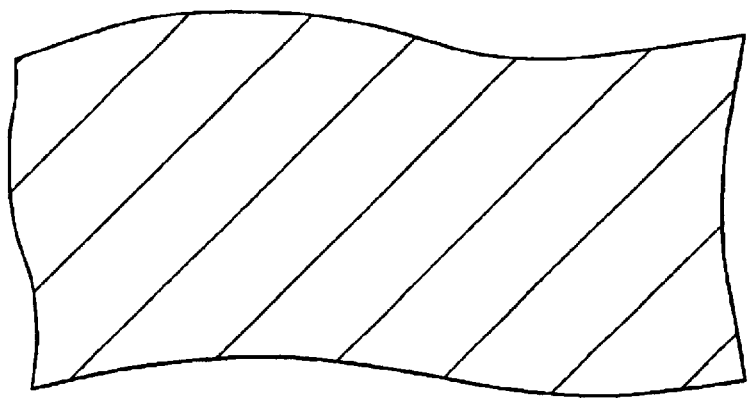
Figure 15I:
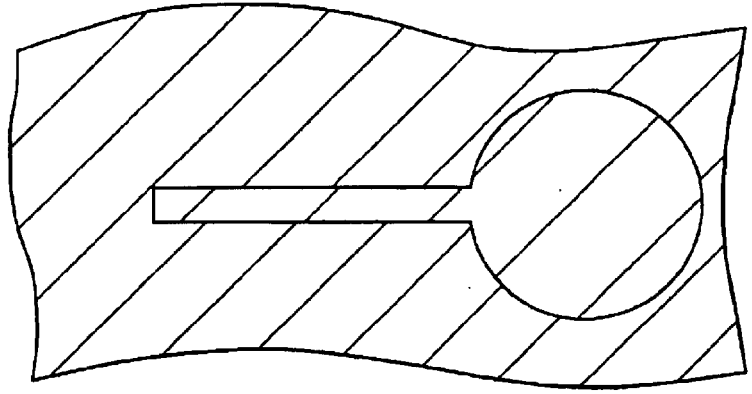

FIGS. 13I, 14I and 15I are cross-sectional, top and bottom views, respectively, of routing line 560 formed in metal layer 526 by wet chemical etching.

Figure 13J:
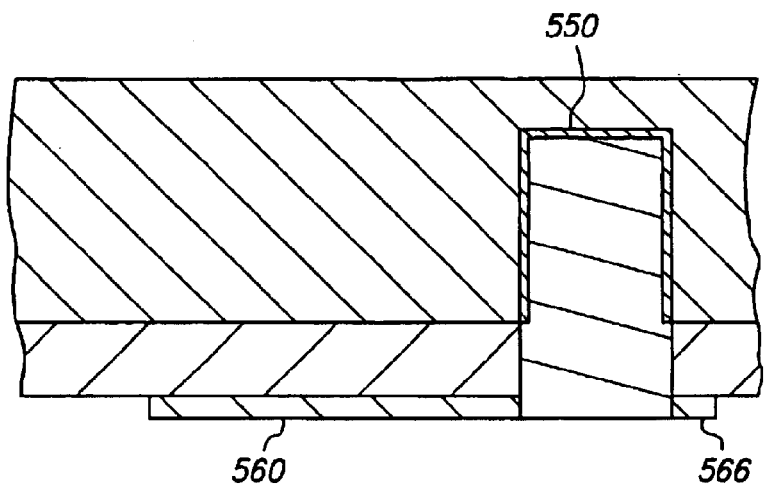
Figure 14J:
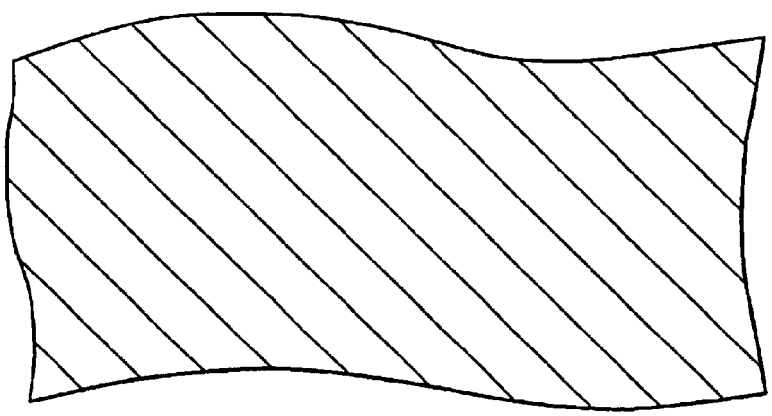
Figure 15J:
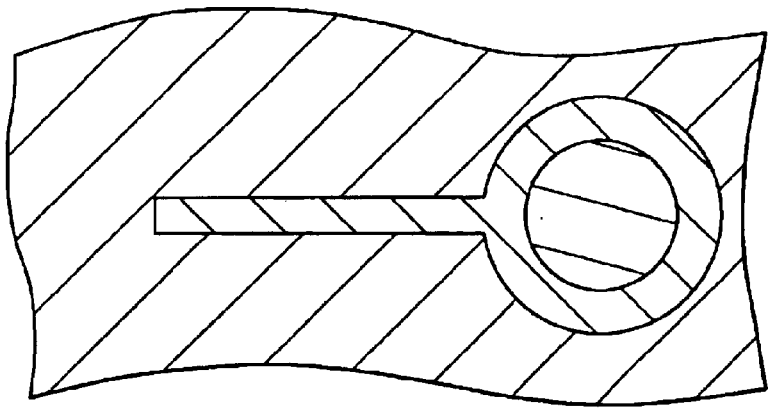

FIGS. 13J, 14J and 15J are cross-sectional, top and bottom views, respectively, of the structure after photoresist layers 552 and 554 are stripped. The combination of contact terminal 550 and routing line 560 provides conductive trace 566.

Figure 13K:
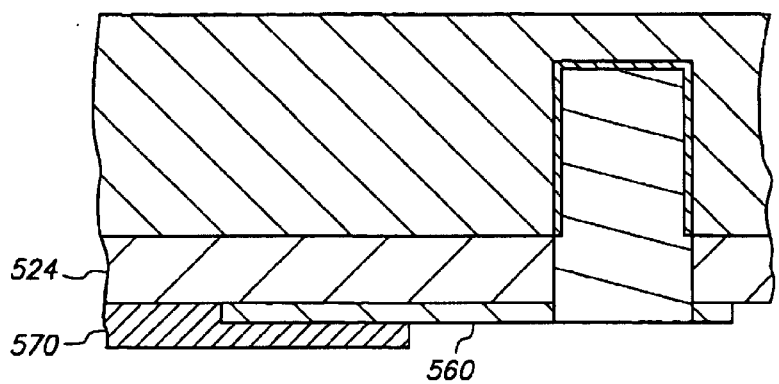
Figure 14K:
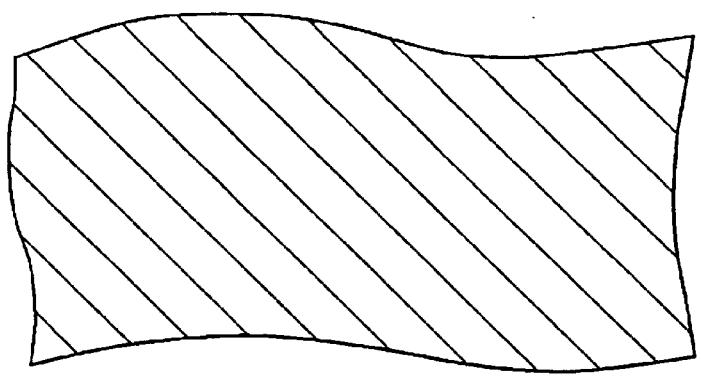
Figure 15K:
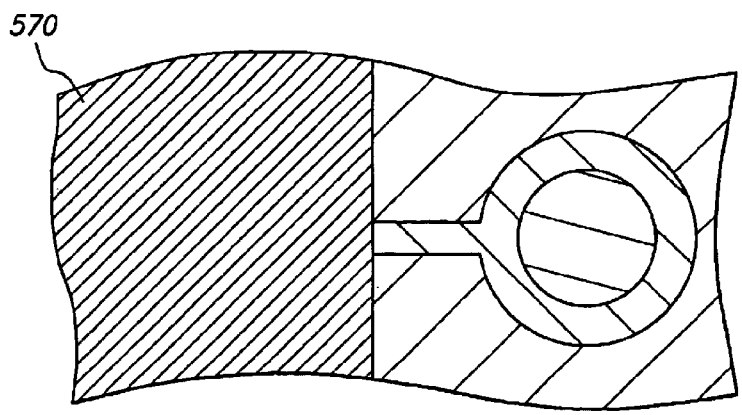

FIGS. 13K, 14K and 15K are cross-sectional top and bottom views, respectively, of adhesive 570 formed on insulative base 524 and routing line 560.

Figure 13L:
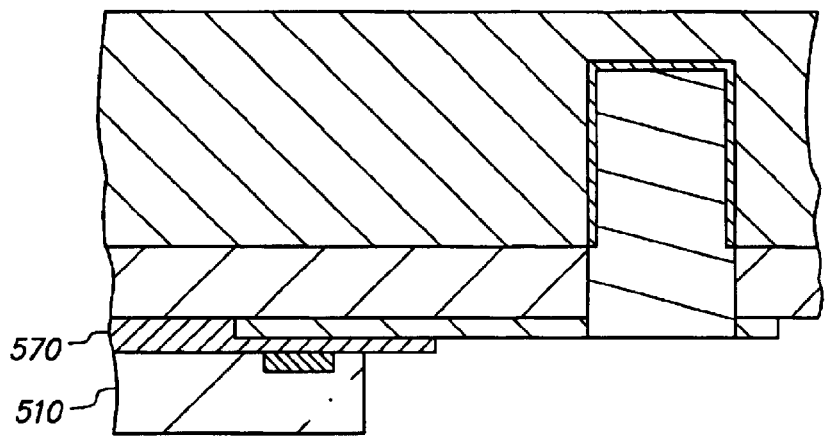
Figure 14L:
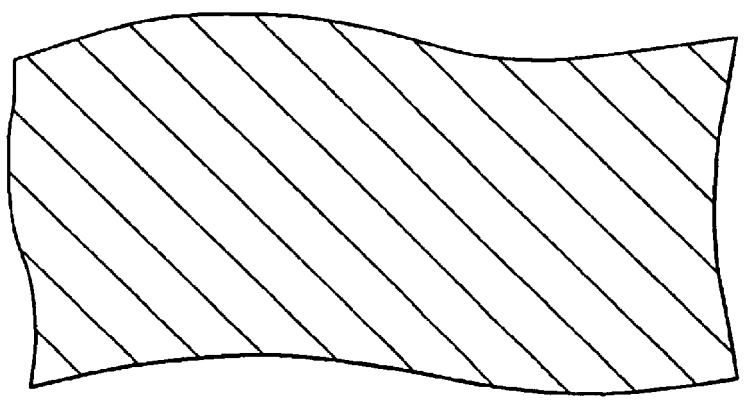
Figure 15L:
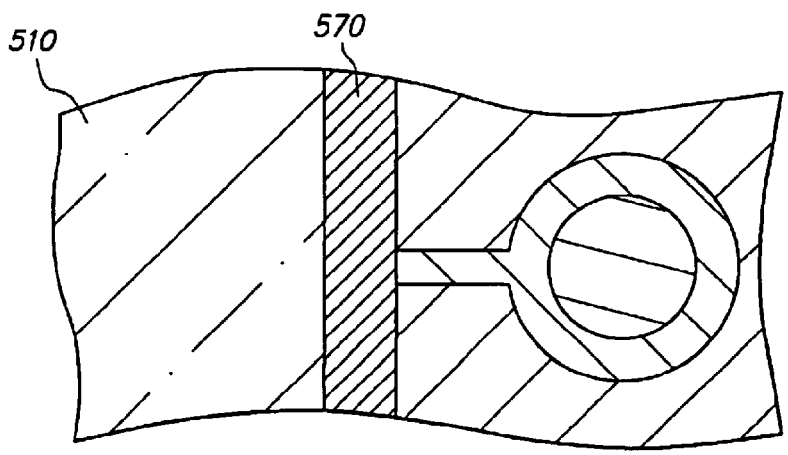

FIGS. 13L, 14L and 15L are cross-sectional, top and bottom views, respectively, of chip 510 mechanically attached to laminated structure 520 by adhesive 570.

Figure 13M:
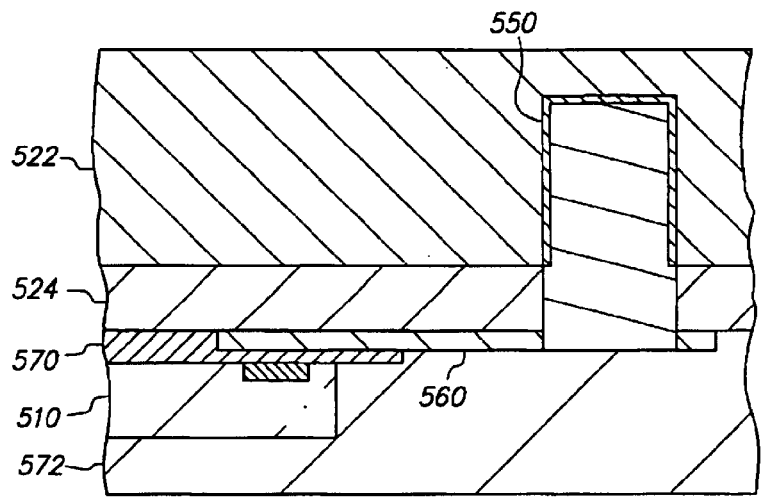
Figure 14M:
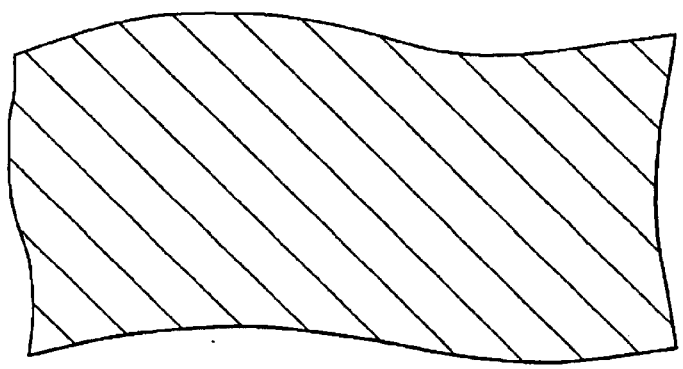
Figure 15M:
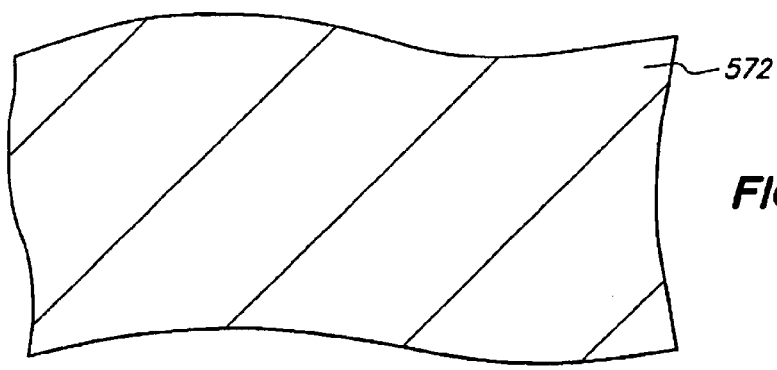

FIGS. 13M, 14M and 15M are cross-sectional, top and bottom views, respectively, of encapsulant 572 formed on chip 510, insulative base 524, contact terminal 550, routing line 560 and adhesive 570 by transfer molding. Since contact terminal 550 does not contain a central bore, encapsulant 572 does not extend through metal base 522, insulative base 524 or routing line 560, nor does encapsulant 572 contact metal base 522 or plated metal 544. As a result, encapsulant 572 does not contact or cover the distal end or a peripheral sidewall portion of contact terminal 550. Also, since contact terminal 550 does not extend to surface 530 of metal base 522, the upper mold section does not include a recess aligned with via 540.

Figure 13N:
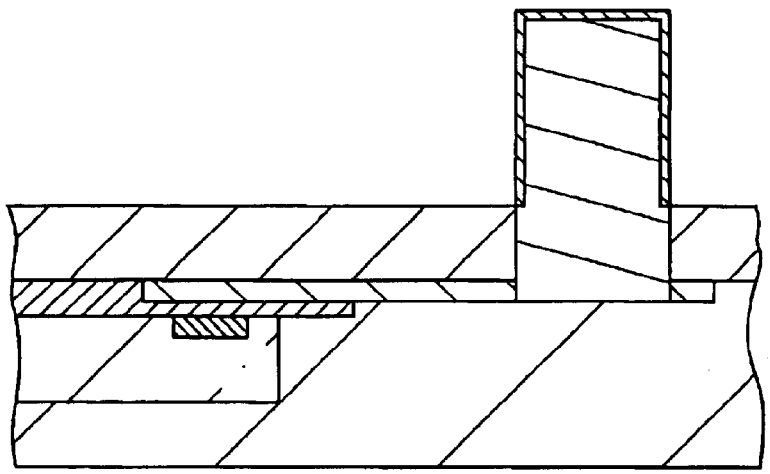
Figure 14N:
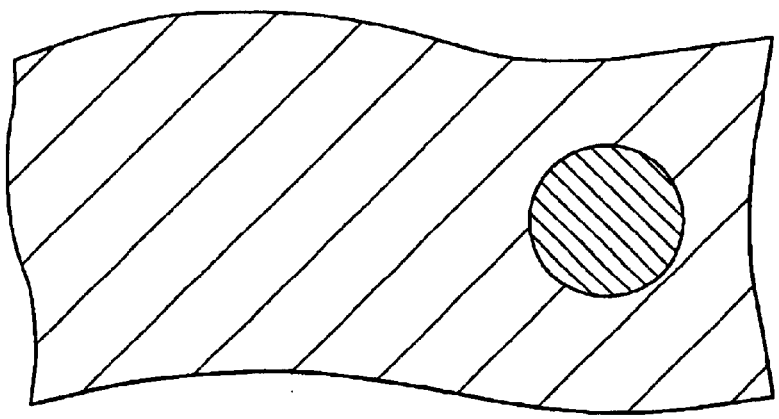
Figure 15N:
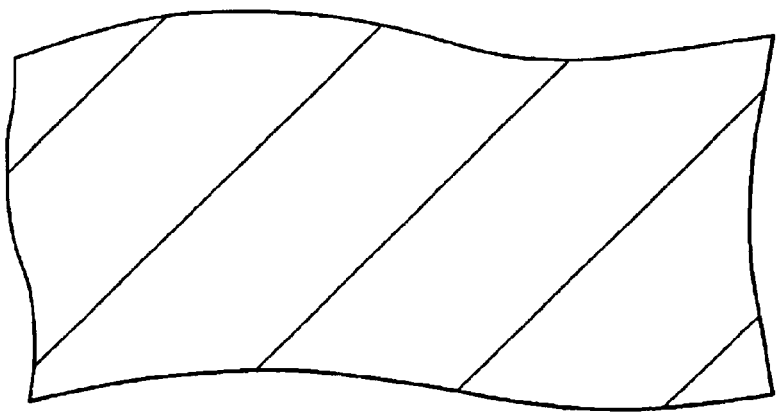

FIGS. 13N, 14N and 15N are cross-sectional, top and bottom views, respectively, of the structure after metal base 522 is removed by wet chemical etching.

Figure 13O:
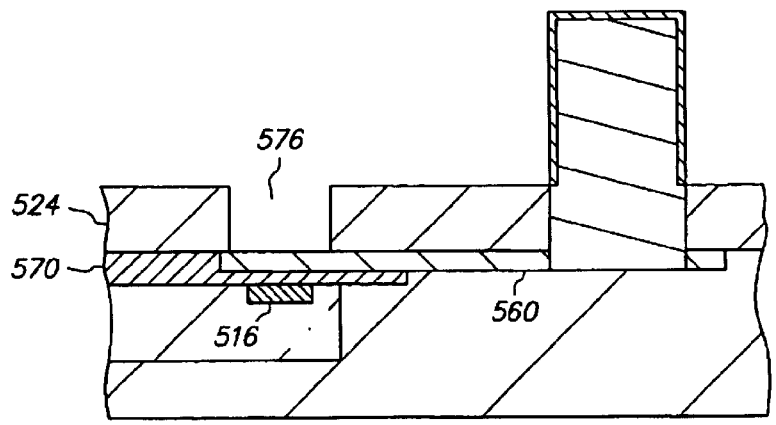
Figure 14O:
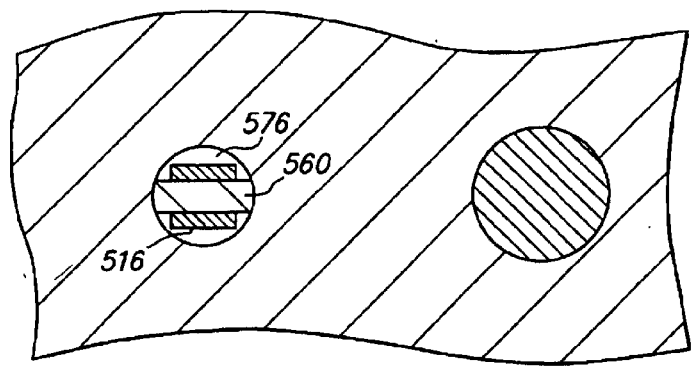
Figure 15O:
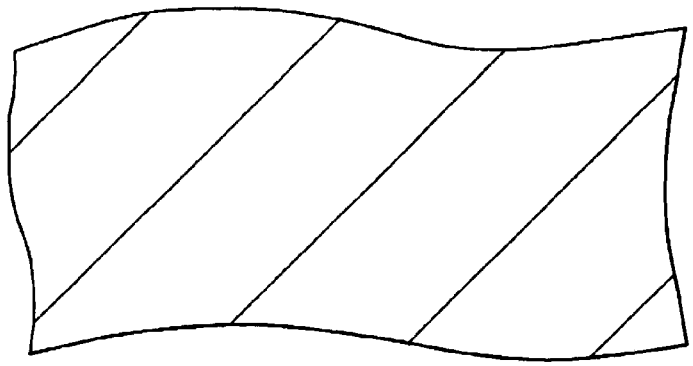

FIGS. 13O, 14O and 15O are cross-sectional, top and bottom views, respectively, of the structure after portions of insulative base 524 and adhesive 570 are selectively removed to form through-hole 576 in insulative base 524 and adhesive 570 that exposes pad 516 and routing line 560.

Figure 13P:
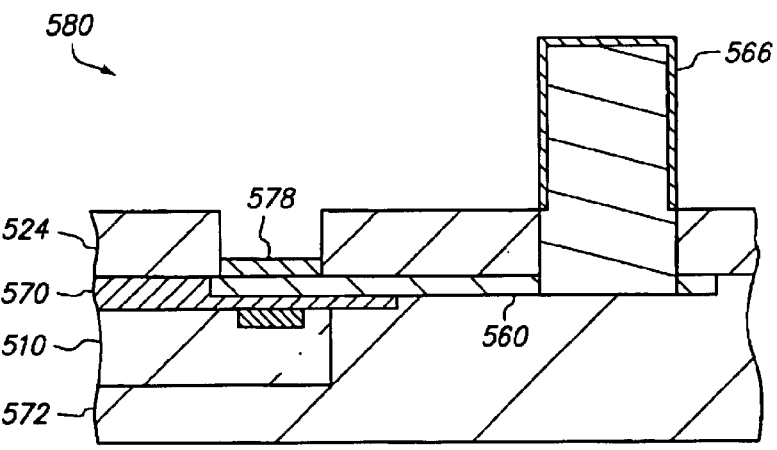
Figure 14P:
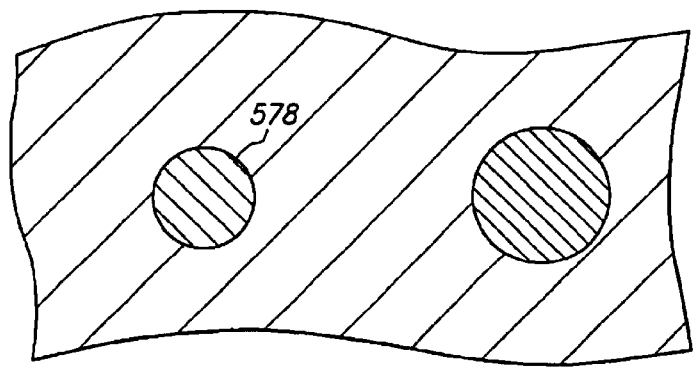
Figure 15P:
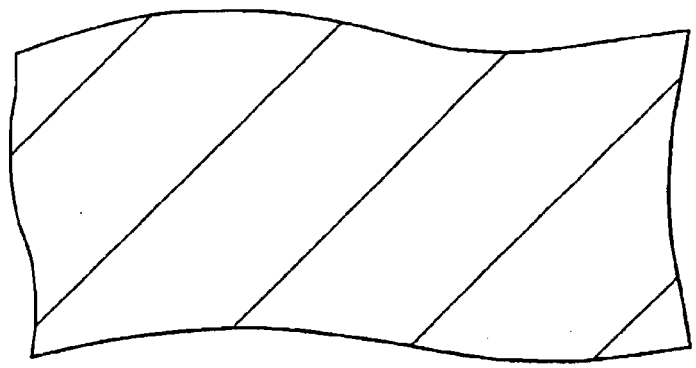

FIGS. 13P, 14P and 15P are cross-sectional, top and bottom views, respectively, of connection joint 578 formed on pad 516 and routing line 560.

At this stage, the manufacture of semiconductor chip assembly 580 that includes chip 510, insulative base 524, conductive trace 566, adhesive 570, encapsulant 572 and connection joint 578 can be considered complete.

FIGS. 16E–16F, 17E–17F and 18E–18F are cross-sectional, top and bottom views, respectively, of a method of making a semiconductor chip assembly in accordance with a sixth embodiment of the present invention. In the sixth embodiment, the via extends into but not through the metal base, the plated metal is initially deposited on the metal base and the metal layer, and the contact terminal includes the plated metal and the conductive adhesive. For purposes of brevity, any description in the first, fourth and fifth embodiments is incorporated herein insofar as the same is applicable, and the same description need not be repeated. Likewise, elements of the sixth embodiment similar to those in the first, fourth and fifth embodiments and shown in separate figures from the first, fourth and fifth embodiments have corresponding reference numerals indexed at six-hundred rather than one-hundred, four-hundred or five-hundred. For instance, metal base 622 corresponds to metal base 122, via 640 corresponds to via 540, plated metal portions 644A and 644B correspond to plated metal portions 444A and 444B, conductive adhesive 646 corresponds to conductive adhesive 546, etc.

The six embodiment begins with the steps depicted in FIGS. 13A–13D, 14A–14D and 15A–15D, then proceeds to the steps depicted in FIGS. 16E–16F, 17E–17F and 18E–18F, then concludes with the steps depicted in FIGS. 13G–13P, 14G–14P and 15G–15P. Thus, FIGS. 16E–16F, 17E–17F and 18E–18F replace FIGS. 13E–13F, 14E–14F and 15E–15F.

Figure 16E:
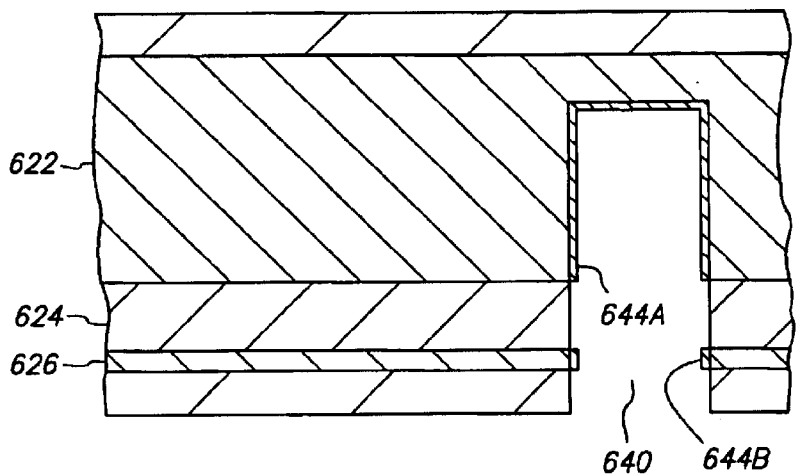
FIGS. 16E–16F are cross-sectional views showing a method of making a semiconductor chip assembly in accordance with a sixth embodiment of the present invention.
Figure 17E:
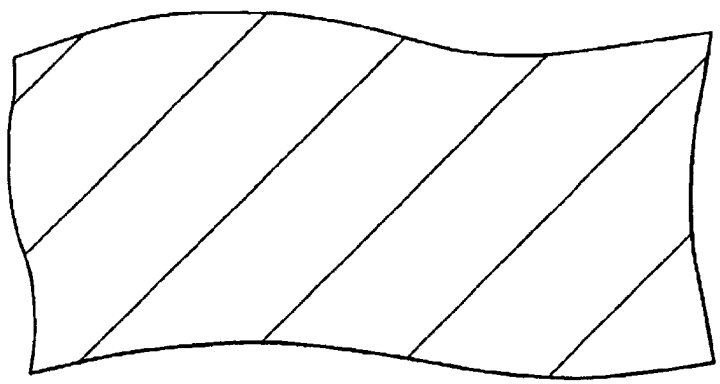
FIGS. 17E–17F are top plan views corresponding to FIGS. 16E–16F, respectively.
Figure 18E:
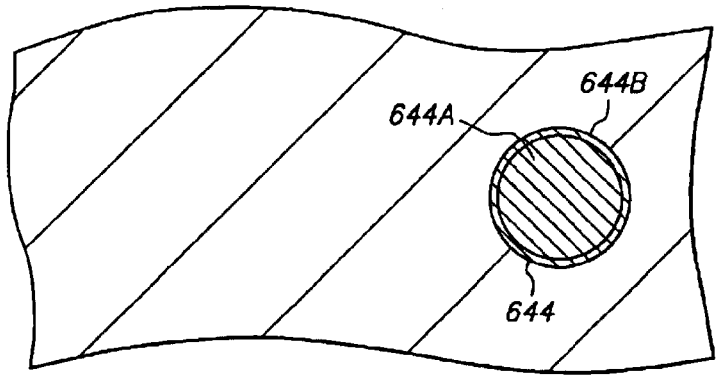
FIGS. 18E–18F are bottom plan views corresponding to FIGS. 16E–16F, respectively.

FIGS. 16E, 17E and 18E are cross-sectional, top and bottom views, respectively, of plated metal 644 formed on metal base 622 and metal layer 626 in via 640. Plated metal 644 includes a first gold layer deposited on metal base 622 and metal layer 626, a nickel layer deposited on the first gold layer, and a second gold layer deposited on the nickel layer. For convenience of illustration, the gold and nickel layers are shown as a single layer.

At this stage, plated metal 644 is deposited as plated metal portion 644A on metal base 622 in via 640 and plated metal portion 644B on metal layer 626 in via 640. However, plated metal 644 does not extend across insulative base 624, plated metal portions 644A and 644B do not contact one another, and the plating operation is finished.

Figure 16F:
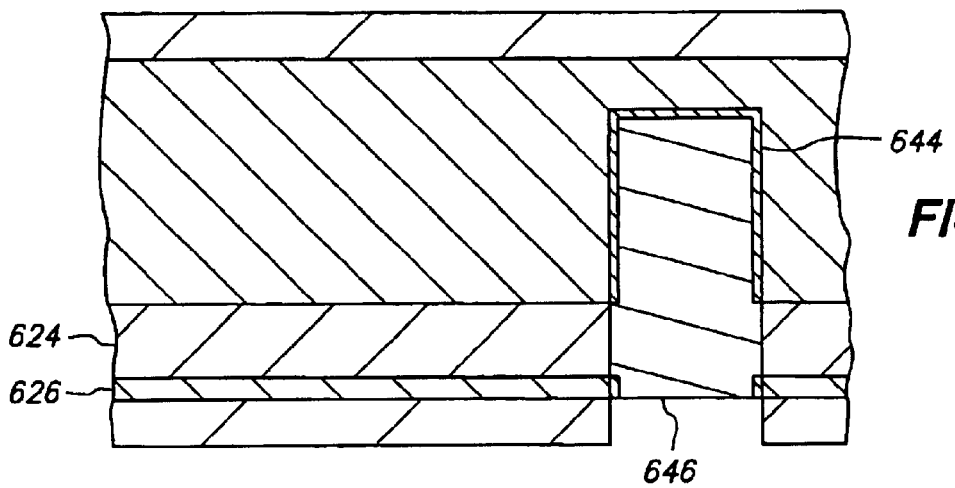
Figure 17F:
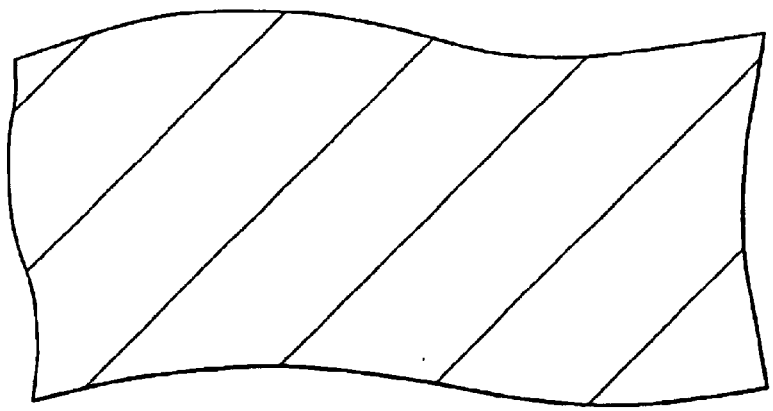
Figure 18F:
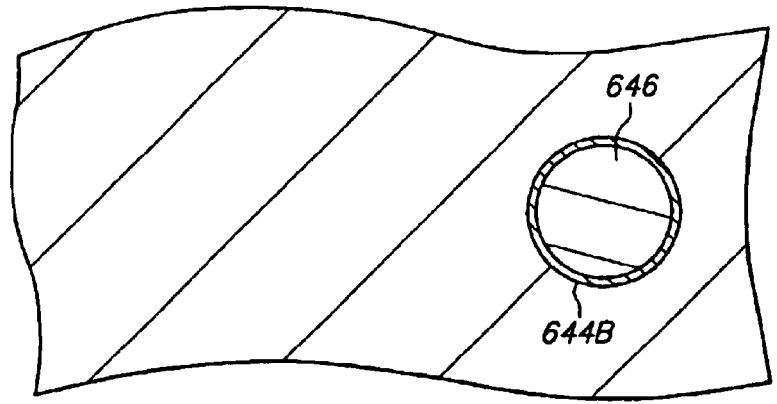

FIGS. 16F, 17F and 18F are cross-sectional, top and bottom views, respectively, of conductive adhesive 646 formed on plated metal 644 in via 640. Conductive adhesive 646 does not contact metal layer 626, and plated metal portion 644B is sandwiched between metal layer 626 and conductive adhesive 646.

Advantageously, via 640 need not be plugged before depositing conductive adhesive 646 therein, plated metal 644 need not grow across insulative base 624, and the second gold layer in plated metal portion 644B provides a better interface for conductive adhesive 646 than the copper in metal layer 626 would. However, contact terminal 650 is shorter than contact terminal 450, providing plated metal 644 and conductive adhesive 646 requires more process steps than plated metal 144 or 244 alone, and metal layer 626 is connected to the plating bus whereas metal layer 526 is not.

FIGS. 19A–19O, 20A–20O and 21A–21O are cross-sectional, top and bottom views, respectively, of a method of making a semiconductor chip assembly in accordance with a seventh embodiment of the present invention. In the seventh embodiment, the plated metal provides the contact terminal and the routing line. For purposes of brevity, any description in the first embodiment is incorporated herein insofar as the same is applicable, and the same description need not be repeated. Likewise, elements of the seventh embodiment similar to those in the first embodiment have corresponding reference numerals indexed at seven-hundred rather than one-hundred. For instance, chip 710 corresponds to chip 110, metal base 722 corresponds to metal base 122, etc.

Figure 19A:
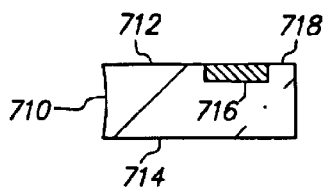
FIGS. 19A–19O are cross-sectional views showing a method of making a semiconductor chip assembly in accordance with a seventh embodiment of the present invention.
Figure 20A:
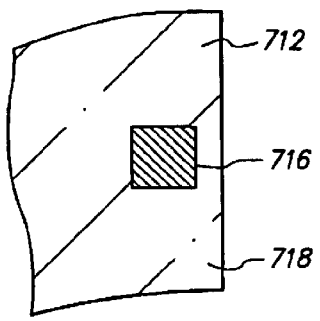
FIGS. 20A–20O are top plan views corresponding to FIGS. 19A–19O, respectively.
Figure 21A:
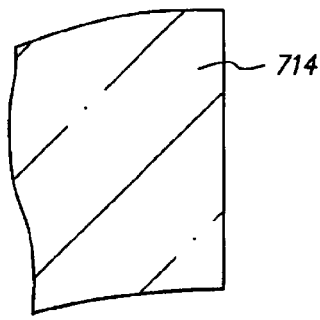
FIGS. 21A–21O are bottom plan views corresponding to FIGS. 19A–19O, respectively.

FIGS. 19A, 20A and 21A are cross-sectional, top and bottom views, respectively, of semiconductor chip 710 which includes surfaces 712 and 714. Surface 712 includes conductive pad 716 and passivation layer 718.

Figure 19B:
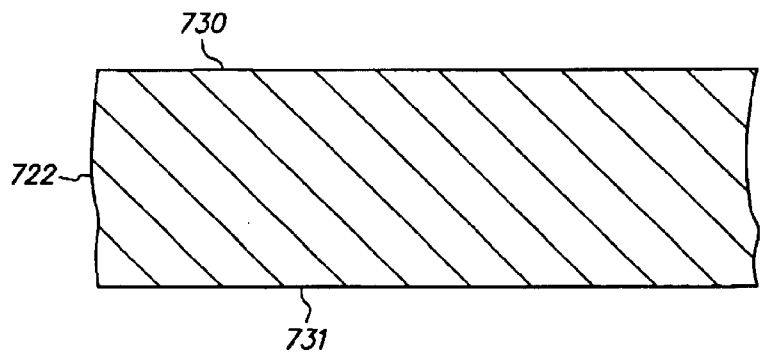
Figure 20B:
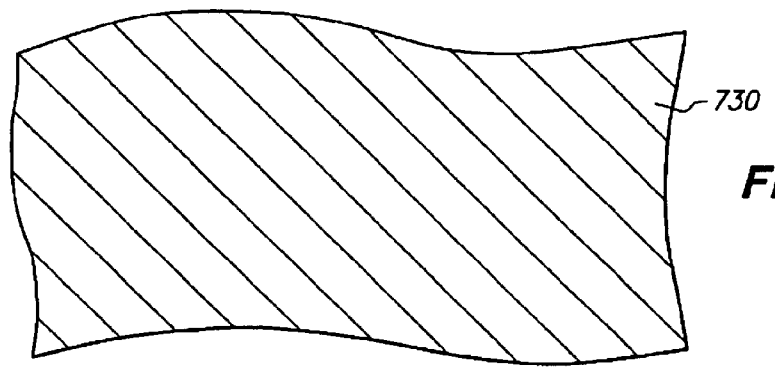
Figure 21B:
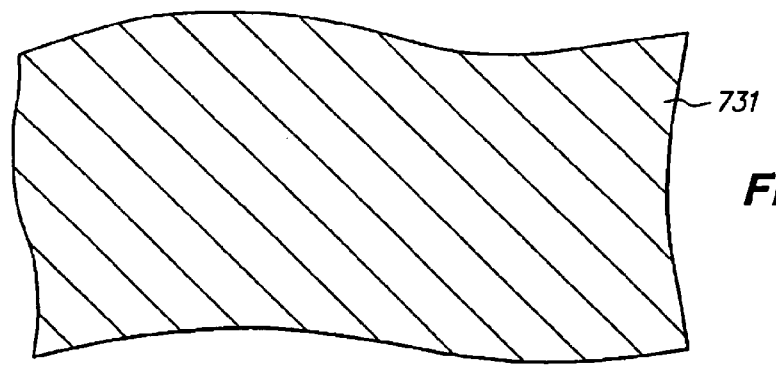

FIGS. 19B, 20B and 21B are cross-sectional, top and bottom views, respectively, of metal base 722 with opposing major surfaces 730 and 731. Metal base 722 is alone and surfaces 730 and 731 are exposed. Advantageously, a diclad laminate is not necessary. However, an insulative base will subsequently be formed which requires additional process steps.

Figure 19C:
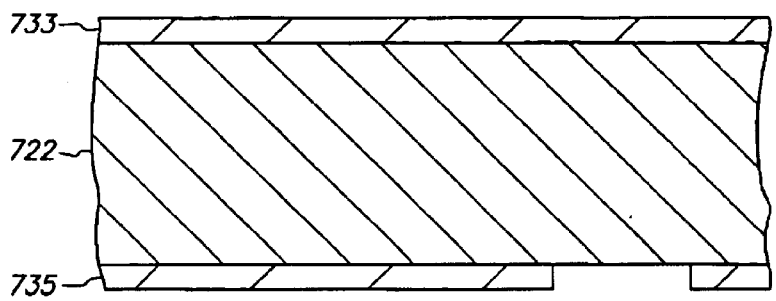
Figure 20C:
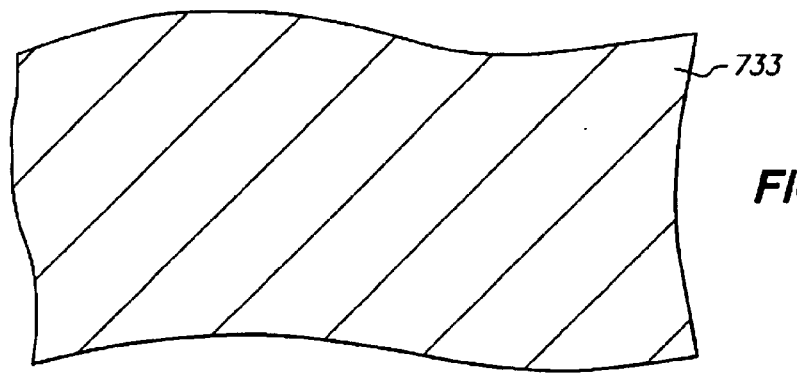
Figure 21C:
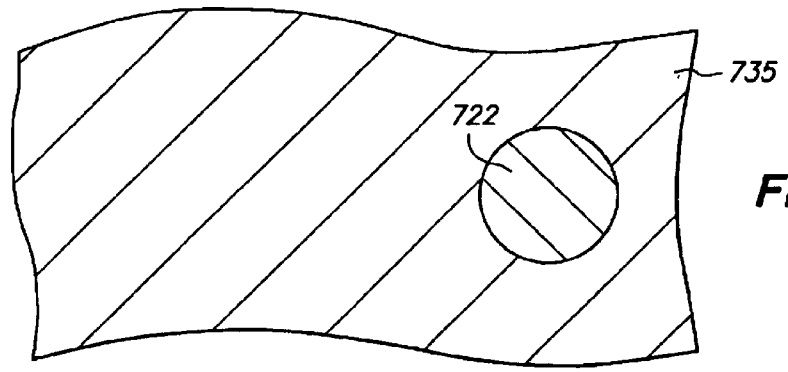

FIGS. 19C, 20C and 21C are cross-sectional, top and bottom views, respectively, of photoresist layers 733 and 735 formed on surfaces 730 and 731, respectively. Photoresist layers 733 and 735 serve as etch masks. Photoresist layers 733 and 735 are deposited using a dry film lamination process in which hot rolls simultaneously press photoresist layers 733 and 735 onto the respective surfaces. A reticle (not shown) is positioned proximate to photoresist layer 735. Thereafter, photoresist layer 735 is patterned by selectively applying light through the reticle, applying a developer solution to remove the photoresist portions rendered soluble by the light, and then hard baking, as is conventional. As a result, photoresist layer 735 contains an opening that selectively exposes a portion of metal base 722, and photoresist layer 733 remains unpatterned. Photoresist layers 733 and 735 each have a thickness of 25 microns.

Figure 19D:
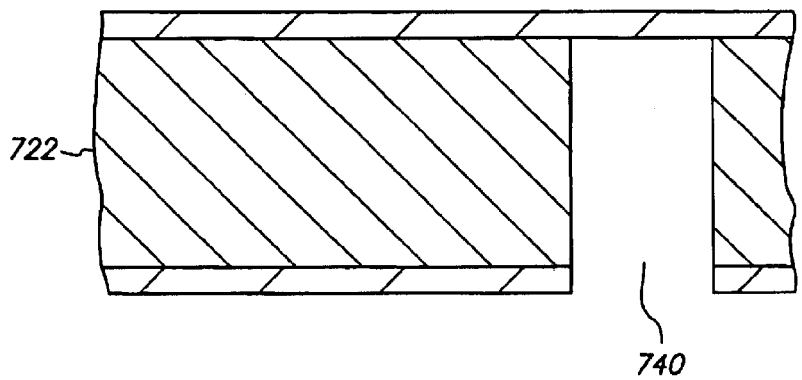
Figure 20D:
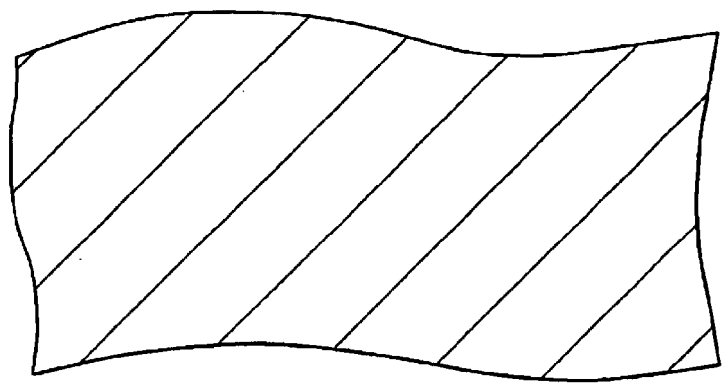
Figure 21D:
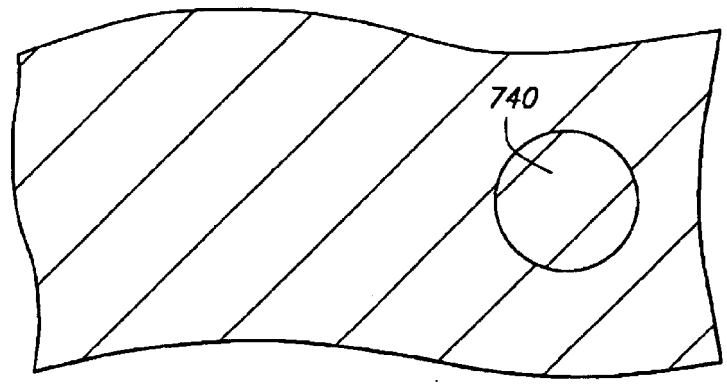

FIGS. 19D. 20D and 21D are cross-sectional, top and bottom views, respectively, of via 740 formed in metal base 722 by applying a wet chemical etch to metal base 722 using photoresist layers 733 and 735 as etch masks. The wet chemical etch etches completely through metal base 722, thereby effecting a pattern transfer of photoresist layer 735 onto metal base 722. Thus, via 740 extends through metal base 722. Via 740 has a diameter of about 300 microns. A suitable wet chemical etch can be provided by the same solution used for etching metal layer 126 to form routing line 160. The optimal etch time for exposing metal base 722 to the wet chemical etch in order to form via 740 with the desired dimensions can be established through trial and error. Via 740 includes tapered sidewalls that slant inwardly as the vertical distance from the open end increases due to the isotropic nature of the wet chemical etch. For convenience of illustration, the taper is not shown.

FIGS. 19E, 20E and 21E are cross-sectional, top and bottom views, respectively, of the structure after photoresist layers 733 and 735 are stripped.

Figure 19F:
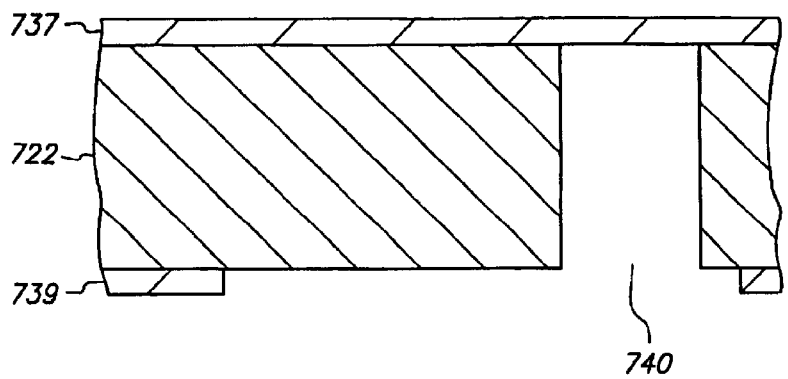
Figure 20F:
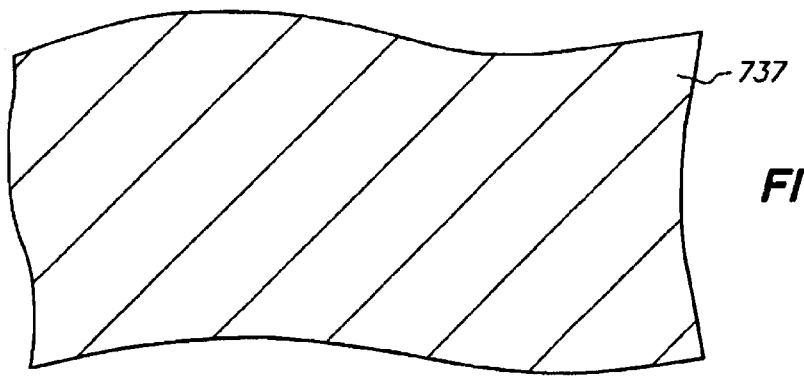
Figure 21F:
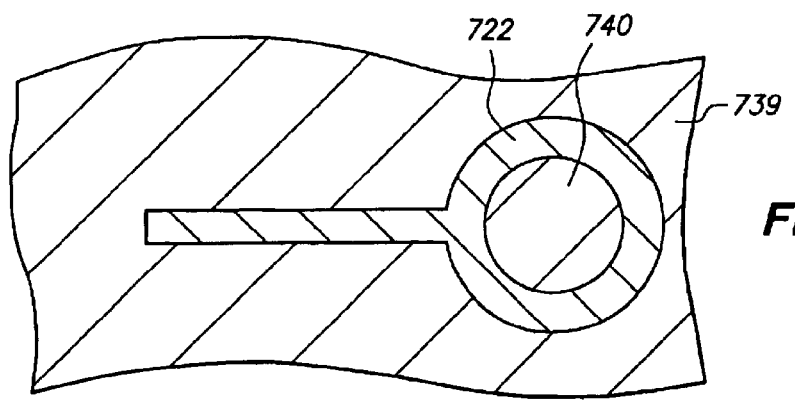

FIGS. 19F, 20F and 21F are cross-sectional, top and bottom views, respectively, of photoresist layers 737 and 739 formed on surfaces 730 and 731, respectively. Photoresist layers 737 and 739 serve as plating masks. Photoresist layers 737 and 739 are deposited using a dry film lamination process in which hot rolls simultaneously press photoresist layers 737 and 739 onto the respective surfaces. A reticle (not shown) is positioned proximate to photoresist layer 739 using via 740 as a registration point so that the reticle can be precisely located. Thereafter, photoresist layer 739 is patterned by selectively applying light through the reticle, applying a developer solution to remove the photoresist portions rendered soluble by the light, and then hard baking, as is conventional. As a result, photoresist layer 739 contains an opening that selectively exposes a portion of metal base 722 and via 740, and photoresist layer 737 remains unpatterned. Photoresist layers 737 and 739 each have a thickness of 25 microns.

Figure 19G:
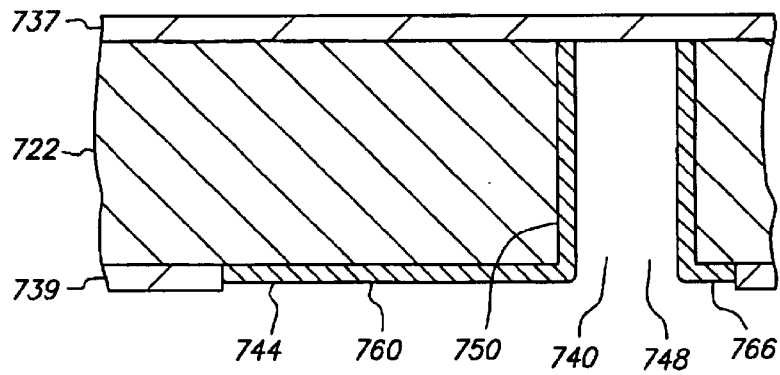
Figure 20G:
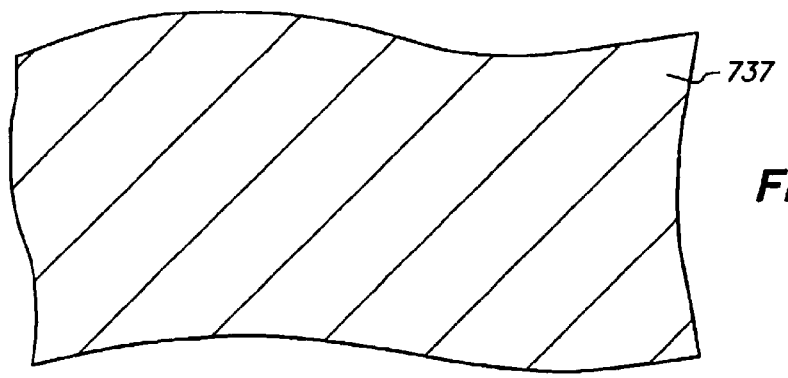
Figure 21G:
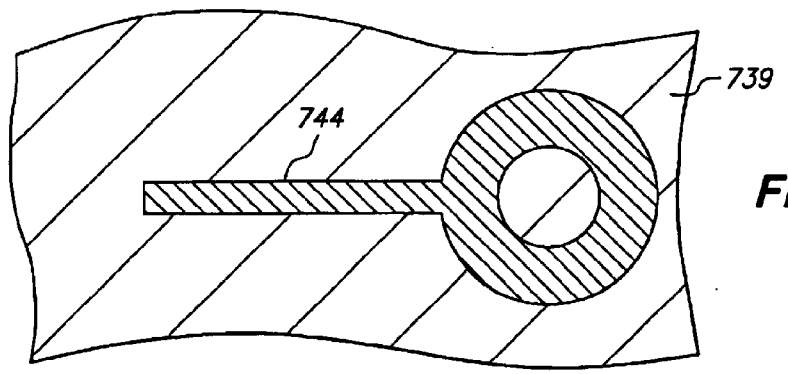

FIGS. 19G, 20G and 21G are cross-sectional, top and bottom views, respectively, of plated metal 744 formed on metal base 722 in and outside of via 740. Plated metal 744 includes a gold layer deposited on metal base 722, and a nickel layer deposited on the gold layer. The gold layer is 0.2 microns thick and the nickel layer is 10 microns thick. For convenience of illustration, the gold and nickel layers are shown as a single layer.

Plated metal 744 is formed by an electroplating operation. Initially, metal base 722 is connected to a plating bus (not shown), current is applied to the plating bus from an external power source, and the structure is submerged in an electrolytic gold plating solution such as Technic Orotenp at room temperature to electroplate the gold layer on metal base 722. Thereafter, the structure is removed from the electrolytic gold plating solution and submerged in an electrolytic nickel plating solution such as Technic Techni Nickel "S" at room temperature while current is applied to the plating bus to electroplate the nickel layer on the gold layer. Thereafter, the structure is removed from the electrolytic nickel plating solution and rinsed in distilled water to remove contaminants.

Plated metal 744 is aligned with surface 730 of metal base 722. That is, photoresist layer 737 plugs via 740 at surface 730 which prevents plated metal 744 from protruding beyond surface 730. Plated metal 744 defines central bore 748 that includes the remaining space in via 740, and plated metal 744 surrounds a central surface area without extending into the central surface area.

Plated metal 744 provides both contact terminal 750 and routing line 760. That is, the portion of plated metal 744 inside via 740 provides contact terminal 750, and the portion of plated metal 744 outside via 740 provides routing line 760. Therefore, contact terminal 750 and routing line 760 are formed additively and are integral with one another. The combination of contact terminal 750 and routing line 760 provides conductive trace 766.

Advantageously, plated metal 744 need not grow across an insulative base. However, an insulative base will subsequently be formed which requires additional process steps.

Figure 19H:
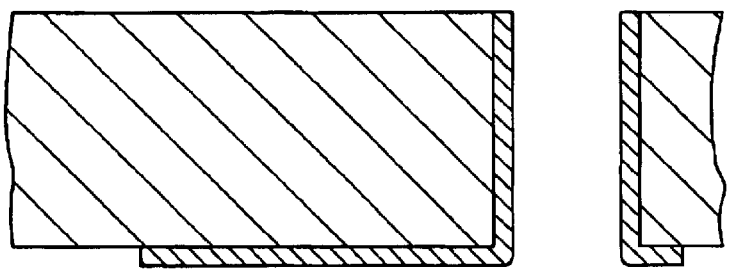
Figure 20H:
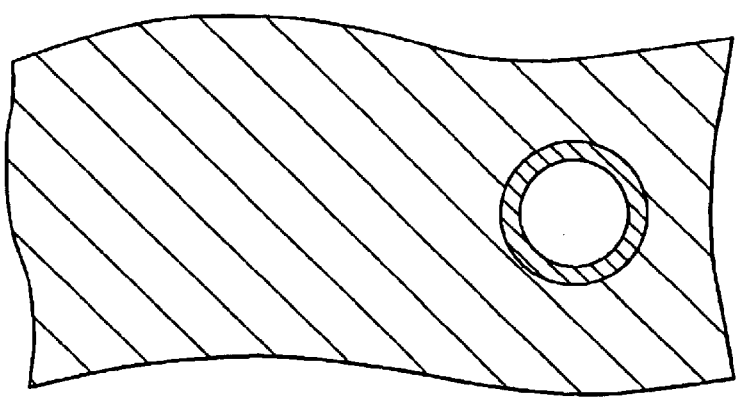
Figure 21H:
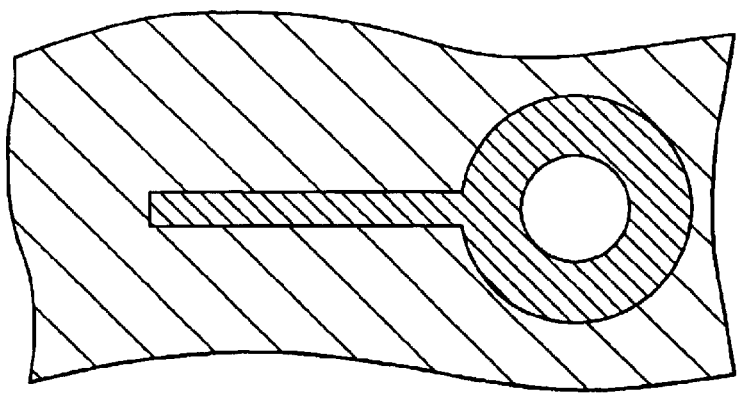

FIGS. 19H, 20H and 21H are cross-sectional, top and bottom views, respectively, of the structure after photoresist layers 737 and 739 are stripped.

Figure 19I:
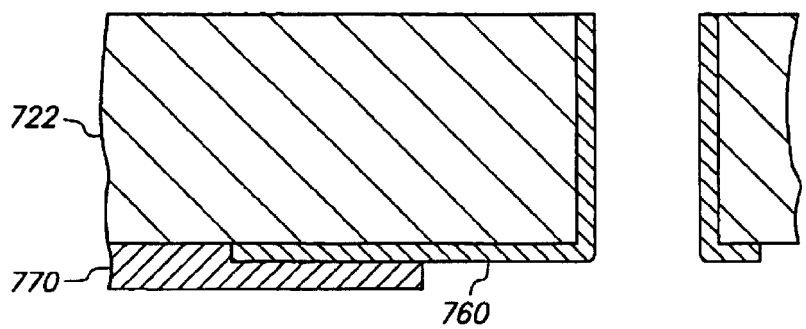
Figure 20I:
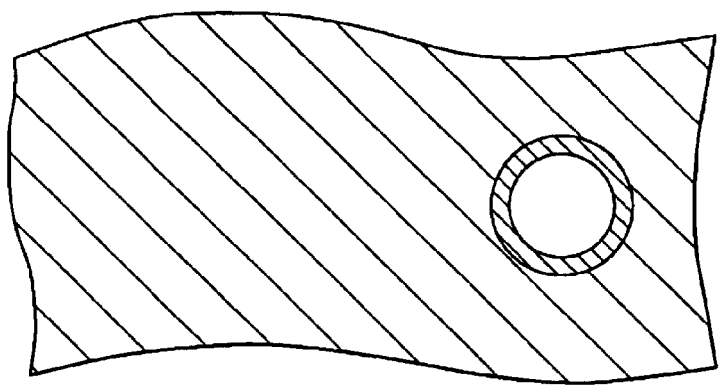
Figure 21I:
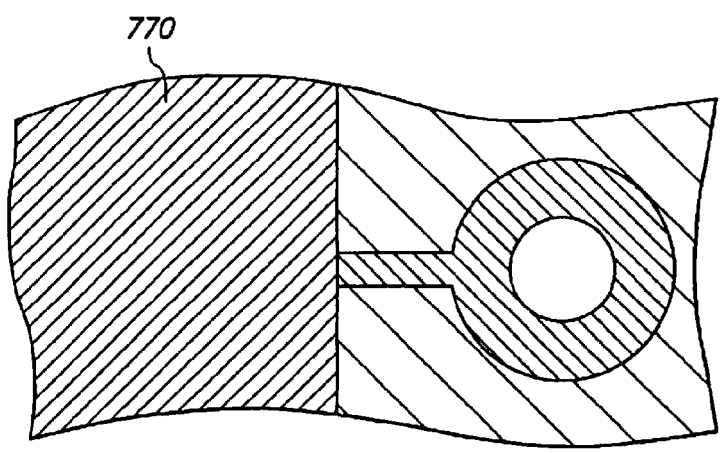

FIGS. 19I, 20I and 21I are cross-sectional, top and bottom views, respectively, of adhesive 770 formed on metal base 722 and routing line 760.

Figure 19J:
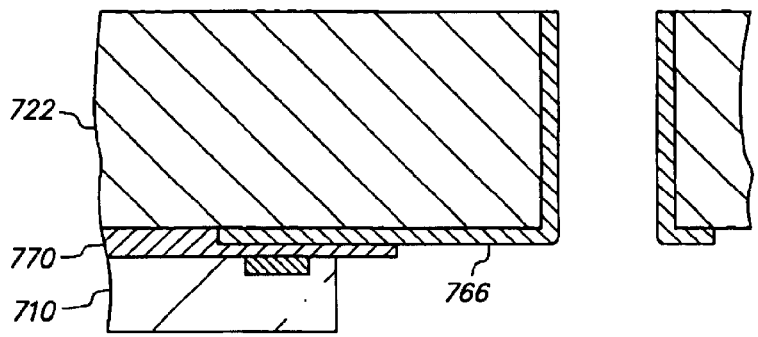
Figure 20J:
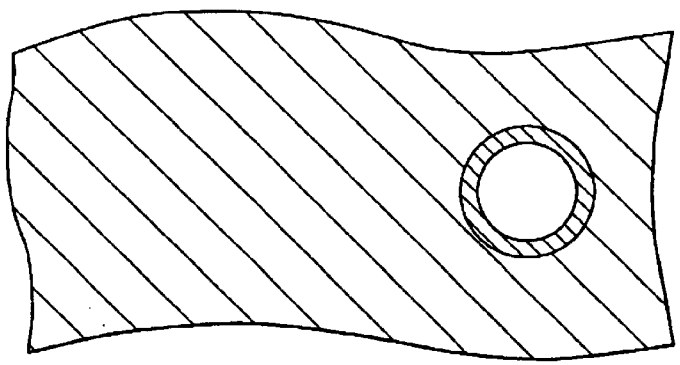
Figure 21J:
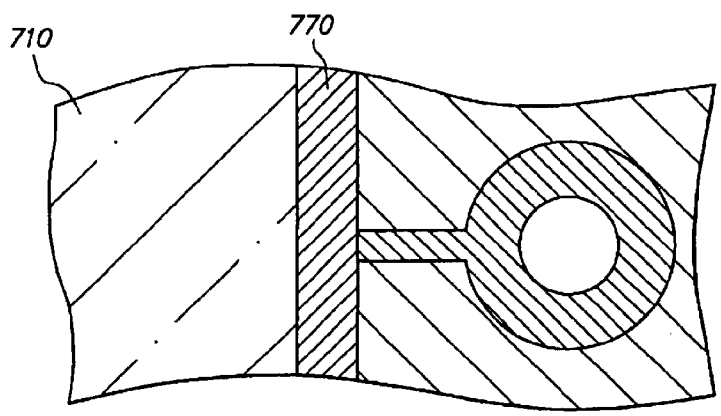

FIGS. 19J, 20J and 21J are cross-sectional, top and bottom views, respectively, of chip 710 mechanically attached to metal base 722 and conductive trace 766 by adhesive 770.

Figure 19K:
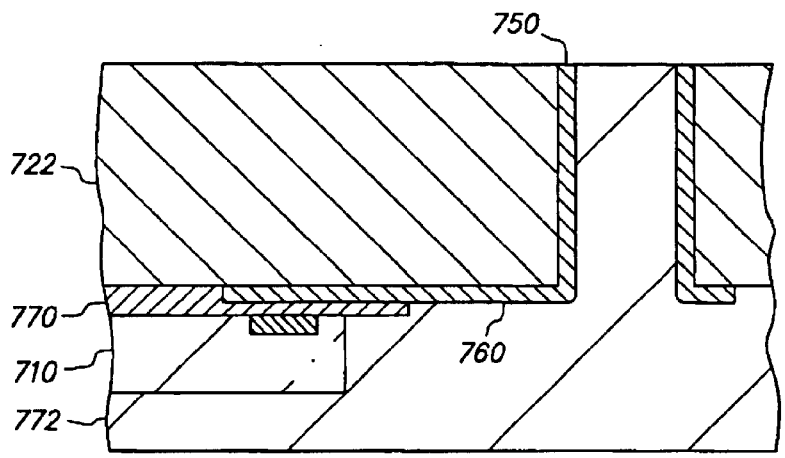
Figure 20K:
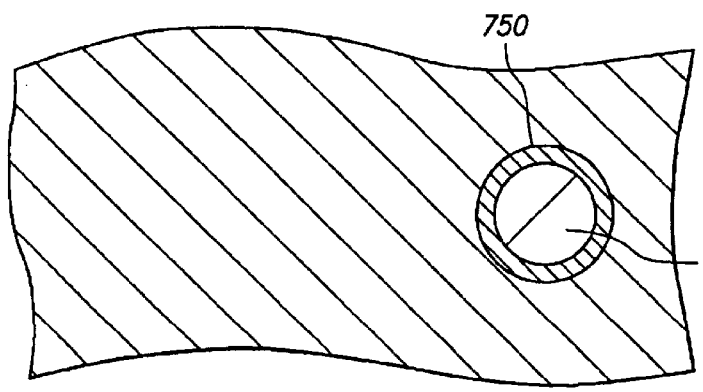
Figure 21K:
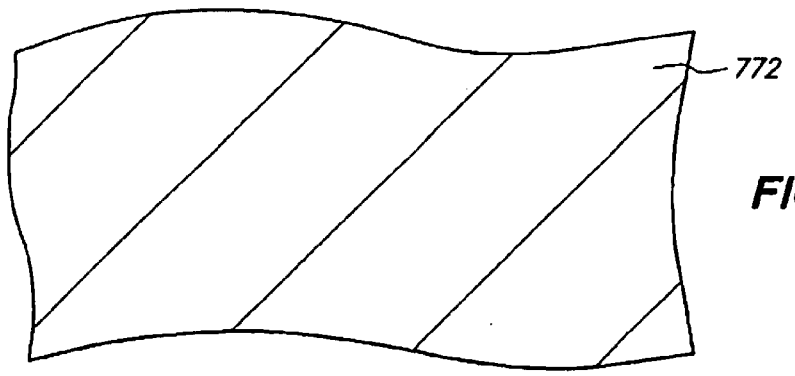

FIGS. 19K, 20K and 21K are cross-sectional, top and bottom views, respectively, of encapsulant 772 formed on chip 710, metal base 722, contact terminal 750, routing line 760 and adhesive 770 by transfer molding. Since contact terminal 750 is aligned with surface 730 of metal base 722, the upper mold section does not include a recess aligned with via 740. As a result, contact terminal 750 and encapsulant 772 are aligned with surface 730 of metal base 722. Encapsulant 772 is concentrically disposed within and aligned with the exposed distal end of contact terminal 750 that faces away from chip 710, and encapsulant 772 does not contact or cover the distal end or a peripheral sidewall portion of contact terminal 750.

Advantageously, the exposed distal end of contact terminal 750 may enhance solder reflow during the next level assembly.

Figure 19L:
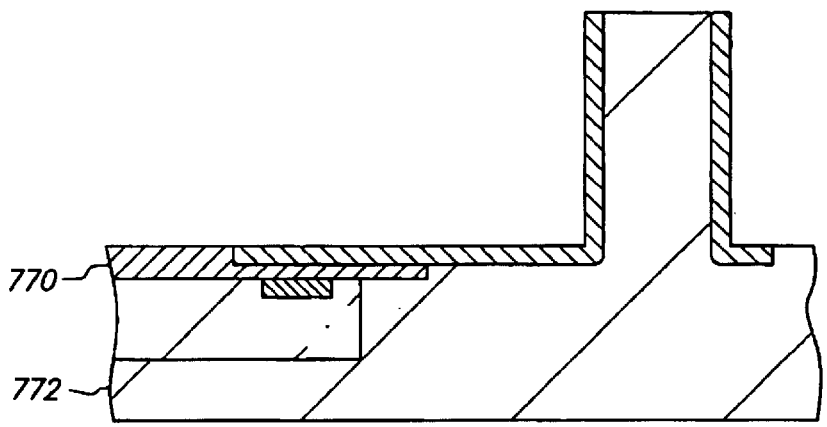
Figure 20L:
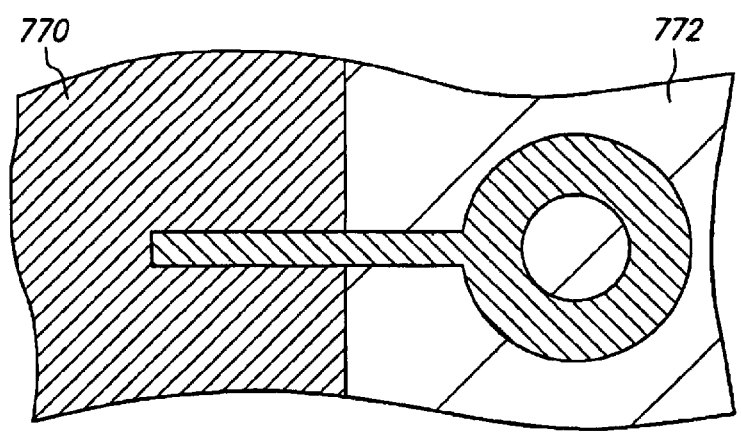
Figure 21L:
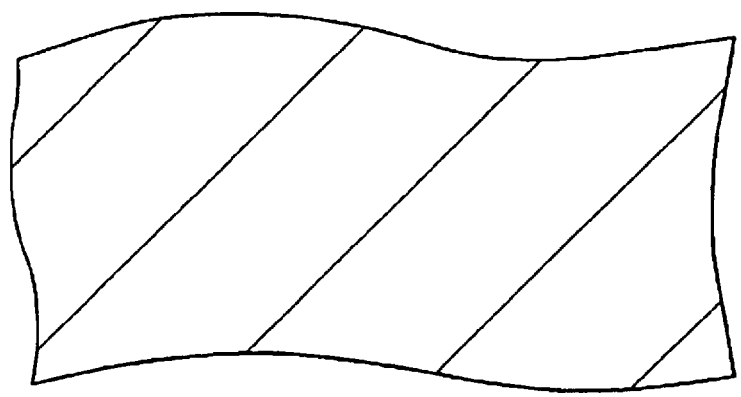

FIGS. 19L, 20L and 21L are cross-sectional, top and bottom views, respectively, of the structure after metal base 722 is removed by wet chemical etching.

Figure 19M:
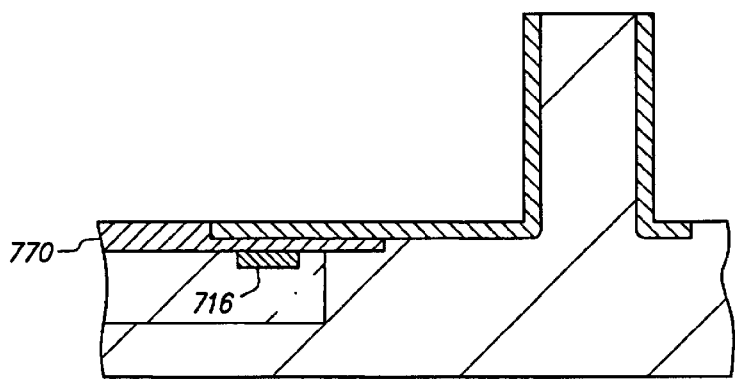
Figure 20M:
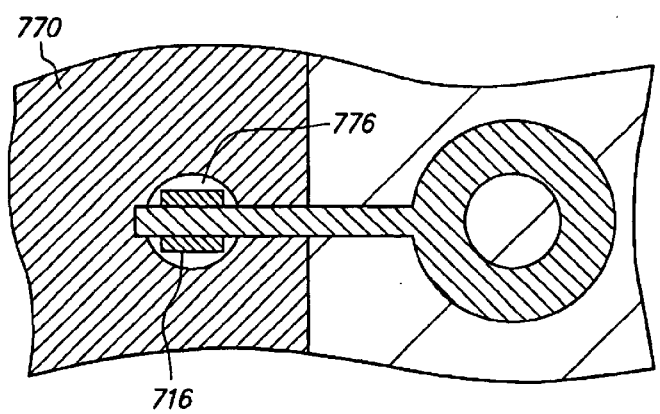
Figure 21M:
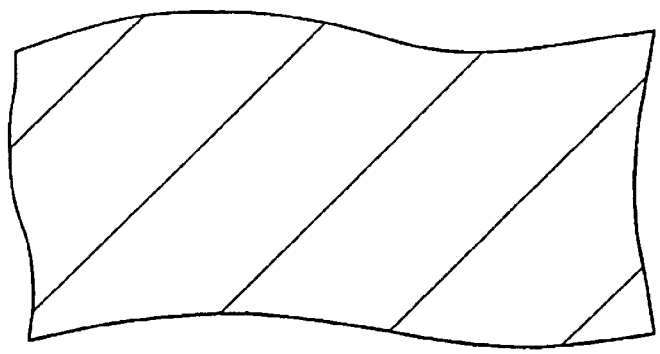

FIGS. 19M, 20M and 21M are cross-sectional, top and bottom views, respectively, of the structure after a portion of adhesive 770 is selectively removed to form through-hole 776 in adhesive 770 that exposes pad 716.

Figure 19N:
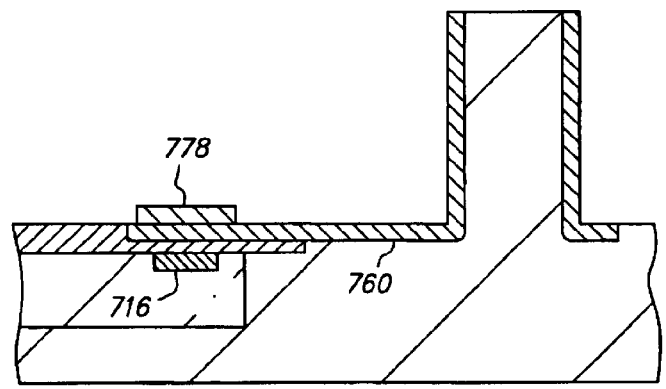
Figure 20N:
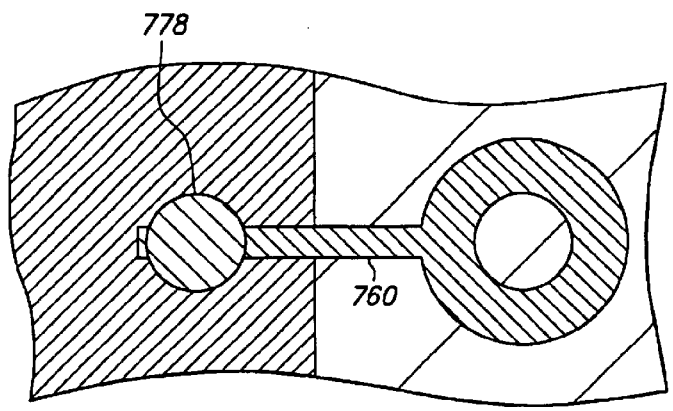
Figure 21N:
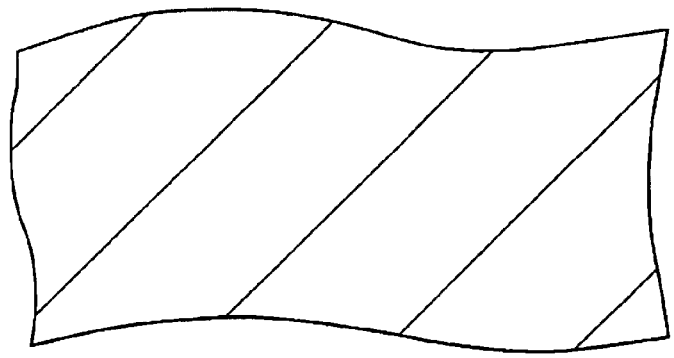

FIGS. 19N, 20N and 21N are cross-sectional, top and bottom views, respectively, of connection joint 778 formed on pad 716 and routing line 760.

Figure 19O:
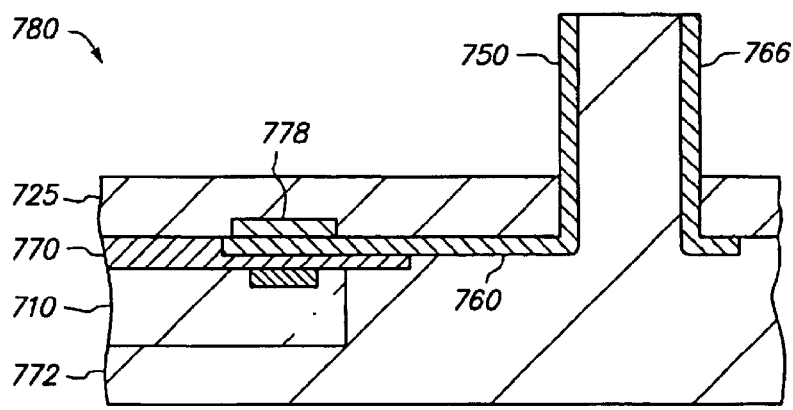
Figure 20O:
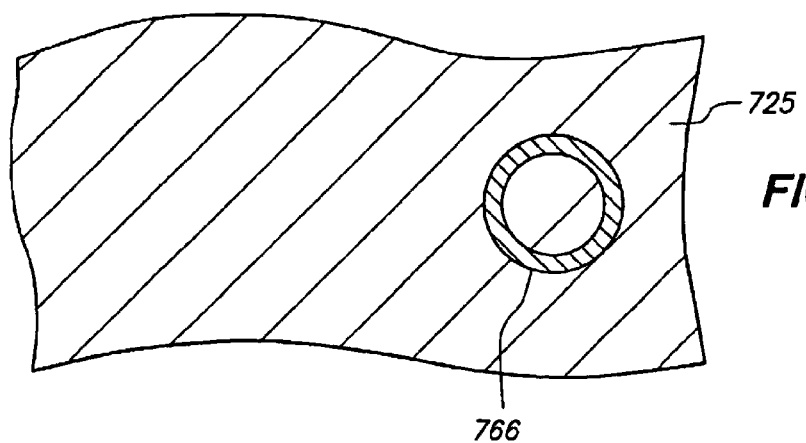
Figure 21O:
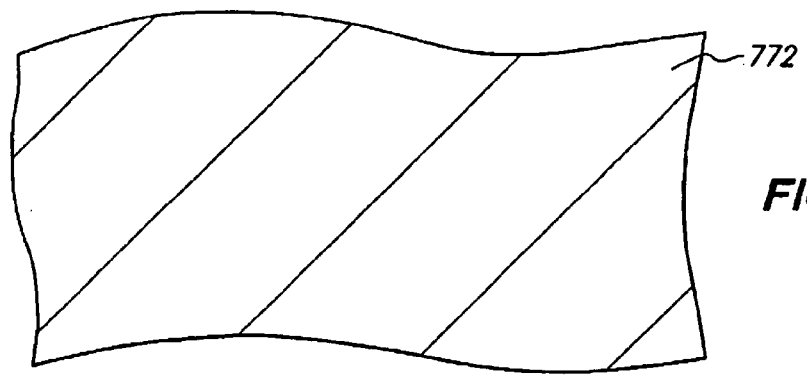

FIGS. 19O, 20O and 21O are cross-sectional, top and bottom views, respectively, of insulative base 725 formed on chip 710, conductive trace 766, adhesive 770, encapsulant 772 and connection joint 778. Insulative base 725 is relatively flat and has a thickness of 50 microns.

Although insulative base 725 covers routing line 760, adhesive 770, encapsulant 772 and connection joint 778 and a lower portion of contact terminal 750, an upper portion of contact terminal 750 protrudes from insulative base 725 in the direction away from chip 710.

Preferably, insulative base 725 is initially an epoxy in paste form that includes an epoxy resin, a curing agent, an accelerator and a filler. The filler is an inert material, such as silica (powdered fused quartz), that improves thermal conductivity, thermal shock resistance, and thermal coefficient of expansion matching. The epoxy paste is selectively coated over routing line 760, adhesive 770, connection joint 778 and the lower portion of contact terminal 750 but not the upper portion of contact terminal 750 using screen printing, then the epoxy paste is cured or hardened at a relatively low temperature in the range of 100–250° C. to form a solid adherent insulative layer that provides additional mechanical strength for conductive trace 766 and protection for connection joint 778. For instance, if a solder joint is subsequently formed on contact terminal 750 during the next level assembly, insulative base 725 protects the underlying metallization from unwanted solder reflow.

At this stage, the manufacture of semiconductor chip assembly 780 that includes chip 710, insulative base 725, conductive trace 766, adhesive 770, encapsulant 772 and connection joint 778 can be considered complete.

FIGS. 22A–22T, 23A–23T and 24A–24T are cross-sectional, top and bottom views, respectively, of a method of making a semiconductor chip assembly in accordance with an eighth embodiment of the present invention. In the eighth embodiment, the plated metal includes electroplated metal portions on the metal base and the metal layer and an electrolessly plated metal portion on the insulative base and the electroplated metal portions. For purposes of brevity, any description in the first, second and third embodiments is incorporated herein insofar as the same is applicable, and the same description need not be repeated. Likewise, elements of the eighth embodiment similar to those in the first, second and third embodiments have corresponding reference numerals indexed at eight-hundred rather than one-hundred, two-hundred or three-hundred. For instance, chip 810 corresponds to chip 110, insulative base 824 corresponds to insulative base 324, plated metal portions 844A and 844B correspond to plated metal portions 244A and 244B, etc.

Figure 22A:
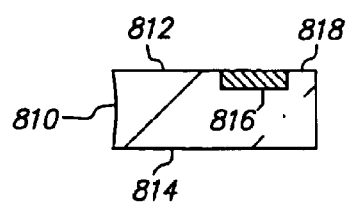
FIGS. 22A–22T are cross-sectional views showing a method of making a semiconductor chip assembly in accordance with an eighth embodiment of the present invention.
Figure 23A:
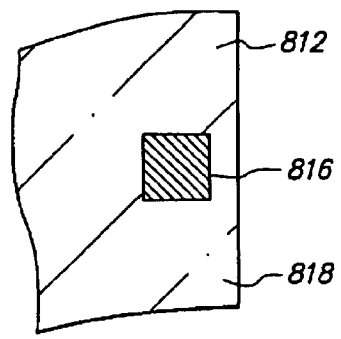
FIGS. 23A–23T are top plan views corresponding to FIGS. 22A–22T, respectively.
Figure 24A:
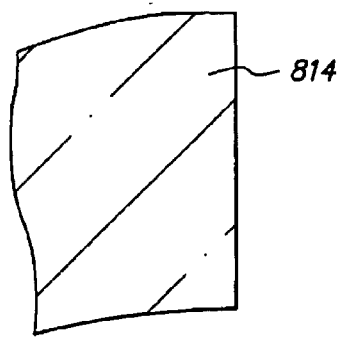
FIGS. 24A–24T are bottom plan views corresponding to FIGS. 22A–22T, respectively.

FIGS. 22A, 23A and 24A are cross-sectional, top and bottom views, respectively, of semiconductor chip 810 which includes surfaces 812 and 814. Surface 812 includes conductive pad 816 and passivation layer 818.

Figure 22B:
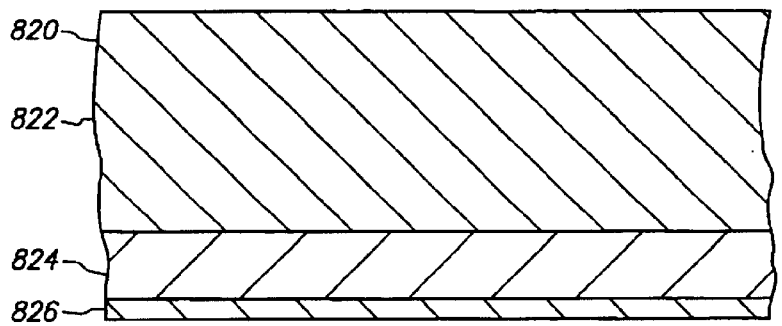
Figure 23B:
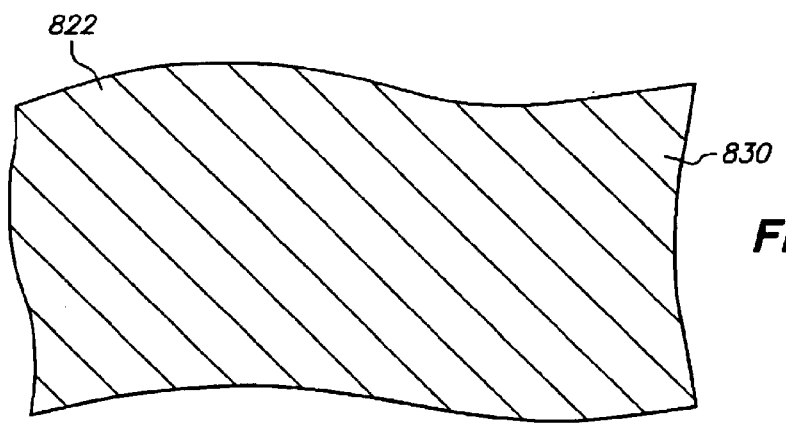
Figure 24B:
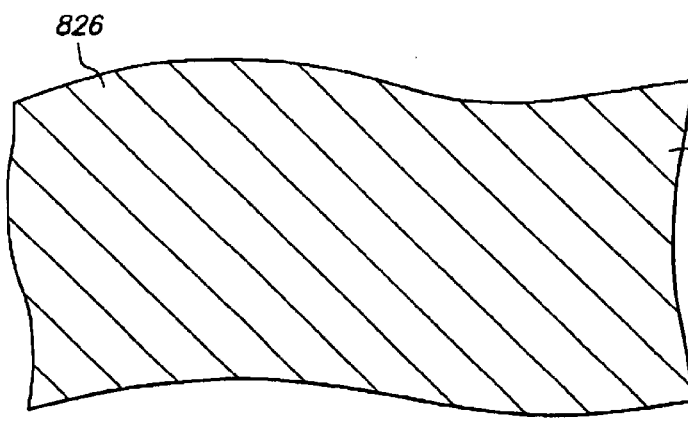

FIGS. 22B, 23B and 24B are cross-sectional, top and bottom views, respectively, of laminated structure 820 which includes metal base 822, insulative base 824 and metal layer 826. Laminated structure 820 also includes surfaces 830 and 832 at metal base 822 and metal layer 826, respectively. Laminated structure 820 is similar to laminated structure 320. Thus, insulative base 824 (with a thickness of 50 microns) is substantially thicker than insulative base 124 (with a thickness of 15 microns).

Figure 22C:
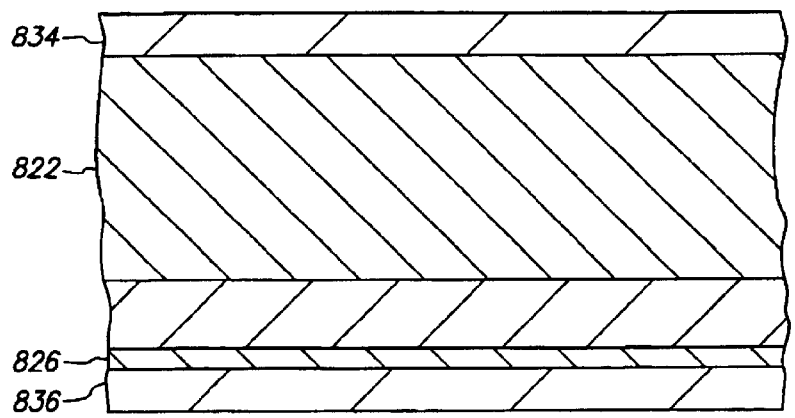
Figure 23C:
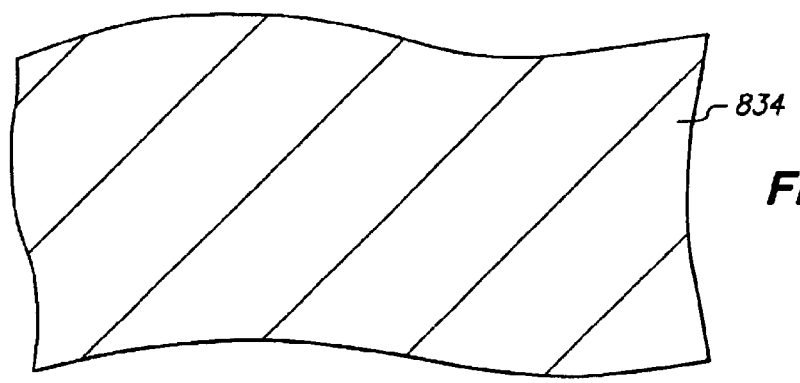
Figure 24C:
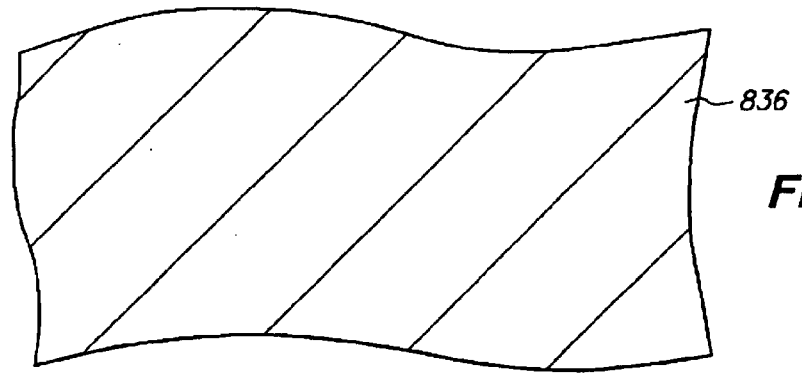

FIGS. 22C, 23C and 24C are cross-sectional, top and bottom views, respectively, of plating masks 834 and 836 formed on metal base 822 and metal layer 826, respectively.

Figure 22D:
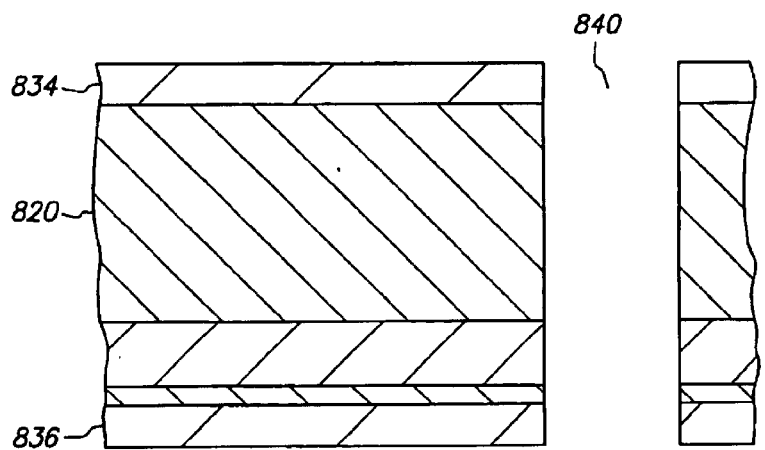
Figure 23D:
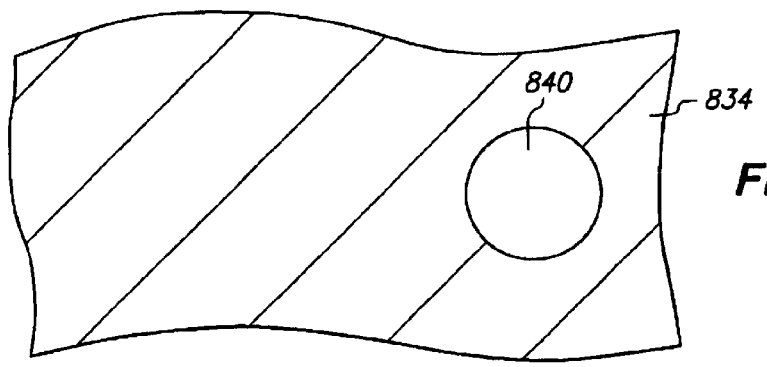
Figure 24D:
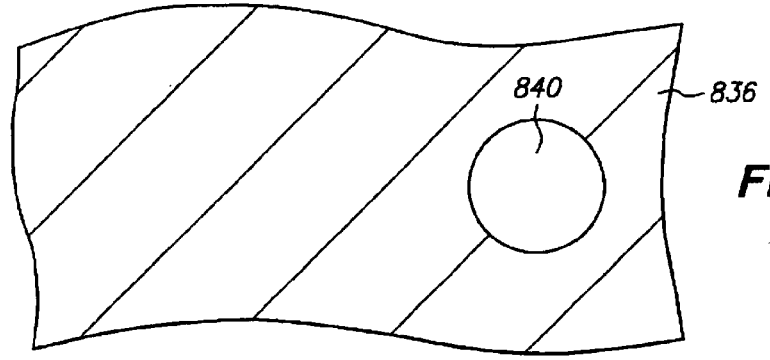

FIGS. 22D, 23D and 24D are cross-sectional top and bottom views, respectively, of via 840 formed in laminated structure 820 and plating masks 834 and 836 by mechanical drilling.

Figure 22E:
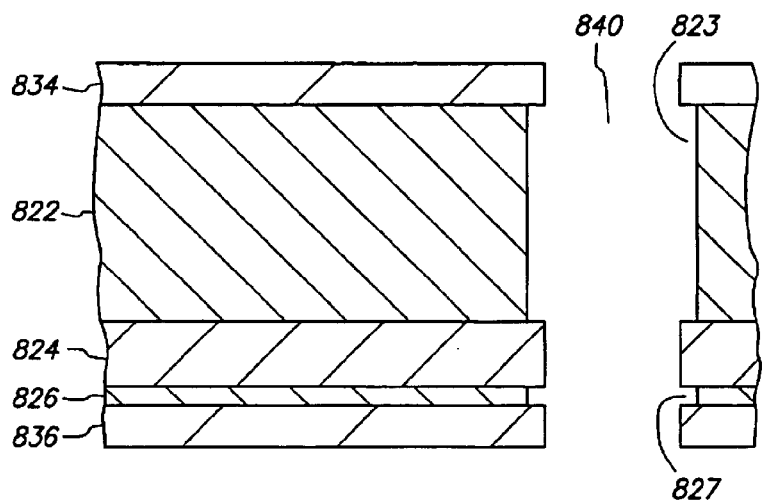
Figure 23E:
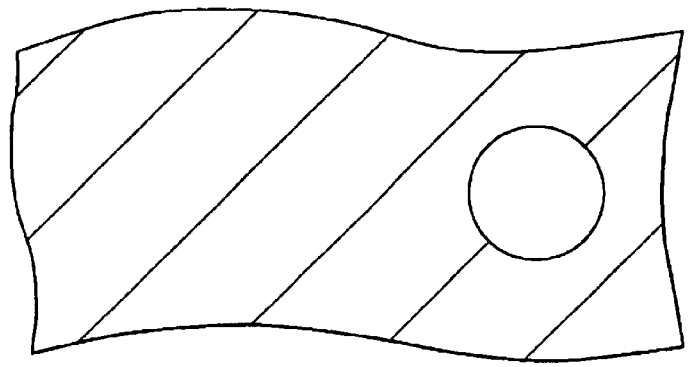
Figure 24E:
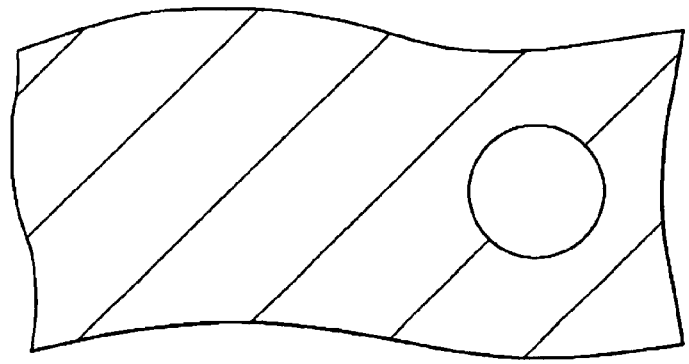

FIGS. 22E, 23E and 24E are cross-sectional, top and bottom views, respectively, of recesses 823 and 827 formed in metal base 822 and metal layer 826, respectively, in via 840 by wet chemical etching using plating masks 834 and 836 as etch masks. The wet chemical etch laterally etches 10 microns into metal base 822 and metal layer 826 in via 840. Thus, recesses 823 and 827 have a depth of 10 microns, and insulative base 824 laterally protrudes 10 microns from metal base 822 and metal layer 826 in via 840. A suitable wet chemical etch can be provided by the same solution used for etching metal layer 126 to form routing line 160. The optimal etch time for exposing metal base 822 and metal layer 826 to the wet chemical etch in order to form recesses 823 and 827 with the desired dimensions can be established through trial and error.

Figure 22F:
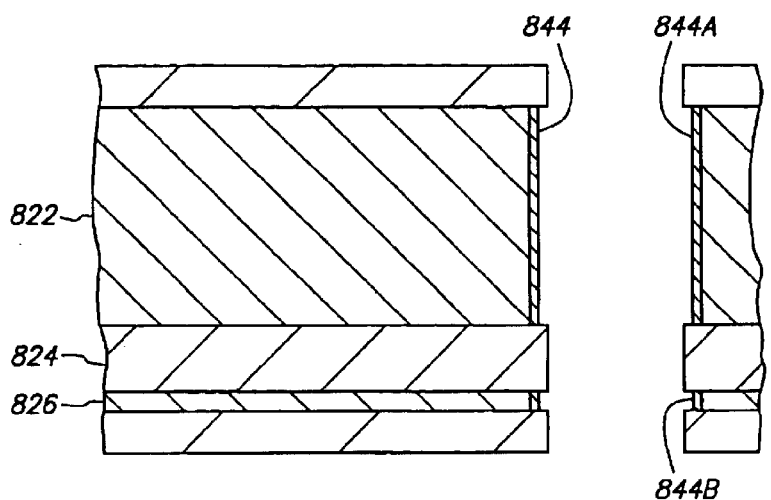
Figure 23F:
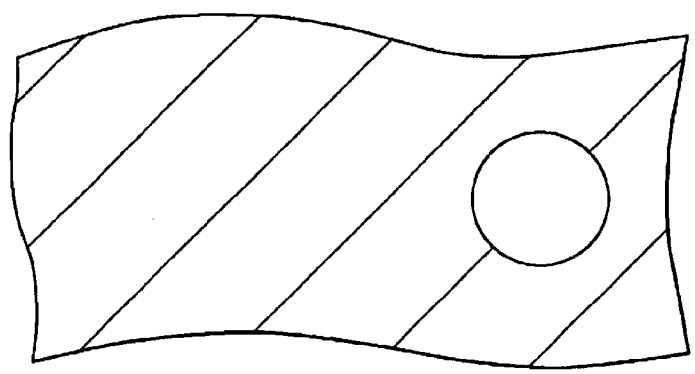
Figure 24F:
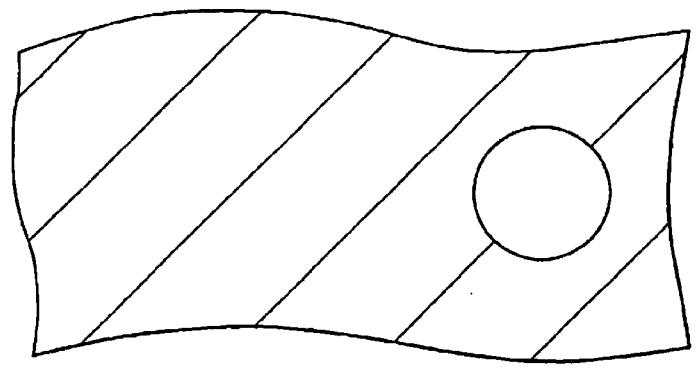

FIGS. 22F, 23F and 24F are cross-sectional, top and bottom views, respectively, of plated metal 844 formed on metal base 822 and metal layer 826 in via 840. Plated metal 844 includes a gold layer deposited on metal base 822 and metal layer 826, a nickel layer deposited on the gold layer, and a first copper layer deposited on the nickel layer. The gold layer is 0.2 microns thick, the nickel layer is 5 microns thick and the first copper layer is 2 microns thick. For convenience of illustration, the gold, nickel and copper layers are shown as a single layer.

Plated metal 844 is formed by a plating operation. Initially, metal base 822 and metal layer 826 are connected to a plating bus (not shown), current is applied to the plating bus from an external power source, and the structure is submerged in an electrolytic gold plating solution such as Technic Orotemp at room temperature to electroplate the gold layer on metal base 822 and metal layer 826. Thereafter, the structure is removed from the electrolytic gold plating solution and submerged in an electrolytic nickel plating solution such as Technic Techni Nickel "S" at room temperature while current is applied to the plating bus to electroplate the nickel layer on the gold layer. Thereafter, the structure is removed from the electrolytic nickel plating solution and submerged in an electrolytic copper plating solution such as Sel-Rex CUBATH M™ at room temperature while current is applied to the plating bus to electroplate the first copper layer on the nickel layer. Thereafter, the structure is removed from the electrolytic copper plating solution and rinsed in distilled water to remove contaminants.

At this initial stage, plated metal 844 is deposited as plated metal portion 844A on metal base 822 in via 840 and plated metal portion 844B on metal layer 826 in via 840. Plated metal portion 844A is located in recess 823, and plated metal portion 844B is located in recess 827. Plated metal 844 does not extend across insulative base 824, and plated metal portions 844A and 844B do not contact one another. However, the plating operation is not finished.

Figure 22G:
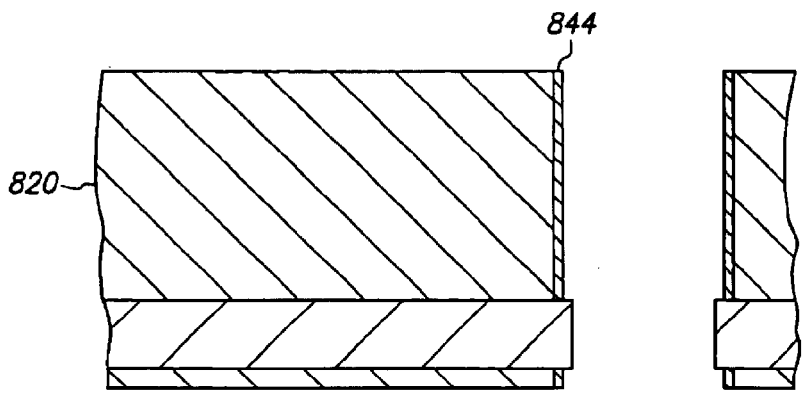
Figure 23G:
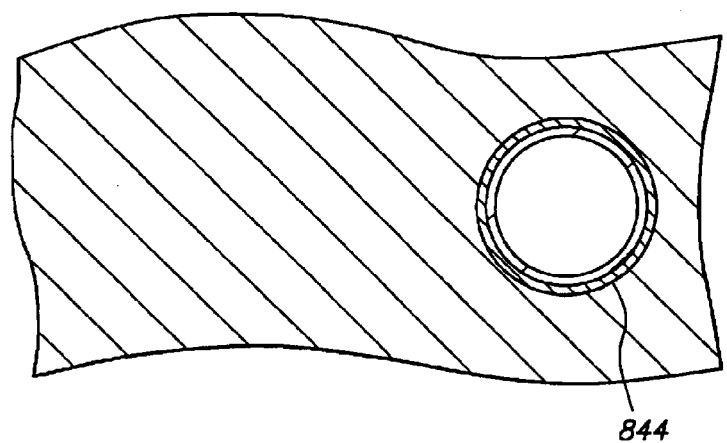
Figure 24G:
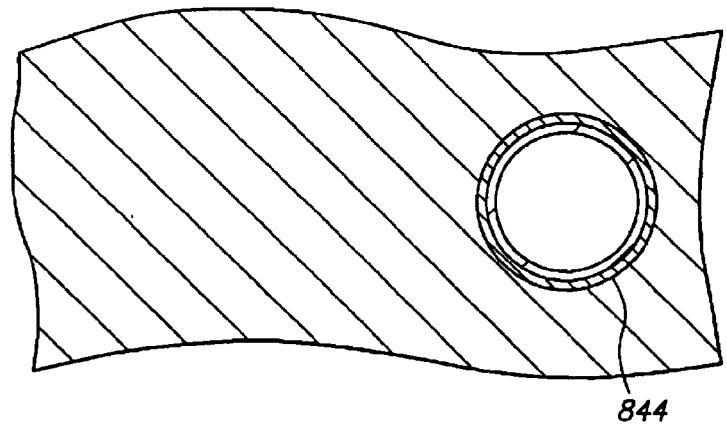

FIGS. 22G, 23G and 24G are cross-sectional, top and bottom views, respectively, of laminated structure 820 and plated metal 844 after plating masks 834 and 836 are stripped.

Figure 22H:
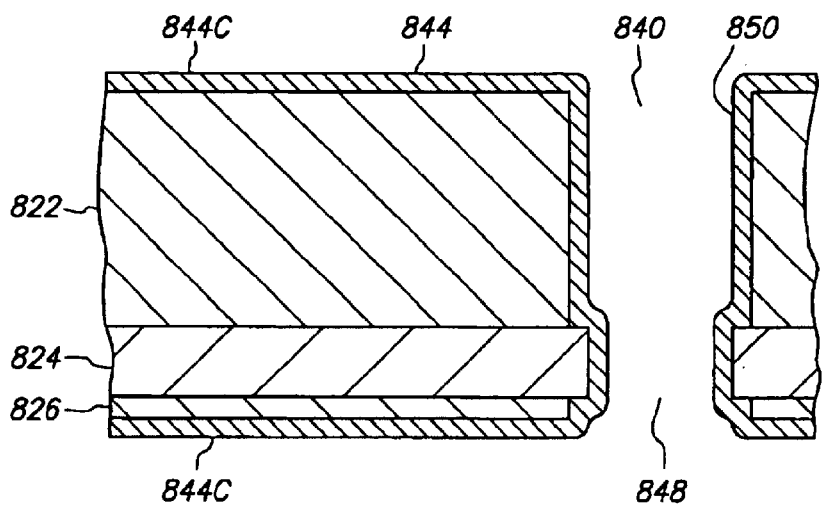
Figure 23H:
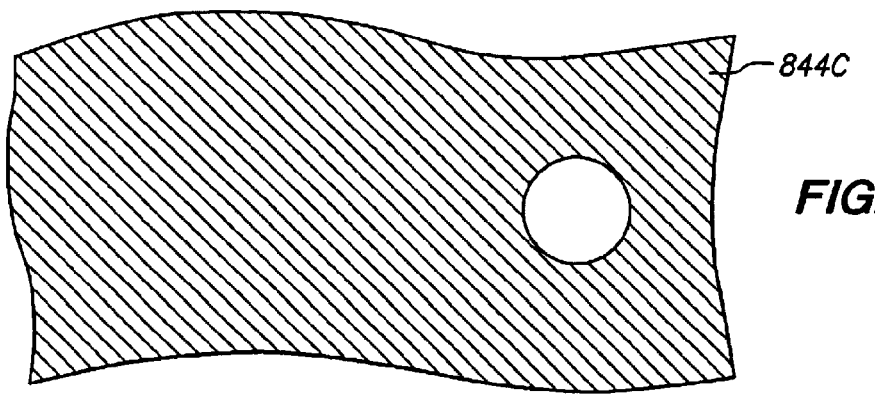
Figure 24H:
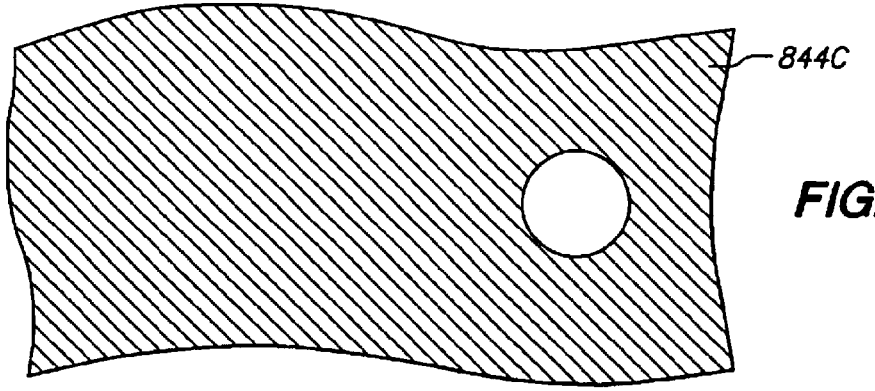

FIGS. 22H, 23H and 24H are cross-sectional, top and bottom views, respectively, of plated metal portion 844C formed on metal base 822, insulative base 824, metal layer 826 and plated metal portions 844A and 844B. Plated metal portion 844C is formed on insulative base 824 and plated metal portions 844A and 844B in via 840, is formed on surface 830 of metal base 822 outside via 840, and is formed on surface 832 of metal layer 826 outside via 840.

Plated metal portion 844C includes a second copper layer deposited on metal base 822, insulative base 824, metal layer 826 and plated metal portions 844A and 844B, and a third copper layer deposited on the second copper layer. The second copper layer is 0.5 microns thick, and the third copper layer is 5 microns thick. For convenience of illustration, plated metal 844 (which includes the gold, nickel and first, second and third copper layers of plated metal portions 844A, 844B and 844C) is shown as a single layer.

Plated metal portion 844C is formed by an electroless plating operation followed by an electroplating operation Electroless plating provides metal deposition by an exchange reaction between metal complexes in a solution and a catalytic metal that activates or initiates the reaction. As a result, the electroless metal continually plates (i.e., deposits or grows) on the catalytic metal. The reaction does not require externally applied electric current, and therefore electroless plating can proceed without a plating bus.

Metal base 822, metal layer 826 and the exposed surface layer of plated metal portions 844A and 844B are composed of copper and therefore are catalytic to electroless copper. However, insulative base 824 is not catalytic to electroless copper. Therefore, insulative base 824 needs to be rendered catalytic to electroless copper before the electroless plating operation begins. To accomplish this, the structure is dipped in a copper activator solution such as dilute palladium chloride of approximately 0.1 grams of palladium chloride and 5 cubic centimeters of hydrochloric acid per liter of water for 10 seconds. A suitable copper activator solution is Shipley CATAPOSIT™. Palladium becomes trapped in the exposed surfaces of insulative base 824, thereby providing a nucleation layer that renders these surfaces catalytic to electroless copper.

Thereafter, the structure is removed from the copper activator solution and submerged in an electroless copper plating solution such as Shipley CUPOSIT™ 250 at 60° C. and the second copper layer deposits on metal base 822, insulative base 824, metal layer 826 and plated metal portions 844A and 844B, thereby forming plated metal 844 as a continuous metal layer that contacts and covers metal base 822 and metal layer 826 both inside and outside via 840 and that covers insulative base 824 in via 840. As a result, all sidewall portions of via 840 are covered with plated metal 844.

Thereafter, the structure is removed from the electroless copper plating solution, metal base 822 is connected to a plating bus (not shown), current is applied to the plating bus from an external power source, and the structure is submerged in an electrolytic copper plating solution such as Sel-Rex CUBATH M™ at room temperature while current is applied to the plating bus to electroplate the third copper layer on the second copper layer. Thereafter, the structure is removed from the electrolytic copper plating solution and rinsed in distilled water to remove contaminants.

Plated metal 844 in via 840 has a hollow, hourglass-like shape that completely covers the previously exposed sidewalls of metal base 822, insulative base 824 and metal layer 826 in via 840. Plated metal 844 extends through metal base 822, insulative base 824 and metal layer 826 in via 840 and covers surfaces 830 and 832 of metal base 822 and metal layer 826, respectively.

Plated metal 844 includes or defines central bore 848 that includes the remaining space in via 840.

Plated metal 844 provides contact terminal 850 in via 840. Advantageously, the copper layers provide an excellent electrical conductor, the nickel layer provides a wettable surface so that solder (not shown) can be subsequently reflowed on contact terminal 850 during the next level assembly, and the gold layer prevents the nickel layer from oxidizing and dissolves into the solder during the reflow operation. Another advantage is that plated metal 844 extends through insulative base 824 without having to grow across insulative base 824 during an electroplating operation. However, providing the activator solution and electroless plating solution requires additional process steps. Furthermore, etching metal layer 826 and plated metal portion 844C is more difficult than etching metal layer 826 alone to form routing line 860 with fine dimensions and spacing.

Figure 22I:
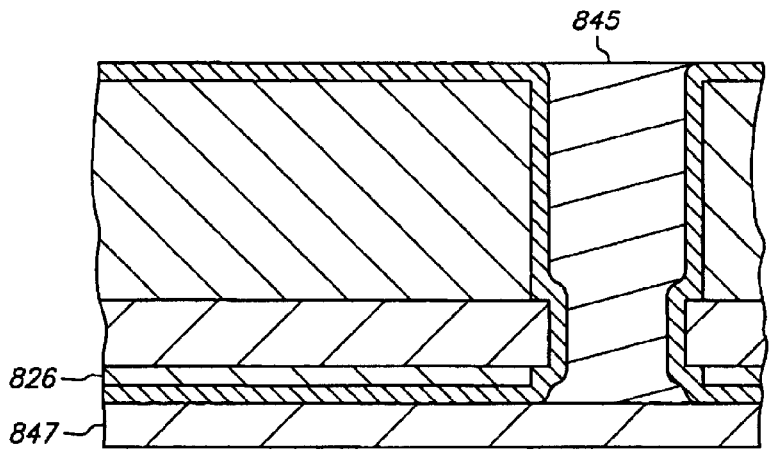
Figure 23I:
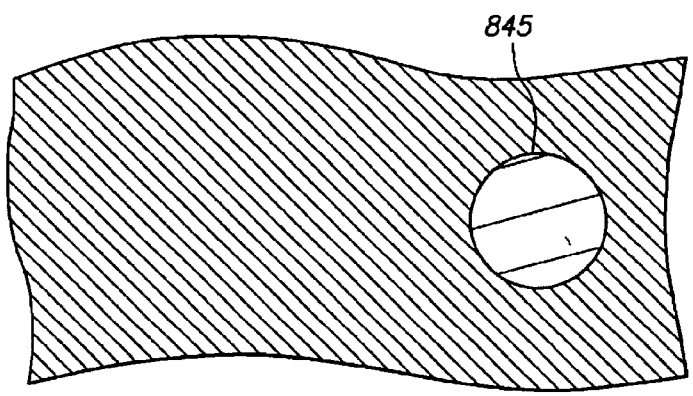
Figure 24I:
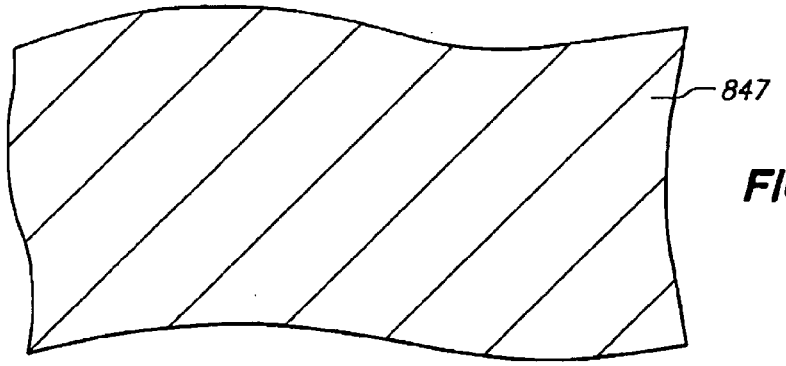

FIGS. 22I, 23I and 24I are cross-sectional, top and bottom views, respectively, of etch ink 845 filled into via 840 as cover sheet 847 plugs via 840 proximate to metal layer 826. Etch ink 845 is deposited as a liquid resin (A stage) epoxy into via 840 using stencil printing after cover sheet 847 plugs via 840. Thereafter, the liquid resin is cured or hardened at relatively low temperature of about 120° C. to form a solid layer. As a result, etch ink 845 fills the remaining space in via 840. Cover sheet 847 is a low cost epoxy film.

Figure 22J:
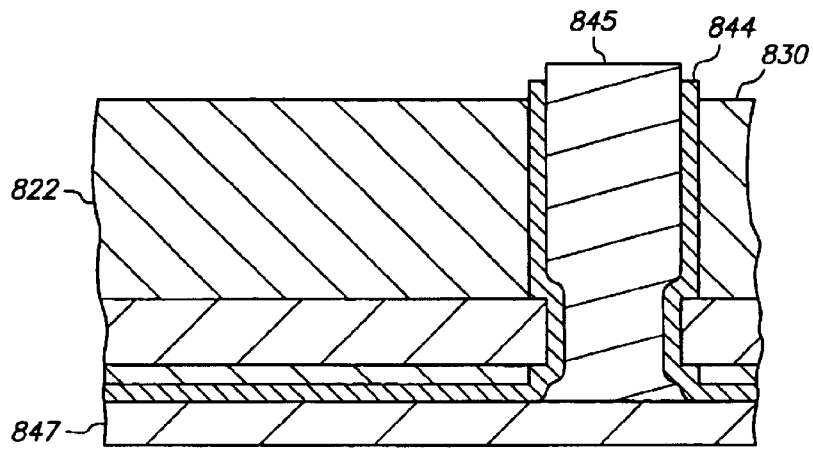
Figure 23J:
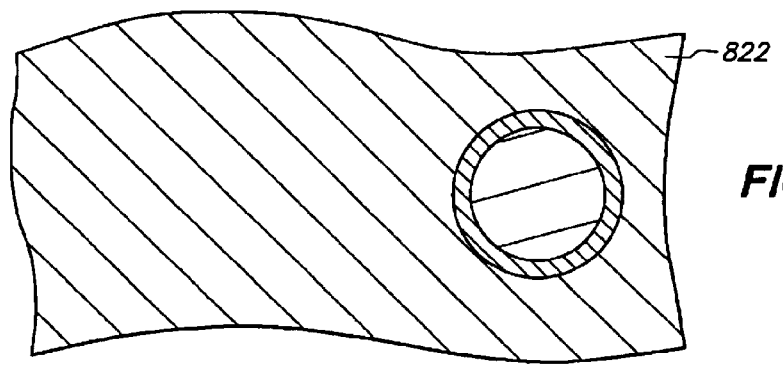
Figure 24J:
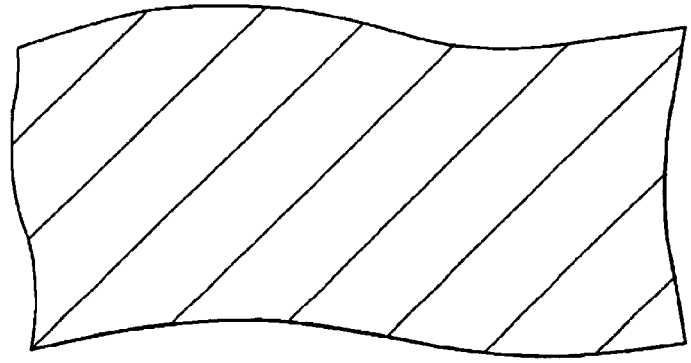

FIGS. 22J, 23J and 24J are cross-sectional, top and bottom views, respectively, of the structure after the portion of plated metal portion 844C that covers metal base 822, and an upper portion of metal base 822 that was previously covered by plated metal portion 844C, are removed by wet chemical etching using etch ink 845 and cover sheet 847 as etch masks. The wet chemical etch completely removes the portion of plated metal portion 844C that contacts and covers metal base 822 and vertically etches 10 microns into metal base 822. Thus, the wet chemical etch removes 10 microns of metal base 822 at surface 830, or stated differently, recedes surface 830 by 10 microns. In addition, the upper 10 microns of plated metal portion 844C between plated metal portion 844A and etch ink 845 is removed. For convenience of illustration, the small gap this leaves between the nickel layer of plated metal portion 844A and etch ink 845 is not shown. Furthermore, etch ink 845 protects the remaining copper of plated metal 844 in via 840, and cover sheet 847 protects the portion of plated metal portion 844C that contacts metal layer 826 outside via 840. As a result, the gold and nickel layers of plated metal portion 844A vertically protrude 10 microns from surface 830 of metal base 822 and are exposed.

A suitable wet chemical etch can be provided by the same solution used for etching metal layer 126 to form routing line 160. The optimal etch time for exposing metal base 822 and plated metal portion 844C to the wet chemical etch in order to recess surface 830 of metal base 822 with the desired dimensions can be established through trial and error.

Figure 22K:
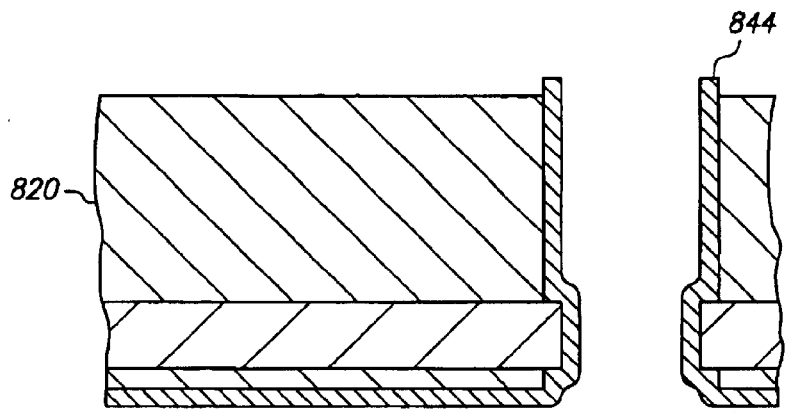
Figure 23K:
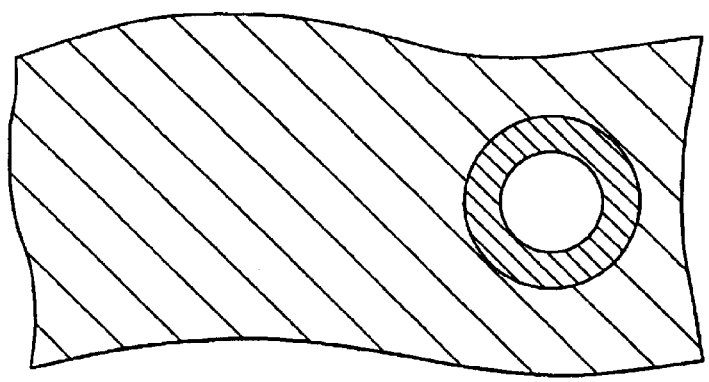
Figure 24K:
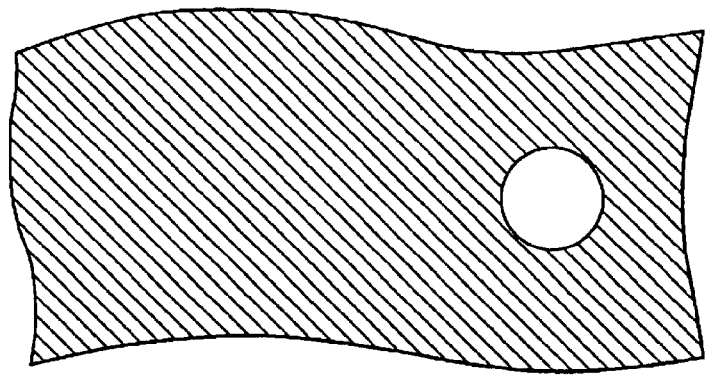

FIGS. 22K, 23K and 24K are cross-sectional, top and bottom views, respectively, of laminated structure 820 and plated metal 844 after etch ink 845 and cover sheet 847 are removed. Etch ink 845 and cover sheet 847 are stripped using a solvent, such as a mild alkaline solution with a pH of 9, that is highly selective of epoxy with respect to copper, nickel and gold. Therefore, no appreciable amount of metal base 822 or plated metal 844 is removed.

Figure 22L:
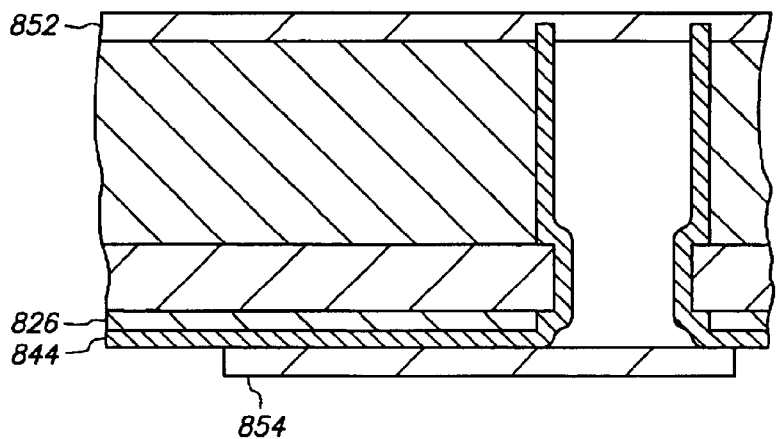
Figure 23L:
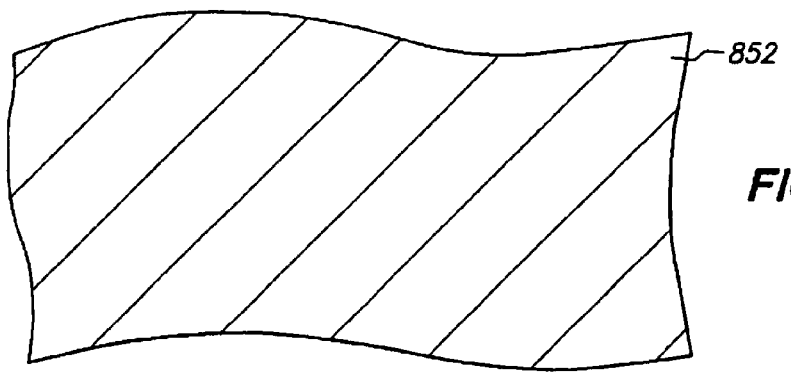
Figure 24L:
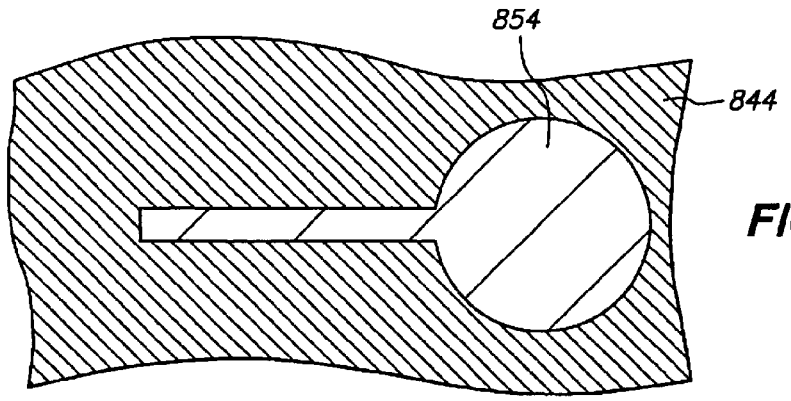

FIGS. 22L, 23L and 24L are cross-sectional, top and bottom views, respectively, of photoresist layers 852 and 854 formed over metal base 822 and plated metal 844 on metal layer 826, respectively. Photoresist layer 854 contains an opening that selectively exposes plated metal 844, and photoresist layer 852 remains unpatterned.

Figure 22M:
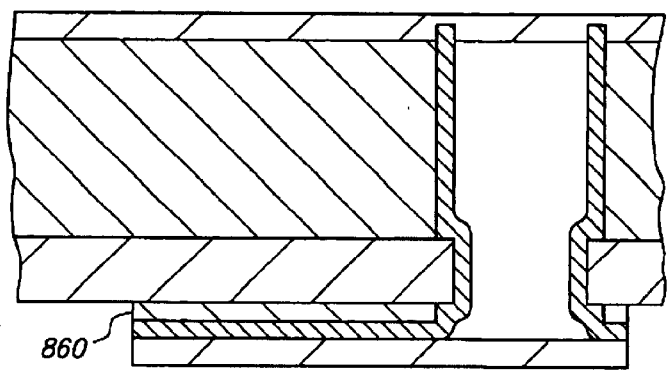
Figure 23M:
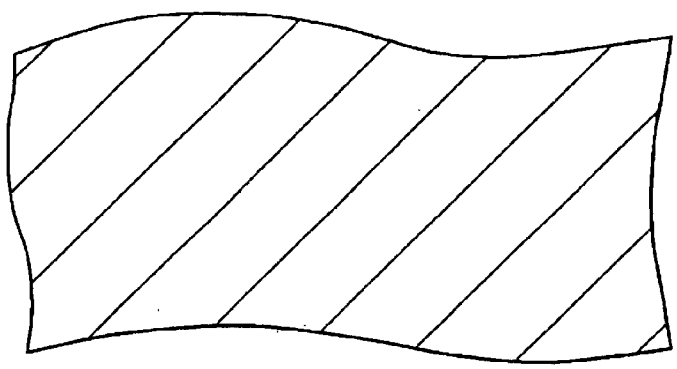
Figure 24M:
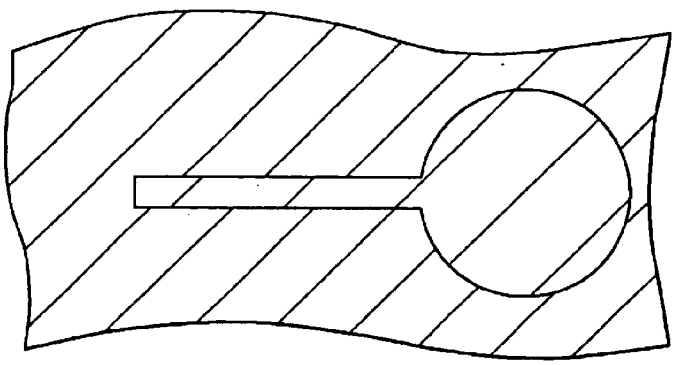

FIGS. 22M, 23M and 24M are cross-sectional, top and bottom views, respectively, of routing line 860 formed in metal layer 826 and plated metal 844 by wet chemical etching.

Figure 22N:
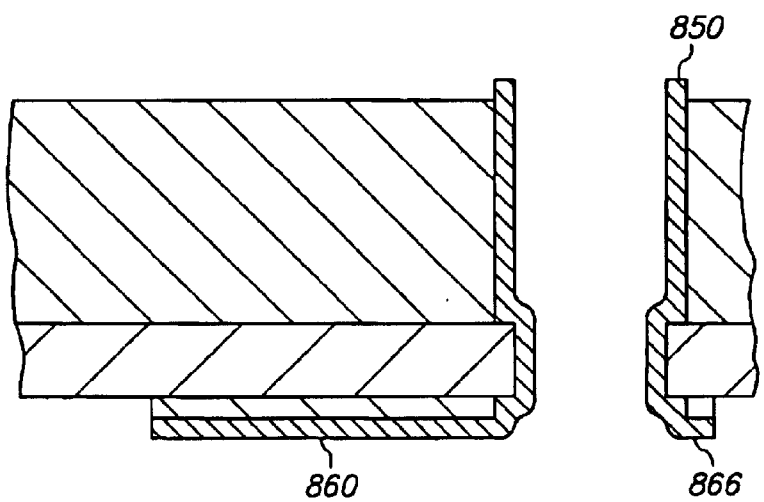
Figure 23N:
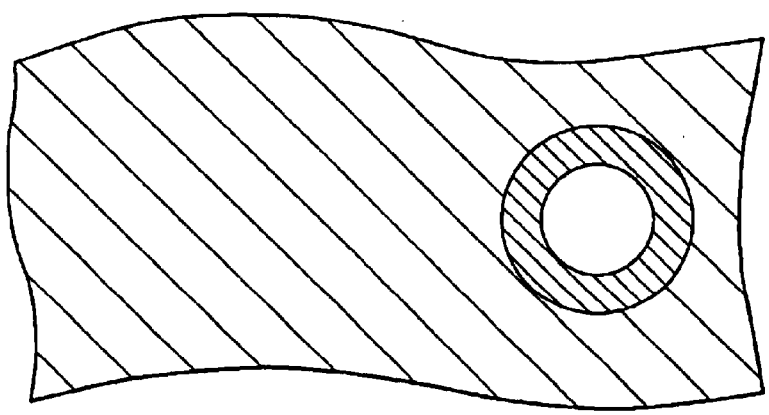
Figure 24N:
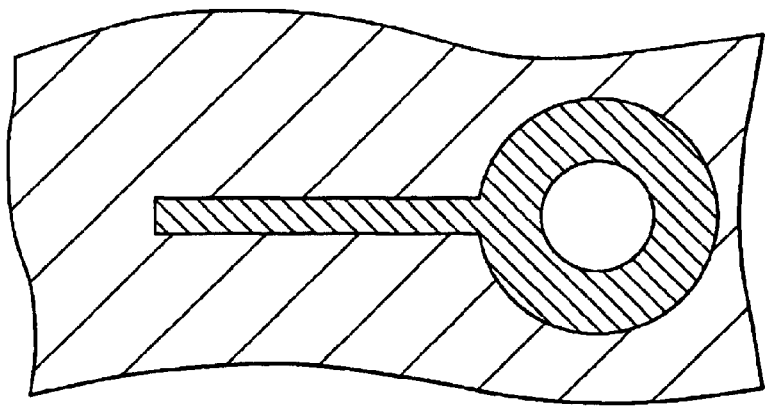
Figure 220:
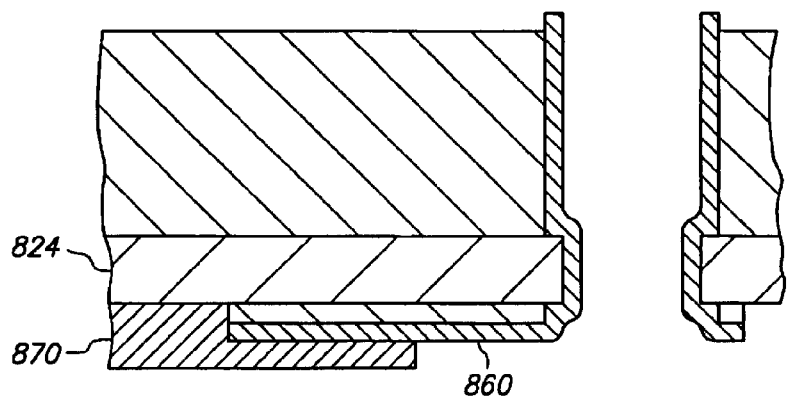
Figure 230:
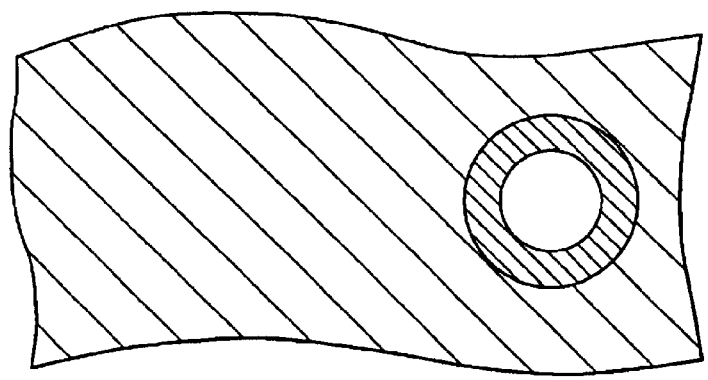
Figure 240:
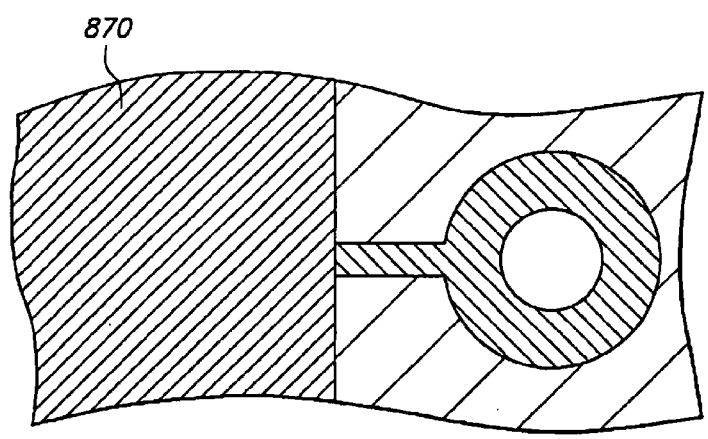

FIGS. 22N, 23N and 24N are cross-sectional, top and bottom views, respectively, of the structure after photoresist layers 852 and 854 are stripped. The combination of contact terminal 850 and routing line 860 provides conductive trace 866.

FIGS. 22O, 23O and 24O are cross-sectional, top and bottom views, respectively, of adhesive 870 formed on insulative base 824 and routing line 860.

Figure 22P:
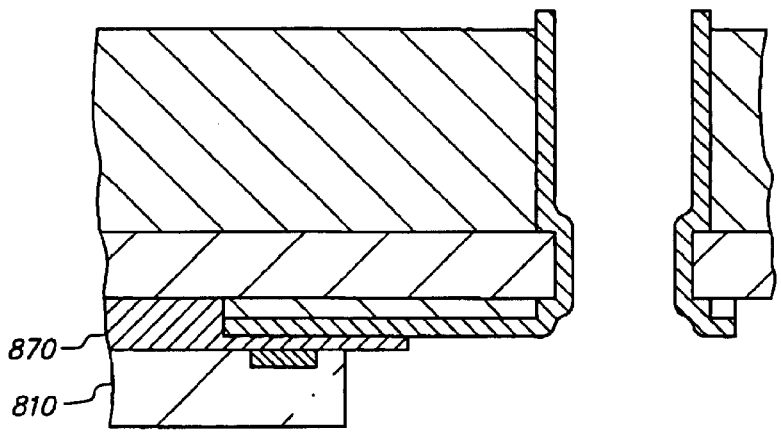
Figure 23P:
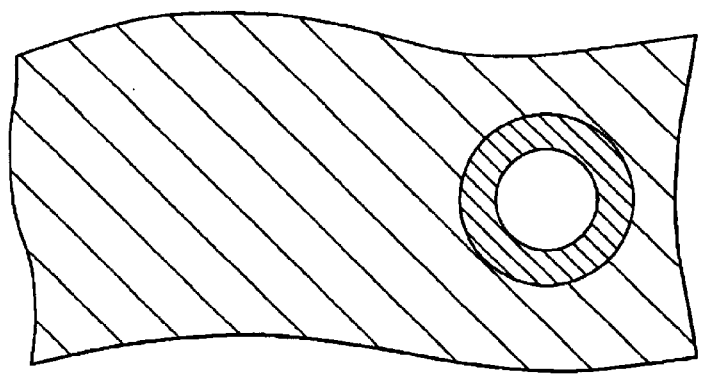
Figure 24P:
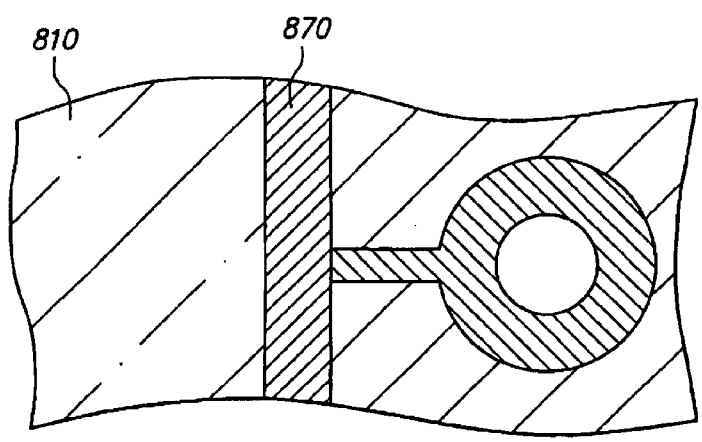

FIGS. 22P, 23P and 24P are cross-sectional, top and bottom views, respectively, of chip 810 mechanically attached to laminated structure 820 by adhesive 870.

Figure 22Q:
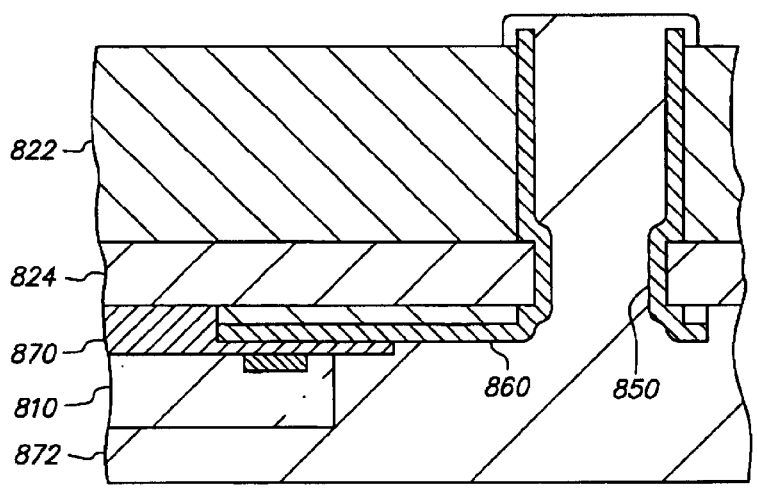
Figure 23Q:
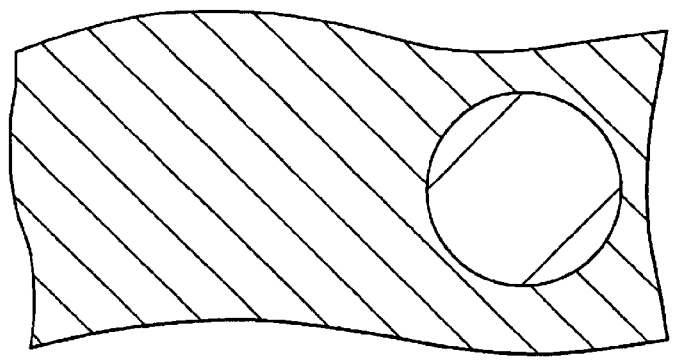
Figure 24Q:
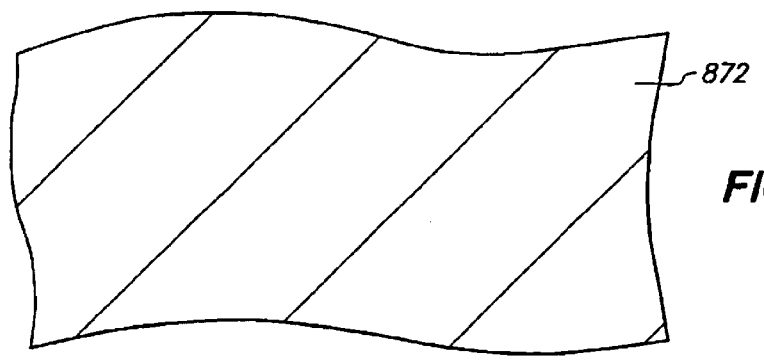

FIGS. 22Q, 23Q and 24Q are cross-sectional, top and bottom views, respectively, of encapsulant 872 formed on chip 810, metal base 822, insulative base 824, contact terminal 850, routing line 860 and adhesive 870 by transfer molding.

Figure 22R:
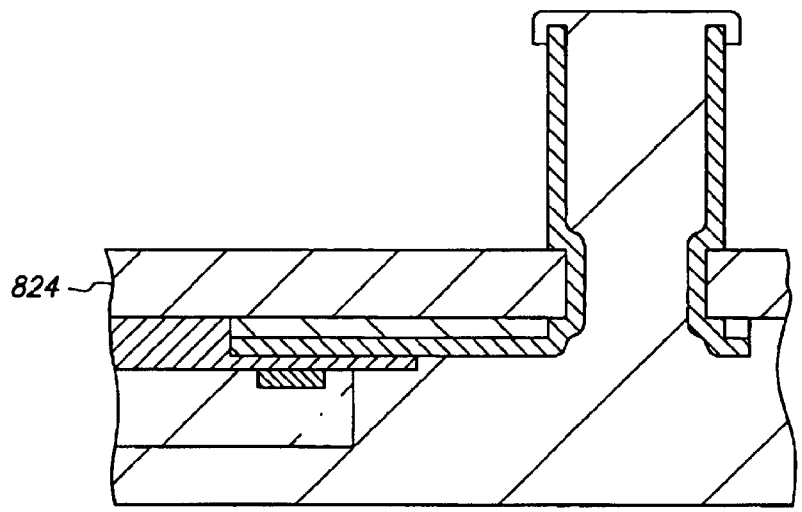
Figure 23R:
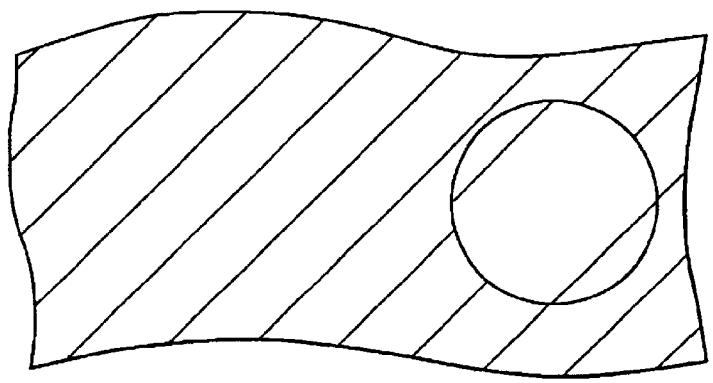
Figure 24R:
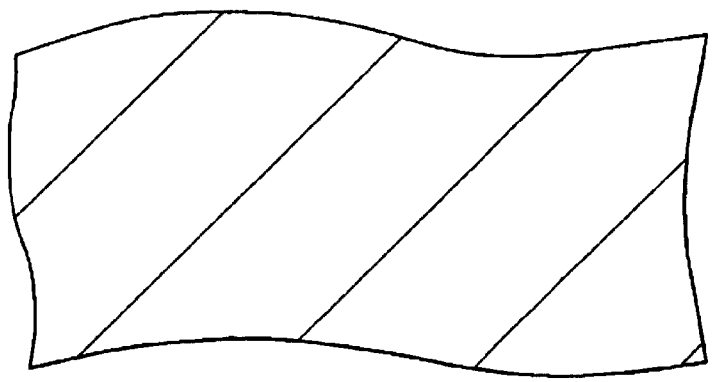

FIGS. 22R, 23R and 24R are cross-sectional, top and bottom views, respectively, of the structure after metal base 822 is removed by wet chemical etching. Advantageously, since insulative base 824 protrudes into via 840 due to recesses 823 and 827, the gold and nickel layers of plated metal 844A contact the major surface of insulative base 824 that faces towards metal base 822, thereby providing a seal that prevents the wet chemical etching solution from seeping into via 840 and attacking the copper layers of plated metal portion 844C. In other words, if recesses 823 and 827 were absent, then no appreciable amount of plated metal portion 844A would contact insulative base 824 at the interface between metal base 822 and insulative base 824 in via 840, and the wet chemical etch that removes metal base 822 might seep between insulative base 824 and plated metal portion 844A, attack the copper layers of plated metal portion 844C and possibly deteriorate or severe plated metal in via 840.

Figure 22S:
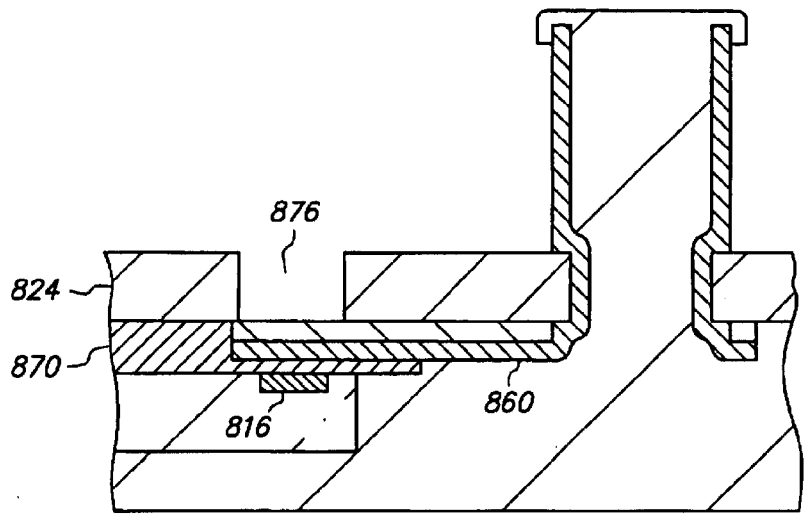
Figure 23S:
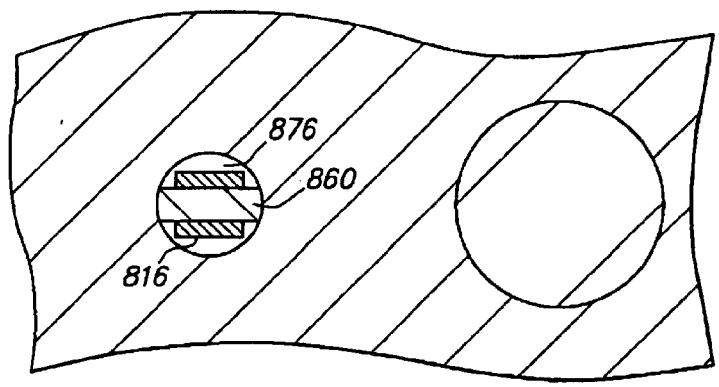
Figure 24S:
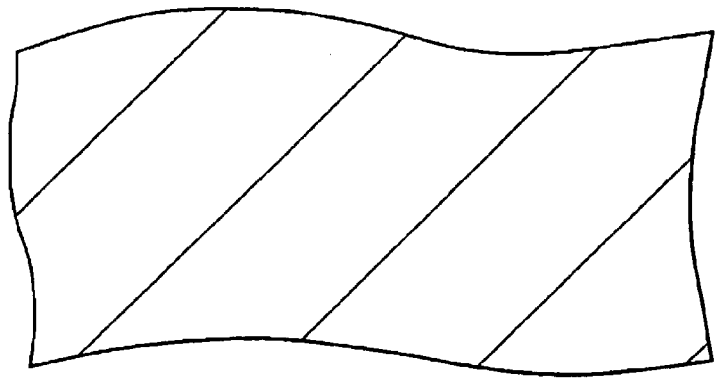

FIGS. 22S, 23S and 24S are cross-sectional, top and bottom views, respectively, of the structure after portions of insulative base 824 and adhesive 870 are selectively removed to form through-hole 876 in insulative base 824 and adhesive 870 that exposes pad 816 and routing line 860.

Figure 22T:
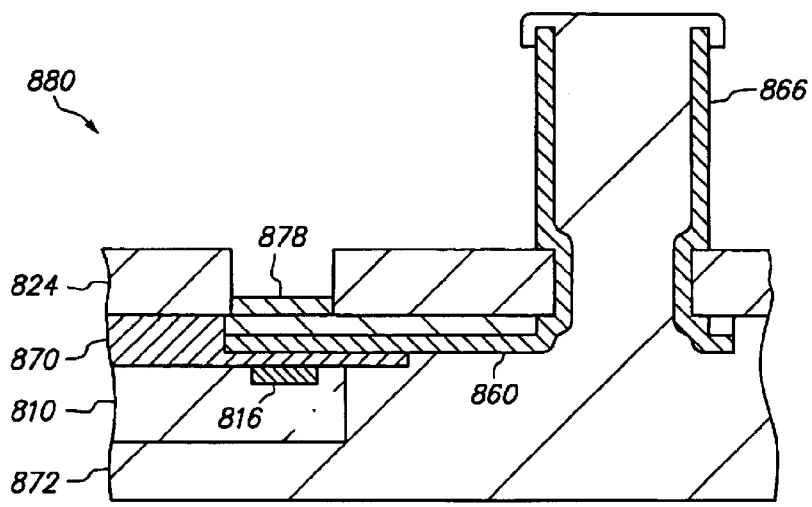
Figure 23T:
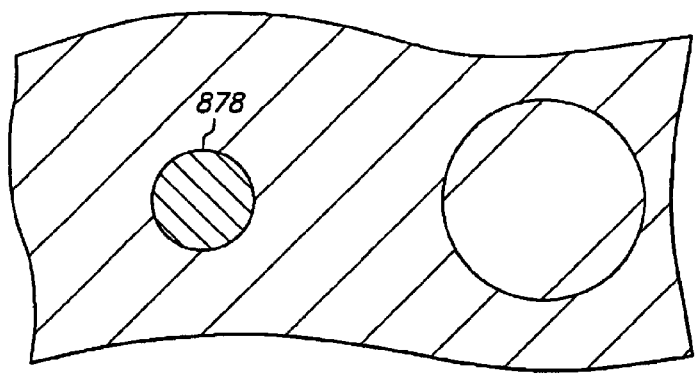
Figure 24T:
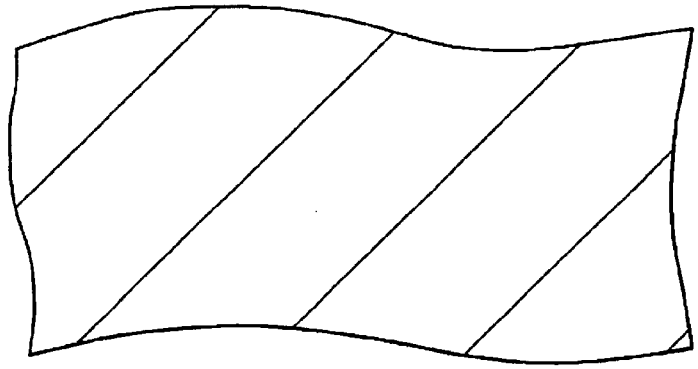

FIGS. 22T, 23T and 24T are cross-sectional, top and bottom views, respectively, of connection joint 878 formed on pad 816 and routing line 860.

At this stage, the manufacture of semiconductor chip assembly 880 that includes chip 810, insulative base 824, conductive trace 866, adhesive 870, encapsulant 872 and connection joint 878 can be considered complete.

FIGS. 25N–25Q, 26N–26Q and 27N–27Q are cross-sectional, top and bottom views, respectively, of a method of making a semiconductor chip assembly in accordance with a ninth embodiment of the present invention. In the ninth embodiment, the tip of the encapsulant that protrudes from the contact terminal is removed. For purposes of brevity, any description in the first embodiment is incorporated herein insofar as the same is applicable, and the same description need not be repeated. Likewise, elements of the ninth embodiment similar to those in the first embodiment and shown in separate figures from the first embodiment have corresponding reference numerals indexed at nine-hundred rather than one-hundred. For instance, metal base 922 corresponds to metal base 122, insulative base 924 corresponds to insulative base 124, etc.

The ninth embodiment begins with the steps depicted in FIGS. 1A–1M, 2A–2M and 3A–3M, then concludes with the steps depicted in FIGS. 25N–25Q, 26N–26Q and 27N–27Q. Thus, FIGS. 25N–25Q, 26N–26Q and 27N–27Q replace FIGS. 1N–1P, 2N–2P and 3N–3P.

Figure 25N:
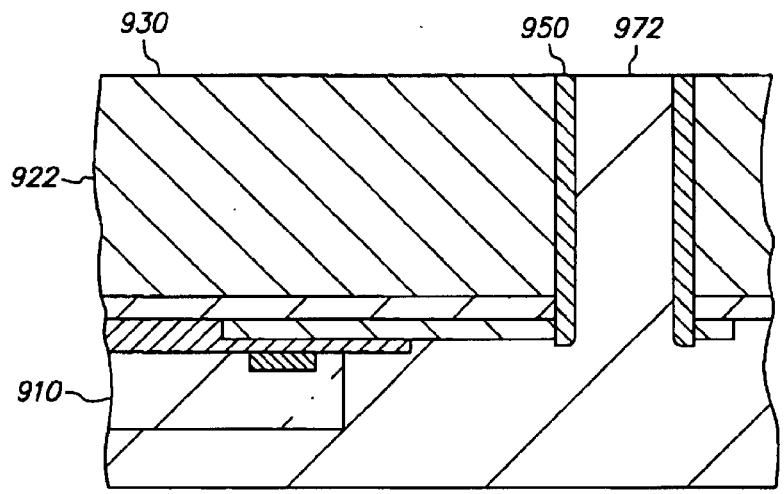
Figure 26N:
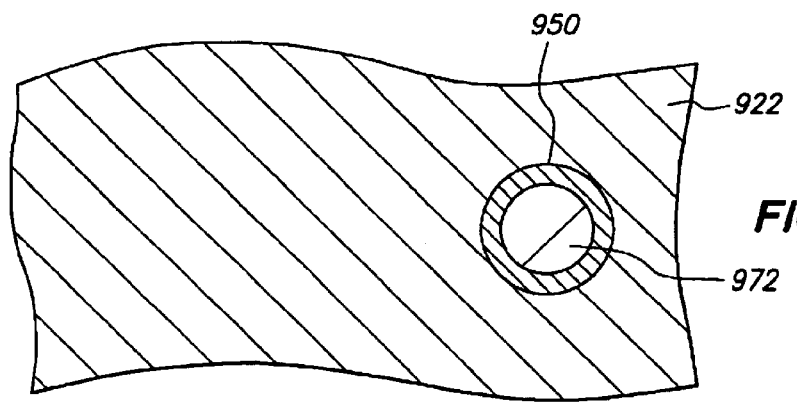
Figure 27N:
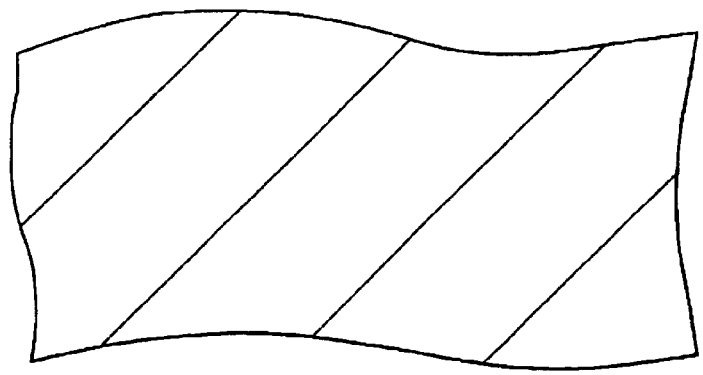
Figure 250:
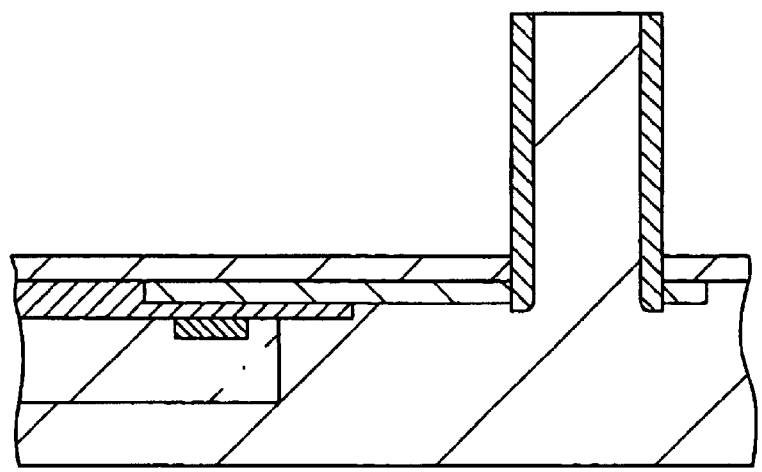
Figure 260:
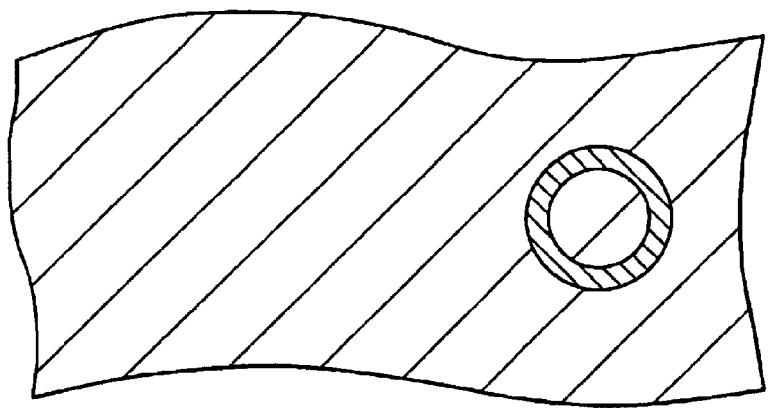
Figure 270:
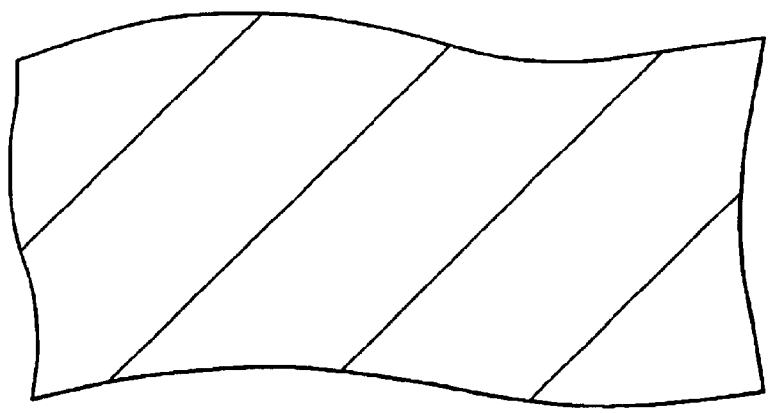

FIGS. 25N, 26N and 27N are cross-sectional, top and bottom views, respectively, of the structure after tip 974 of encapsulant 972 is removed by polishing.

Polishing planarizes a workpiece using a polishing slurry that includes abrasive particles mixed in a suspension agent. The workpiece is mounted on a holder, a polishing pad is coated with the slurry, the workpiece and the pad are rotated such that the workpiece provides a planetary motion with respect to the pad, the workpiece is pressed against the pad, and the process continues until the workpiece is largely flattened. In chemical-mechanical polishing, the slurry particles abrade the workpiece while a chemical reaction facilitates the process.

The polishing pad is typically a felt fiber fabric impregnated with polyurethane, and the amount of impregnation determines whether the pad is hard or soft. A hard pad tends to focus the polishing pressure on protruding regions of the workpiece in order to rapidly planarize the workpiece, and a soft pad tends to create a more planar surface over the entire workpiece and less mechanical damage to the workpiece.

In this instance, the polishing is applied with a hard pad to rapidly remove portions of contact terminal 950 and encapsulant 972 that protrude from surface 930 of metal base 922. The polishing is terminated shortly after the pad contacts metal base 922, and no appreciable amount of metal base 922 is removed. As a result, contact terminal 950 and encapsulant 972 are aligned with surface 930 of metal base 922. Encapsulant 972 is concentrically disposed within and aligned with the exposed distal end of contact terminal 950 that faces away from chip 910, and encapsulant 972 no longer contacts or covers the distal end or a peripheral sidewall portion of contact terminal 950.

Advantageously, the exposed distal end of contact terminal 950 may enhance solder reflow during the next level assembly. However, the polishing is an additional process step.

FIGS. 25O, 26O and 27O are cross-sectional, top and bottom views, respectively, of the structure after metal base 922 is removed by wet chemical etching.

Figure 25P:
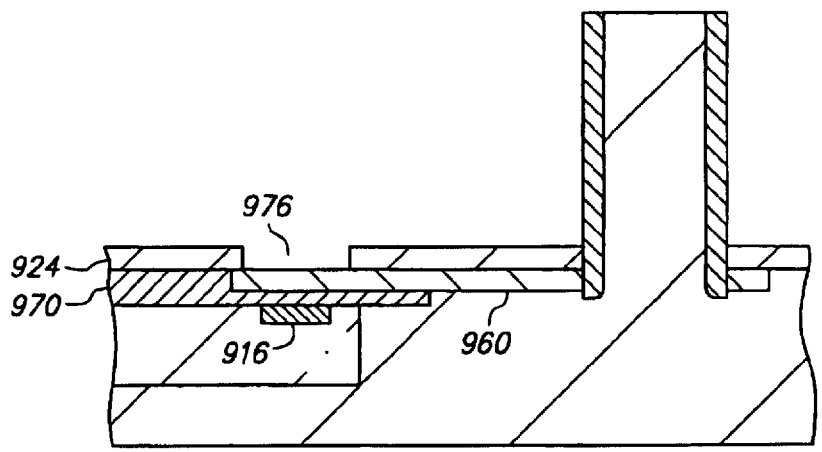
Figure 26P:
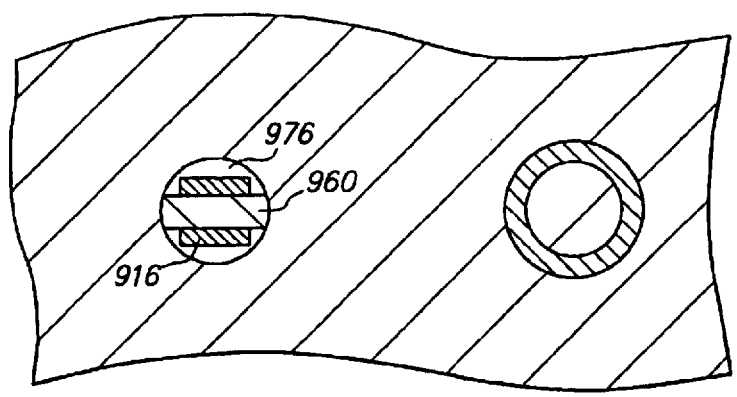
Figure 27P:
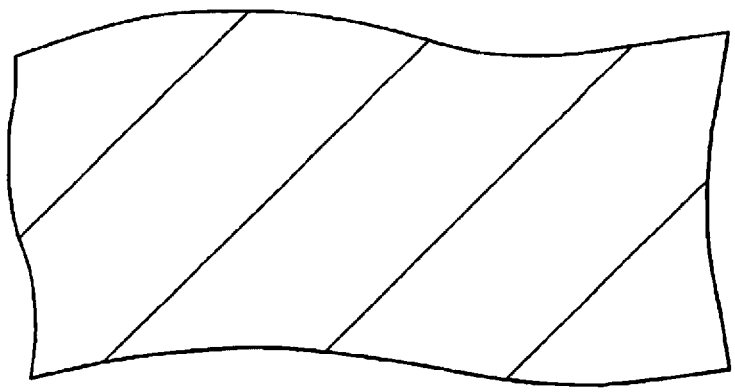

FIGS. 25P, 26P and 27P are cross-sectional, top and bottom views, respectively, of the structure after portions of insulative base 924 and adhesive 970 are selectively removed to form through-hole 976 in insulative base 924 and adhesive 970 that exposes pad 916 and routing line 960.

Figure 25Q:
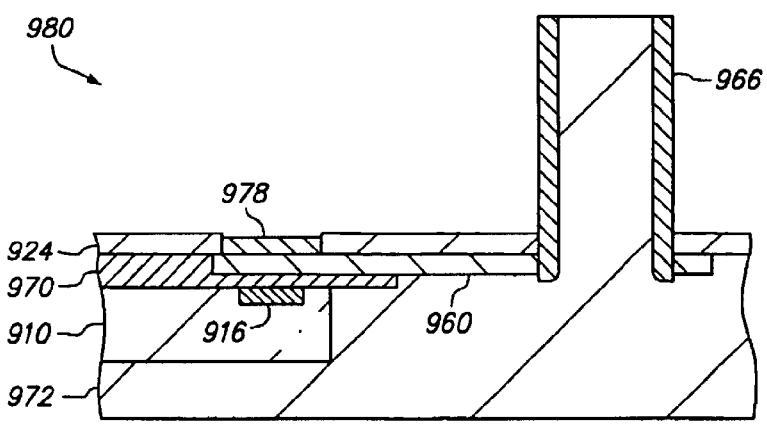
Figure 26Q:
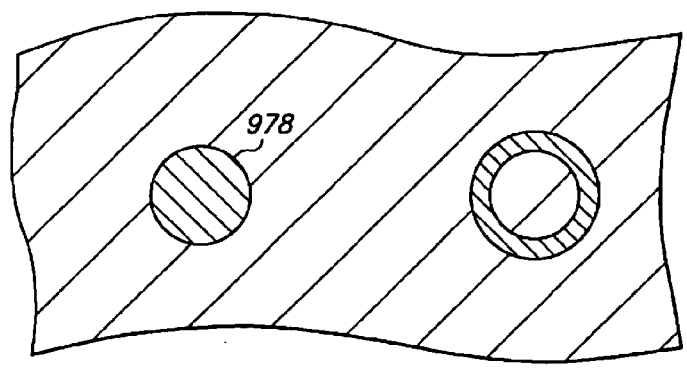
Figure 27Q:
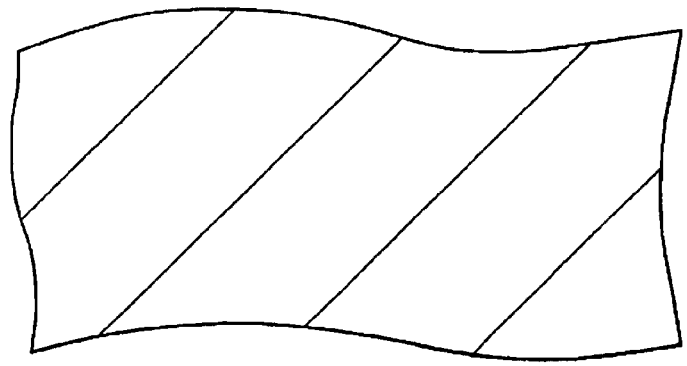

FIGS. 25Q, 26Q and 27Q are cross-sectional, top and bottom views, respectively, of connection joint 978 formed on pad 916 and routing line 960.

At this stage, the manufacture of semiconductor chip assembly 980 that includes chip 910, insulative base 924, conductive trace 966, adhesive 970, encapsulant 972 and connection joint 978 can be considered complete.

FIGS. 28L–28O, 29L–29O and 30L–30O are cross-sectional, top and bottom views, respectively, of a method of making a semiconductor chip assembly in accordance with a tenth embodiment of the present invention. In the tenth embodiment, the conductive pad of the chip faces away from the routing line and is electrically connected to the routing line by a wire bond. For purposes of brevity, any description in the first embodiment is incorporated herein insofar as the same is applicable, and the same description need not be repeated. Likewise, elements of the tenth embodiment similar to those in the first embodiment and shown in separate figures from the first embodiment have corresponding reference numerals indexed at one-thousand rather than one-hundred. For instance, metal base 1022 corresponds to metal base 122, insulative base 1024 corresponds to insulative base 124, etc.

The tenth embodiment begins with the steps depicted in FIGS. 1A–1K, 2A–2K and 3A–3K, then concludes with the steps depicted in FIGS. 28L–28O, 29K–29O and 30L–30O. Thus, FIGS. 28L–28O, 29L–29O and 30L–30O replace FIGS. 1L–1P, 2L–2P and 3L–3P.

Figure 28L:
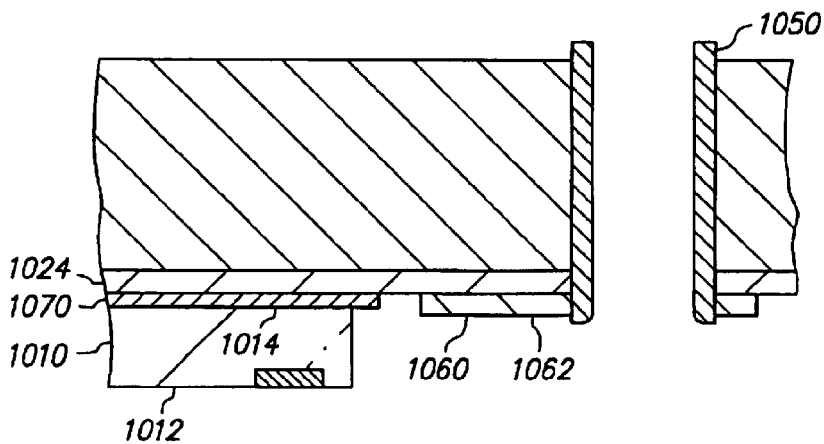
FIGS. 28L–28O are cross-sectional views showing a method of making a semiconductor chip assembly in accordance with a tenth embodiment of the present invention.
Figure 29L:
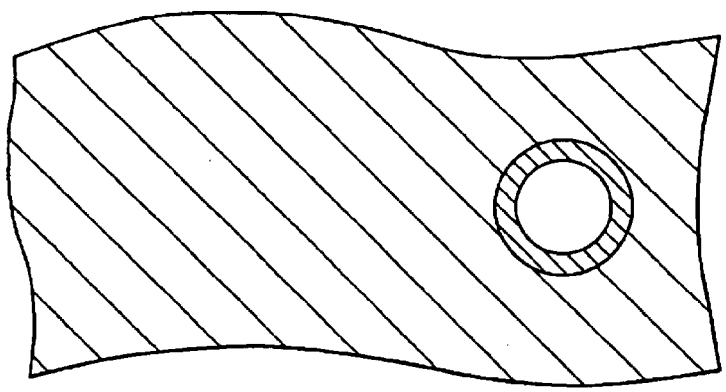
FIGS. 29L–29O are top plan views corresponding to FIGS. 28L–28O, respectively.
Figure 30L:
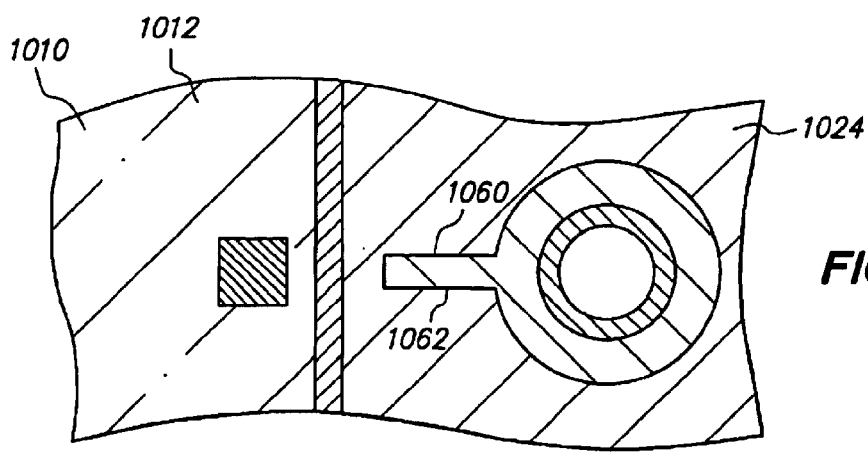
FIGS. 30L–30O are bottom plan views corresponding to FIGS. 28L–28O, respectively.

FIGS. 28L, 29L and 30L are cross-sectional, top and bottom views, respectively, of chip 1010 mechanically attached to laminated structure 1020 by adhesive 1070. Adhesive 1070 is disposed between and contacts chip 1010 and insulative base 1024. However, elongated routing region 1062 of routing line 1060 is shorter than elongated routing region 162 of routing line 160. This is accomplished by making opening 1056 in photoresist layer 1054 shorter than opening 156 in photoresist layer 154. As a result, routing line 1060 is spaced from adhesive 1070 and does not extend within the periphery of chip 1010. In addition, surface 1012 of chip 1010 faces away from insulative base 1024 and is exposed, and surface 1014 of chip 1010 faces towards insulative base 1024 and is embedded in adhesive 1070. Thus, chip 1010 is inverted relative to chip 110.

Chip 1010 and laminated structure 1020 are positioned relative to one another so that chip 1010 is disposed within the surface area of adhesive 1070, and contact terminal 1050 and routing line 1060 are disposed outside the periphery of chip 1010.

Figure 28M:
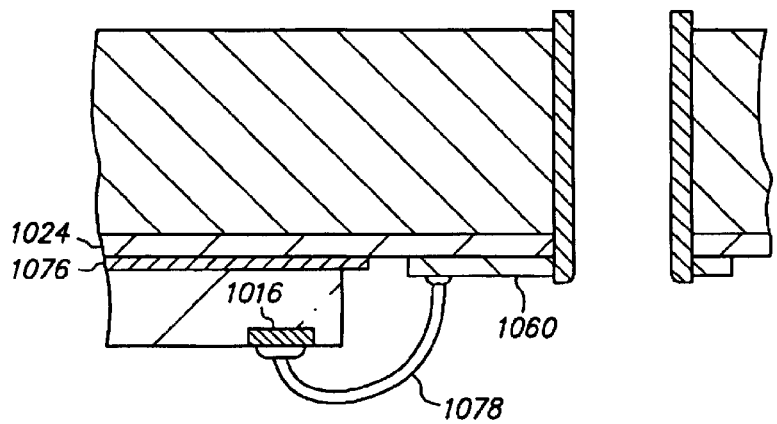
Figure 29M:
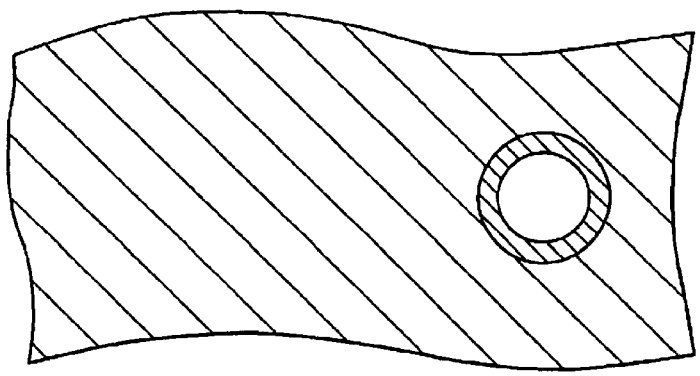
Figure 30M:
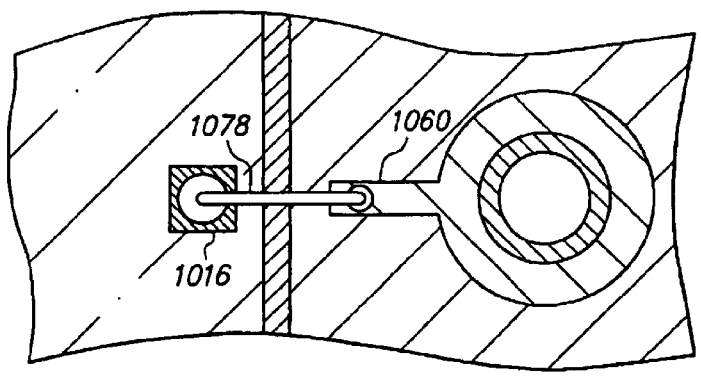

FIGS. 28M, 29M and 30M are cross-sectional, top and bottom views, respectively, of connection joint 1078 formed on pad 1016 and routing line 1060. Connection joint 1078 is a wire bond.

Wire bonding is by far the most common and economical connection technique. In this approach, wires are bonded, one at a time, from the chip to external circuitry by thermocompression, thermosonic or ultrasonic processes. In thermocompression bonding, fine gold wire is fed from a spool through a clamp and a capillary. A thermal source is swept past an end of the wire to form a wire ball that protrudes from the capillary. The chip or capillary is then heated to about 200 to 300° C., the capillary is brought down over an aluminum pad, the capillary exerts pressure on the wire ball, and the wire ball forms a ball bond on the pad. The capillary is then raised and moved to a terminal on the support circuit, the capillary is brought down again, and the combination of force and temperature forms a wedge bond between the wire and the terminal. Thus, the connection between the pad and the terminal includes the ball bond (which only contacts the pad), the wedge bond (which only contacts the terminal) and the wire between the bonds. After raising the capillary again, the wire is ripped from the wedge bond, the thermal source is swept past the wire to form a new wire ball, and the process is repeated for other pads on the chip. Thermosonic bonding is similar to thermocompression bonding but adds ultrasonic vibration as the ball and wedge bonds are formed so that less heat is necessary. Ultrasonic bonding uses aluminum wire to form wedge bonds without applying heat There are many variations on these basic methods.

Advantageously, connection joint 1078 does not require a through-hole in insulative base 1024 or adhesive 1070, which reduces process steps. However, connection joint 1078 is a wire bond that is far less effective and reliable than connection joint 178. For instance, connection joint 1078 creates a longer connection path with more inductive noise, cross-talk, propagation delay and waveform distortion than connection joint 178.

Figure 28N:
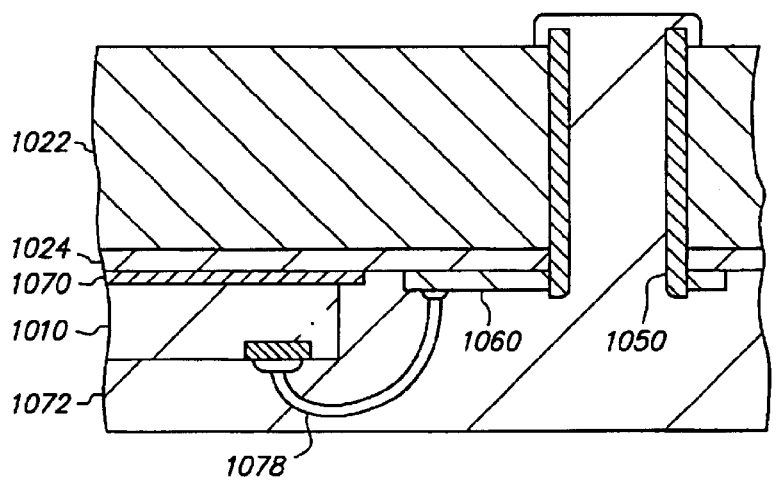
Figure 29N:
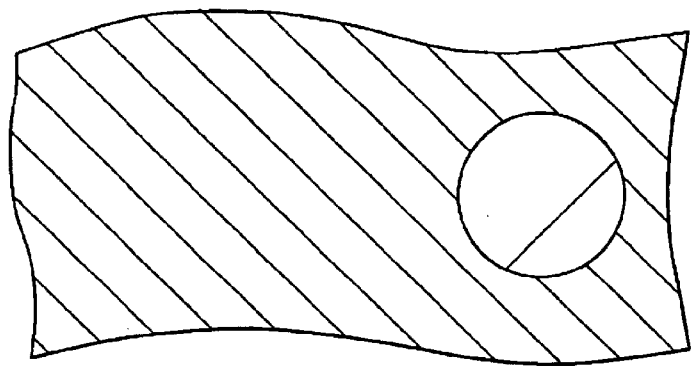
Figure 30N:
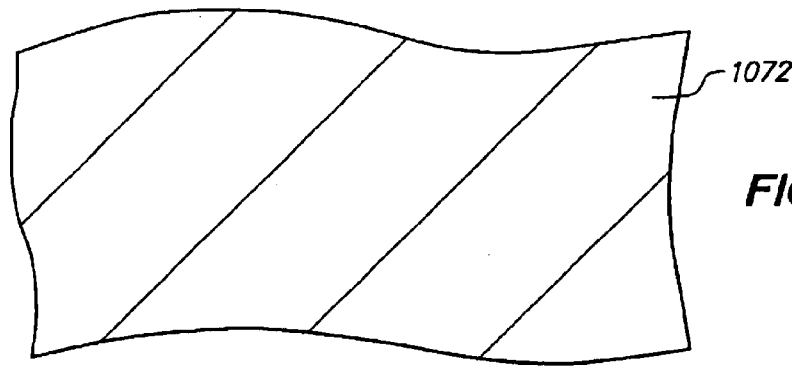

FIGS. 28N, 29N and 30N are cross-sectional, top and bottom views, respectively, of encapsulant 1072 formed on chip 1010, metal base 1022, insulative base 1024, contact terminal 1050, routing line 1060, adhesive 1070 and connection joint 1078 by transfer molding.

Figure 28O:
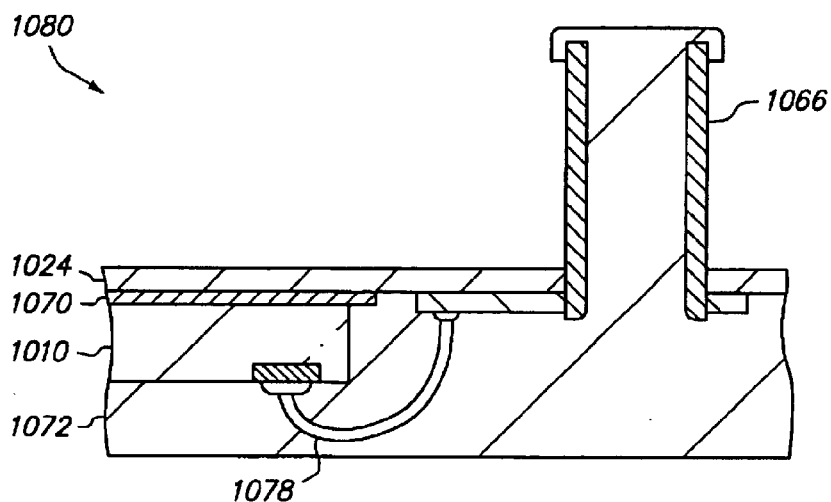
Figure 29O:
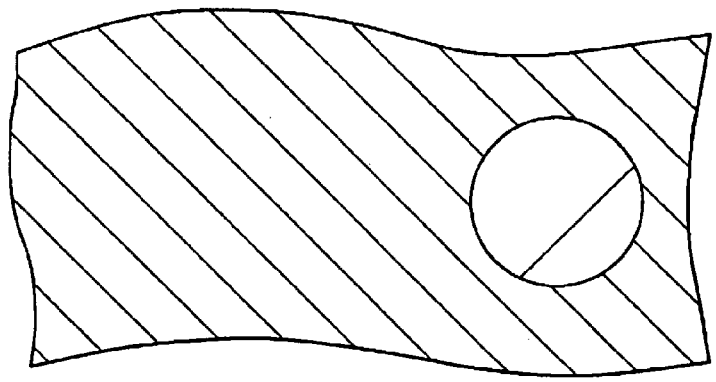
Figure 30O:
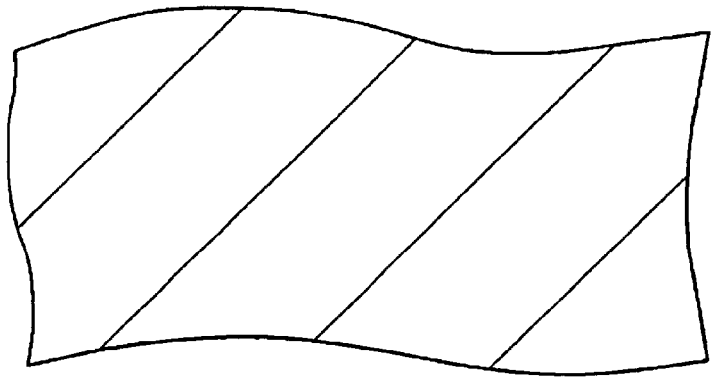

FIGS. 28O, 29O and 30O are cross-sectional, top and bottom views, respectively, of the structure after metal base 1022 is removed by wet chemical etching.

At this stage, the manufacture of semiconductor chip assembly 1080 that includes chip 1010, insulative base 1024, conductive trace 1066, adhesive 1070, encapsulant 1072 and connection joint 1078 can be considered complete.

The semiconductor chip assemblies described above are merely exemplary. Numerous other embodiments are contemplated. Likewise, various aspects of the embodiments described above can be combined with another. For instance, a semiconductor chip assembly can include contact terminal 650 and connection joint 1078, contact terminal 950 with plated metal portions 244A and 244B, contact terminal 850 and recesses 823 and 827 formed in via 540, and so on The embodiment best suited for a particular application depends on numerous factors. For instance, if the insulative base is less than 25 microns thick then the first embodiment may be preferred. If the insulative base is greater than 25 microns thick and the routing line requires fine dimensions and spacing then the third embodiment may be preferred. If the insulative base is greater than 25 microns thick and the routing line does not require fine dimensions and spacing then the eighth embodiment may be preferred. If the insulative base is unnecessary then the seventh embodiment may be preferred. If the contact terminal requires an exposed distal end then the ninth embodiment may be preferred If mature technologies such as plated through-holes and wire bonds are desired then the tenth embodiment may be preferred. Various aspects of the embodiments described above can be mixed-and-matched with one another and other embodiments depending on design and reliability considerations.

The conductive trace can have various shapes and sizes. The conductive trace can overlap various portions of the pad, such as two opposing peripheral edges and the center of the pad, one peripheral edge and the center of the pad, three peripheral edges but not the center of the pad, two corners and the center of the pad, or four peripheral edges but not the center of the pad.

The conductive trace can be various conductive metals including copper, gold, nickel, aluminum, palladium, tin, combinations thereof, and alloys thereof The preferred composition of the conductive trace will depend on the nature of the connection joint as well as design and reliability factors. Furthermore, those skilled in the art will understand that in the context of a semiconductor chip assembly, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper). The conductive trace may function as a signal, power or ground layer depending on the purpose of the associated chip pad. Likewise, the conductive trace can fan-in or fan-out or both, regardless of whether it includes a contact terminal.

The laminated structure can be formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. However, other laminated structures such as single clad laminates (that omit the metal base) and dual-insulator laminates (in which the metal base is replaced by a second insulative base that can be selectively etched with respect to the insulative base and the contact terminal) can also be employed.

The metal base and the metal layer can be various metals such as copper, gold, nickel, aluminum, palladium, tin, combinations thereof, and alloys, and need not necessarily have the same composition.

The metal base and the metal layer can each be a single layer or multiple layers. If desired, the metal layer (or routing line) can be spot plated near the pad to make it compatible with receiving the connection joint. For instance, a copper routing line can be spot plated with nickel and then silver to make it compatible with a gold ball bond connection joint and avoid the formation of brittle silver-copper intermetallic compounds. As another example, the metal layer can include a non-copper layer between a copper layer and the insulative base. Suitable non-copper layers include nickel, gold, palladium and silver. A gold layer is well-suited for receiving a gold ball bond connection joint.

The metal base need not necessarily be removed. For instance, a portion of the metal base above the pad can be selectively etched to permit formation of the through-hole, and another portion of the metal base that contacts the contact terminal can remain intact and provide part of the conductive trace. Alternatively, a portion of the metal base above the pad can be selectively etched to permit formation of the through-hole, another portion of the metal base that contacts the contact terminal can be selectively etched so that the contact terminal is electrically isolated from the metal base, and another portion of the metal base that is disposed within the periphery of the chip can remain intact and provide a heat sink.

The insulative base may be rigid or flexible, and can be various dielectric films or prepregs formed from numerous organic or inorganic insulators such as tape (polyimide), epoxy; silicone, glass, aramid and ceramic. Organic insulators are preferred for low cost, high dielectric applications, whereas inorganic insulators are preferred when high thermal dissipation and a matched thermal coefficient of expansion are important. Organic fiber reinforcement may also be used in the insulative base, particularly when the through-hole is not formed in the insulative base and the adhesive. Fibers that may be used include aramid, polyester, polyamide, poly-ether-ether-ketone, polyimide, polyetherimide and polysulfone. The fiber reinforcement can be woven fabric, non-woven fabric or paper. Commercially available dielectric materials such as SPEEDBOARD C prepreg by W. L. Gore & Associates of Eau Claire, Wis. are suitable.

The insulative base may be disposed between the metal base and the metal layer in numerous manners. For instance, an epoxy resin without reinforcement can be coated onto the metal base and then laminated to the metal layer as heat and pressure are applied. Alternatively, a prepreg with reinforcement can be a dry film that is sandwiched between the metal base and the metal layer and then laminated to the metal base and the metal layer as heat and pressure are applied.

The via can be formed in numerous manner. For instance, the via can be formed with a single removal step such as mechanical drilling, mechanical punching or laser drilling. Alternatively, the via can be formed with multiple removal steps. For example, a first plating mask can be deposited on the metal base, a second plating mask can be deposited on the metal layer, and the via can be formed through the second plating mask using laser drilling, then through the metal layer using wet chemical etching, then through the insulative base using laser drilling, then through the metal base using wet chemical etching. As another example, the via can be formed through the metal layer using wet chemical etching, then through the insulative base using plasma etching, then through the metal base using wet chemical etching.

The via can be formed with numerous configurations. For instance, the via can extend through the metal base, the insulative base and the metal layer. Alternatively, the via can extend through the metal layer and the insulative base and extend into but not through the metal base. Likewise, the via may reach but not extend into, extend into but not through, or extend through the metal base or the metal layer.

The contact terminal is particularly well-suited for interconnecting to the next level assembly. The contact terminal need not necessarily extend above the insulative base, and a ball, pad or pillar (columnar post) can be subsequently deposited on the contact terminal. Likewise, the contact terminal can be disposed within or outside the periphery of the chip, and the central bore in the contact terminal can be filled with the adhesive, the encapsulant, another material, or left empty. For instance, the contact terminal can be disposed within the periphery of the chip between the pad and an outer edge of the chip, and the adhesive which mechanically attaches the laminated structure to the chip can fill the central bore. In addition, the routing line can include a first portion that extends from the contact terminal to the pad, and a second portion that extends from the contact terminal beyond the outer edge.

The contact terminal can be formed with numerous techniques and materials. For instance, the contact terminal can be formed by electrolessly plating a tin layer on the metal layer, the insulative base and the metal base in the via, and then electroplating a copper layer on the tin layer. As another example, the contact terminal can include a tin surface layer rather than a gold surface layer. These approaches provide a tin-coated contact terminal that is well-suited for a tin reflow operation in a lead-free environment during the next level assembly, or alternatively, a solder reflow operation during the next level assembly in which solder paste is deposited on the contact terminal after the metal base is removed. Likewise, the contact terminal can include a silver surface layer that is well-suited for a solder reflow operation during the next level assembly. As another example, the contact terminal can include a solder surface layer. This provides a solder-coated contact terminal that is well-suited for a solder reflow operation during the next level assembly.

The metal layer can be etched to form the routing line at various stages. For instance, a photoresist layer can be formed over the metal layer before or after the via is formed, and before or after the contact terminal is formed. Similarly, the metal layer can be etched using the photoresist layer as an etch mask to form the routing line before or after the via is formed, and before or after the contact terminal is formed. Similarly, the photoresist layer can be stripped before or after the via is formed, and before or after the contact terminal is reflowed. Preferably, the photoresist layer is not present when the contact terminal is formed.

The pad can have numerous shapes including a flat rectangular shape and a bumped shape. For instance, a bump-shaped pad may extend into the through-hole and may even extend above the routing line. The pad can either be partially or completely exposed prior to forming the connection joint. The pad can have a length and width that are larger than, equal to, or smaller than the diameter of the through-hole. Preferably, the pad and through-hole have the same or similar size, and a substantial portion of the pad is directly beneath the through-hole. If desired, the pad can be treated to accommodate the connection joint For instance, the pad can be rendered catalytic to an electroless nickel connection joint by depositing several metal layers, such as chromium/copper/gold or titanium/nickel/gold on the aluminum base, or alternatively, zincating the aluminum base and electrolessly plating a nickel surface layer on the zincated aluminum base.

Numerous adhesives can be applied between the chip and the conductive trace. For instance, the adhesive can be applied as a paste, a laminated layer, or a liquid applied by screen-printing, spin-on or spray-on. If a paste or liquid adhesive is applied, the adhesive may contact the insulative base, whereas if a laminated adhesive is applied then no appreciable amount of adhesive may contact the insulative base. Thermosetting adhesive liquids and pastes such as epoxies are generally suitable. Likewise, thermoplastic adhesives such as an insulative thermoplastic polyimide film with a glass transition temperature (Tg) of 400° C. are also generally suitable. Furthermore, silicone adhesives are particularly well-suited if the adhesive extends into the contact terminal.

The through-hole may be formed either before or after mechanically attaching the conductive trace to the chip. For instance, the adhesive can be applied as a liquid or paste (A stage) to the bottom surface of the conductive trace, the adhesive can be partially cured (B stage), a back-side etch can form the through-hole in the insulative base and the adhesive, the partially cured adhesive can be brought into contact with the chip, and then the adhesive can be fully cured (C stage). Alternatively, the liquid or paste adhesive can be sandwiched between the chip and the conductive trace, the adhesive can be fully cured thereby mechanically fastening the chip to the conductive trace, and then a front-side etch can form the through-hole in the insulative base and the adhesive.

The through-hole can be formed with numerous etching techniques. For instance, the through-hole can be formed by laser ablation (including laser direct write without a mask and projection laser ablation with a mask) or plasma etching (including brief blanket plasma etching without a mask or plasma etching with a mask). The through-hole can also be formed by photo definition if a photosensitive dielectric is used. In addition, the through-hole can have a circular, ovular, square, rectangular or other shape (as viewed from the top surface of the insulative base). The through-bole may be aligned with and expose a single pad or a plurality of pads. Furthermore, the through-hole sidewalls may have a wide variety of shapes and slopes including vertical sidewalls, tapered sidewalls, continuous sidewalls and stepped sidewalls.

The encapsulant can be deposited on the chip using a wide variety of techniques including printing and transfer molding For instance, the encapsulant can be printed on the chip as an epoxy paste and then cured or hardened to form a solid adherent protective layer. The encapsulant can be any of the adhesives mentioned above or other plastic materials. Moreover, the encapsulant need not necessarily contact the chip. For instance, a glob-top coating can be deposited on the chip after mechanically attaching the chip to the laminated structure, and then the encapsulant can be formed on the glob-top coating.

The connection joint can be formed from a wide variety of materials including copper, gold, nickel, palladium, tin, alloys thereof, and combinations thereof, can be formed by a wide variety of processes including electroplating, electroless plating, ball bonding, solder reflowing and conductive adhesive curing, and can have a wide variety of shapes and sizes. The shape and composition of the connection joint depends on the composition of the routing line and the contact terminal as well as design and reliability considerations. Further details regarding an electroplated connection joint are disclosed in U.S. application Ser. No. 09/865,367 filed May 24, 2001 by Charles W. C. Lin entitled "Semiconductor Chip Assembly with Simultaneously Electroplated Contact Terminal and Connection Joint" which is incorporated by reference. Further details regarding an electrolessly plated connection joint are disclosed in U.S. application Ser. No. 09/864,555 filed May 24, 2001 by Charles W. C. Lin entitled "Semiconductor Chip Assembly with Simultaneously Electrolessly Plated Contact Terminal and Connection Joint" which is incorporated by reference. Further details regarding a ball bond connection joint are disclosed in U.S. application Ser. No. 09/864,773 filed May 24, 2001 by Charles W. C. Lin entitled "Semiconductor Chip Assembly with Ball Bond Connection Joint" which is incorporated by reference. Further details regarding a solder or conductive adhesive connection joint are disclosed in U.S. application Ser. No. 09/927,216 filed Aug. 10, 2001 by Charles W. C. Lin entitled "Semiconductor Chip Assembly with Hardened Connection Joint" which is incorporated by reference.

After the connection joint is formed, further encapsulation can be performed but is generally not necessary. However, it may be desirable to provide further encapsulation to enhance the mechanical strength of the assembly in the event the encapsulant and/or insulative base are particularly thin or omitted. Likewise, further encapsulation can be used to cover the connection joint.

After the connection joint is formed, a soldering material or solder ball can be deposited over the contact terminal by plating or printing or placement techniques if required for the next level assembly. However, the next level assembly may not require that the semiconductor chip assembly contain solder. For instance, in land grid array (LGA) packages, the soldering material is normally provided by the panel rather than the contact terminals on the semiconductor chip assembly. Moreover, the contact terminal can be formed with a solder surface layer, thereby rendering additional soldering material unnecessary. That is, the contact terminal itself can be reflowed to provide a solder joint for electrical connection with the next level assembly.

After the connection joint is formed, if a plating bus exists then it is disconnected from the conductive trace. The plating bus can be disconnected by mechanical sawing, laser cutting, chemical etching, and combinations thereof, If the plating bus is disposed about the periphery of the assembly but is not integral to the assembly, then the plating bus can be disconnected when the assembly is singulated from other assemblies. However, if the plating bus is integral to the assembly, or singulation has already occurred, then a photolithography step can be added to selectively cut related circuitry on the assembly that is dedicated to the plating bus since this circuitry would otherwise short the conductive traces together.

The "upper" and "lower" surfaces of the chip and the "top" and "bottom" surfaces of the conductive trace do not depend on the orientation of the assembly, as will be readily apparent to those skilled in the art. For instance, the upper surface of the chip includes the pad and faces the bottom surface of the insulative base, and the top surface of the contact terminal faces away from the chip, regardless of whether the assembly is inverted and/or mounted on a printed circuit board. Similarly, the conductive trace is disposed "above" the chip when the bottom surface of the conductive faces the upper surface of the chip regardless of whether the assembly is inverted, rotated or slanted. Likewise, the insulative base is shown above the chip, the insulative base is shown above the routing line, and the metal base is shown above the insulative base with a single orientation throughout the drawings for ease of comparison between the figures, although the assembly and its components may be inverted at various manufacturing stages.

The working format for the semiconductor chip assembly can be a single chip, a wafer, a strip or a panel based on the manufacturing design For instance, when the working format is a wafer, numerous assemblies are simultaneously batch manufactured on a single wafer and then separated from one another during singulation. As another example, when the working format is a strip (or reel-to-reel) form, the chips are individually attached to the strip. Semiconductor chip assemblies manufactured using a strip can be chip scale packages, chip size packages, bump grid arrays, or other structures. The wafer-based approach employs fewer steps and is less time consuming than the strip-based approach, however the strip-based approach is easier to control and has better dimensional stability than the wafer-based approach since aligning the conductive traces with the pads involves a single chip rather than the entire wafer.

Advantageously, the semiconductor chip assembly of the present invention is reliable and inexpensive. The insulative base and the encapsulant protect the chip from handling damage and provide a known dielectric barrier for the conductive trace. The insulative base and the encapsulant also provide critical mechanical support for the conductive trace during and after the metal base removal. The insulative base prevents solder reflow from electrically shorting the underlying routing line. The contact terminal yields enhanced reliability for the next level assembly. The contact terminal can exhibit compliance and flexibility for the next level assembly by defining a central bore that is filled with a compressible insulator such as the encapsulant. The mode of the connection shifts from the initial mechanical coupling to metallurgical coupling to assure sufficient metallurgical bond strength. Furthermore, the conductive trace can be mechanically and metallurgically coupled to the chip without wire bonding, TAB or solder joints, although the process is flexible enough to accommodate these techniques if desired. As a result, the assembly of the present invention significantly enhances throughput, yield and performance characteristics compared to conventional packaging techniques. Moreover, the assembly of the present invention is well-suited for use with materials compatible with copper chip and lead-free environmental requirements.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a semiconductor chip assembly, comprising:

providing a semiconductor chip that includes a conductive pad;

providing a conductive trace and a metal base, wherein the conductive trace includes a routing line and a contact terminal, the routing line is disposed outside the metal base, the contact terminal extends from the routing line through the metal base, the contact terminal includes a plated metal that contacts and extends through the metal base, the plated metal forms a peripheral sidewall portion of the contact terminal, and the plated metal surrounds a central surface area without extending into the central surface area; then mechanically attaching the chip to the conductive trace;

removing a portion of the metal base that contacts the plated metal; and forming a connection joint that contacts and electrically connects the conductive trace and the pad.

2. The method of claim 1, including mechanically attaching the chip to the conductive trace using an insulative adhesive.

3. The method of claim 2, including forming a through-hole that extends through the adhesive and exposes the routing line and the pad after removing the portion of the metal base and before forming the connection joint.

4. The method of claim 3, wherein the adhesive contacts and is sandwiched between the routing line and the pad, and the routing line and the pad are electrically isolated from one another after forming the through-hole and before forming the connection joint.

5. The method of claim 1, wherein the routing line contacts a side of the metal base that faces towards the chip after mechanically attaching the chip and before removing the portion of the metal base.

6. The method of claim 1, wherein the plated metal is integral with the routing line.

7. The method of claim 1, wherein the plated metal is spaced from the routing line.

8. The method of claim 1, wherein the plated metal is electrically connected to the routing line by a conductive adhesive that extends from the routing line into the metal base.

9. The method of claim 1, wherein the contact terminal consists of the plated metal.

10. The method of claim 1, wherein the contact terminal is aligned with an exposed side of the metal base that faces away from the routing line before mechanically attaching the chip.

11. The method of claim 1, wherein the contact terminal extends beyond an exposed side of the metal base that faces away from the routing line before mechanically attaching the chip.

12. The method of claim 1, wherein removing the portion of the metal base includes applying a wet chemical etch that is selective of the metal base with respect to the contact terminal.

13. The method of claim 1, wherein removing the portion of the metal base includes removing all of the metal base.

14. The method of claim 1, including filling an insulator into the contact terminal that extends from the routing line into the metal base and contacts the plated metal after mechanically attaching the chip and before removing the portion of the metal base.

15. The method of claim 14, wherein the insulator contacts a distal end of the contact terminal that faces away from the chip.

16. The method of claim 14, wherein the insulator contacts the peripheral sidewall portion of the contact terminal.

17. The method of claim 1, wherein the metal base is a first metal and the plated metal includes a second metal.

18. The method of claim 17, wherein the first metal is copper and the second metal is nickel.

19. The method of claim 18, wherein the plated metal includes a third metal that is gold or tin.

20. The method of claim 1, wherein the assembly is devoid of wire bonds, TAB leads and solder joints.

21. A method of making a semiconductor chip assembly, comprising:
   providing a semiconductor chip that includes a conductive pad;
   providing a conductive trace, an insulative base and a metal base, wherein the conductive trace includes a routing line and a contact terminal, the metal base and the routing line are disposed on opposite sides of the insulative base, the contact terminal extends from the routing line through the insulative base and the metal base, the contact terminal includes a plated metal that contacts and extends through the metal base, the plated metal forms a peripheral sidewall portion of the contact terminal, and the plated metal surrounds a central surface area without extending into the central surface area; then
   mechanically attaching the chip to the conductive trace such that the metal base is disposed on a side of the insulative base that faces away from the chip and the routing line is disposed on a side of the insulative base that faces towards the chip;
   removing a portion of the metal base that contacts the plated metal; and
   forming a connection joint that contacts and electrically connects the conductive trace and the pad.

22. The method of claim 21, including mechanically attaching the chip to the conductive trace using an insulative adhesive.

23. The method of claim 22, including forming a through-hole that extends through the insulative base and the adhesive and exposes the routing line and the pad after removing the portion of the metal base and before forming the connection joint.

24. The method of claim 23, wherein the adhesive contacts and is sandwiched between the routing line and the pad, and the routing line and the pad are electrically isolated from one another after forming the through-hole and before forming the connection joint.

25. The method of claim 21, wherein the plated metal is contiguous with the routing line.

26. The method of claim 21, wherein the plated metal is spaced from the routing line.

27. The method of claim 21, wherein the plated metal extends through the insulative base.

28. The method of claim 21, wherein the plated metal does not extend through the insulative base.

29. The method of claim 21, wherein the contact terminal consists of the plated metal.

30. The method of claim 21, wherein the contact terminal consists of the plated metal and a conductive adhesive, the plated metal does not extend through the insulative base, and the conductive adhesive extends through the insulative base.

31. The method of claim 21, wherein the contact terminal extends into and contacts sidewalls of an opening in the routing line.

32. The method of claim 21, wherein the contact terminal is aligned with an exposed side of the metal base that faces away from the insulative base before mechanically attaching the chip.

33. The method of claim 21, wherein the contact terminal extends beyond an exposed side of the metal base that faces away from the insulative base before mechanically attaching the chip.

34. The method of claim 21, wherein removing the portion of the metal base includes applying a wet chemical etch that is selective of the metal base with respect to the contact terminal.

35. The method of claim 21, wherein removing the portion of the metal base includes removing all of the metal base.

36. The method of claim 21, including filling an insulator into the contact terminal that extends from the routing line through the insulative base and the metal base and contacts the plated metal after mechanically attaching the chip and before removing the portion of the metal base.

37. The method of claim 36, wherein the insulator contacts a distal end of the contact terminal that faces away from the chip.

38. The method of claim 36, wherein the insulator contacts the peripheral sidewall portion of the contact terminal.

39. The method of claim 21, wherein the metal base and the metal layer are copper, the plated metal includes a first layer that contacts the metal base and a second layer that is spaced from the metal base, the first layer is gold or tin and the second layer is nickel.

40. The method of claim 21, wherein the assembly is devoid of wire bonds, TAB leads and solder joints.

41. A method of making a semiconductor chip assembly, comprising:
   providing a metal base, an insulative base and a metal layer, wherein the metal base and the metal layer are disposed on opposite sides of the insulative base;
   forming a via that extends through the insulative base and into the metal base and the metal layer;
   depositing a contact terminal into the via, wherein the contact terminal contacts the metal base, the insulative base and the metal layer in the via, the contact terminal includes a plated metal that contacts and extends into the metal base without extending through the insulative base, and the contact terminal includes a conductive adhesive that contacts the plated metal and extends through the insulative base and into the metal base;

forming a routing line from a first portion of the metal layer by selectively removing a second portion of the metal layer; then mechanically attaching a chip to the insulative base, wherein the chip includes a pad, a conductive trace includes the routing line and the contact terminal, the metal base is disposed on a side of the insulative base that faces away from the chip, and the routing line is disposed on a side of the insulative base that faces towards the chip;

removing a portion of the metal base that contacts the contact terminal; and forming a connection joint that contacts and electrically connects the conductive trace and the pad.

42. The method of claim 41, wherein forming the routing line includes:

forming a photoresist layer;

etching the metal layer using the photoresist layer as an etch mask; and removing the photoresist layer.

43. The method of claim 42, including depositing the contact terminal before etching the metal layer.

44. The method of claim 42, including depositing the contact terminal after etching the metal layer.

45. The method of claim 41, wherein the via extends through the metal base and the metal layer and has open opposing ends.

46. The method of claim 45, wherein the plated metal extends through the metal base before mechanically attaching the chip.

47. The method of claim 45, wherein the plated metal extends beyond an exposed side of the metal base that faces away from the insulative base before mechanically attaching the chip.

48. The method of claim 45, wherein the conductive adhesive extends through the metal base before mechanically attaching the chip.

49. The method of claim 41, wherein the via extends into but not through the metal base.

50. The method of claim 49, wherein the plated metal extends into but not through the metal base before mechanically attaching the chip.

51. The method of claim 49, wherein the plated metal is spaced from an exposed side of the metal base that faces away from the insulative base before mechanically attaching the chip.

52. The method of claim 49, wherein the conductive adhesive extends into but not through the metal base before mechanically attaching the chip.

53. The method of claim 41, wherein the contact terminal consists of the plated metal and the conductive adhesive.

54. The method of claim 53, wherein the plated metal forms a peripheral sidewall portion of the contact terminal and surrounds a central surface area without extending into the central surface area, and the conductive adhesive extends into all of the central surface area.

55. The method of claim 53, wherein the plated metal forms a peripheral sidewall portion of the contact terminal that surrounds a central surface area, the plated metal forms a distal end of the contact terminal that extends into all of the central surface area, and the conductive adhesive extends into all of the central surface area.

56. The method of claim 41, wherein the plated metal is spaced from the metal layer, and the conductive adhesive contacts and electrically connects the plated metal and the metal layer.

57. The method of claim 41, wherein the plated metal includes a first plated metal portion that contacts the metal base and a second plated metal portion that contacts the metal layer, the first and second plated metal portions are spaced from one another, and the conductive adhesive contacts and electrically connects the first and second plated metal portions.

58. The method of claim 41, wherein removing the portion of the metal base includes applying a wet chemical etch that is selective of the metal base with respect to the contact terminal.

59. The method of claim 41, wherein removing the portion of the metal base includes removing all of the metal base.

60. The method of claim 41, wherein the assembly is devoid of wire bonds, TAB leads and solder joints.

61. A method of making a semiconductor chip assembly, comprising:

providing a metal base;

forming a via that extends through the metal layer and has opposing open ends;

depositing a contact terminal into the via, wherein the contact terminal includes a plated metal that contacts the metal base in the via, the plated metal forms a peripheral sidewall portion of the contact terminal, and the plated metal surrounds a central surface area without extending into the central surface area;

depositing a routing line on the metal base outside the via that is contiguous with the contact terminal; then mechanically attaching a chip to the routing line using an insulative adhesive, wherein the chip includes a pad, and a conductive trace includes the routing line and the contact terminal;

removing a portion of the metal base that contacts the contact terminal; and forming a connection joint that contacts and electrically connects the routing line and the pad.

62. The method of claim 61, wherein forming the via includes applying a wet chemical etch to the metal base.

63. The method of claim 61, wherein depositing the contact terminal and the routing line includes simultaneously plating the plated metal on the metal base in and outside the via.

64. The method of claim 61, wherein removing the portion of the metal base includes applying a wet chemical etch that is highly selective of the metal base with respect to the contact terminal and removes all of the metal base.

65. The method of claim 61, including filling an insulator into the via such that the insulator extends from the routing line through the metal base and contacts the plated metal after mechanically attaching the chip and before removing the portion of the metal base.

66. The method of claim 65, wherein filling the insulator includes transfer molding.

67. The method of claim 66, wherein the insulator contacts a distal end of the contact terminal that faces away from the chip.

68. The method of claim 67, wherein the insulator contacts the peripheral sidewall portion of the contact terminal.

69. The method of claim 68, wherein the insulator is a single-piece encapsulant that contacts the chip, the insulative base and the routing line outside the via.

70. The method of claim 61, wherein the assembly is devoid of wire bonds, TAB leads and solder joints.

71. A method of making a semiconductor chip assembly, comprising:

providing a metal base, an insulative base and a metal layer, wherein the metal base and the metal layer are disposed on opposite sides of the insulative base;

forming a via that extends through the metal base, the insulative base and the metal layer and has opposing open ends;

depositing a contact terminal into the via, wherein the contact terminal contacts the metal base, the insulative base and the metal layer in the via, the contact terminal includes a plated metal that contacts and extends through the metal base, the plated metal forms a peripheral sidewall portion of the contact terminal, and the plated metal surrounds a central surface area without extending into the central surface area;

forming a routing line from a first portion of the metal layer by selectively removing a second portion of the metal layer; then mechanically attaching a chip to the insulative base using an insulative adhesive, wherein the chip includes a pad, a conductive trace includes the routing line and the contact terminal, the metal base is disposed on a side of the insulative base that faces away from the chip the routing line is disposed on a side of the insulative base that faces towards the chip, and the contact terminal contacts the routing line;

removing a portion of the metal base that contacts the contact terminal; and forming a connection joint that contacts and electrically connects the routing line and the pad.

72. The method of claim 71, wherein forming the via includes mechanically drilling through the metal base, the insulative base and the metal layer.

73. The method of claim 71, wherein forming the via includes applying a wet chemical etch to the metal base, applying a laser etch or plasma etch to the insulative base, and applying a wet chemical etch to the metal layer.

74. The method of claim 71, wherein depositing the contact terminal includes:

plating the plated metal into the via and on the metal base without plating the plated metal on the metal layer; and then plating the plated metal into the via and on the metal layer.

75. The method of claim 71, wherein depositing the contact terminal includes:

plating the plated metal into the via as a first plated metal portion on the metal base and a second plated metal portion on the metal layer without the first and second plated metal portions contacting one another; and then plating the plated metal into the via such that the first and second plated metal portions contact one another in the via.

76. The method of claim 71, wherein depositing the contact terminal includes:

electroplating the plated metal into the via as a first plated metal portion on the metal base and a second plated metal portion on the metal layer without the first and second plated metal portions contacting one another; and then electrolessly plating the plated metal into the via as a third plated metal portion on the first and second plated metal portions and the insulative base.

77. The method of claim 71, wherein depositing the contact terminal includes:

plating the plated metal into the via and on the metal base without plating the plated metal on the metal layer; and then depositing a conductive adhesive into the via and on the plated metal and the metal layer.

78. The method of claim 71, wherein depositing the contact terminal includes:

plating the plated metal into the via as a first plated metal portion on the metal base and a second plated metal portion on the metal layer without the first and second plated metal portions contacting one another; and then depositing a conductive adhesive into the via and on the first and second plated metal portions.

79. The method of claim 71, wherein forming the via and depositing the contact terminal includes:

mechanically drilling through the metal base, the insulative base and the metal layer to form the via; then etching the metal base and the metal layer in the via such that the metal base and the metal layer are recessed relative to the insulative base in the via; and then plating the plated metal into the via and on the metal base and the metal layer.

80. The method of claim 71, wherein forming the via and depositing the contact terminal includes:

mechanically drilling through the metal base, the insulative base and the metal layer to form the via; then etching the metal base and the metal layer in the via such that the metal base and the metal layer are recessed relative to the insulative base in the via; then electroplating the plated metal into the via as a first plated metal portion on the metal base and a second plated metal portion on the metal layer without the first and second plated metal portions contacting one another;

rendering the insulative base in the via catalytic to electroless plating; and then electrolessly plating the plated metal into the via as a third plated metal portion on the first and second plated metal portions and the insulative base.

81. The method of claim 71, wherein forming the routing line includes:

forming a photoresist layer;

etching the metal layer using the photoresist layer as an etch mask; and removing the photoresist layer.

82. The method of claim 71, wherein removing the portion of the metal base includes applying a wet chemical etch that is highly selective of the metal base with respect to the insulative base and the contact terminal and removes all of the metal base.

83. The method of claim 71, including filling an insulator into the via such that the insulator extends from the routing line through the insulative base and the metal base and contacts the plated metal after mechanically attaching the chip and before removing the portion of the metal base.

84. The method of claim 83, wherein filling the insulator includes transfer molding.

85. The method of claim 83, wherein the insulator contacts a distal end of the contact terminal that faces away from the chip.

86. The method of claim 83, wherein the insulator contacts the peripheral sidewall portion of the contact terminal.

87. The method of claim 83, wherein the insulator is a single-piece encapsulant that contacts the chip, the insulative base and the routing line outside the via, and the encapsulant is compressible and permits the contact terminal to exhibit elastic deformation in response to externally applied pressure.

88. The method of claim 71, including forming an encapsulant by transfer molding that contacts the chip, the insulative base and the routing line after mechanically attaching the chip and before removing the portion of the metal base, wherein the routing line extends within and outside a periphery of the chip, the contact terminal is disposed outside the periphery of the chip and includes a distal end that faces away from the chip, and the encapsulant extends through the metal base and contacts the distal end and the peripheral sidewall portion of the contact terminal.

89. The method of claim 71, wherein the steps are performed in the sequence set forth.

90. The method of claim 71, wherein the assembly is devoid of wire bonds, TAB leads and solder joints.

91. A method of making a semiconductor chip assembly, comprising:

providing a metal base, an insulative base and a metal layer, wherein the metal base and the metal layer are disposed on opposite sides of the insulative base;

forming a via that extends through the metal layer, the insulative base and the metal base and has opposing open ends;

forming a conductive trace that includes a routing line and a contact terminal, wherein the routing line includes an unetched portion of the metal layer, the contact terminal includes a plated metal that contacts the metal base in the via, the plated metal forms a peripheral sidewall portion of the contact terminal, and the plated metal surrounds a central surface area without extending into the central surface area;

mechanically attaching a chip to the conductive trace, wherein the chip includes a pad, the metal base is disposed on a side of the insulative base that faces away from the chip, and the routing line is disposed on a side of the insulative base that faces towards the chip;

removing a portion of the metal base that contacts the contact terminal, wherein the plated metal includes an exposed protruding portion that extends beyond the insulative base in a direction away from the chip; and forming a connection joint that contacts and electrically connects the routing line and the pad.

92. The method of claim 91, wherein forming the via includes mechanically drilling through the metal base, the insulative base and the metal layer.

93. The method of claim 91, wherein forming the contact terminal includes:

plating the plated metal into the via and on the metal base without the plated metal extending through the insulative base; and then plating the plated metal into the via such that the plated metal contacts the metal base and the metal layer and extends through the insulative base.

94. The method of claim 91, wherein forming the contact terminal includes:

plating the plated metal into the via and on the metal base without the plated metal extending through the insulative base; and then depositing a conductive adhesive into the via and on the plated metal, wherein the conductive adhesive extends through the insulative base.

95. The method of claim 91, wherein forming the routing line includes:

forming a photoresist layer;

etching the metal layer using the photoresist layer as an etch mask; and removing the photoresist layer.

96. The method of claim 91, wherein removing the portion of the metal base includes applying a wet chemical etch that is highly selective of the metal base with respect to the contact terminal and removes all of the metal base.

97. The method of claim 91, including transfer molding an encapsulant into the via that extends through the routing line, the insulative base and the metal base, contacts the routing line, the insulative base and the plated metal in the via, and extends into all of the central surface area after mechanically attaching the chip.

98. The method of claim 97, wherein the encapsulant contacts and covers a distal end of the contact terminal that faces away from the chip.

99. The method of claim 91, wherein the steps are performed in the sequence set forth.

100. The method of claim 91, wherein the assembly is devoid of wire bonds, TAB leads and solder joints.

101. A method of making a semiconductor chip assembly, comprising:

providing a metal base, an insulative base and a metal layer, wherein the metal base and the metal layer are disposed on opposite sides of the insulative base;

forming a first plating mask on the metal base and a second plating mask on the metal layer;

forming a via that extends through the metal base, the insulative base, the metal layer and the plating masks and has opposing open ends;

depositing a contact terminal into the via, wherein the contact terminal includes a plated metal that contacts and extends through the metal base, the insulative base and the metal layer in the via, and the contact terminal surrounds a central surface area without extending into the central surface area;

removing the plating masks;

forming a routing line that includes a first portion of the metal layer by selectively removing a second portion of the metal layer;

mechanically attaching a chip to a conductive trace, wherein the chip includes a pad, the conductive trace includes the routing line and the contact terminal the metal base is disposed on a side of the insulative base that faces away from the chip, and the routing line is disposed on a side of the insulative base that faces towards the chip;

removing a portion of the metal base that contacts the contact terminal; and forming a connection joint that contacts and electrically connects the routing line and the pad.

102. The method of claim 101, wherein forming the via includes mechanically drilling through the metal base, the insulative base, the metal layer and the plating masks.

103. The method of claim 101, wherein depositing the contact terminal includes:

electroplating the plated metal into the via and on the metal base without electroplating the plated metal on the metal layer; and then electroplating the plated metal into the via and on the metal layer.

104. The method of claim 101, wherein depositing the contact terminal includes:

electroplating the plated metal into the via as a first plated metal portion on the metal base and a second plated metal portion on the metal layer without the first and second plated metal portions contacting one another; and then electroplating the plated metal into the via such that the first and second plated metal portions contact one another in the via.

105. The method of claim 101, wherein forming the routing line includes:
- forming a photoresist layer;
- etching the metal layer using the photoresist layer as an etch mask; and
- removing the photoresist layer.

106. The method of claim 101, wherein removing the portion of the metal base includes applying a wet chemical etch that is highly selective of the metal base with respect to the insulative base and the contact terminal and removes all of the metal base.

107. The method of claim 101, including transfer molding an encapsulant into the via such that the encapsulant extends through the routing line, the insulative base and the contact terminal after mechanically attaching the chip.

108. The method of claim 107, wherein the encapsulant contacts and covers a distal end of the contact terminal that faces away from the chip.

109. The method of claim 107, wherein the encapsulant contacts the chip, the insulative base and the routing line outside the via.

110. The method of claim 101, wherein the steps are performed in the sequence set forth.

111. A method of making a semiconductor chip assembly, comprising:
- providing a metal base, an insulative base and a metal layer, wherein the metal base and the metal layer are disposed on opposite sides of the insulative base;
- forming a first plating mask on the metal base and a second plating mask on the metal layer;
- forming a via that extends through the metal base, the insulative base, the metal layer and the plating masks and has opposing open ends;
- etching the metal base and the metal layer in the via such that the metal base and the metal layer are recessed relative to the insulative base in the via;
- depositing a contact terminal into the via, wherein the contact terminal includes a plated metal that contacts the metal base and the metal layer and extends through the metal base, the insulative base and the metal layer in the via, and the contact terminal surrounds a central surface area without extending into the central surface area;
- removing the plating masks;
- forming a routing line that includes a first portion of the metal layer by selectively removing a second portion of the metal layer;
- mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip;
- removing a portion of the metal base that contacts the contact terminal; and
- forming a connection joint that contacts and electrically connects the routing line and the pad.

112. The method of claim 111, wherein forming the via includes mechanically drilling through the metal base, the insulative base, the metal layer and the plating masks.

113. The method of claim 111, wherein depositing the contact terminal includes:
- electroplating the plated metal into the via as a first plated metal portion on the metal base and a second plated metal portion on the metal layer without the first and second plated metal portions contacting one another;
- rendering the insulative base in the via catalytic to electroless plating; and then
- electrolessly plating the plated metal into the via as a third plated metal portion on the first and second plated metal portions and the insulative base.

114. The method of claim 113, including removing the plating masks after the electroplating and before the electroless plating.

115. The method of claim 111, wherein forming the routing line includes:
- forming a photoresist layer;
- etching the metal layer and the plated metal using the photoresist layer as an etch mask; and
- removing the photoresist layer.

116. The method of claim 111, wherein removing the portion of the metal base includes applying a wet chemical etch that is highly selective of the metal base with respect to the insulative base and the contact terminal and removes all of the metal base.

117. The method of claim 111, including transfer molding an encapsulant into the via such that the encapsulant extends through the routing line, the insulative base and the contact terminal after mechanically attaching the chip.

118. The method of claim 117, wherein the encapsulant contacts and covers a distal end of the contact terminal that faces away from the chip.

119. The method of claim 117, wherein the encapsulant contacts the chip, the insulative base and the routing line outside the via.

120. The method of claim 111, wherein the steps before and after removing the plating masks are performed in the sequence set forth.

121. A method of making a semiconductor chip assembly, comprising:
- providing a metal base, an insulative base and a metal layer, wherein the metal base and the metal layer are disposed on opposite sides of the insulative base;
- forming a first plating mask on the metal base and a second plating mask on the metal layer;
- forming a via that extends through the second plating mask, the metal layer and the insulative base, extends into but not through the metal base and is spaced from the fist plating mask;
- depositing a contact terminal into the via, wherein the contact terminal includes a plated metal that contacts and extends into the metal base without extending through the insulative base, and the contact terminal includes a conductive adhesive that contacts the plated metal and the insulative base, extends through the insulative base and extends into the metal base;
- removing the plating masks;
- forming a routing line that includes a first portion of the metal layer by selectively removing a second portion of the metal layer;
- mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip;
- removing a portion of the metal base that contacts the contact terminal; and forming a connection joint that contacts and electrically connects the routing line and the pad.

122. The method of claim 121, wherein forming the via includes mechanically drilling through the second plating mask, the metal layer, the insulative base, and into but not through the metal base.

123. The method of claim 121, wherein depositing the contact terminal includes:
plating the plated metal into the via and on the metal base without plating the plated metal on the metal layer; and then
depositing the conductive adhesive into the via and on the plated metal and the metal layer.

124. The method of claim 121, wherein depositing the contact terminal includes:
plating the plated metal into the via as a first plated metal portion on the metal base and a second plated metal portion on the metal layer without the first and second plated metal portions contacting one another; and then
depositing the conductive adhesive into the via and on the first and second plated metal portions.

125. The method of claim 121, wherein forming the routing line includes:
forming a photoresist layer;
etching the metal layer using the photoresist layer as an etch mask; and
removing the photoresist layer.

126. The method of claim 121, wherein removing the portion of the metal base includes applying a wet chemical etch that is highly selective of the metal base with respect to the insulative base and the contact terminal and removes all of the metal base.

127. The method of claim 121, including transfer molding an encapsulant on the chip, the insulative base, the routing line and the conductive adhesive after mechanically attaching the chip.

128. The method of claim 127, wherein the encapsulant is spaced from the plated metal.

129. The method of claim 127, wherein the encapsulant is spaced from the metal base.

130. The method of claim 121, wherein the steps are performed in the sequence set forth.

131. A method of making a semiconductor chip assembly, comprising:
providing a metal base, an insulative base and a metal layer, wherein the metal base and the metal layer are disposed on opposite sides of the insulative base;
forming a via that extends through the insulative base and the metal layer and extends into the metal base by mechanical drilling;
etching the metal base and the metal layer in the via by applying a wet chemical etch that is highly selective of the metal base and the metal layer with respect to the insulative base such that the metal base and the metal layer are recessed relative to the insulative base in the via;
depositing a contact terminal into the via, wherein the contact terminal includes a plated metal that contacts the metal base and the metal layer, extends through the insulative base and the metal layer in the via, and extends into the metal base in the via;
forming a routing line that includes a first portion of the metal layer by selectively removing a second portion of the metal layer;
mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip;
removing a portion of the metal base that contacts the contact terminal; and
forming a connection joint that contacts and electrically connects the routing line and the pad.

132. The method of claim 131, wherein the via extends through the metal base and has open opposing ends.

133. The method of claim 131, wherein the via extends into but not through the metal base.

134. The method of claim 131, wherein depositing the contact terminal includes:
electroplating the plated metal into the via and on the metal base without the plated metal extending through the insulative base;
rendering the insulative base in the via catalytic to electroless plating; and then
electrolessly plating the plated metal into the via such that the plated metal extends through the insulative base.

135. The method of claim 131, wherein forming the routing line includes:
forming a photoresist layer;
etching the metal layer and the plated metal using the photoresist layer as an etch mask; and
removing the photoresist layer.

136. The method of claim 131, wherein removing the portion of the metal base includes applying a wet chemical etch that is highly selective of the metal base with respect to the insulative base and the contact terminal.

137. The method of claim 131, including transfer molding an encapsulant into the via such that the encapsulant extends through the routing line and the insulative base and extends into the metal base after mechanically attaching the chip.

138. The method of claim 137, including transfer molding the encapsulant before removing the portion of the metal base.

139. The method of claim 137, wherein the encapsulant contacts the chip, the insulative base and the routing line outside the via.

140. The method of claim 131, wherein the steps before forming the connection joint are performed in the sequence set forth.

141. A method of making a semiconductor chip assembly, comprising:
providing a semiconductor chip that includes a conductive pad;
providing a conductive trace and a metal base, wherein the conductive trace includes a routing line and a contact terminal, the routing line is disposed outside the metal base, the contact terminal extends from the routing line through the metal base, the contact terminal includes a plated metal that contacts and extends through the metal base, the plated metal forms a peripheral sidewall portion of the contact terminal, and the plated metal surrounds a central surface area without extending into the central surface area; then
mechanically attaching the chip to the conductive trace; then
removing a portion of the metal base that contacts the plated metal, thereby electrically isolating the contact terminal from other contact terminals that extend through the metal base; and forming a connection joint that contacts and electrically connects the conductive trace and the pad.

142. The method of claim 141, including mechanically attaching the chip to the conductive trace using an adhesive.

143. The method of claim 142, including forming a through-hole that extends through the adhesive and exposes the routing line and the pad after mechanically attaching the chip and before forming the connection joint.

144. The method of claim 143, wherein the adhesive contacts and is sandwiched between the routing line and the pad, and the routing line and the pad are electrically isolated from one another after forming the through-hole and before forming the connection joint.

145. The method of claim 141, wherein the routing line contacts a side of the metal base that faces towards the chip after mechanically attaching the chip and before removing the portion of the metal base.

146. The method of claim 141, wherein the plated metal is integral with the routing line.

147. The method of claim 141, wherein the plated metal is spaced from the routing line.

148. The method of claim 141, wherein the plated metal is electrically connected to the routing line by a conductive adhesive that extends from the routing line into the metal base.

149. The method of claim 141, wherein the contact terminal consists of the plated metal.

150. The method of claim 141, wherein the contact terminal is aligned with an exposed side of the metal base that faces away from the routing line before mechanically attaching the chip.

151. The method of claim 141, wherein the contact terminal extends beyond an exposed side of the metal base that faces away from the routing line before mechanically attaching the chip.

152. The method of claim 141, wherein removing the portion of the metal base includes applying a wet chemical etch that is selective of the metal base with respect to the contact terminal.

153. The method of claim 141, wherein removing the portion of the metal base includes removing all remaining portions of the metal base that overlap the chip.

154. The method of claim 141, including filling an insulator into the contact terminal that extends from the routing line into the metal base and contacts the plated metal after mechanically attaching the chip and before removing the portion of the metal base.

155. The method of claim 154, wherein the insulator contacts a distal end of the contact terminal that faces away from the chip.

156. The method of claim 154, wherein the insulator contacts the peripheral sidewall portion of the contact terminal.

157. The method of claim 141, wherein the metal base is a first metal and the plated metal includes a second metal.

158. The method of claim 157, wherein the first metal is copper and the second metal is nickel.

159. The method of claim 158, wherein the plated metal includes a third metal that is gold or tin.

160. The method of claim 141, wherein the assembly is devoid of wire bonds, TAB leads and solder joints.

161. A method of making a semiconductor chip assembly, comprising:
providing a semiconductor chip that includes a conductive pad;
providing a conductive trace, an insulative base and a metal base, wherein the conductive trace includes a routing line and a contact terminal, the metal base and the routing line are disposed on opposite sides of the insulative base, the contact terminal extends from the routing line through the insulative base and the metal base, the contact terminal includes a plated metal that contacts and extends through the metal base, the plated metal forms a peripheral sidewall portion of the contact terminal, and the plated metal surrounds a central surface area without extending into the central surface area; then
mechanically attaching the chip to the, conductive trace such that the metal base is disposed on a side of the insulative base that faces away from the chip and the routing line is disposed on a side of the insulative base that faces towards the chip; then
removing a portion of the metal base that contacts the plated metal, thereby electrically isolating the contact terminal from other contact terminals that extend through the insulative base and the metal base; and
forming a connection joint that contacts and electrically connects the conductive trace and the pad.

162. The method of claim 161, including mechanically attaching the chip to the conductive trace using an adhesive.

163. The method of claim 162, including forming a through-hole that extends through the insulative base and the adhesive and exposes the routing line and the pad after mechanically attaching the chip and before forming the connection joint.

164. The method of claim 163, wherein the adhesive contacts and is sandwiched between the routing line and the pad, and the routing line and the pad are electrically isolated from one another after forming the through-hole and before forming the connection joint.

165. The method of claim 161, wherein the plated metal is contiguous with the routing line.

166. The method of claim 161, wherein the plated metal is spaced from the routing line.

167. The method of claim 161, wherein the plated metal extends through the insulative base.

168. The method of claim 161, wherein the plated metal does not extend through the insulative base.

169. The method of claim 161, wherein the contact terminal consists of the plated metal.

170. The method of claim 161, wherein the contact terminal consists of the plated metal and a conductive adhesive, the plated metal does not extend through the insulative base, and the conductive adhesive extends through the insulative base.

171. The method of claim 161, wherein the contact terminal extends into and contacts sidewalls of an opening in the routing line.

172. The method of claim 161, wherein the contact terminal is aligned with an exposed side of the metal base that faces away from the insulative base before mechanically attaching the chip.

173. The method of claim 161, wherein the contact terminal extends beyond an exposed side of the metal base that faces away from the insulative base before mechanically attaching the chip.

174. The method of claim 161, wherein removing the portion of the metal base includes applying a wet chemical etch that is selective of the metal base with respect to the contact terminal.

175. The method of claim 161, wherein removing the portion of the metal base includes removing all remaining portions of the metal base that overlap the chip.

176. The method of claim 161, including filling an insulator into the contact terminal that extends from the routing line through the insulative base and the metal base and contacts the plated metal after mechanically attaching the chip and before removing the portion of the metal base.

177. The method of claim 176, wherein the insulator contacts a distal end of the contact terminal that faces away from the chip.

178. The method of claim 176, wherein the insulator contacts the peripheral sidewall portion of the contact terminal.

179. The method of claim 161, wherein the metal base and the metal layer are copper, the plated metal includes a first layer that contacts the metal base and a second layer that is spaced from the metal base, the first layer is gold or tin and the second layer is nickel.

180. The method of claim 161, wherein the assembly is devoid of wire bonds, TAB leads and solder joints.

181. A method of making a semiconductor chip assembly, comprising:
providing a metal base, an insulative base and a metal layer, wherein the metal base and the metal layer are disposed on opposite sides of the insulative base;
forming a via that extends through the insulative base and into the metal base and the metal layer;
depositing a contact terminal into the via, wherein the contact terminal contacts the metal base, the insulative base and the metal layer in the via, the contact terminal includes a plated metal that contacts and extends into the metal base without extending through the insulative base, and the contact terminal includes a conductive adhesive that contacts the plated metal and extends through the insulative base and into the metal base;
forming a routing line from a first portion of the metal layer by selectively removing a second portion of the metal layer; then
mechanically attaching a chip to the insulative base, wherein the chip includes a pad, a conductive trace includes the routing line and the contact terminal, the metal base is disposed on a side of the insulative base that faces away from the chip, and the routing line is disposed on a side of the insulative base that faces towards the chip; then
removing a portion of the metal base that contacts the contact terminal, thereby electrically isolating the contact terminal from other contact terminals that extend through the insulative base and into the metal base; and
forming a connection joint that contacts and electrically connects the conductive trace and the pad.

182. The method of claim 181, wherein forming the routing line includes:
forming a photoresist layer;
etching the metal layer using the photoresist layer as an etch mask; and
removing the photoresist layer.

183. The method of claim 182, including depositing the contact terminal before etching the metal layer.

184. The method of claim 182, including depositing the contact terminal after etching the metal layer.

185. The method of claim 181, wherein the via extends through the metal base and the metal layer and has open opposing ends.

186. The method of claim 185, wherein the plated metal extends through the metal base before mechanically attaching the chip.

187. The method of claim 185, wherein the plated metal extends beyond an exposed side of the metal base that faces away from the insulative base before mechanically attaching the chip.

188. The method of claim 185, wherein the conductive adhesive extends through the metal base before mechanically attaching the chip.

189. The method of claim 181, wherein the via extends into but not through the metal base.

190. The method of claim 189, wherein the plated metal extends into but not through the metal base before mechanically attaching the chip.

191. The method of claim 189, wherein the plated metal is spaced from an exposed side of the metal base that faces away from the insulative base before mechanically attaching the chip.

192. The method of claim 189, wherein the conductive adhesive extends into but not through the metal base before mechanically attaching the chip.

193. The method of claim 181, wherein the contact terminal consists of the plated metal and the conductive adhesive.

194. The method of claim 193, wherein the plated metal forms a peripheral sidewall portion of the contact terminal and surrounds a central surface area without extending into the central surface area, and the conductive adhesive extends into all of the central surface area.

195. The method of claim 193, wherein the plated metal forms a peripheral sidewall portion of the contact terminal that surrounds a central surface area, the plated metal forms a distal end of the contact terminal that extends into all of the central surface area, and the conductive adhesive extends into all of the central surface area.

196. The method of claim 181, wherein the plated metal is spaced from the metal layer, and the conductive adhesive contacts and electrically connects the plated metal and the metal layer.

197. The method of claim 181, wherein the plated metal includes a first plated metal portion that contacts the metal base and a second plated metal portion that contacts the metal layer, the first and second plated metal portions are spaced from one another, and the conductive adhesive contacts and electrically connects the first and second plated metal portions.

198. The method of claim 181, wherein removing the portion of the metal base includes applying a wet chemical etch that is selective of the metal base with respect to the contact terminal.

199. The method of claim 181, wherein removing the portion of the metal base includes removing all remaining portions of the metal base that overlap the chip.

200. The method of claim 181, wherein the assembly is devoid of wire bonds, TAB leads and solder joints.

201. A method of making a semiconductor chip assembly, comprising:
providing a metal base;
forming a via that extends through the metal layer and has opposing open ends;
depositing a contact terminal into the via, wherein the contact terminal includes a plated metal that contacts the metal base in the via, the plated metal forms a peripheral sidewall portion of the contact terminal, and the plated metal surrounds a central surface area without extending into the central surface area;
depositing a routing line on the metal base outside the via that is contiguous with the contact terminal; then
mechanically attaching a chip to the routing line using an adhesive, wherein the chip includes a pad, and a conductive trace includes the routing line and the contact terminal; then removing a portion of the metal base that contacts the contact terminal, thereby electrically isolating the contact terminal from other contact terminals; and forming a connection joint that contacts and electrically connects the routing line and the pad.

202. The method of claim 201, wherein forming the via includes applying a wet chemical etch to the metal base.

203. The method of claim 201, wherein depositing the contact terminal and the routing line includes simultaneously plating the plated metal on the metal base in and outside the via.

204. The method of claim 201, wherein removing the portion of the metal base includes applying a wet chemical etch that is highly selective of the metal base with respect to the contact terminal and removes all remaining portions of the metal base that overlap the chip.

205. The method of claim 201, including filling an insulator into the via such that the insulator extends from the routing line through the metal base and contacts the plated metal after mechanically attaching the chip and before removing the portion of the metal base.

206. The method of claim 205, wherein filling the insulator includes transfer molding.

207. The method of claim 206, wherein the insulator contacts a distal end of the contact terminal that faces away from the chip.

208. The method of claim 207, wherein the insulator contacts the peripheral sidewall portion of the contact terminal.

209. The method of claim 208, wherein the insulator is a single-piece encapsulant that contacts the chip, the insulative base and the routing line outside the via.

210. The method of claim 201, wherein the assembly is devoid of wire bonds, TAB leads and solder joints.

211. A method of making a semiconductor chip assembly, comprising:

providing a metal base, an insulative base and a metal layer, wherein the metal base and the metal layer are disposed on opposite sides of the insulative base;

forming a via that extends through the metal base, the insulative base and the metal layer and has opposing open ends;

depositing a contact terminal into the via, wherein the contact terminal contacts the metal base, the insulative base and the metal layer in the via, the contact terminal includes a plated metal that contacts and extends through the metal base, the plated metal forms a peripheral sidewall portion of the contact terminal, and the plated metal surrounds a central surface area without extending into the central surface area;

forming a routing line from a first portion of the metal layer by selectively removing a second portion of the metal layer; then mechanically attaching a chip to the insulative base using an adhesive, wherein the chip includes a pad, a conductive trace includes the routing line and the contact terminal, the metal base is disposed on a side of the insulative base that faces away from the chip, the routing line is disposed on a side of the insulative base that faces towards the chip, and the contact terminal contacts the routing line; then removing a portion of the metal base that contacts the contact terminal, thereby electrically isolating the contact terminal from other contact terminals that extend through the metal base; and forming a connection joint that contacts and electrically connects the routing line and the pad.

212. The method of claim 211, wherein forming the via includes mechanically drilling through the metal base, the insulative base and the metal layer.

213. The method of claim 211, wherein forming the via includes applying a wet chemical etch to the metal base, applying a laser etch or plasma etch to the insulative base, and applying a wet chemical etch to the metal layer.

214. The method of claim 211, wherein depositing the contact terminal includes:

plating the plated metal into the via and on the metal base without plating the plated metal on the metal layer; and then plating the plated metal into the via and on the metal layer.

215. The method of claim 211, wherein depositing the contact terminal includes:

plating the plated metal into the via as a first plated metal portion on the metal base and a second plated metal portion on the metal layer without the first and second plated metal portions contacting one another; and then plating the plated metal into the via such that the first and second plated metal portions contact one another in the via.

216. The method of claim 211, wherein depositing the contact terminal includes:

electroplating the plated metal into the via as a first plated metal portion on the metal base and a second plated metal portion on the metal layer without the first and second plated metal portions contacting one another; and then electrolessly plating the plated metal into the via as a third plated metal portion on the first and second plated metal portions and the insulative base.

217. The method of claim 211, wherein depositing the contact terminal includes:

plating the plated metal into the via and on the metal base without plating the plated metal on the metal layer; and then depositing a conductive adhesive into the via and on the plated metal and the metal layer.

218. The method of claim 211, wherein depositing the contact terminal includes:

plating the plated metal into the via as a first plated metal portion on the metal base and a second plated metal portion on the metal layer without the first and second plated metal portions contacting one another; and then depositing a conductive adhesive into the via and on the first and second plated metal portions.

219. The method of claim 211, wherein forming the via and depositing the contact terminal includes:

mechanically drilling through the metal base, the insulative base and the metal layer to form the via; then etching the metal base and the metal layer in the via such that the metal base and the metal layer are recessed relative to the insulative base in the via; and then plating the plated metal into the via and on the metal base and the metal layer.

220. The method of claim 211, wherein forming the via and depositing the contact terminal includes:

mechanically drilling through the metal base, the insulative base and the metal layer to form the via; then etching the metal base and the metal layer in the via such that the metal base and the metal layer are recessed relative to the insulative base in the via; then electroplating the plated metal into the via as a first plated metal portion on the metal base and a second plated metal portion on the metal layer without the first and second plated metal portions contacting one another;

rendering the insulative base in the via catalytic to electroless plating; and then electrolessly plating the plated metal into the via as a third plated metal portion on the first and second plated metal portions and the insulative base.

221. The method of claim 211, wherein forming the routing line includes:

forming a photoresist layer;

etching the metal layer using the photoresist layer as an etch mask; and removing the photoresist layer.

222. The method of claim 211, wherein removing the portion of the metal base includes applying a wet chemical etch that is highly selective of the metal base with respect to the insulative base and the contact terminal and removes all remaining portions of the metal base that overlap the chip.

223. The method of claim 211, including filling an insulator into the via such that the insulator extends from the routing line through the insulative base and the metal base and contacts the plated metal after mechanically attaching the chip and before removing the portion of the metal base.

224. The method of claim 223, wherein filling the insulator includes transfer molding.

225. The method of claim 223, wherein the insulator contacts a distal end of the contact terminal that faces away from the chip.

226. The method of claim 223, wherein the insulator contacts the peripheral sidewall portion of the contact terminal.

227. The method of claim 223, wherein the insulator is a single-piece encapsulant that contacts the chip, the insulative base and the routing line outside the via, and the encapsulant is compressible and permits the contact terminal to exhibit elastic deformation in response to externally applied pressure.

228. The method of claim 211, including forming an encapsulant by transfer molding that contacts the chip, the insulative base and the routing line after mechanically attaching the chip and before removing the portion of the metal base, wherein the routing line extends within and outside a periphery of the chip, the contact terminal is disposed outside the periphery of the chip and includes a distal end that faces away from the chip, and the encapsulant extends through the metal base and contacts the distal end and the peripheral sidewall portion of the contact terminal.

229. The method of claim 211, wherein the steps are performed in the sequence set forth.

230. The method of claim 211, wherein the assembly is devoid of wire bonds, TAB leads and solder joints.

231. A method of making a semiconductor chip assembly, comprising:

providing a metal base, an insulative base and a metal layer, wherein the metal base and the metal layer are disposed on opposite sides of the insulative base;

forming a via that extends through the metal layer, the insulative base and the metal base and has opposing open ends;

forming a conductive trace that includes a routing line and a contact terminal, wherein the routing line includes an unetched portion of the metal layer, the contact terminal includes a plated metal that contacts the metal base in the via, the plated metal forms a peripheral sidewall portion of the contact terminal, and the plated metal surrounds a central surface area without extending into the central surface area;

mechanically attaching a chip to the conductive trace, wherein the chip includes a pad, the metal base is disposed on a side of the insulative base that faces away from the chip, and the routing line is disposed on a side of the insulative base that faces towards the chip; then removing a portion of the metal base that contacts the contact terminal, thereby electrically isolating the contact terminal from other contact terminals, wherein the plated metal includes an exposed protruding portion that extends beyond the insulative base in a direction away from the chip; and forming a connection joint that contacts and electrically connects the routing line and the pad.

232. The method of claim 231, wherein forming the via includes mechanically drilling through the metal base, the insulative base and the metal layer.

233. The method of claim 231, wherein forming the contact terminal includes:

plating the plated metal into the via and on the metal base without the plated metal extending through the insulative base; and then plating the plated metal into the via such that the plated metal contacts the metal base and the metal layer and extends through the insulative base.

234. The method of claim 231, wherein forming the contact terminal includes:

plating the plated metal into the via and on the metal base without the plated metal extending through the insulative base; and then depositing a conductive adhesive into the via and on the plated metal, wherein the conductive adhesive extends through the insulative base.

235. The method of claim 231, wherein forming the routing line includes:

forming a photoresist layer;

etching the metal layer using the photoresist layer as an etch mask; and removing the photoresist layer.

236. The method of claim 231, wherein removing the portion of the metal base includes applying a wet chemical etch that is highly selective of the metal base with respect to the contact terminal and removes all remaining portions of the metal base that overlap the chip.

237. The method of claim 231, including transfer molding an encapsulant into the via that extends through the routing line, the insulative base and the metal base, contacts the routing line, the insulative base and the plated metal in the via, and extends into all of the central surface area after mechanically attaching the chip.

238. The method of claim 237, wherein the encapsulant contacts and covers a distal end of the contact terminal that faces away from the chip.

239. The method of claim 231, wherein the steps are performed in the sequence set forth.

240. The method of claim 231, wherein the assembly is devoid of wire bonds, TAB leads and solder joints.

241. A method of making a semiconductor chip assembly, comprising:

providing a metal base, an insulative base and a metal layer, wherein the metal base and the metal layer are disposed on opposite sides of the insulative base;

forming a first plating mask on the metal base and a second plating mask on the metal layer;

forming a via that extends through the metal base, the insulative base, the metal layer and the plating masks and has opposing open ends;

depositing a contact terminal into the via, wherein the contact terminal includes a plated metal that contacts and extends through the metal base, the insulative base and the metal layer in the via, and the contact terminal surrounds a central surface area without extending into the central surface area;

forming a routing line that includes a first portion of the metal layer by selectively removing a second portion of the metal layer;

mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip; then removing a portion of the metal base that contacts the contact terminal, thereby electrically isolating the contact terminal from other contact terminals that extend through the metal base, the insulative base and the metal layer, and forming a connection joint that contacts and electrically connects the routing line and the pad.

242. The method of claim 241, wherein forming the via includes mechanically drilling through the metal base, the insulative base, the metal layer and the plating masks.

243. The method of claim 241, wherein depositing the contact terminal includes:

electroplating the plated metal into the via and on the metal base without electroplating the plated metal on the metal layer; and then electroplating the plated metal into the via and on the metal layer.

244. The method of claim 241, wherein depositing the contact terminal includes:

electroplating the plated metal into the via as a first plated metal portion on the metal base and a second plated metal portion on the metal layer without the first and second plated metal portions contacting one another; and then electroplating the plated metal into the via such that the first and second plated metal portions contact one another in the via.

245. The method of claim 241, wherein forming the routing line includes:

forming a photoresist layer;

etching the metal layer using the photoresist layer as an etch mask; and removing the photoresist layer.

246. The method of claim 241, wherein removing the portion of the metal base includes applying a wet chemical etch that is highly selective of the metal base with respect to the insulative base and the contact terminal and removes all remaining portions of the metal base that overlap the chip.

247. The method of claim 241, including transfer molding an encapsulant into the via such that the encapsulant extends through the routing line, the insulative base and the contact terminal after mechanically attaching the chip.

248. The method of claim 247, wherein the encapsulant contacts and covers a distal end of the contact terminal that faces away from the chip.

249. The method of claim 247, wherein the encapsulant contacts the chip, the insulative base and the routing line outside the via.

250. The method of claim 241, wherein the steps are performed in the sequence set forth.

251. A method of making a semiconductor chip assembly, comprising:

providing a metal base, an insulative base and a metal layer, wherein the metal base and the metal layer are disposed on opposite sides of the insulative base;

forming a first plating mask on the metal base and a second plating mask on the metal layer;

forming a via that extends through the metal base, the insulative base, the metal layer and the plating masks and has opposing open ends;

etching the metal base and the metal layer in the via such that the metal base and the metal layer are recessed relative to the insulative base in the via;

depositing a contact terminal into the via, wherein the contact terminal includes a plated metal that contacts the metal base and the metal layer and extends through the metal base, the insulative base and the metal layer in the via, and the contact terminal surrounds a central surface area without extending into the central surface area;

removing the plating masks;

forming a routing line that includes a fist portion of the metal layer by selectively removing a second portion of the metal layer;

mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip; then removing a portion of the metal base that contacts the contact terminal, thereby electrically isolating the contact terminal from other contact terminals that extend through the metal base, the insulative base and the metal layer; and forming a connection joint that contacts and electrically connects the routing line and the pad.

252. The method of claim 251, wherein forming the via includes mechanically drilling through the metal base, the insulative base, the metal layer and the plating masks.

253. The method of claim 251, wherein depositing the contact terminal includes:

electroplating the plated metal into the via as a first plated metal portion on the metal base and a second plated metal portion on the metal layer without the first and second plated metal portions contacting one another;

rendering the insulative base in the via catalytic to electroless plating; and then electrolessly plating the plated metal into the via as a third plated metal portion on the first and second plated metal portions and the insulative base.

254. The method of claim 253, including removing the plating masks after the electroplating and before the electroless plating.

255. The method of claim 251, wherein forming the routing line includes:

forming a photoresist layer;

etching the metal layer and the plated metal using the photoresist layer as an etch mask; and removing the photoresist layer.

256. The method of claim 251, wherein removing the portion of the metal base includes applying a wet chemical etch that is highly selective of the metal base with respect to the insulative base and the contact terminal and removes all remaining portions of the metal base that overlap the chip.

257. The method of claim 251, including transfer molding an encapsulant into the via such that the encapsulant extends through the routing line, the insulative base and the contact terminal after mechanically attaching the chip.

258. The method of claim 257, wherein the encapsulant contacts and covers a distal end of the contact terminal that faces away from the chip.

259. The method of claim 257, wherein the encapsulant contacts the chip, the insulative base and the routing line outside the via.

260. The method of claim 251, wherein the steps before removing the plating masks are performed in the sequence set forth.

261. A method of making a semiconductor chip assembly, comprising:

providing a metal base, an insulative base and a metal layer, wherein the metal base and the metal layer are disposed on opposite sides of the insulative base;

forming a first plating mask on the metal base and a second plating mask on the metal layer;

forming a via that extends through the second plating mask, the metal layer and the insulative base, extends into but not through the metal base and is spaced from the first plating mask;

depositing a contact terminal into the via, wherein the contact terminal includes a plated metal that contacts and extends into the metal base without extending through the insulative base, and the contact terminal includes a conductive adhesive that contacts the plated metal and the insulative base, extends through the insulative base and extends into the metal base;

forming a routing line that includes a first portion of the metal layer by selectively removing a second portion of the metal layer;

mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip; then removing a portion of the metal base that contacts the contact terminal thereby electrically isolating the contact terminal from other contact terminals that extend through the insulative base and into the metal base; and forming a connection joint that contacts and electrically connects the routing line and the pad.

262. The method of claim 261, wherein forming the via includes mechanically drilling through the second plating mask, the metal layer, the insulative base, and into but not through the metal base.

263. The method of claim 261, wherein depositing the contact terminal includes:

plating the plated metal into the via and on the metal base without plating the plated metal on the metal layer; and then depositing the conductive adhesive into the via and on the plated metal and the metal layer.

264. The method of claim 261, wherein depositing the contact terminal includes:

plating the plated metal into the via as a first plated metal portion on the metal base and a second plated metal portion on the metal layer without the first and second plated metal portions contacting one another; and then depositing the conductive adhesive into the via and on the first and second plated metal portions.

265. The method of claim 261, wherein forming the routing line includes:

forming a photoresist layer;

etching the metal layer using the photoresist layer as an etch mask; and removing the photoresist layer.

266. The method of claim 261, wherein removing the portion of the metal base includes applying a wet chemical etch that is highly selective of the metal base with respect to the insulative base and the contact terminal and removes all remaining portions of the metal base that overlap the chip.

267. The method of claim 261, including transfer molding an encapsulant on the chip, the insulative base, the routing line and the conductive adhesive after mechanically attaching the chip.

268. The method of claim 267, wherein the encapsulant is spaced from the plated metal.

269. The method of claim 267, wherein the encapsulant is spaced from the metal base.

270. The method of claim 261, wherein the steps are performed in the sequence set forth.

271. A method of making a semiconductor chip assembly, comprising:

providing a metal base, an insulative base and a metal layer, wherein the metal base and the metal layer are disposed on opposite sides of the insulative base;

forming a via that extends through the insulative base and the metal layer and extends into the metal base by mechanical drilling;

etching the metal base and the metal layer in the via by applying a wet chemical etch that is highly selective of the metal base and the metal layer with respect to the insulative base such that the metal base and the metal layer are recessed relative to the insulative base in the via;

depositing a contact terminal into the via, wherein the contact terminal includes a plated metal that contacts the metal base and the metal layer, extends through the insulative base and the metal layer in the via, and extends into the metal base in the via;

forming a routing line that includes a first portion of the metal layer by selectively removing a second portion of the metal layer;

mechanically attaching a chip to a conductive trace, wherein the chip includes a pad, the conductive trace includes the routing line and the contact terminal, the metal base is disposed on a side of the insulative base that faces away from the chip, and the routing line is disposed on a side of the insulative base that faces towards the chip; then removing a portion of the metal base that contacts the contact terminal, thereby electrically isolating the contact terminal from other contact terminals that extend through the insulative base and the metal layer and into the metal base; and forming a connection joint that contacts and electrically connects the routing line and the pad.

272. The method of claim 271, wherein the via extends through the metal base and has open opposing ends.

273. The method of claim 271, wherein the via extends into but not through the metal base.

274. The method of claim 271, wherein depositing the contact terminal includes:

electroplating the plated metal into the via and on the metal base without the plated metal extending through the insulative base;

rendering the insulative base in the via catalytic to electroless plating; and then electrolessly plating the plated metal into the via such that the plated metal extends through the insulative base.

275. The method of claim 271, wherein forming the routing line includes:

forming a photoresist layer;

etching the metal layer and the plated metal using the photoresist layer as an etch mask; and removing the photoresist layer.

276. The method of claim 271, wherein removing the portion of the metal base includes applying a wet chemical etch that is highly selective of the metal base with respect to the insulative base and the contact terminal.

277. The method of claim 271, including transfer molding an encapsulant into the via such that the encapsulant extends through the routing line and the insulative base and extends into the metal base after mechanically attaching the chip.

278. The method of claim 277, including transfer molding the encapsulant before removing the portion of the metal base.

279. The method of claim 277, wherein the encapsulant contacts the chip, the insulative base and the routing line outside the via.

280. The method of claim 271, wherein the steps before forming the connection joint are performed in the sequence set forth.

* * * * *

UNITED STATES PATENT AND TRADEMARK OFFICE
CERTIFICATE OF CORRECTION

PATENT NO. : 6,740,576 B1
DATED : May 25, 2004
INVENTOR(S) : Charles W.C. Lin et al.

It is certified that error appears in the above-identified patent and that said Letters Patent is hereby corrected as shown below:

Column 22,
Line 1, change "130, 140 and 150" to -- 13O, 14O and 15O --.
Line 34, change "six" to -- sixth --.

Column 60,
Lines 49-52, "electrolessly plating... the insulative base" is a subparagraph.

Signed and Sealed this

Thirtieth Day of November, 2004

JON W. DUDAS
*Director of the United States Patent and Trademark Office*